US012749868B2

(12) United States Patent
Hamaguchi et al.

(10) Patent No.: US 12,749,868 B2
(45) Date of Patent: Sep. 29, 2026

(54) LIGHT EMITTING ELEMENT

(71) Applicant: Sony Group Corporation, Tokyo (JP)

(72) Inventors: Tatsushi Hamaguchi, Tokyo (JP); Mikihiro Yokozeki, Tokyo (JP); Rintaro Koda, Tokyo (JP)

(73) Assignee: Sony Group Corporation, Tokyo (JP)

( * ) Notice: Subject to any disclaimer, the term of this patent is extended or adjusted under 35 U.S.C. 154(b) by 986 days.

(21) Appl. No.: 17/789,875

(22) PCT Filed: Dec. 7, 2020

(86) PCT No.: PCT/JP2020/045395
§ 371 (c)(1),
(2) Date: Jun. 29, 2022

(87) PCT Pub. No.: WO2021/140802
PCT Pub. Date: Jul. 15, 2021

(65) Prior Publication Data

US 2023/0139279 A1 May 4, 2023

(30) Foreign Application Priority Data

Jan. 7, 2020 (JP) ................................ 2020-000825

(51) Int. Cl.
*H01S 5/06* (2006.01)
*H01S 5/024* (2006.01)
(Continued)

(52) U.S. Cl.
CPC ........ *H01S 5/0601* (2013.01); *H01S 5/02469* (2013.01); *H01S 5/18361* (2013.01);
(Continued)

(58) Field of Classification Search
CPC .................................................. H01S 5/18305
See application file for complete search history.

(56) References Cited

U.S. PATENT DOCUMENTS 10,873,174 B2 12/2020 Sato et al.
2002/0126720 A1 9/2002 Yang
(Continued)

FOREIGN PATENT DOCUMENTS

CN 105188540 A 12/2015
CN 109923742 A 6/2019
(Continued)

OTHER PUBLICATIONS

Hiroyuki Shibata et al., High Thermal Conductivity of Gallium Nitride (GaN) Crystals Grown by HVPE Process, Materials Transactions, 2007, vol. 48, Issue 10, pp. 27 (Year: 2007).*
(Continued)

*Primary Examiner* — Minsun O Harvey
(74) *Attorney, Agent, or Firm* — K&L Gates LLP

(57) ABSTRACT

A light emitting element (10A) of the present disclosure includes: a stacked structure (20) in which a first compound semiconductor layer (21) having a first surface (21*a*) and a second surface (21*b*), an active layer (23), and a second compound semiconductor layer (22) having a first surface (22*a*) and a second surface (22*b*) are stacked; a first light reflecting layer (41) formed on a first surface side of the first compound semiconductor layer (21) and having a convex shape in a direction away from the active layer (23); and a second light reflecting layer (42) formed on a second surface side of the second compound semiconductor layer (22) and having a flat shape, in which a partition wall (24) extending in a stacking direction of the stacked structure (20) is formed so as to surround the first light reflecting layer (41).

20 Claims, 68 Drawing Sheets

(51) Int. Cl.

*H01S 5/183* (2006.01)
*H01S 5/343* (2006.01)
*H01S 5/42* (2006.01)
*H01S 5/042* (2006.01)

(52) U.S. Cl.

CPC .......... *H01S 5/34333* (2013.01); *H01S 5/423* (2013.01); *H01S 5/04253* (2019.08); *H01S 5/18311* (2013.01); *H01S 5/18369* (2013.01); *H01S 5/34346* (2013.01)

(56) References Cited

U.S. PATENT DOCUMENTS

| | | | | |
|---|---|---|---|---|
| 2006/0198404 | A1 | 9/2006 | Henrichs | |
| 2014/0268169 | A1 | 9/2014 | Jayaraman et al. | |
| 2017/0346258 | A1* | 11/2017 | Kuramoto | H01S 5/34333 |
| 2020/0169061 | A1 | 5/2020 | Mitomo et al. | |
| 2020/0343694 | A1 | 10/2020 | Hamaguchi et al. | |

FOREIGN PATENT DOCUMENTS

| | | | | |
|---|---|---|---|---|
| JP | 3091855 | U | 2/2003 | |
| JP | 2016-513889 | A | 5/2016 | |
| WO | WO2018/083877 | A1 | 5/2018 | |
| WO | WO-2019017044 | A1 * | 1/2019 | H01S 5/04253 |
| WO | WO-2019124163 | A1 * | 6/2019 | H01S 5/0206 |

OTHER PUBLICATIONS

Wang, Kai & Reeber, Robert. (2011). Thermal expansion of GaN and AlN. MRS Proceedings. 482. 10.1557/PROC-482-863. (Year: 2011).* https://web.archive.org/web/20191011073235/https://www.engineeringtoolbox.com/thermal-conductivity-metals-d_858.html (Year: 2019).*

English Translation of Hamaguchi (Year: 2019).*

English Translation of Hamaguchi 2 (Year: 2019).* https://web.archive.org/web/20200807221732/https://dovermotion.com/resources/motion-control-handbook/thermal-expansion/ (Year: 2020).*

International Search Report issued in International Patent Application No. PCT/JP2020/045395 on Feb. 22, 2021 and English translation of same. 7 pages.

Written Opinion issued in International Patent Application No. PCT/JP2020/045395 on Feb. 22, 2021. 5 pages.

* cited by examiner

[FIRST LIGHT REFLECTING LAYER]

[FIRST LIGHT REFLECTING LAYER]

LIGHT EMITTING ELEMENT

TECHNICAL FIELD

The present disclosure relates to a light emitting element, more specifically, to a light emitting element including a surface emitting laser element (vertical-cavity surface-emitting laser (VCSEL)).

BACKGROUND ART

In a light emitting element including a surface emitting laser element, laser oscillation generally occurs by causing laser light to resonate between two light reflecting layers (distributed Bragg reflector (DBR) layers). Then, in a surface emitting laser element having a stacked structure in which an n-type compound semiconductor layer (first compound semiconductor layer), an active layer (light emitting layer) formed using a compound semiconductor, and a p-type compound semiconductor layer (second compound semiconductor layer) are stacked, generally, a second electrode formed using a transparent conductive material is formed on the p-type compound semiconductor layer, and a second light reflecting layer is formed on the second electrode. In addition, a first light reflecting layer and a first electrode are formed on the n-type compound semiconductor layer (on an exposed surface of a conductive substrate in a case where the n-type compound semiconductor layer is formed on the substrate). Note that, in the present specification, the concept "on" may refer to a direction away from the active layer with respect to the active layer, the concept "under" may refer to a direction toward the active layer with respect to the active layer, and the concepts "convex" and "concave" may be based on the active layer.

A structure in which the first light reflecting layer also functions as a concave mirror is known from, for example, WO 2018/083877 A1. Here, in the technology disclosed in this International Publication, for example, a convex portion is formed in the n-type compound semiconductor layer with respect to the active layer, and the first light reflecting layer is formed on the convex portion.

CITATION LIST

Patent Document

Patent Document 1: WO 2018/083877 A1

SUMMARY OF THE INVENTION

Problems to be Solved by the Invention

A vertical-cavity surface-emitting laser (VCSEL) in which the first light reflecting layer functions as a kind of concave mirror has a problem that stray light is likely to enter an adjacent VCSEL due to a side portion (end portion) of the concave mirror. Such light having flown to the adjacent VCSEL is absorbed by an active layer of the adjacent VCSEL or coupled to a resonance mode and thereby affects a light emission operation of the adjacent VCSEL and causes noise generation. Note that such a phenomenon may be referred to as optical crosstalk caused by a concave mirror. Furthermore, in a case where the stacked structure is formed using a GaN-based compound semiconductor, there is a problem of thermal saturation. Here, "thermal saturation" is a phenomenon in which light output is saturated due to self-heating at the time of driving of the surface emitting laser element. A material used for the light reflecting layer (for example, a material such as $SiO_2$ or $Ta_2O_5$) has a lower thermal conductivity value than that of the GaN-based compound semiconductor. Therefore, increasing a thickness of the GaN-based compound semiconductor layer leads to suppression of thermal saturation. However, in a case where the thickness of the GaN-based compound semiconductor layer is increased, since a length of a resonator length $L_{OR}$ is increased, the problem described above is likely to occur.

Therefore, an object of the present disclosure is to provide a light emitting element having a configuration and a structure capable of preventing occurrence of optical crosstalk or a light emitting element having a configuration and a structure capable of preventing occurrence of thermal saturation.

Solutions to Problems

A light emitting element of the present disclosure for achieving the above-described object includes:

a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked;

a first light reflecting layer formed on a first surface side of the first compound semiconductor layer and having a convex shape in a direction away from the active layer; and a second light reflecting layer formed on a second surface side of the second compound semiconductor layer and having a flat shape, in which a partition wall extending in a stacking direction of the stacked structure is formed so as to surround the first light reflecting layer.

A light emitting element array of the present disclosure for achieving the above-described object is a light emitting element array in which a plurality of light emitting elements is arranged, the light emitting elements each including:

a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked;

a first light reflecting layer formed on a first surface side of the first compound semiconductor layer and having a convex shape in a direction away from the active layer; and a second light reflecting layer formed on a second surface side of the second compound semiconductor layer and having a flat shape.

Figure 55:
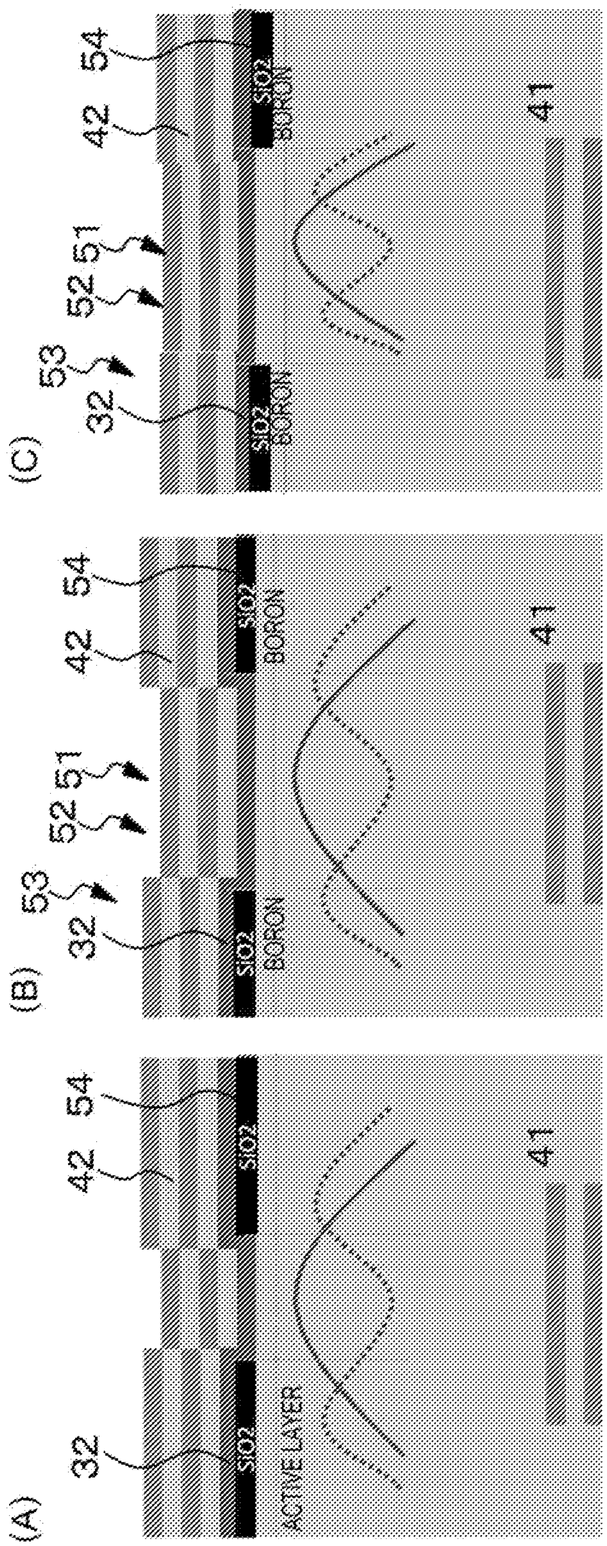

(A), (B), and (C) of FIG. 55 are conceptual diagrams illustrating light field intensities in a conventional light emitting element, the light emitting element of Embodiment 15, and a light emitting element of Embodiment 20, respectively.

Figure 56:
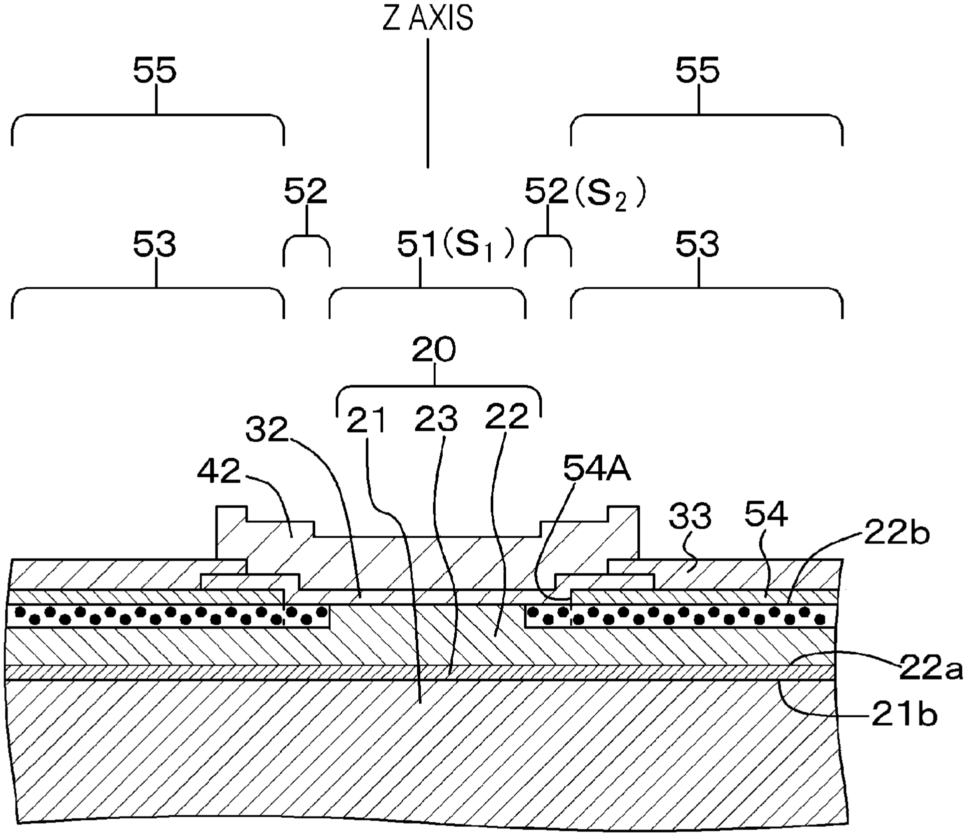

FIG. 56 is a schematic partial end view of a light emitting element of Embodiment 16.

Figure 57:
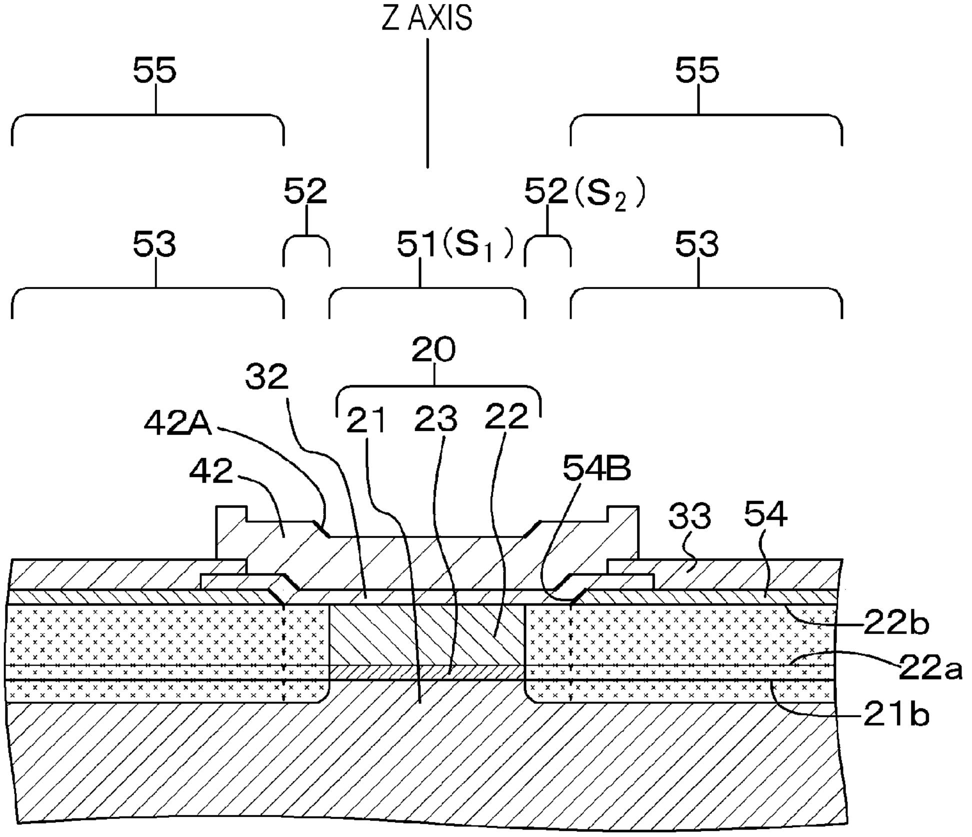

FIG. 57 is a schematic partial end view of a light emitting element of Embodiment 17.

Figure 58A:
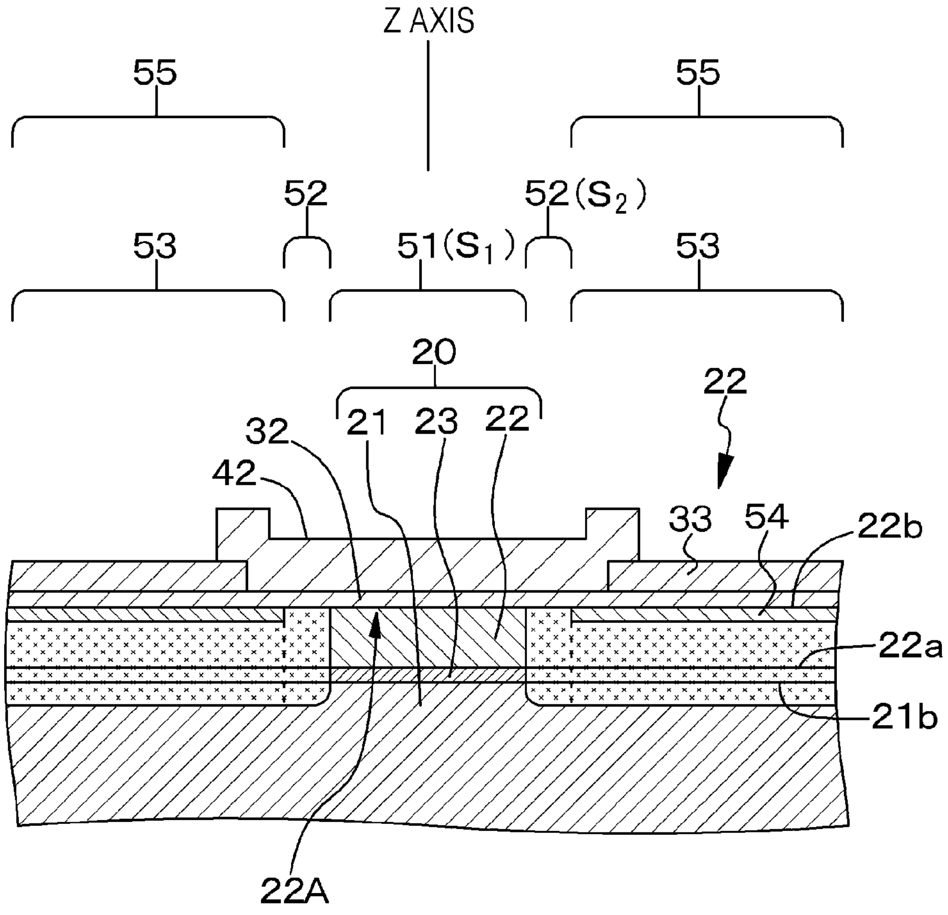
Figure 58B:
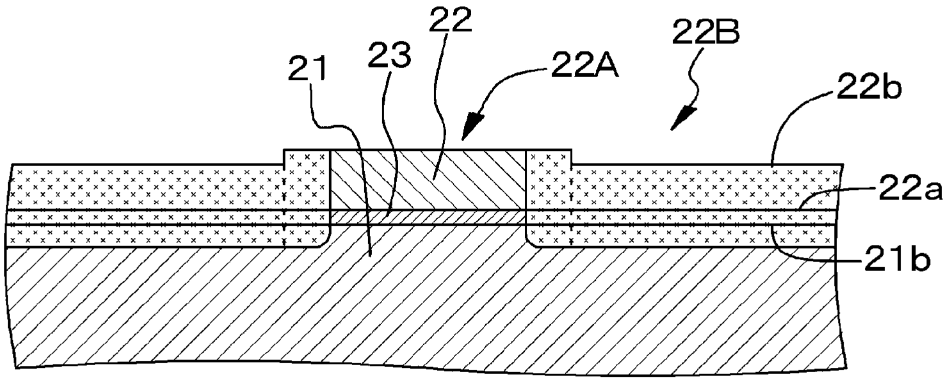

FIGS. 58A and 58B are a schematic partial end view of a light emitting element of Embodiment 18 and a schematic partial cross-sectional view obtained by cutting a main part of the light emitting element of Embodiment 18, respectively.

Figure 59:
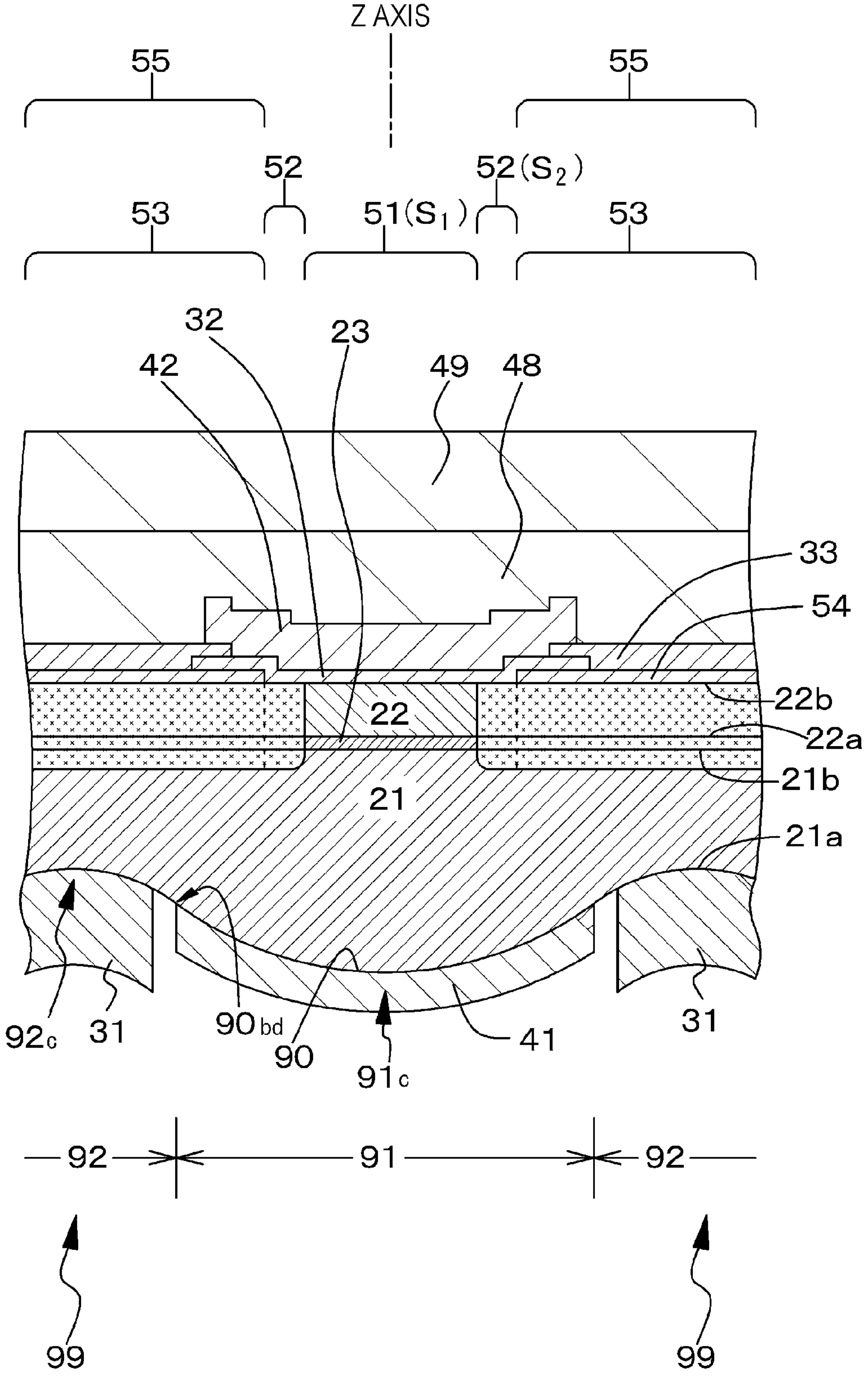

FIG. 59 is a schematic partial end view of a light emitting element of Embodiment 19.

Figure 60:
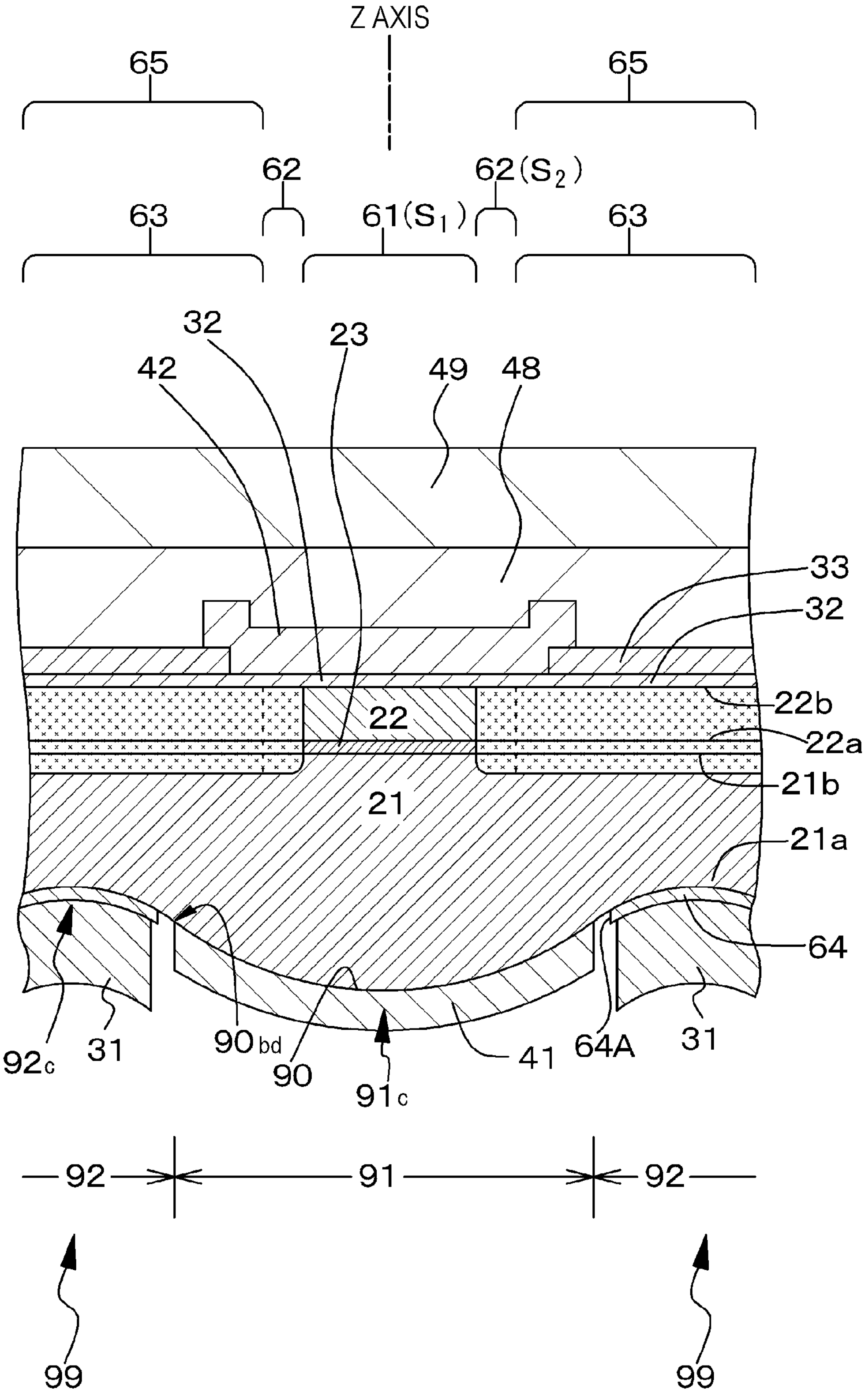

FIG. 60 is a schematic partial end view of the light emitting element of Embodiment 20.

Figure 61:
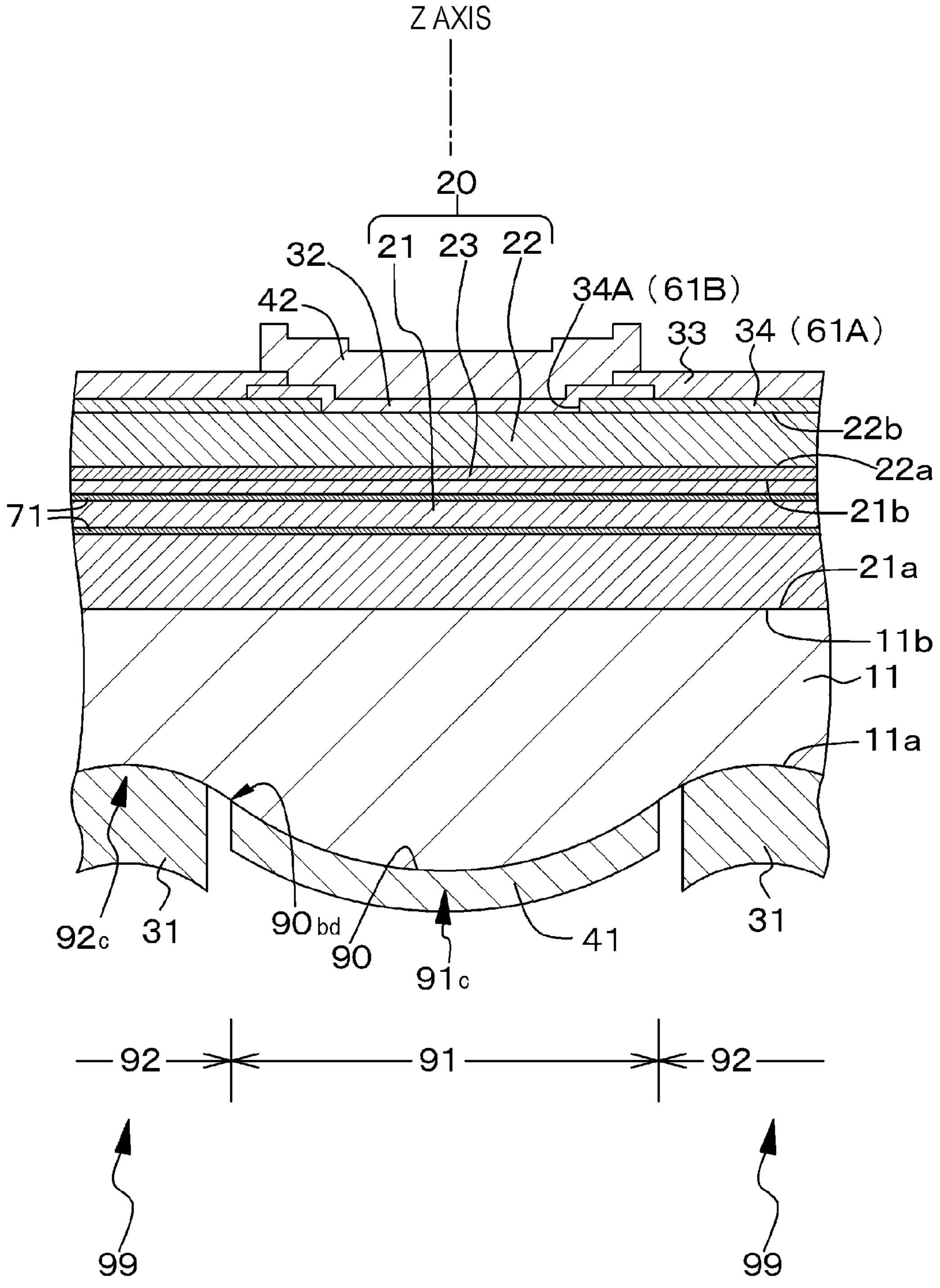

FIG. 61 is a schematic partial cross-sectional view of a light emitting element of Embodiment 21.

Figure 62:
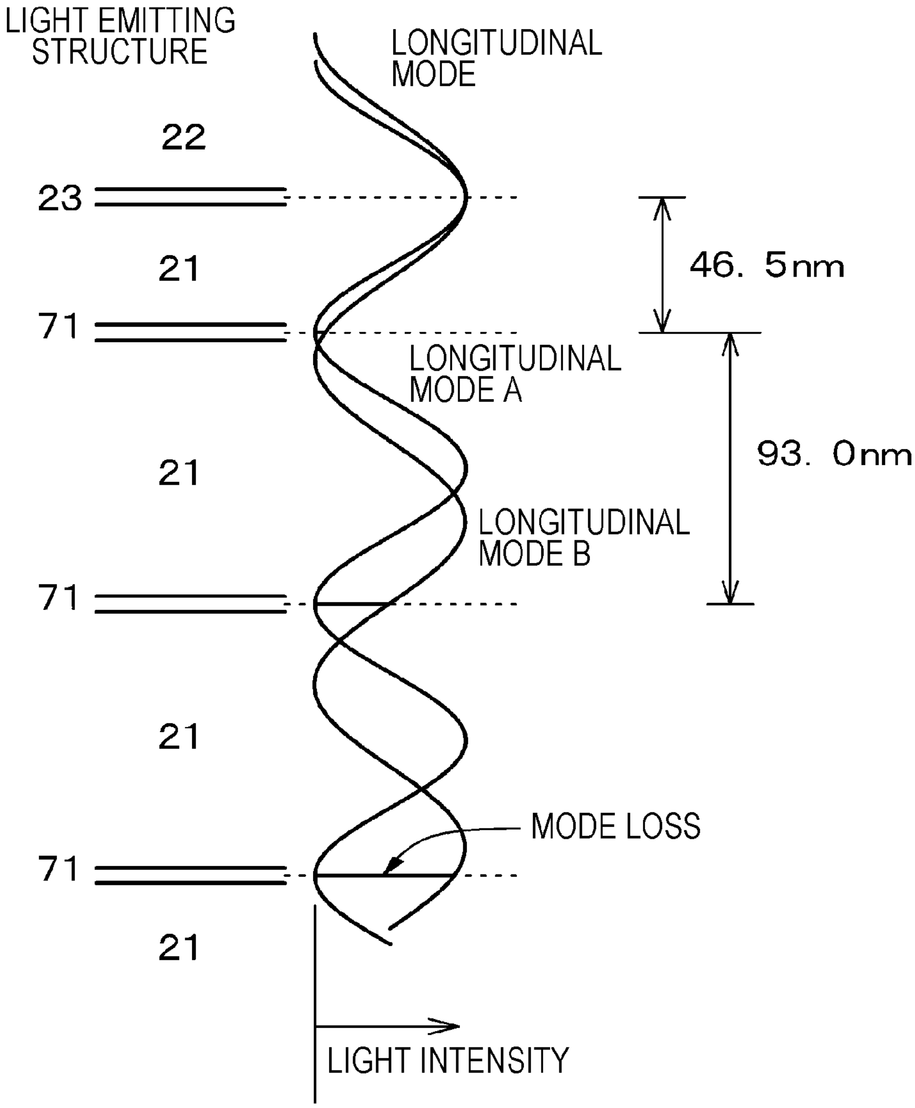

FIG. 62 is a schematic partial cross-sectional view of the light emitting element of Embodiment 21, and a view in which two longitudinal modes, a longitudinal mode A and a longitudinal mode B, are superimposed.

Figure 63:
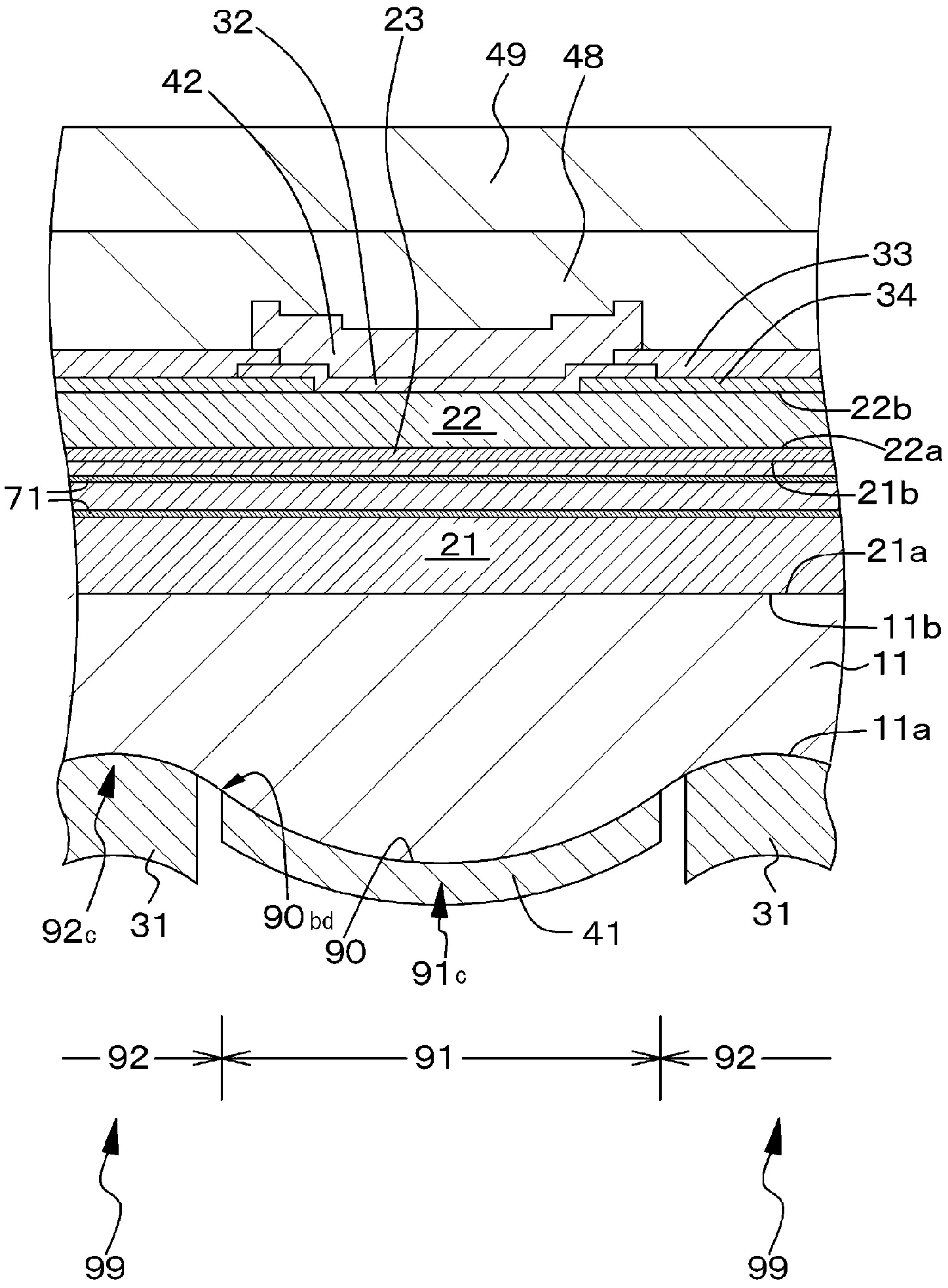

FIG. 63 is a schematic partial cross-sectional view of a light emitting element of Embodiment 24.

Figure 64:
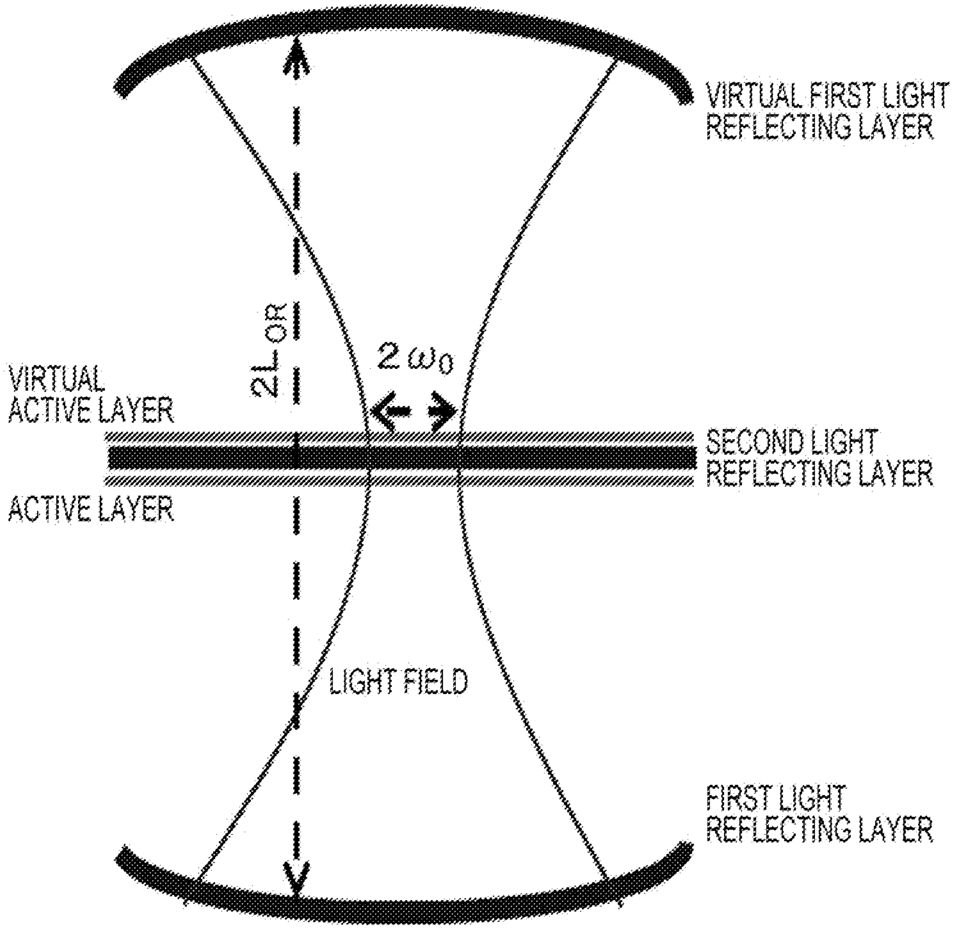

FIG. 64 is a conceptual diagram assuming a Fabry-Perot resonator sandwiched between two concave mirror portions having the same radius of curvature.

Figure 65:
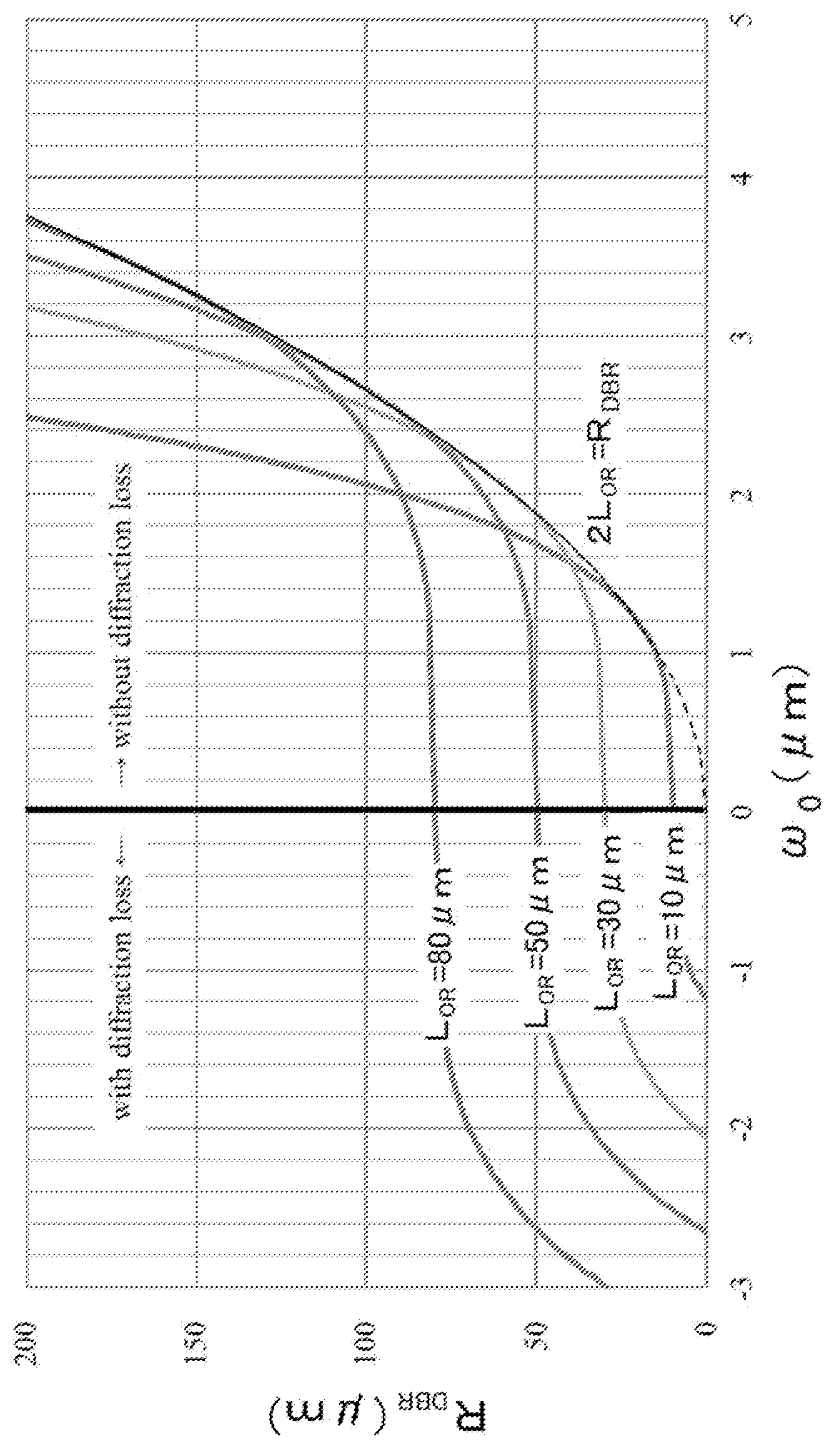

FIG. 65 is a graph illustrating a relationship between a value of $\omega_0$, a value of a resonator length $L_{OR}$, and a value of a radius $R_1$ of curvature ($R_{DBR}$) of the concave mirror portion of the first light reflecting layer.

Figure 66:
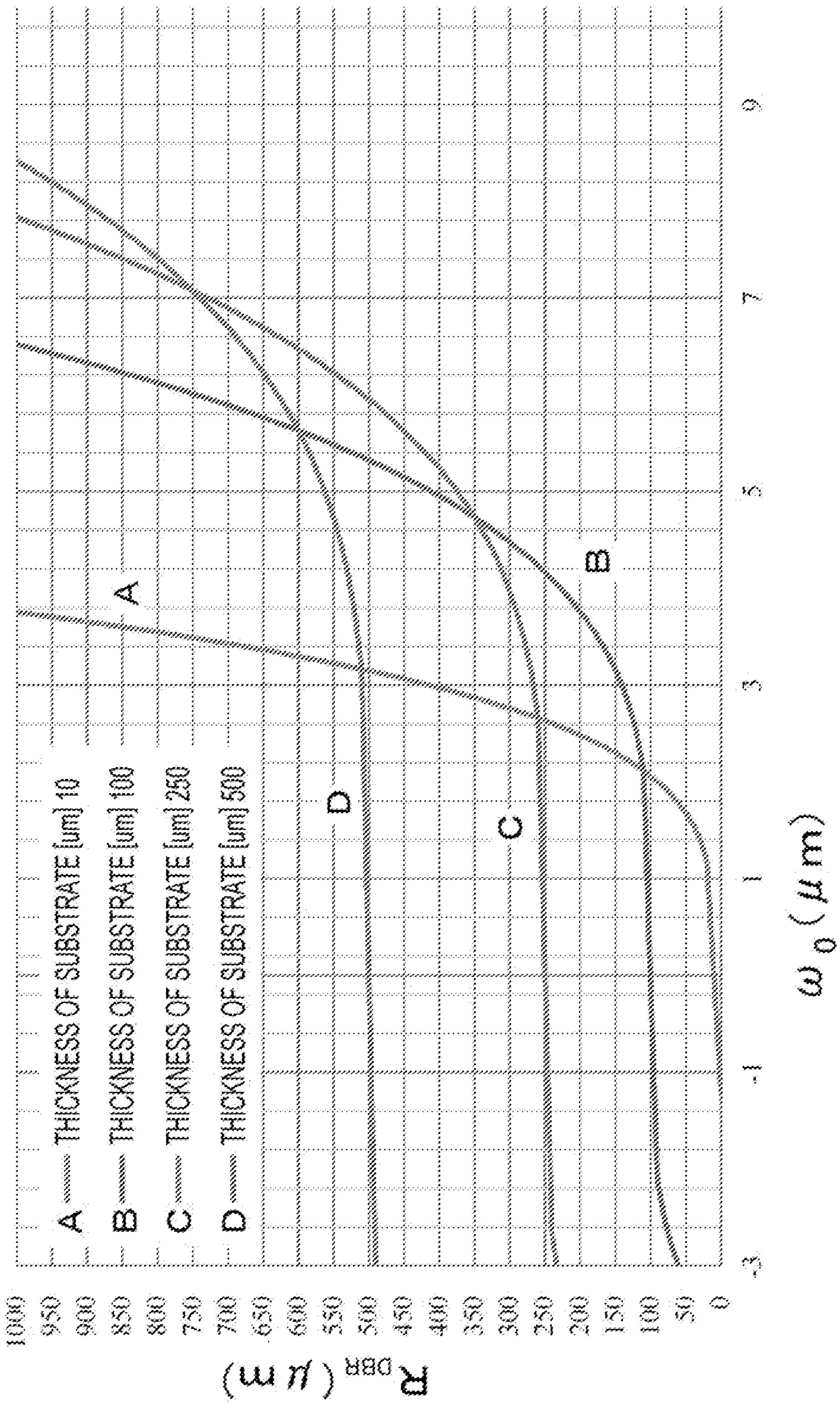

FIG. 66 is a graph illustrating a relationship between the value of $\omega_0$, the value of the resonator length $L_{OR}$, and the value of the radius $R_1$ of curvature ($R_{DBR}$) of the concave mirror portion of the first light reflecting layer.

Figure 67A:
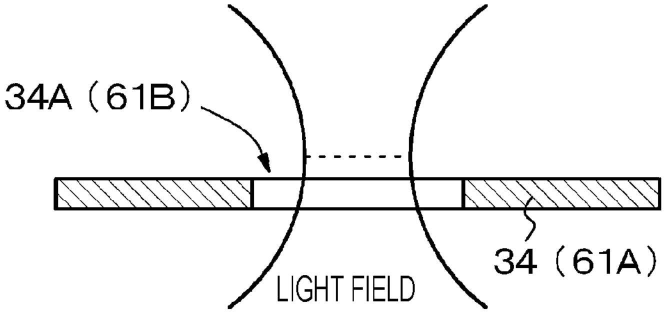
Figure 67B:
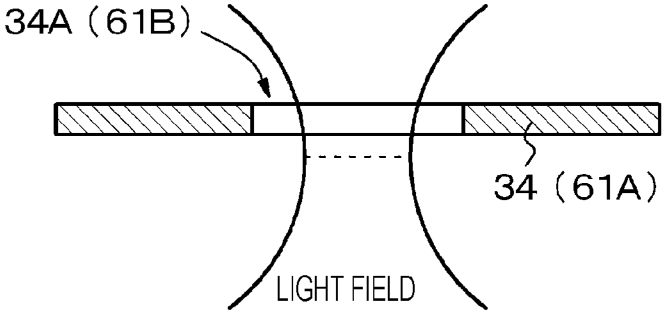

FIGS. 67A and 67B are a diagram schematically illustrating a laser light collecting state in a case where the value of $\omega_0$ is "positive", and a diagram schematically illustrating a laser light collecting state in a case where the value of $\omega_0$ is "negative", respectively.

Figure 68A:
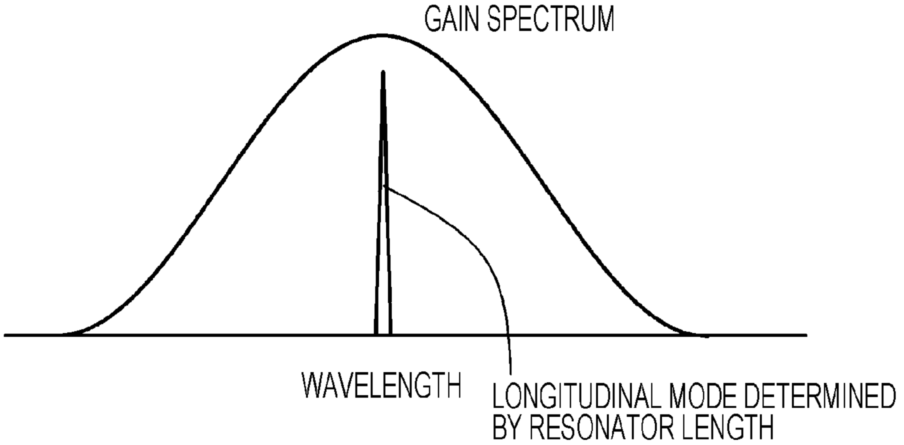
Figure 68B:
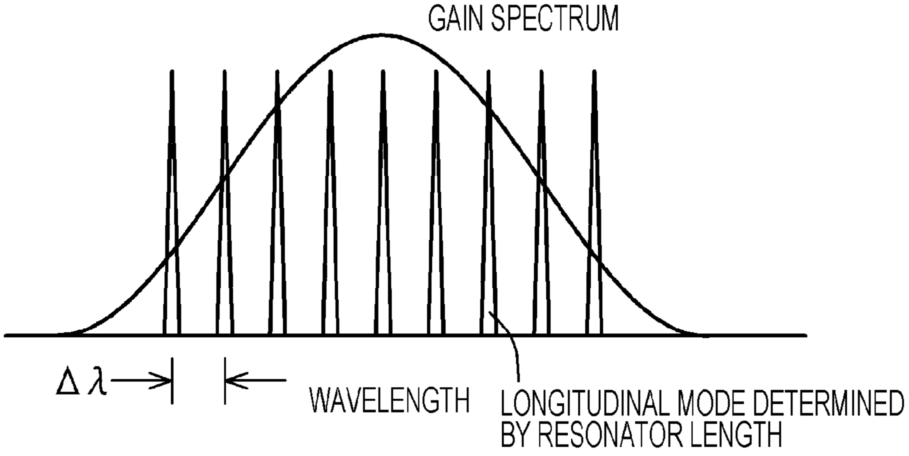

FIGS. 68A and 68B are conceptual diagrams schematically illustrating a longitudinal mode existing in a gain spectrum determined by an active layer.

MODE FOR CARRYING OUT THE INVENTION

Hereinafter, the present disclosure will be described on the basis of embodiments with reference to the drawings, but the present disclosure is not limited to the embodiments, and various numerical values and materials in the embodiments are examples. Note that descriptions will be provided in the following order.

1. General Description of Light Emitting Element of Present Disclosure and Light Emitting Element Array of Present Disclosure
2. Embodiment 1 (Light Emitting Element of Present Disclosure and Light Emitting Element Array of Present Disclosure)
3. Embodiment 2 (Modification of Embodiment 1)
4. Embodiment 3 (Modification of Embodiments 1 and 2)
5. Embodiment 4 (Modification of Embodiments 1 to 3)
6. Embodiment 5 (Light Emitting Element According to Second Aspect of Present Disclosure, Light Emitting Element Array According to Second Aspect of Present Disclosure, Method for Manufacturing Light Emitting Element Array According to First Aspect of Present Disclosure, Light emitting Element of First Configuration, Light Emitting Element of 1-A-th Configuration, and Light Emitting Element of Second Configuration)
7. Embodiment 6 (Modification of Embodiment 5 and Light Emitting Element of 1-B-th Configuration)
8. Embodiment 7 (Another Modification of Embodiment 5 and Light Emitting Element of 1-C-th Configuration)
9. Embodiment 8 (Still Another Modification of Embodiment 5)
10. Embodiment 9 (Modification of Embodiments 5 to 8 and Light Emitting Element of Third Configuration)
11. Embodiment 10 (Modification of Embodiments 5 to 8, and Light Emitting Element of Fourth Configuration)
12. Embodiment 11 (Modification of Embodiment 10)
13. Embodiment 12 (Modification of Embodiments 5 to 11)
14. Embodiment 13 (Method for Manufacturing Light Emitting Element Array According to Second Aspect of Present disclosure)
15. Embodiment 14 (Modification of Embodiments 5 to 13 and Light Emitting Element of Fifth Configuration)
16. Embodiment 15 (Modification of Embodiments 5 to 14 and Light Emitting Element of 6-A-th Configuration)
17. Embodiment 16 (Modification of Embodiment 15 and Light Emitting Element of 6-B-th Configuration)
18. Embodiment 17 (Modification of Embodiments 15 and 16 and Light Emitting Element of 6-C-th Configuration)
19. Embodiment 18 (Modification of Embodiments 15 to 17 and Light Emitting Element of 6-D-th Configuration)
20. Embodiment 19 (Modification of Embodiments 15 to 18)
21. Embodiment 20 (Modification of Embodiments 5 to 19, Light Emitting Element of 7-A-th Configuration, Light Emitting Element of 7-B-th Configuration, Light Emitting Element of 7-C-th Configuration, and Light Emitting Element of 7-D-th Configuration)
22. Embodiment 21 (Modification of Embodiments 5 to 20 and Light Emitting Element of Eighth Configuration)
23. Embodiment 22 (Modification of Embodiment 21)
24. Embodiment 23 (Another Modification of Embodiment 21)

25. Embodiment 24 (Modification of Embodiments 21 to 23)

26. Others

<General Description of Light Emitting Element of Present Disclosure and Light Emitting Element Array of Present Disclosure>

A light emitting element array of the present disclosure can have a form in which a partition wall extending in a stacking direction of a stacked structure is formed so as to surround a first light reflecting layer in each light emitting element.

In the above-described preferable form of the light emitting element of the present disclosure or the light emitting element array of the present disclosure, the partition wall extending in the stacking direction of the stacked structure is formed so as to surround the first light reflecting layer. However, an orthogonal projection image of the first light reflecting layer may be included in an orthogonal projection image of a side surface (which may hereinafter be referred to as the “partition wall side surface”) of the partition wall that faces the first light reflecting layer (which may hereinafter be referred to as “an orthogonal projection image of the partition wall side surface”), or the orthogonal projection image of the partition wall side surface may be included in an orthogonal projection image of a portion that does not contribute to light reflection of the first light reflecting layer (a non-effective region of the first light reflecting layer). Alternatively, a base surface (as described later) on which the first light reflecting layer is formed may be included in the orthogonal projection image of the partition wall side surface. In addition, the partition wall side surface may be a continuous surface or a discontinuous surface partially cut out. Note that, in the present specification, the “orthogonal projection image” means an orthogonal projection image obtained in a case where orthogonal projection is performed on the stacked structure.

The light emitting element of the present disclosure or the light emitting element included in the light emitting element array of the present disclosure having the above-described preferable form (which may hereinafter be collectively referred to as a “light emitting element of the present disclosure and the like”) can have a form in which the partition wall extends from a first surface side of a first compound semiconductor layer to the middle of the first compound semiconductor layer in a thickness direction in the first compound semiconductor layer. That is, an upper end portion of the partition wall may be positioned at the middle of the first compound semiconductor layer in the thickness direction. A lower end portion of the partition wall is exposed at a first surface of the light emitting element in some cases or is not exposed at the first surface of the light emitting element in some cases. Here, the “first surface of the light emitting element” refers to an exposed surface of the light emitting element on a side where the first light reflecting layer is provided, and a “second surface of the light emitting element” refers to an exposed surface of the light emitting element on a side where a second light reflecting layer is provided. Then, in such a form of the light emitting element array of the present disclosure, a relationship between $L_0$, $L_1$, and $L_3$ is as follows.

It is desirable to satisfy the following Formula (1), preferably, Formula (1'), satisfy the following Formula (2), preferably, Formula (2'), satisfy the following Formulas (1) and (2), or satisfy the following Formulas (1') and (2').

$$0.01 \times L_0 \leq L_0 - L_1 \quad (1)$$

$$0.05 \times L_0 \leq L_0 - L_1 \quad (1')$$

$$0.01 \times L_3 \leq L_1 \quad (2)$$

$$0.05 \times L_3 \leq L_1 \quad (2')$$

where $L_0$: a distance from an end portion of a facing surface of the first light reflecting layer that faces a first surface of the first compound semiconductor layer to an active layer, $L_1$: a distance from the active layer to an end portion (the upper end portion of the partition wall and an end portion facing the active layer) of the partition wall extending to the middle of the first compound semiconductor layer in the thickness direction in the first compound semiconductor layer, and $L_3$: a distance from an axial line of the first light reflecting layer included in the light emitting element to an orthogonal projection image of the partition wall on the stacked structure (more specifically, an orthogonal projection image of the upper end portion of the partition wall). Note that an upper limit value of ($L_0$−$L_1$) is less than $L_0$, but in a case where a short circuit does not occur between the active layer and a first electrode due to the partition wall, the upper limit value of ($L_0$−$L_1$) may be equal to or more than $L_0$.

Alternatively, in the light emitting element of the present disclosure and the like, the partition wall can extend from a second surface side of a second compound semiconductor layer in the second compound semiconductor layer and the active layer, and further extend to the middle of the first compound semiconductor layer in the thickness direction in the first compound semiconductor layer. That is, the lower end portion of the partition wall may be positioned at the middle of the first compound semiconductor layer in the thickness direction. The upper end portion of the partition wall is exposed at the second surface of the light emitting element in some cases or is not exposed at the second surface of the light emitting element in some cases. Then, in such a form of the light emitting element array of the present disclosure, a relationship between $L_0$, $L_2$, and $L_3'$ is as follows.

It is desirable to satisfy the following Formula (3), preferably, Formula (3'), satisfy the following Formula (4), preferably, Formula (4'), satisfy the following Formulas (3) and (4), or satisfy the following Formulas (3') and (4').

$$0.01 \times L_0 \leq L_2 \quad (3)$$

$$0.05 \times L_0 \leq L_2 \quad (3')$$

$$0.01 \times L_3' \leq L_2 \quad (4)$$

$$0.05 \times L_3' \leq L_2 \quad (4')$$

where $L_0$: the distance from the end portion of the facing surface of the first light reflecting layer that faces the first surface of the first compound semiconductor layer to the active layer, $L_2$: a distance from the active layer to an end portion (the lower end portion of the partition wall and an end portion facing the first electrode) of the partition wall extending to the middle of the first compound semiconductor layer in the thickness direction in the first compound semiconductor layer, and $L_3'$: a distance from the axial line of the first light reflecting layer included in the light emitting element to an orthogonal projection image of the partition wall on the stacked structure (more specifically, an orthogonal projection image of the lower end portion of the partition wall). Note that an upper limit value of $L_2$ is less than $L_0$, but in a case where a short circuit does not occur between the active layer and the first electrode due to the partition wall, the upper limit value of $L_2$ may be equal to or more than $L_0$.

The light emitting element of the present disclosure and the like having various preferable forms described above can have a form in which the partition wall is formed using a material that does not transmit light generated in the active layer, and thus, generation of stray light and occurrence of optical crosstalk can be prevented. Specifically, examples of such a material can include a material capable of blocking light, such as titanium (Ti), chromium (Cr), tungsten (W), tantalum (Ta), aluminum (Al), or $MoSi_2$, and for example, formation can be performed by a vapor deposition method including an electron beam vapor deposition method, a hot filament vapor deposition method, and a vacuum vapor deposition method, a sputtering method, a chemical vapor deposition (CVD) method, an ion plating method, or the like. Alternatively, a black resin film (specifically, for example, a black polyimide-based resin, an epoxy-based resin, or a silicone-based resin) mixed with a black colorant and having an optical density of 1 or more can be used.

Alternatively, the light emitting element of the present disclosure and the like having various preferable forms described above can have a form in which the partition wall is formed using a material that reflects light generated in the active layer, and thus, generation of stray light and occurrence of optical crosstalk can be prevented, and stray light can be efficiently returned to the light emitting element itself, which can contribute to improvement of light emission efficiency of the light emitting element. Specifically, the partition wall includes a thin film filter using interference of a thin film. The thin film filter has a similar configuration and structure although a stacking direction (alternate arrangement direction) is different from that of, for example, the light reflecting layer as described later. Specifically, a concave portion is formed at a portion of the stacked structure, and the concave portion is sequentially filled with a similar material to that of the light reflecting layer on the basis of, for example, a sputtering method, such that it is possible to obtain the thin film filter in which dielectric layers are alternately arranged in a case where the partition wall is cut along a virtual plane orthogonal to the stacking direction of the stacked structure. Alternatively, as such a material, a metal material, an alloy material, or a metal oxide material can be exemplified, and more specifically, copper (Cu) or an alloy thereof, gold (Au) or an alloy thereof, tin (Sn) or an alloy thereof, silver (Ag) or a silver alloy (for example, Ag—Pd—Cu or Ag—Sm—Cu), platinum (Pt) or an alloy thereof, palladium (Pd) or an alloy thereof, titanium (Ti) or an alloy thereof, aluminum (Al) or an aluminum alloy (for example, Al—Nd or Al—Cu), an Al/Ti stacked structure, an Al—Cu/Ti stacked structure, chromium (Cr) or an alloy thereof, indium tin oxide (ITO), or the like can be exemplified, and formation can be performed by, for example, a vapor deposition method including an electron beam vapor deposition method, a hot filament vapor deposition method, and a vacuum vapor deposition method, a sputtering method, a CVD method, an ion plating method, a plating method (electroplating method or electroless plating method), a lift-off method, a laser ablation method, a sol-gel method, a plating method, or the like.

Alternatively, the light emitting element of the present disclosure and the like having various preferable forms described above can have a form in which $1\times10^{-1} \leq TC_1/TC_0 \leq 1\times10^2$, where a thermal conductivity of a material forming the first compound semiconductor layer is $TC_1$, and a thermal conductivity of the material forming the partition wall is $TC_0$. Specifically, examples of such a material forming the partition wall can include a metal such as silver (Ag), copper (Cu), gold (Au), tin (Sn), aluminum (Al), ruthenium (Ru), rhodium (Rh), or platinum (Pt), alloys thereof, or mixtures of these metals, ITO, and the like, and for example, formation can be performed by a vapor deposition method including an electron beam vapor deposition method, a hot filament vapor deposition method, and a vacuum vapor deposition method, a sputtering method, a CVD method, an ion plating method, a plating method (electroplating method or electroless plating method), a lift-off method, a laser ablation method, a sol-gel method, a plating method, or the like. Then, as the partition wall is formed using a material having a high thermal conductivity as described above, heat generated in the stacked structure can be released (dissipated) to the outside through the partition wall. Note that, in this case, a partition wall extension portion may be formed on an outer surface (the first surface or the second surface) of the light emitting element so that heat generated in the stacked structure can be released (dissipated) to the outside via the partition wall and the partition wall extension portion, or the partition wall may be connected to the first electrode, a second electrode, or a pad electrode so that heat generated in the stacked structure can be released (dissipated) to the outside via the partition wall and the first electrode, the second electrode, or the pad electrode (as described later).

Alternatively, the light emitting element of the present disclosure and the like having various preferable forms described above can have a form in which $|CTE_0-CTE_1| \leq 1\times10^{-4}/K$, where a linear expansivity of the material forming the first compound semiconductor layer is $CTE_1$, and a linear expansivity of the material forming the partition wall is $CTE_0$. Specifically, examples of such a material forming the partition wall can include a polyimide-based resin, a silicone-based resin, an epoxy-based resin, a carbon-based material, SOG, polycrystalline GaN, and monocrystalline GaN. By defining the linear expansivity in this manner, a thermal expansion coefficient of the entire light emitting element can be optimized, and thermal expansion of the light emitting element can be controlled (suppressed). Specifically, for example, a net thermal expansion coefficient of the stacked structure can be increased, and can be adjusted to match a thermal expansion coefficient of a substrate material or the like on which the light emitting element is mounted, such that it is possible to prevent damage of the light emitting element and to suppress a decrease in reliability of the light emitting element due to generation of stress. The partition wall formed using a polyimide-based resin can be formed on the basis of, for example, a spin coating method and a curing method.

Alternatively, in the light emitting element of the present disclosure and the like having various preferable forms described above, if the partition wall is formed using an insulating material, occurrence of electrical crosstalk can be suppressed. That is, it is possible to prevent an unnecessary current from flowing between adjacent light emitting elements.

Alternatively, the light emitting element of the present disclosure and the like having various preferable forms described above can have a form in which the partition wall is formed using a solder material, and a portion of the partition wall is exposed at an outer surface of the light emitting element. A kind of bump can be constituted by the portion of the partition wall exposed at the outer surface of the light emitting element. Specifically, as such a material forming the partition wall, a Au—Sn eutectic solder, a so-called low melting point metal (alloy) material, a solder material, or a brazing material can be used. For example, a brazing material such as indium (In) (melting point: 157° C.); an indium-gold-based low melting point alloy; a tin (Sn)-based high-temperature solder such as $Sn_{80}Ag_{20}$ (melting point: 220 to 370° C.) or $Sn_{95}Cu_5$ (melting point: 227 to 370° C.); a lead (Pb)-based high-temperature solder such as $Pb_{97.5}Ag_{2.5}$ (melting point: 304° C.), $Pb_{94.5}Ag_{5.5}$ (melting point: 304 to 365° C.), or $Pb_{97.5}Ag_{1.5}Sn_{1.0}$ (melting point: 309° C.); a zinc (Zn)-based high-temperature solder such as $Zn_{95}Al_5$ (melting point: 380° C.); a tin-lead-based standard solder such as $Sn_5Pb_{95}$ (melting point: 300 to 314° C.) or $Sn_2Pb_{98}$ (melting point: 316 to 322° C.); or $Au_{88}Ga_{12}$ (melting point: 381° C.) (the above subscripts all represent atom %) can be used.

Furthermore, the light emitting element of the present disclosure and the like having various preferable forms described above can have a form in which a side surface of the partition wall is narrowed in a direction from the first surface side of the first compound semiconductor layer toward the second surface side of the second compound semiconductor layer. That is, a shape of the side surface of the partition wall in a case where the light emitting element is cut along a virtual plane including the stacking direction of the stacked structure can be a trapezoid (an isosceles trapezoid in which a second compound semiconductor layer side is a shorter side and a first compound semiconductor layer side is a longer side). Further, accordingly, stray light can be returned to the light emitting element itself more efficiently.

Examples of the shape of the side surface of the partition wall in a case where the light emitting element is cut along the virtual plane including the stacking direction of the stacked structure can include a line segment, an arc, a part of a parabola, and a part of an arbitrary curve. In addition, examples of a shape of the side surface of the partition wall in a case where the light emitting element is cut along the virtual plane orthogonal to the stacking direction of the stacked structure can include a circle, an ellipse, an oval, a quadrangle including a square or a rectangle, and a regular polygon (including a rounded regular polygon). Specifically, examples of planar shapes of the first light reflecting layer and the second light reflecting layer can include a circle, an ellipse, an oval, a quadrangle, and a regular polygon (a regular triangle, a square, a regular hexagon, or the like). The planar shapes of the first light reflecting layer and the second light reflecting layer and the shape of the side surface of the partition wall in a case where the light emitting element is cut along the virtual plane orthogonal to the stacking direction of the stacked structure are desirably similar or approximate.

In a case where the light emitting elements are arranged in an array form, the partition wall is provided so as to surround the first light reflecting layer included in each light emitting element, but a region outside the partition wall side surface may be occupied by the partition wall (that is, a space between the light emitting elements may be occupied by the material forming the partition wall) or may be occupied by a material (for example, the stacked structure) other than the material forming the partition wall. In the latter case, the partition wall is formed in, for example, a continuous groove shape or a discontinuous groove shape.

In the light emitting element array of the present disclosure, it is desirable that a formation pitch $P_0$ (a distance from the axial line of the first light reflecting layer included in the light emitting element to the axial line of the first light reflecting layer included in an adjacent light emitting element) of the light emitting elements is 3 μm or more and 50 μm or less, preferably, 5 μm or more and 30 μm or less, and more preferably, 8 μm or more and 25 μm or less.

In the light emitting element of the present disclosure and the like, the stacked structure can be formed using at least one material selected from the group consisting of a GaN-based compound semiconductor, an InP-based compound semiconductor, and a GaAs-based compound semiconductor. Specifically, the stacked structure can be formed using:

(a) a GaN-based compound semiconductor;
(b) an InP-based compound semiconductor;
(c) a GaAs-based compound semiconductor;
(d) a GaN-based compound semiconductor and an InP-based compound semiconductor;
(e) a GaN-based compound semiconductor and a GaAs-based compound semiconductor;
(f) an InP-based compound semiconductor and a GaAs-based compound semiconductor; or
(g) a GaN-based compound semiconductor, an InP-based compound semiconductor, and a GaAs-based compound semiconductor.

In the light emitting element of the present disclosure and the like, it is preferable that $1\times10^{-5}$ m$\leq L_{OR}$, where a resonator length is $L_{OR}$.

The light emitting element of the present disclosure and the like can have a configuration in which a value of a thermal conductivity of the stacked structure is higher than a value of a thermal conductivity of the first light reflecting layer. A value of a thermal conductivity of a dielectric material of the first light reflecting layer is generally about 10 watts/(m·K) or less. On the other hand, a value of a thermal conductivity of the GaN-based compound semiconductor of the stacked structure is about 50 to 100 watts/(m·K).

In the light emitting element of the present disclosure and the like, in a case where various compound semiconductor layers (including a compound semiconductor substrate) are present between the active layer and the first light reflecting layer, materials of the various compound semiconductor layers (including the compound semiconductor substrate) are preferably not modulated in refractive index by 10% or more (there is no refractive index difference of 10% or more from an average refractive index of the stacked structure), and as a result, it is possible to suppress occurrence of disturbance of a light field in a resonator.

The light emitting element of the present disclosure and the like can be implemented as a surface emitting laser element (vertical-cavity surface-emitting laser (VCSEL)) that emits laser light via the first light reflecting layer, or can be implemented as a surface emitting laser element that emits laser light via the second light reflecting layer. In some cases, a light emitting element manufacturing substrate (as described later) may be removed.

In the light emitting element of the present disclosure and the like, specifically, as described above, the stacked structure can be formed using, for example, an AlInGaN-based compound semiconductor. Here, more specifically, examples of the AlInGaN-based compound semiconductor can include GaN, AlGaN, InGaN, and AlInGaN. Furthermore, these compound semiconductors may contain a boron (B) atom, a thallium (Tl) atom, an arsenic (As) atom, a phosphorus (P) atom, or an antimony (Sb) atom as desired. It is desirable that the active layer has a quantum well structure. Specifically, the active layer may have a single quantum well structure (SQW structure) or a multiple quantum well structure (MQW structure). The active layer having the quantum well structure has a structure in which at least one well layer and at least one barrier layer are stacked, and examples of a combination of (a compound semiconductor constituting the well layer and a compound semiconductor constituting the barrier layer) can include ($In_yGa_{(1-y)}N$ and GaN), ($In_yGa_{(1-y)}N$ and $In_zGa_{(1-z)}N$) [where y>z], and ($In_yGa_{(1-y)}N$ and AlGaN). The first compound semiconductor layer can be formed using a compound semiconductor of a first conductivity type (for example, n-type), and the second compound semiconductor layer can be formed using a compound semiconductor of a second conductivity type (for example, p-type) different from the first conductivity type. The first compound semiconductor layer and the second compound semiconductor layer are also referred to as a first cladding layer and a second cladding layer. The first compound semiconductor layer and the second compound semiconductor layer may each be a single structure layer, a multilayer structure layer, or a superlattice structure layer. Furthermore, The first compound semiconductor layer and the second compound semiconductor layer can each be a layer including a composition gradient layer and a concentration gradient layer.

Alternatively, examples of a Group III atom constituting the stacked structure can include gallium (Ga), indium (In), and aluminum (Al), and examples of a Group V atom constituting the stacked structure can include arsenic (As), phosphorus (P), antimony (Sb), and nitrogen (N). Specifically, AlAs, GaAs, AlGaAs, AlP, GaP, GaInP, AlInP, AlGaInP, AlAsP, GaAsP, AlGaAsP, AlInAsP, GaInAsP, AlInAs, GaInAs, AlGaInAs, AlAsSb, GaAsSb, AlGaAsSb, AlN, GaN, InN, AlGaN, GaNAs, and GaInNAs can be used, and examples of a compound semiconductor constituting the active layer can include GaAs, AlGaAs, GaInAs, GaInAsP, GaInP, GaSb, GaAsSb, GaN, InN, GaInN, GaInN, GaInNAs, and GaInNAsSb.

Examples of the quantum well structure can include a two-dimensional quantum well structure, a one-dimensional quantum well structure (quantum wire), and a zero-dimensional quantum well structure (quantum dot). Examples of a material constituting the quantum well can include: Si, Se, a chalcopyrite-based compound such as CuInGaSe (CIGS), $CuInSe_2$ (CIS), $CuInS_2$, $CuAlS_2$, $CuAlSe_2$, $CuGaS_2$, $CuGaSe_2$, $AgAlS_2$, $AgAlSe_2$, $AgInS_2$, or $AgInSe_2$, a perovskite-based material, a Group III-V compound such as GaAs, GaP, InP, AlGaAs, InGaP, AlGaInP, InGaAsP, GaN, InAs, InGaAs, GaInNAs, GaSb, or GaAsSb, CdSe, CdSeS, CdS, CdTe, $In_2Se_3$, $In_2S_3$, $Bi_2Se_3$, $Bi_2S_3$, ZnSe, ZnTe, ZnS, HgTe, HgS, PbSe, PbS, and $TiO_2$, but are not limited thereto.

The stacked structure is formed on a second surface of the light emitting element manufacturing substrate or formed on a second surface of the compound semiconductor substrate. The second surface of the light emitting element manufacturing substrate or the compound semiconductor substrate faces the first surface of the first compound semiconductor layer, and a first surface of the light emitting element manufacturing substrate or the compound semiconductor substrate opposes the second surface of the light emitting element manufacturing substrate. Examples of the light emitting element manufacturing substrate can include a GaN substrate, a sapphire substrate, a GaAs substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and a substrate obtained by forming an underlying layer or a buffer layer on a surface (main surface) of each of these substrates, and it is preferable that a GaN substrate is used because of a low defect density. Furthermore, examples of the compound semiconductor substrate can include a GaN substrate, an InP substrate, and a GaAs substrate. Although it is known that a characteristic of the GaN substrate is changed to being polar/nonpolar/semipolar depending on a growth surface, any main surface (second surface) of the GaN substrate can be used for formation of the compound semiconductor layer. Furthermore, regarding the main surface of the GaN substrate, depending on a crystal structure (for example, a cubic crystal type or a hexagonal crystal type), a crystal plane orientation called a so-called A plane, B plane, C plane, R plane, M plane, N plane, S plane, or the like, or a plane obtained by offsetting them in a specific direction can be used. Examples of a method for forming various compound semiconductor layers included in the light emitting element can include, but are not limited to, an organic metal chemical vapor deposition (a metal organic-chemical vapor deposition (MOCVD) method or a metal organic-vapor phase epitaxy (MOVPE) method), a molecular beam epitaxy (MBE) method, a hydride vapor phase epitaxy (HVPE) method in which halogen contributes to transport or reaction, an atomic layer deposition (ALD) method, a migration-enhanced epitaxy (MEE) method, and a plasma-assisted physical vapor deposition (PPD) method.

Both of the GaAs material and the InP material have a zinc blende structure. Examples of the main surface of the compound semiconductor substrate formed using these materials can include planes obtained by offsetting in a specific direction in addition to planes such as (100), (111) AB, (211)AB, and (311)AB. Note that “AB” means that a 90° offset direction is different, and whether a main material of the plane is Group III or Group V is determined by the offset direction. By controlling these crystal plane orientation and film formation conditions, composition unevenness and a dot shape can be controlled. As a film forming method, a film forming method such as the MBE method, the MOCVD method, the MEE method, or the ALD method is generally used as with the GaN-based compound semiconductor, but the film forming method is not limited to these methods.

Here, in formation of the GaN-based compound semiconductor layer, examples of an organic gallium source gas in the MOCVD method can include a trimethylgallium (TMG) gas and a triethylgallium (TEG) gas, and examples of a nitrogen source gas can include an ammonia gas and a hydrazine gas. In formation of the GaN-based compound semiconductor layer of which the conductivity type is the n type, for example, it is only required to add silicon (Si) as an n-type impurity (n-type dopant), and in formation of the GaN-based compound semiconductor layer of which the conductivity type is the p type, for example, it is only required to add magnesium (Mg) as a p-type impurity (p-type dopant). In a case where aluminum (Al) or indium (In) is contained as a constituent atom of the GaN-based compound semiconductor layer, a trimethylaluminum (TMA) gas may be used as an Al source, and a trimethylindium (TMI) gas may be used as an In source. Moreover, a monosilane gas ($SiH_4$ gas) may be used as a Si source, and a biscyclopentadienyl magnesium gas, methylcyclopentadienyl magnesium, or biscyclopentadienyl magnesium ($Cp_2Mg$) may be used as a Mg source. Note that examples of the n-type impurity (n-type dopant) can include Ge, Se, Sn, C, Te, S, O, Pd, and Po in addition to Si, and examples of the p-type impurity (p-type dopant) can include Zn, Cd, Be, Ca, Ba, C, Hg, and Sr in addition to Mg.

In a case where the stacked structure is formed using the InP-based compound semiconductor or the GaAs-based compound semiconductor, TMGa, TEGa, TMIn, TMAl, and the like, which are organometallic raw materials, are generally used as Group III raw materials. Furthermore, as a Group V raw material, an arsine gas ($AsH_3$ gas), a phosphine gas ($PH_3$ gas), ammonia ($NH_3$), or the like is used. Note that an organometallic raw material is used as the Group V raw material in some cases, and examples of the organometallic raw material can include tertiary-butylarsine (TBAs), tertiary-butylphosphine (TBP), dimethylhydrazine (DMHy), and trimethylantimony (TMSb). These materials are effective in low-temperature growth because they decompose at a low temperature. As the n-type dopant, monosilane ($SiH_4$) is used as a Si source, hydrogen selenide ($H_2Se$) or the like is used as a Se source. Furthermore, dimethyl zinc (DMZn), biscyclopentadienyl magnesium ($Cp_2Mg$), or the like is used as the p-type dopant. A material similar to that of the GaN-based compound semiconductor is a candidate of a dopant material.

In manufacturing of the light emitting element of the present disclosure and the like, the light emitting element manufacturing substrate may be left, or the light emitting element manufacturing substrate may be removed after sequentially forming the active layer, the second compound semiconductor layer, the second electrode, and the second light reflecting layer on the first compound semiconductor layer. Specifically, the light emitting element manufacturing substrate may be removed after sequentially forming the active layer, the second compound semiconductor layer, the second electrode, and the second light reflecting layer on the first compound semiconductor layer, and then fixing the second light reflecting layer to a support substrate, thereby exposing the first compound semiconductor layer (the first surface of the first compound semiconductor layer). The light emitting element manufacturing substrate can be removed by a wet etching method using an alkali aqueous solution such as a sodium hydroxide aqueous solution or a potassium hydroxide aqueous solution, an ammonia solution+a hydrogen peroxide solution, a sulfuric acid solution+a hydrogen peroxide solution, a hydrochloric acid solution+a hydrogen peroxide solution, or a phosphoric acid solution+a hydrogen peroxide solution, a dry etching method such as a chemical mechanical polishing (CMP) method, a mechanical polishing method, or a reactive ion etching (RIE) method, a lift-off method using a laser, or the like, or a combination thereof.

The support substrate is only required to be formed using, for example, various substrates exemplified as the light emitting element manufacturing substrate, or can be formed using an insulating substrate formed using AlN or the like, a semiconductor substrate formed using Si, SiC, Ge, or the like, a metal substrate, or an alloy substrate, but it is preferable to use a substrate having conductivity, or it is preferable to use a metal substrate or alloy substrate from the viewpoint of a mechanical characteristic, elastic deformation, plastic deformability, heat dissipation, and the like. A thickness of the support substrate can be, for example, 0.05 mm to 1 mm. As a method for fixing the second light reflecting layer to the support substrate, a known method such as a solder bonding method, a room temperature bonding method, a bonding method using an adhesive tape, a bonding method using wax bonding, or a method using an adhesive can be used, but it is desirable to employ the solder bonding method or the room temperature bonding method from the viewpoint of ensuring conductivity. For example, in a case where a silicon semiconductor substrate that is a conductive substrate is used as the support substrate, it is desirable to employ a method capable of bonding at a low temperature of 400° C. or lower in order to suppress warpage due to a difference in thermal expansion coefficient. In a case where a GaN substrate is used as the support substrate, a bonding temperature may be 400° C. or higher.

The first electrode electrically connected to the first compound semiconductor layer may be common to a plurality of light emitting elements, and the second electrode electrically connected to the second compound semiconductor layer may be common to the plurality of light emitting elements, or may be individually provided in the plurality of light emitting elements.

In a case where the light emitting element manufacturing substrate is left, it is only required to form the first electrode on the first surface opposing the second surface of the light emitting element manufacturing substrate, or on the first surface opposing the second surface of the compound semiconductor substrate. Furthermore, in a case where the light emitting element manufacturing substrate is not left, it is only required to form the first electrode on the first surface of the first compound semiconductor layer included in the stacked structure. Note that, in this case, since the first light reflecting layer is formed on the first surface of the first compound semiconductor layer, for example, it is only required to form the first electrode so as to surround the first light reflecting layer. The first electrode desirably has a single-layer configuration or a multilayer configuration including, for example, at least one metal (including an alloy) selected from the group consisting of gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), and indium (In). Specifically, for example, Ti/Au, Ti/Al, Ti/Al/Au, Ti/Pt/Au, Ni/Au, Ni/Au/Pt, Ni/Pt, Pd/Pt, and Ag/Pd can be exemplified. Note that a layer before "/" in the multilayer configuration is positioned closer to the active layer. A similar configuration applies to the following description. The first electrode can be formed by, for example, a physical vapor deposition (PVD) method such as a vacuum vapor deposition method or a sputtering method.

In a case where the first electrode is formed so as to surround the first light reflecting layer, the first light reflecting layer and the first electrode can be in contact with each other. Alternatively, the first light reflecting layer and the first electrode can be separated from each other. In some cases, the first electrode can be formed up to an edge portion of the first light reflecting layer, or the first light reflecting layer can be formed up to an edge portion of the first electrode.

The second electrode can be formed using a transparent conductive material. Examples of the transparent conductive material of the second electrode can include an indium-based transparent conductive material [specifically, for example, indium tin oxide (ITO) (including Sn-doped $In_2O_3$, crystalline ITO, and amorphous ITO), indium zinc oxide (IZO), indium gallium oxide (IGO), indium-doped gallium zinc oxide (IGZO) (In—$GaZnO_4$), IFO (F-doped $In_2O_3$), ITiO (Ti-doped $In_2O_3$), InSn, or InSnZnO], a tin-based transparent conductive material [specifically, for example, tin oxide ($SnO_X$), ATO (Sb-doped $SnO_2$), or FTO (F-doped $SnO_2$)], a zinc-based transparent conductive material [specifically, for example, zinc oxide (ZnO) (Al-doped ZnO (AZO) or B-doped ZnO), gallium-doped zinc oxide (GZO), AlMgZnO (aluminum oxide and magnesium oxide-doped zinc oxide)], NiO, $TiO_X$, and graphene. Alternatively, examples of the second electrode can include a transparent conductive film having gallium oxide, titanium oxide, niobium oxide, antimony oxide, nickel oxide, or the like as a base layer, and a transparent conductive material such as a spinel-type oxide or an oxide having a $YbFe_2O_4$ structure can be used. However, the material of the second electrode depends on a disposition state of the second light reflecting layer and the second electrode, but is not limited to the transparent conductive material, and a metal such as palladium (Pd), platinum (Pt), nickel (Ni), gold (Au), cobalt (Co), or rhodium (Rh) can also be used. The second electrode is only required to be formed using at least one of these materials. The second electrode can be formed by, for example, a PVD method such as a vacuum vapor deposition method or a sputtering method. Alternatively, a low-resistance semiconductor layer can be used as a transparent electrode layer, and in this case, specifically, an n-type GaN-based compound semiconductor layer can also be used. Furthermore, in a case where a layer adjacent to the n-type GaN-based compound semiconductor layer is the p type, an electrical resistance of an interface can be reduced by bonding the n-type GaN-based compound semiconductor layer and the p-type layer via a tunnel junction. As the second electrode is formed using the transparent conductive material, a current can be expanded in a lateral direction (an in-plane direction of the second compound semiconductor layer) and can be efficiently supplied to a current injection region (as described later).

A first pad electrode and a second pad electrode may be provided on the first electrode and the second electrode in order to be electrically connected to an external electrode or circuit (which may hereinafter be referred to as an "external circuit or the like"). The pad electrode desirably has a single-layer configuration or a multilayer configuration including at least one metal selected from the group consisting of titanium (Ti), aluminum (Al), platinum (Pt), gold (Au), nickel (Ni), and palladium (Pd). Alternatively, the pad electrode may have a multilayer configuration exemplified by a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, and a Ti/Ni/Au/Cr/Au multilayer configuration. In a case where the first electrode includes an Ag layer or an Ag/Pd layer, it is preferable that a cover metal layer formed using, for example, Ni/TiW/Pd/TiW/Ni is formed on a surface of the first electrode, and the pad electrode having, for example, the Ti/Ni/Au multilayer configuration or the Ti/Ni/Au/Cr/Au multilayer configuration is formed on the cover metal layer.

The light reflecting layers (distributed Bragg reflector (DBR) layers) constituting the first light reflecting layer and the second light reflecting layer are each formed using, for example, a semiconductor multilayer film or a dielectric multilayer film. Examples of the dielectric material can include oxides, nitrides (for example, $SiN_X$, $AlN_X$, $AlGaN_X$, $GaN_X$, $BN_X$, and the like), and fluorides of Si, Mg, Al, Hf, Nb, Zr, Sc, Ta, Ga, Zn, Y, B, Ti, and the like. Specifically, $SiO_X$, $TiO_X$, $NbO_X$, $ZrO_X$, $TaO_X$, $ZnO_X$, $AlO_X$, $HfO_X$, $SiN_X$, $AlN_X$, and the like can be exemplified. Then, the light reflecting layer can be obtained by alternately stacking two or more kinds of dielectric films formed using dielectric materials having different refractive indexes among these dielectric materials. For example, a multilayer film of $SiO_X$/$SiN_Y$, $SiO_X$/$TaO_X$, $SiO_X$/$NbO_Y$, $SiO_X$/$ZrO_Y$, $SiO_X$/$AlN_Y$, or the like is preferable. It is sufficient if a material of each dielectric film, a film thickness, the number of stacked layers, and the like are appropriately selected in order to obtain a desired light reflectance. The thickness of each dielectric film can be appropriately adjusted according to the material to be used or the like, and is determined by an oscillation wavelength (emission wavelength) $\lambda_0$ and a refractive index n at the oscillation wavelength $\lambda_0$ of the material to be used. Specifically, an odd multiple of $\lambda_0/(4n)$ is preferable. For example, in the light emitting element having the oscillation wavelength $\lambda_0$ of 410 nm, in a case where the light reflecting layer is formed using $SiO_X$/$NbO_Y$, about 40 nm to 70 nm can be exemplified. The number of stacked layers may be two or more, preferably, about five to twenty. The thickness of the entire light reflecting layer can be, for example, about 0.6 μm to 1.7 μm. In addition, the light reflectance of the light reflecting layer is desirably 95% or more. A size and shape of the light reflecting layer are not particularly limited as long as the light reflecting layer covers the current injection region or an element region (which will be described later).

The light reflecting layer can be formed on the basis of a known method, and specifically, examples of the known method can include a PVD method such as a vacuum vapor deposition method, a sputtering method, a reactive sputtering method, an ECR plasma sputtering method, a magnetron sputtering method, an ion beam assisted vapor deposition method, an ion plating method, or a laser ablation method; various CVD methods; an application method such as a spray method, a spin coating method, or a dipping method; a method in which two or more of these methods are combined; and a method in which these methods are combined with any one or more of whole or partial pretreatment, irradiation of inert gas (Ar, He, Xe, or the like) or plasma, irradiation of oxygen gas or ozone gas and plasma, oxidation treatment (heat treatment), and exposure treatment.

The current injection region is provided to regulate current injection into the active layer. Specifically, examples of a shape of a boundary between the current injection region and a current non-injection/inner region, a shape of a boundary between the current non-injection/inner region and a current non-injection/outer region, and a planar shape of an opening provided in the element region or a current constriction region can include a circle, an ellipse, an oval, a quadrangle, and a regular polygon (a regular triangle, a square, a regular hexagon, or the like). The shape of the boundary between the current injection region and the current non-injection/inner region and the shape of the boundary between the current non-injection/inner region and the current non-injection/outer region are desirably similar or approximate. Here, the "element region" refers to a region into which a constricted current is injected, a region in which light is confined due to a refractive index difference or the like, a region where laser oscillation occurs in a region sandwiched between the first light reflecting layer and the second light reflecting layer, or a region actually contributing to laser oscillation in a region sandwiched between the first light reflecting layer and the second light reflecting layer.

A side surface or an exposed surface of the stacked structure may be covered by a coating layer (insulating film). The coating layer (insulating film) can be formed on the basis of a known method. A refractive index of a material of the coating layer (insulating film) is preferably smaller than a refractive index of the material of the stacked structure. Examples of the material of the coating layer (insulating film) can include a $SiO_X$-based material including $SiO_2$, a $SiN_X$-based material, a $SiO_YN_Z$-based material, $TaO_X$, $ZrO_X$, $AlN_X$, $AlO_X$, and $GaO_X$, or an organic material such as a polyimide-based resin can be used. Examples of a method for forming the coating layer (insulating film) can include a PVD method such as a vacuum vapor deposition method or a sputtering method, and a CVD method, and the coating layer (insulating film) can also be formed on the basis of a coating method.

Embodiment 1

Figure 1:
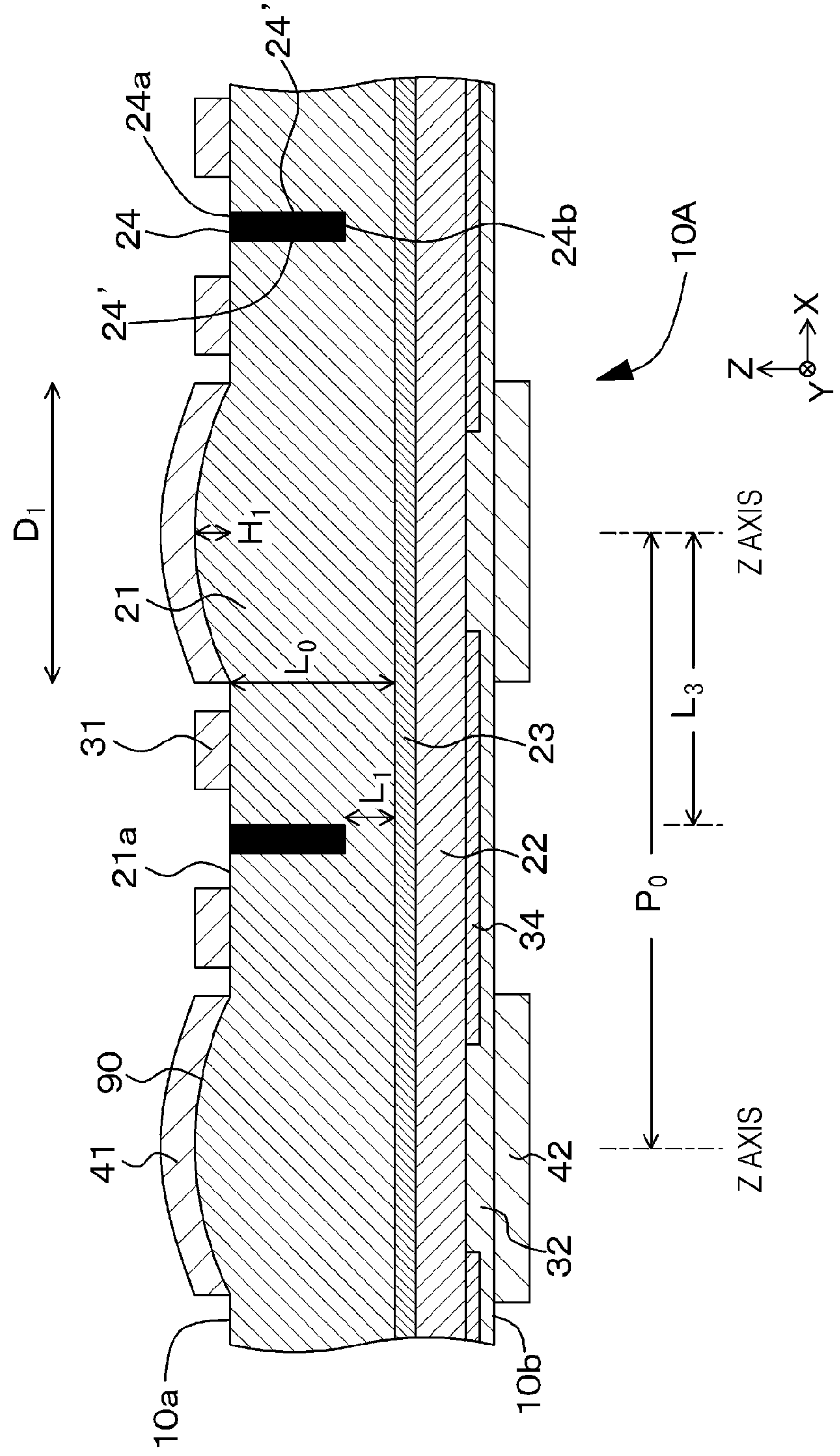
FIG. 1 is a schematic partial cross-sectional view of a light emitting element array of Embodiment 1.
Figure 2:
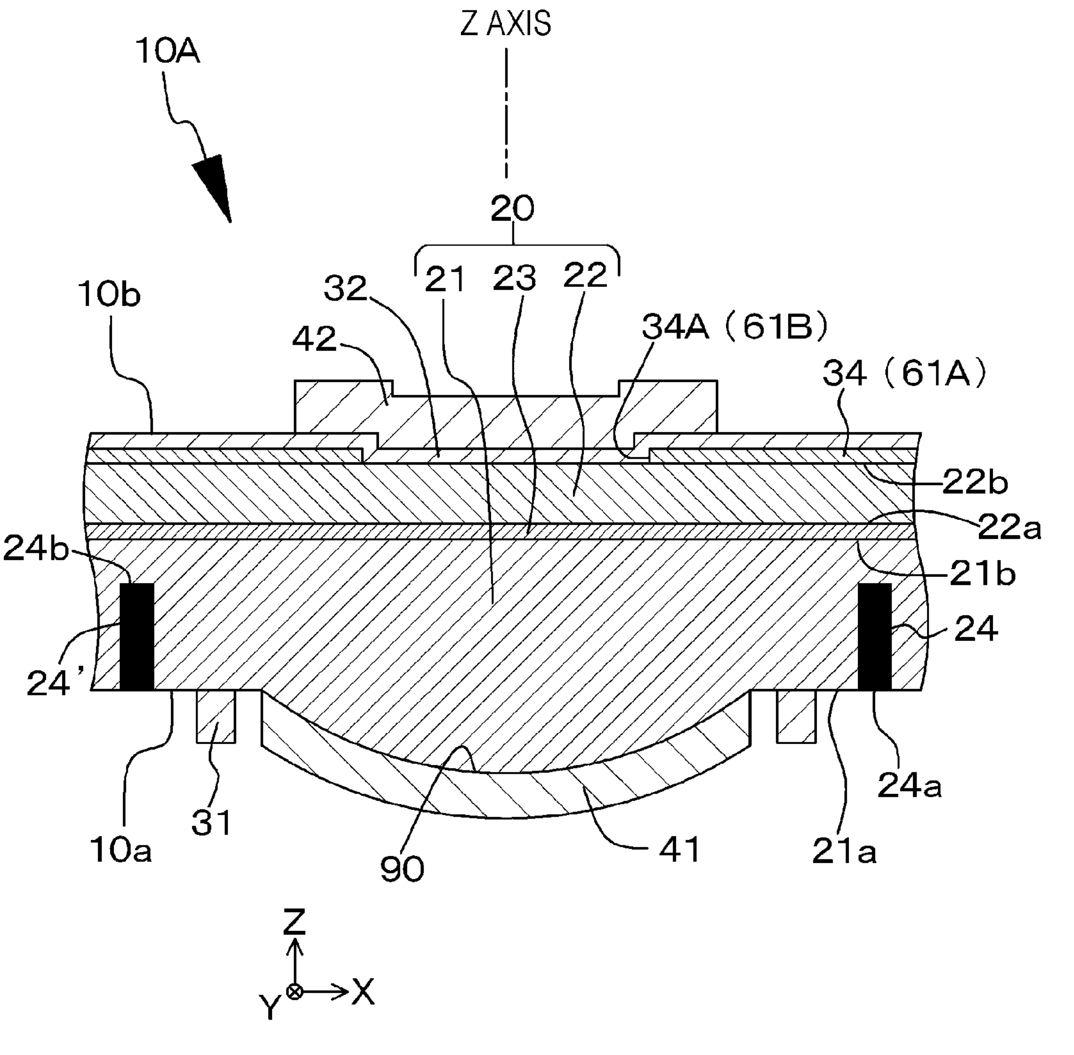
FIG. 2 is a schematic partial cross-sectional view of a light emitting element included in the light emitting element array of Embodiment 1 illustrated in FIG. 1.
Figure 3:
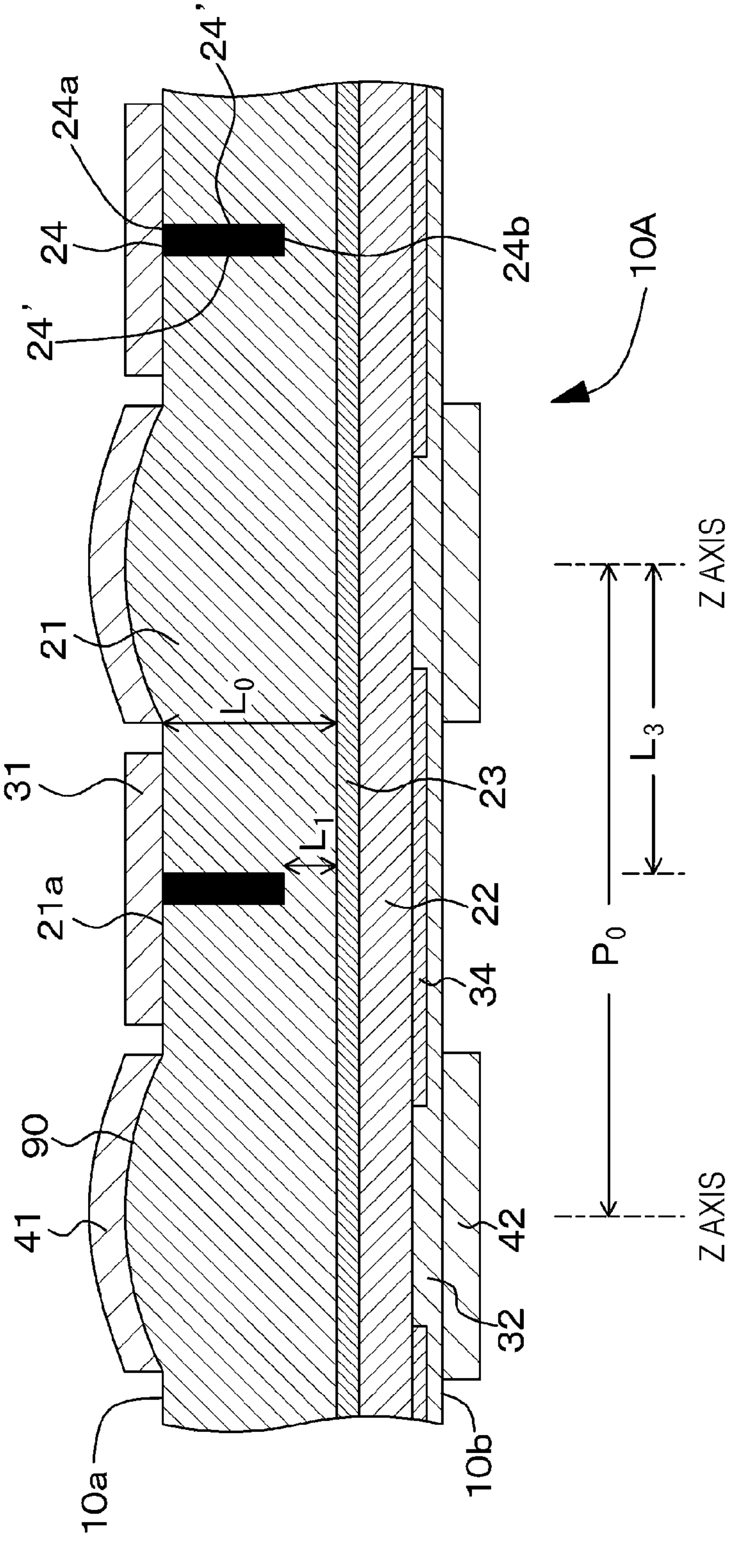
FIG. 3 is a schematic plan view illustrating disposition of a first light reflecting layer and a partition wall in the light emitting element array of Embodiment 1.
Figure 4:
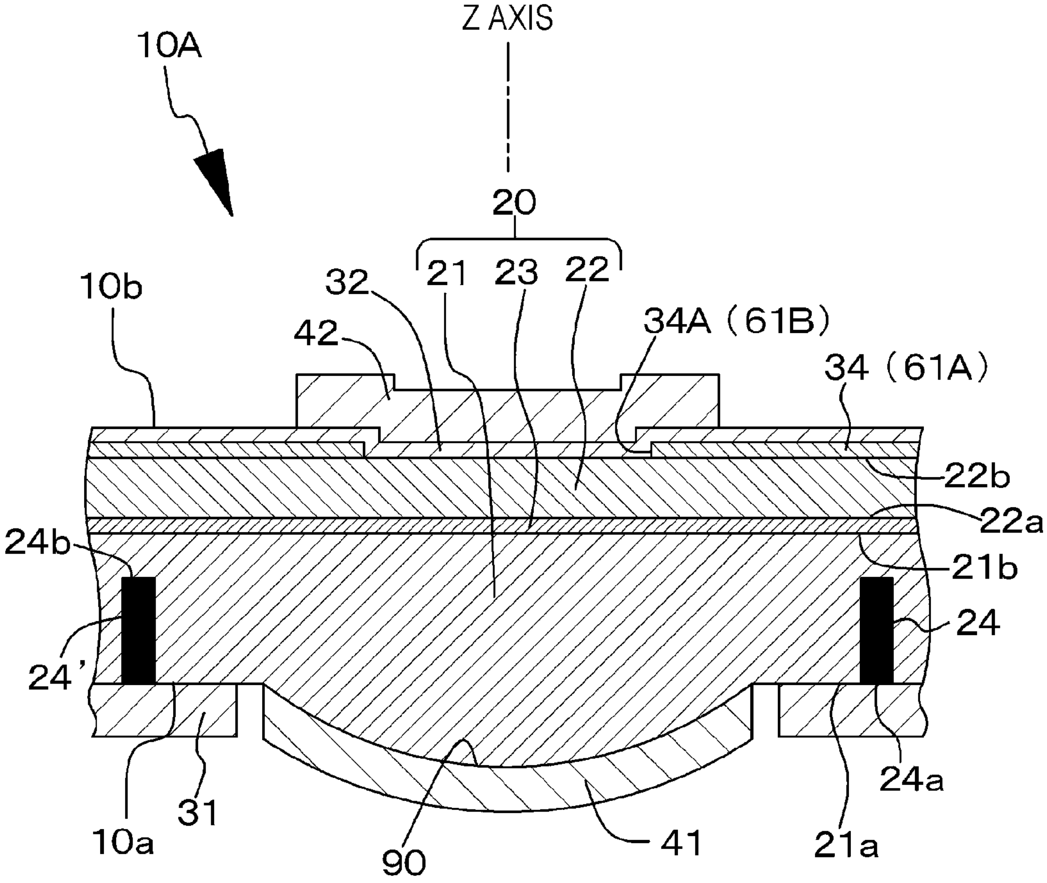
FIG. 4 is a schematic plan view illustrating disposition of the first light reflecting layer and a first electrode in the light emitting element array of Embodiment 1 illustrated in FIG. 3.

Embodiment 1 relates to a light emitting element of the present disclosure and a light emitting element array of the present disclosure. The light emitting element of the embodiment includes a surface emitting laser element (vertical-cavity surface-emitting laser (VCSEL)) that emits laser light. FIGS. 1 and 3 are schematic partial cross-sectional views of the light emitting element array of Embodiment 1, FIGS. 2 and 4 are schematic partial cross-sectional views of the light emitting element, and FIGS. 5, 6, 7, 8, 9, 10, 11, and 12 are schematic plan views illustrating disposition of a first light reflecting layer and a partition wall in the light emitting element array of Embodiment 1. Here, FIGS. 1 and 2 illustrate an example in which the partition wall is formed using a material having no conductivity, and FIGS. 3 and 4 illustrate an example in which the partition wall is formed using a material having conductivity or an example in which the partition wall is formed using a material having no conductivity. In addition, FIGS. 5, 6, 9, and 11 illustrate a case where the light emitting element is positioned on a vertex of a square lattice, and FIGS. 7, 8, 10, and 12 illustrate a case where the light emitting element is positioned on a vertex of a regular triangular lattice. FIGS. 1, 2, 3, and 4 are schematic partial cross-sectional views taken along arrow A-A in FIG. 5 or 7. Furthermore, in the drawings, a Z axis indicates an axial line of the first light reflecting layer included in the light emitting element (a perpendicular line with respect to a stacked structure passing through the center of the first light reflecting layer).

A light emitting element 10A of Embodiment 1 and light emitting elements of Embodiments 2 to 24 as described later each include:

- a stacked structure 20 in which a first compound semiconductor layer 21 having a first surface 21*a* and a second surface 21*b* opposing the first surface 21*a*, an active layer (light emitting layer) 23 facing the second surface 21*b* of the first compound semiconductor layer 21, and a second compound semiconductor layer 22 having a first surface 22*a* facing the active layer 23 and a second surface 22*b* opposing the first surface 22*a* are stacked;
- a first light reflecting layer 41 formed on a first surface side of the first compound semiconductor layer 21 and having a convex shape in a direction away from the active layer 23; and
- a second light reflecting layer 42 formed on a second surface side of the second compound semiconductor layer 22 and having a flat shape,
- in which a partition wall 24 extending in a stacking direction of the stacked structure 20 is formed so as to surround the first light reflecting layer 41.

Furthermore, a light emitting element array of Embodiment 1 or light emitting element arrays of Embodiments 2 to 24 as described later are each a light emitting element array in which a plurality of light emitting elements 10A is arranged, the light emitting elements 10A each including:

- a stacked structure 20 in which a first compound semiconductor layer 21 having a first surface 21*a* and a second surface 21*b* opposing the first surface 21*a*, an active layer (light emitting layer) 23 facing the second surface 21*b* of the first compound semiconductor layer 21, and a second compound semiconductor layer 22 having a first surface 22*a* facing the active layer 23 and a second surface 22*b* opposing the first surface 22*a* are stacked;
- a first light reflecting layer 41 formed on a first surface side of the first compound semiconductor layer 21 and having a convex shape in a direction away from the active layer 23; and
- a second light reflecting layer 42 formed on a second surface side of the second compound semiconductor layer 22 and having a flat shape. Then, a partition wall 24 extending in a stacking direction of the stacked structure 20 is formed so as to surround the first light reflecting layer 41 in each light emitting element 10A.

As illustrated, an orthogonal projection image of the first light reflecting layer 41 may be included in an orthogonal projection image of a side surface 24' of the partition wall 24 that faces the first light reflecting layer 41, or, although not illustrated, the orthogonal projection image of the partition wall side surface 24' may be included in an orthogonal projection image of a portion that does not contribute to light reflection of the first light reflecting layer 41 (a non-effective region of the first light reflecting layer 41). In addition, the side surface 24' of the partition wall 24 may be a continuous surface (see FIGS. 9 and 10) or a discontinuous surface partially cut out (see FIGS. 11 and 12). A similar configuration can apply to a partition wall 25 of Embodiment 2 as described later.

In the light emitting element 10A of Embodiment 1, the partition wall 24 extends from the first surface side of the first compound semiconductor layer 21 to the middle of the first compound semiconductor layer 21 in a thickness direction in the first compound semiconductor layer 21. That is, an upper end portion (an end portion facing the active layer 23) 24*b* of the partition wall 24 is positioned at the middle of the first compound semiconductor layer 21 in the thickness direction. Then, in the light emitting element array of Embodiment 1, a relationship between $L_0$, $L_1$, and $L_3$ satisfies the relationship described above. Specifically, it is as shown in Table D as described later.

The partition wall 24 is formed using a material that does not transmit light generated in the active layer 23, or $1\times10^{-1}\leq TC_1/TC_0\leq1\times10^2$, where a thermal conductivity of a material forming the first compound semiconductor layer 21 is $TC_1$, and a thermal conductivity of the material forming the partition wall 24 is $TC_0$. Specifically, the material forming the first compound semiconductor layer 21 includes GaN, and the partition wall 24 is formed using copper (Cu). Note that $TC_0$: 50 watts/(m·K) to 100 watts/(m·K), and $TC_1$: 400 watts/(m·K). For example, in a case where the partition wall 24 including a copper layer is formed by a plating method, it is sufficient if an underlying layer including a Au layer or the like having a thickness of about 0.1 μm is formed in advance as a seed layer by a sputtering method or the like, and the copper layer is formed thereon by a plating method. As the partition wall 24 is formed using a material having a high thermal conductivity as described above, heat generated in the stacked structure 20 can be effectively released (dissipated) to the outside through the partition wall 24.

Alternatively, the partition wall 24 is formed using a material that reflects light generated in the active layer 23, for example, silver (Ag).

Alternatively, $|CTE_0-CTE_1|\leq1\times10^{-4}$/K, where a linear expansivity of the material (GaN) of the first compound semiconductor layer 21 is $CTE_1$, and a linear expansivity of the material (polyimide-based resin) of the partition wall 24 is $CTE_0$. Specifically, $CTE_0$: $5.5\times10^{-6}$/K, and $CTE_1$: $25\times10^{-6}$/K. Then, as these materials are combined, a net thermal expansion coefficient of the light emitting element 10A can be increased and can be adjusted to match a thermal expansion coefficient of a substrate material or the like on which the light emitting element 10A is mounted, such that it is possible to suppress damage of the light emitting element 10A and to suppress a decrease in reliability of the light emitting element 10A due to generation of stress.

Figure 5:
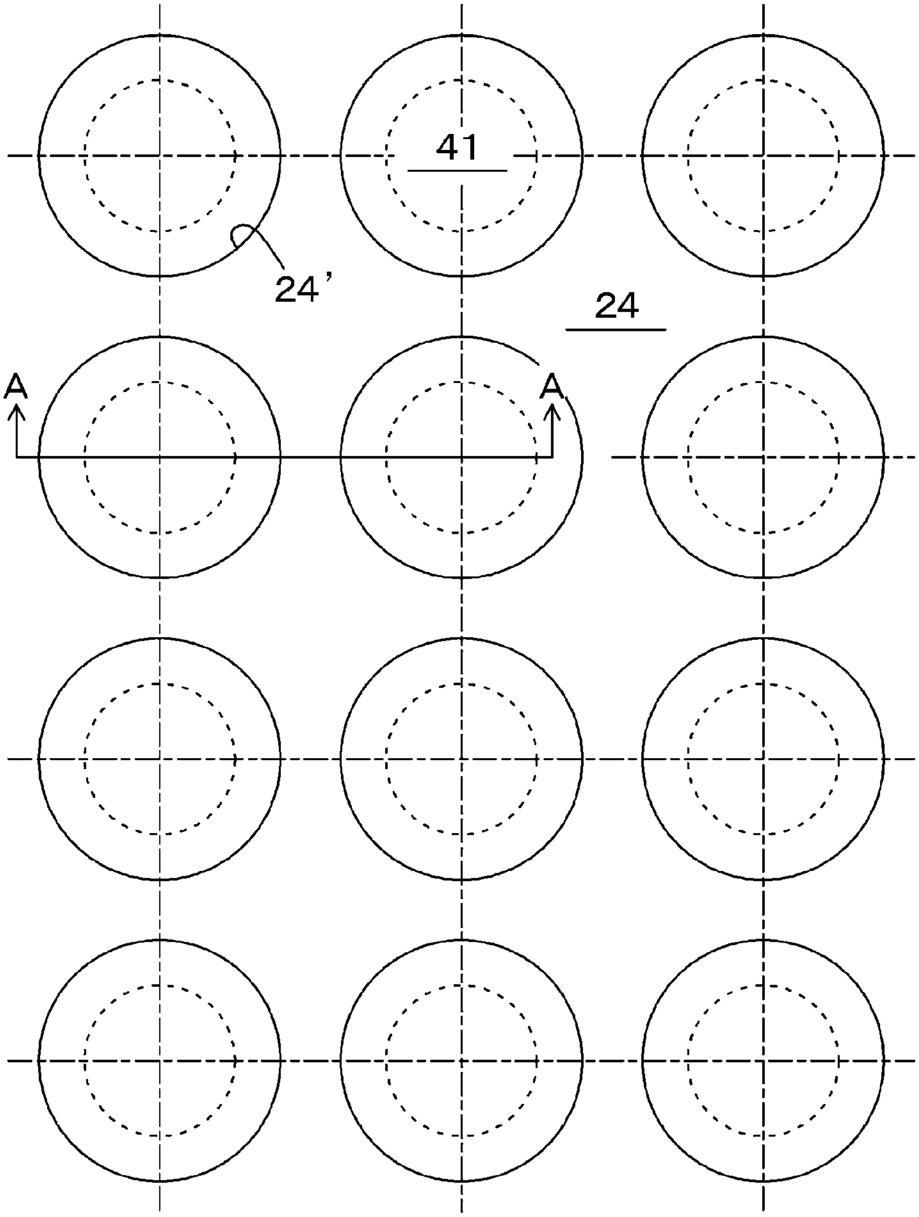
FIG. 5 is a schematic plan view illustrating disposition of the first light reflecting layer and the partition wall in the light emitting element array of Embodiment 1.
Figure 6:
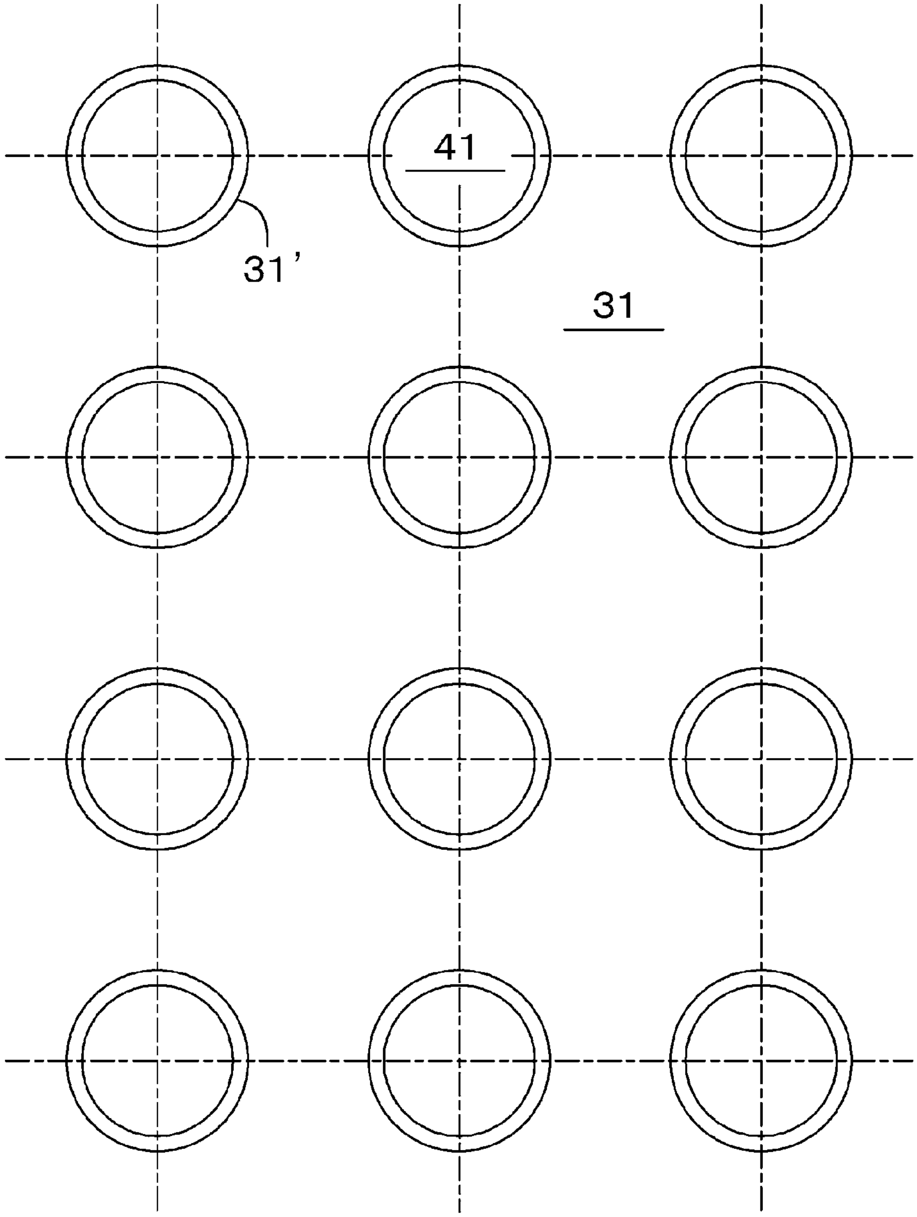
FIG. 6 is a schematic plan view illustrating disposition of the first light reflecting layer and the first electrode in the light emitting element array of Embodiment 1 illustrated in FIG. 5.
Figure 7:
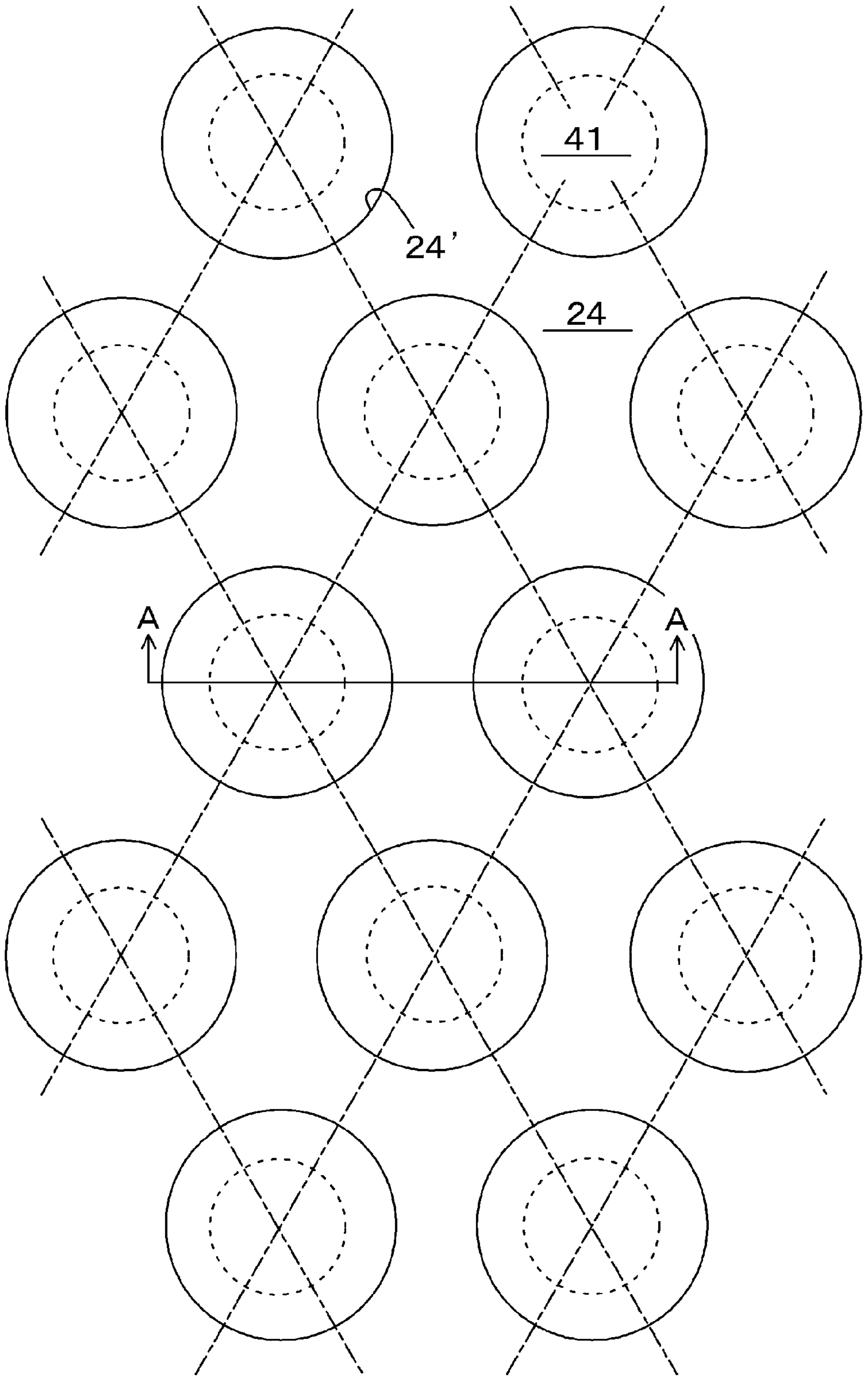
FIG. 7 is a schematic plan view illustrating disposition of the first light reflecting layer and the partition wall in the light emitting element array of Embodiment 1.
Figure 8:
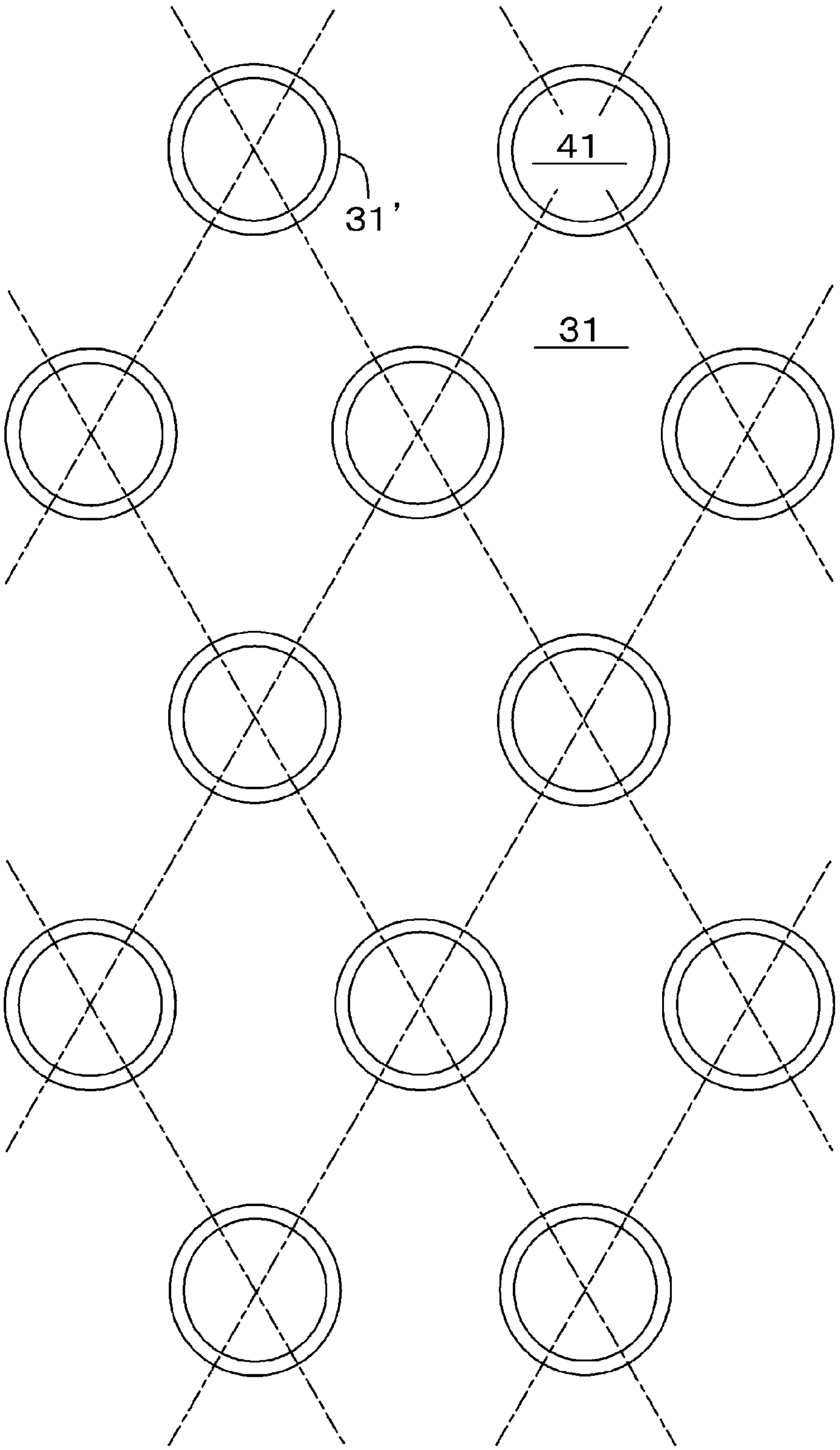
FIG. 8 is a schematic plan view illustrating disposition of the first light reflecting layer and the first electrode in the light emitting element array of Embodiment 1 illustrated in FIG. 7.
Figure 9:
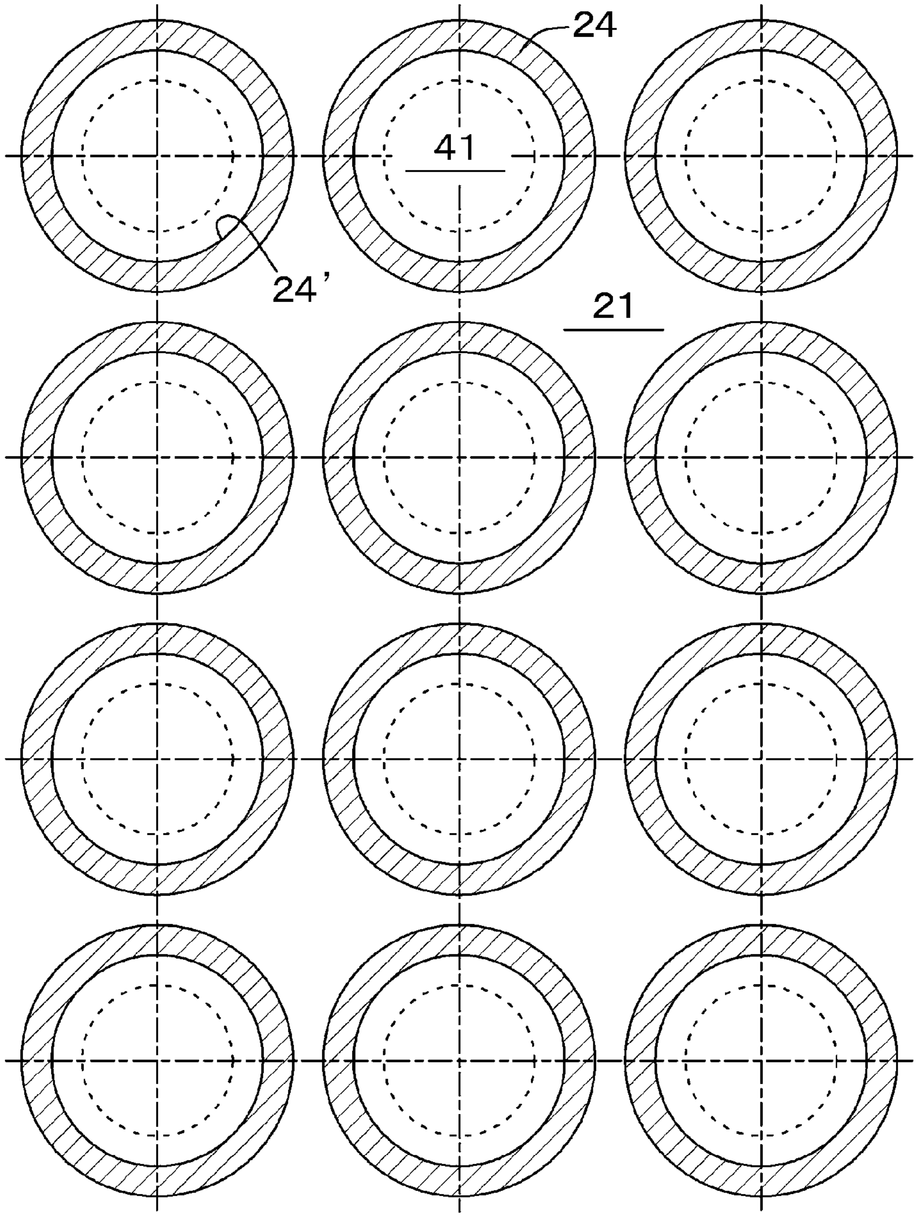
FIG. 9 is a schematic plan view illustrating disposition of the first light reflecting layer and the partition wall in the light emitting element array of Embodiment 1.
Figure 10:
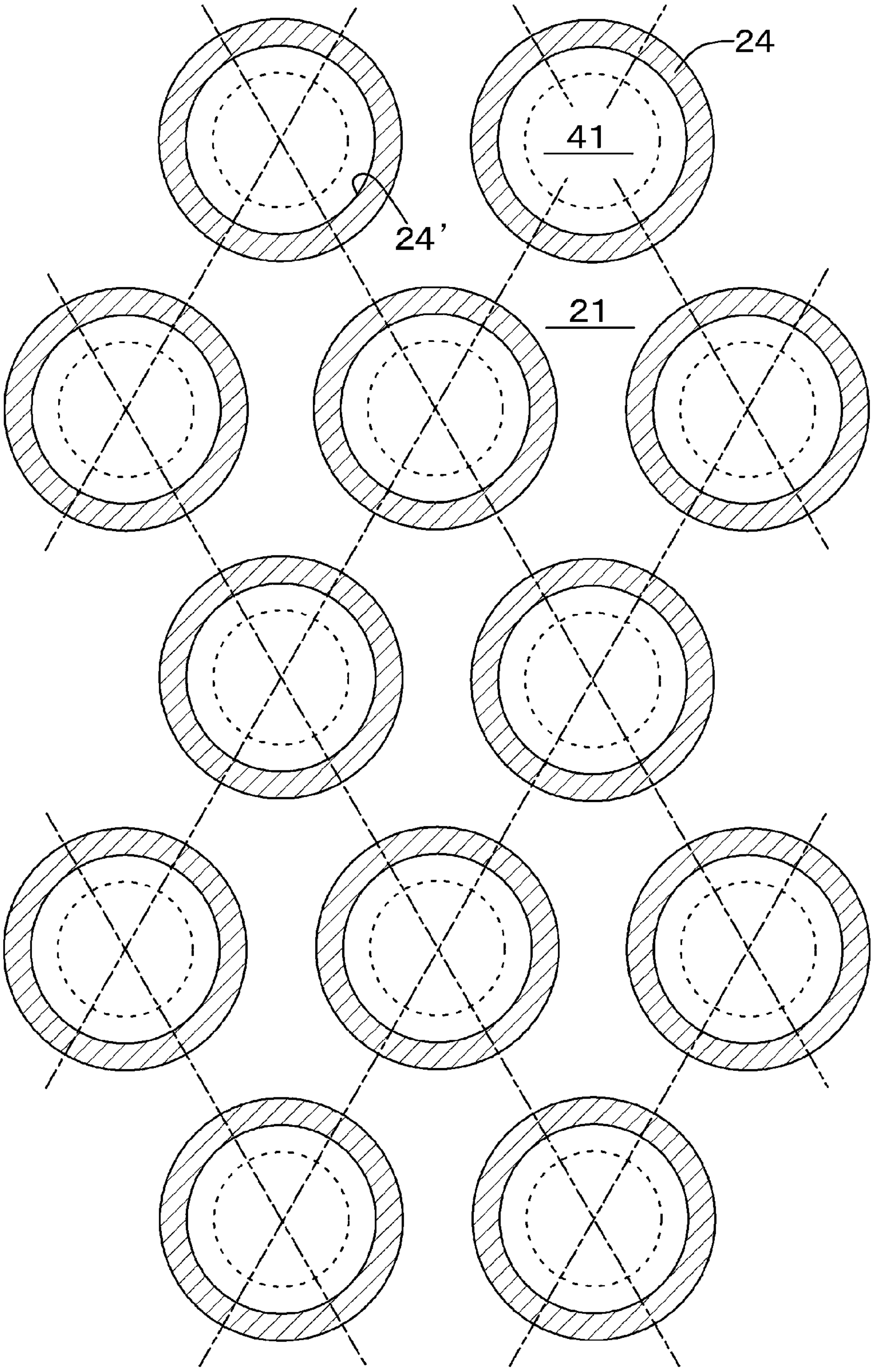
FIG. 10 is a schematic plan view illustrating disposition of the first light reflecting layer and the partition wall in the light emitting element array of Embodiment 1.
Figure 11:
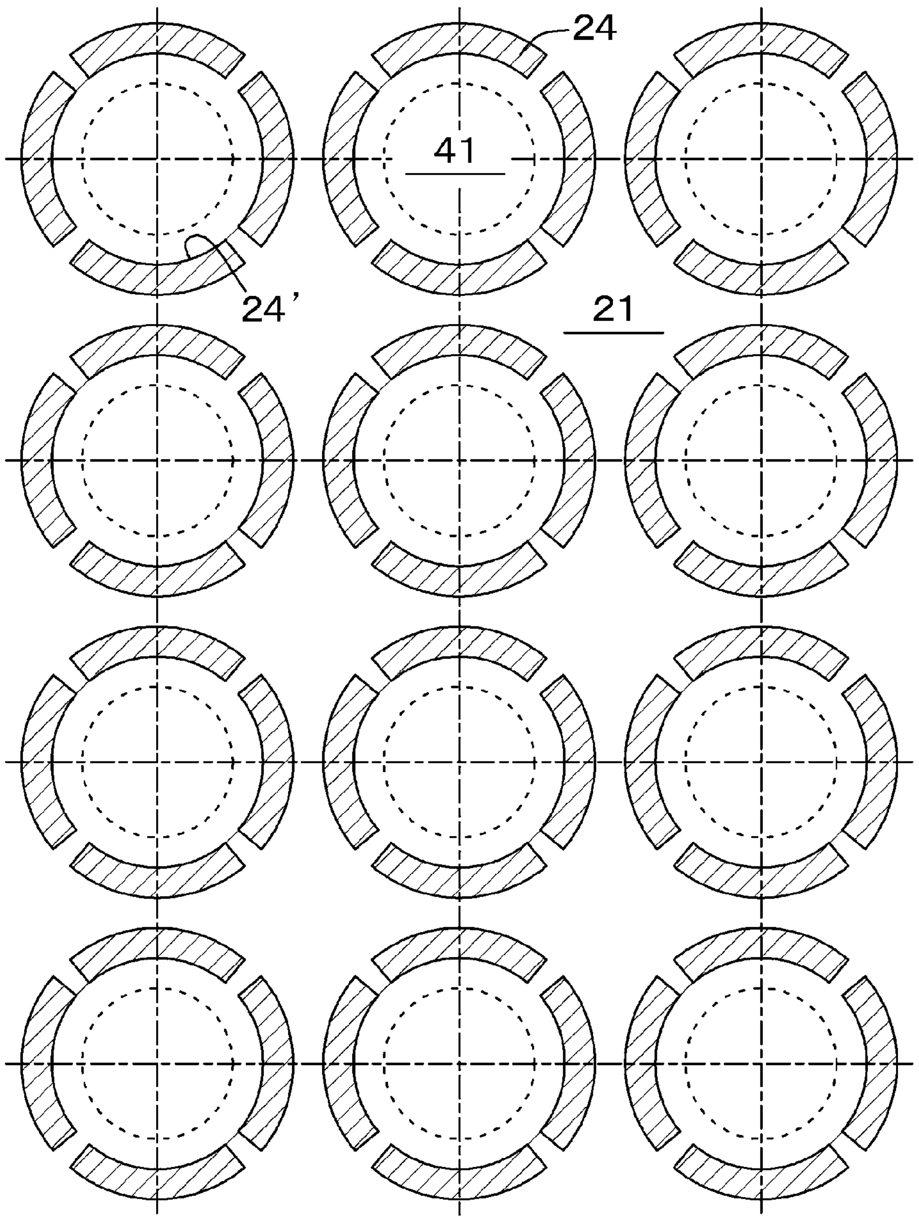
FIG. 11 is a schematic plan view illustrating disposition of the first light reflecting layer and the partition wall in the light emitting element array of Embodiment 1.
Figure 12:
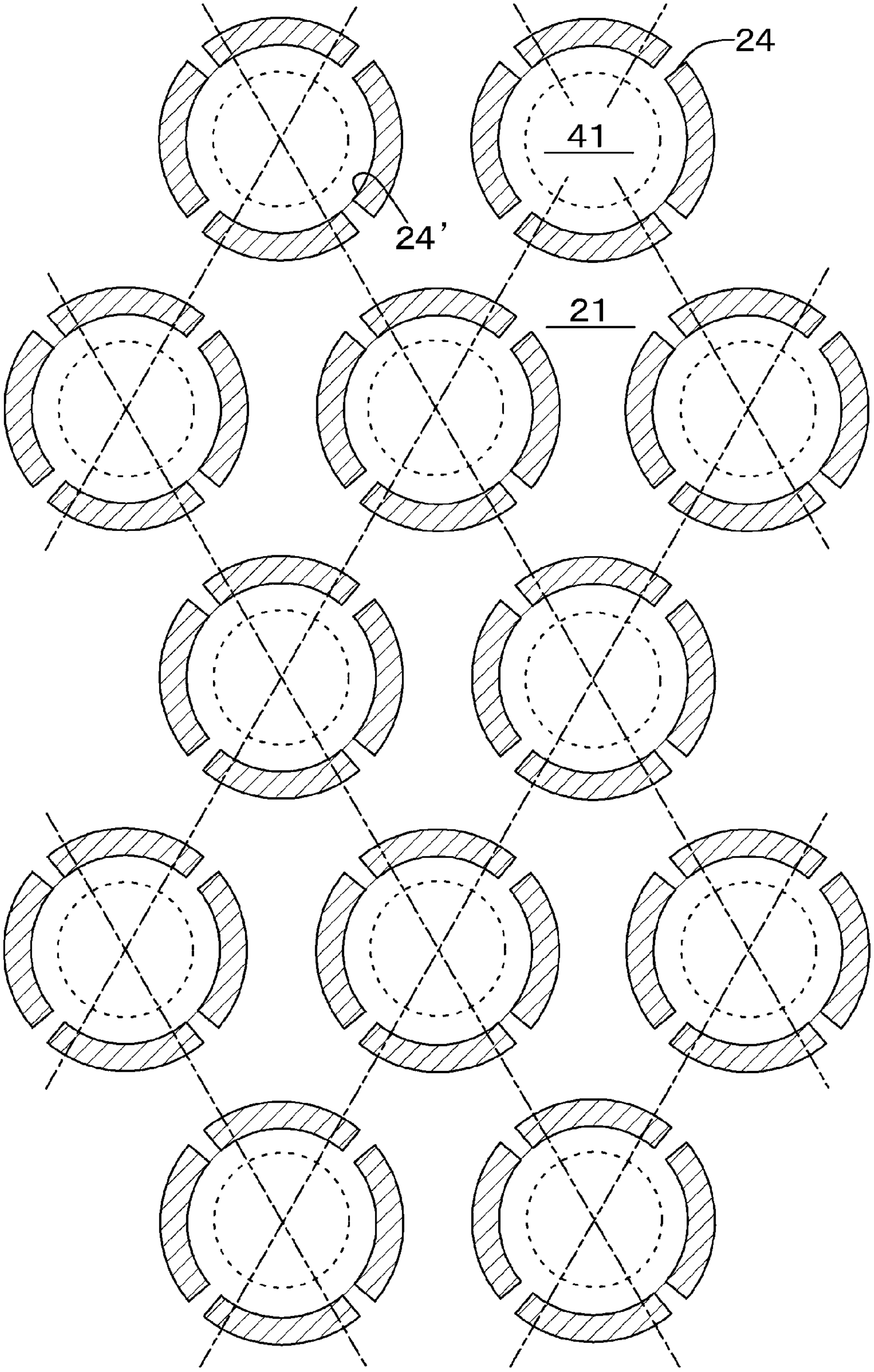
FIG. 12 is a schematic plan view illustrating disposition of the first light reflecting layer and the partition wall in the light emitting element array of Embodiment 1.

A shape of the side surface 24' of the partition wall 24 in a case where the light emitting element 10A is cut along a virtual plane (in the illustrated example, for example, an XZ plane) including the stacking direction of the stacked structure 20 is a line segment. In addition, a shape of the side surface 24' of the partition wall 24 in a case where the light emitting element 10A is cut along a virtual plane orthogonal to the stacking direction of the stacked structure 20 is a circle. Moreover, as illustrated in FIGS. 5 and 7, the partition wall 24 is provided so as to surround the first light reflecting layer 41 included in each light emitting element 10A, and a region outside the side surface 24' of the partition wall 24 is occupied by the partition wall 24. That is, a space between the light emitting elements 10A is occupied by the material forming the partition wall 24.

As illustrated in FIGS. 1 and 2, in a case where the partition wall 24 is formed using a material having no conductivity, a first electrode 31 is provided on the first surface 21*a* of the first compound semiconductor layer 21.

Furthermore, as illustrated in FIGS. 3 and 4, in a case where the partition wall 24 is formed using a material having conductivity, or in a case where the partition wall 24 is formed using a material having no conductivity, the first electrode 31 may be provided on an exposed surface (lower end surface 24*a*) of the partition wall 24 (see also FIGS. 5, 6, 7, and 8). Specifically, a lower end portion (an end portion facing the first electrode 31) 24*a* of the partition wall 24 is in contact with the first electrode 31 formed on a first surface 10*a* (the first surface 21*a* of the first compound semiconductor layer 21) of the light emitting element 10A. Note that a second surface 10*b* of the light emitting element is an exposed surface of the light emitting element. In a case where the partition wall 24 is formed using a material having conductivity, the partition wall 24 may also serve as the first electrode 31. As the partition wall 24 is formed using a material having a high thermal conductivity as described above, heat generated in the stacked structure 20 can be released (dissipated) to the outside through the partition wall 24. Specifically, the heat generated in the stacked structure 20 can be effectively released (dissipated) to the outside through the partition wall 24 and the first electrode 31 or a first pad electrode.

However, the present disclosure is not limited thereto, and the space between the light emitting elements 10A may be occupied by a material (for example, the stacked structure 20) other than the material forming the partition wall 24. That is, for example, the partition wall 24 may be formed in a continuous groove shape (see FIGS. 9 and 10), or may be formed in a discontinuous groove shape (see FIGS. 11 and 12). Note that, in FIGS. 9, 10, 11, and 12, a portion corresponding to the partition wall is hatched to clearly show the partition wall.

The first compound semiconductor layer 21 has a first conductivity type (specifically, n type), and the second compound semiconductor layer 22 has a second conductivity type (specifically, p type) different from the first conductivity type. Then, in the light emitting element 10A of Embodiment 1, the first surface 21*a* of the first compound semiconductor layer 21 constitutes a base surface 90. The first light reflecting layer 41 is formed on the base surface 90. The base surface 90 has a convex shape in a direction away from the active layer 23.

In the light emitting element array, it is desirable that a formation pitch of the light emitting elements 10A is 3 μm or more and 50 μm or less, preferably, 5 μm or more and 30 μm or less, and more preferably, 8 μm or more and 25 μm or less. Furthermore, a radius $R_1$ of curvature of the base surface 90 is desirably $1\times10^{-5}$ m or more. A resonator length $L_{OR}$ preferably satisfies $1\times10^{-5}$ m$\leq L_{OR}$.

The stacked structure 20 can be formed using at least one material selected from the group consisting of a GaN-based compound semiconductor, an InP-based compound semiconductor, and a GaAs-based compound semiconductor. In Embodiment 1, specifically, the stacked structure 20 is formed using a GaN-based compound semiconductor.

The first compound semiconductor layer 21 includes, for example, an n-GaN layer doped with about $2\times10^{16}$ $cm^{-3}$ Si, the active layer 23 has a five-layered multiple quantum well structure in which an $In_{0.04}Ga_{0.96}N$ layer (barrier layer) and an $In_{0.16}Ga_{0.84}N$ layer (well layer) are stacked, and the second compound semiconductor layer 22 includes, for example, a p-GaN layer doped with about $1\times10^{19}$ $cm^{-3}$ magnesium. A plane orientation of the first compound semiconductor layer 21 is not limited to a {0001} plane, and may be, for example, a {20-21} plane which is a semipolar plane. The first electrode 31 formed using Ti/Pt/Au is electrically connected to an external circuit or the like via the first pad electrode (not illustrated) formed using Ti/Pt/Au or V/Pt/Au, for example. On the other hand, a second electrode 32 is formed on the second compound semiconductor layer 22, and the second light reflecting layer 42 is formed on the second electrode 32. The second light reflecting layer 42 on the second electrode 32 has a flat shape. The second electrode 32 is formed using a transparent conductive material, specifically, ITO having a thickness of 30 nm. A second pad electrode 33 formed using, for example, Pd/Ti/Pt/Au, Ti/Pd/Au, or Ti/Ni/Au for electrical connection with an external circuit or the like may be formed on or connected to an edge portion of the second electrode 32 (see FIGS. 13, 14, 15, and 16). The first light reflecting layer 41 and the second light reflecting layer 42 have a structure in which a $Ta_2O_5$ layer and a $SiO_2$ layer are stacked or a structure in which a SiN layer and a $SiO_2$ layer are stacked. The first light reflecting layer 41 and the second light reflecting layer 42 each have a multilayer structure as described above, but are illustrated as having one layer for simplification of the drawing. A planar shape of each of an opening 31' provided in the first electrode 31, the first light reflecting layer 41, the second light reflecting layer 42, and an opening 34A provided in an insulating layer (current constriction layer) 34 is a circle.

In order to obtain the current constriction region, as described above, the insulating layer (current constriction layer) 34 formed using an insulating material (for example, $SiO_X$, $SiN_X$, or $AlO_X$) may be formed between the second electrode 32 and the second compound semiconductor layer 22, and the insulating layer (current constriction layer) 34 has the opening 34A for injecting a current into the second compound semiconductor layer 22. Alternatively, in order to obtain the current constriction region, the second compound semiconductor layer 22 may be etched by an RIE method or the like to form a mesa structure. Alternatively, a partial layer of the stacked second compound semiconductor layer 22 may be partially oxidized in the lateral direction to form the current constriction region. Alternatively, an impurity (for example, boron) may be ion-implanted into the second compound semiconductor layer 22 to form the current constriction region including a region with a decreased conductivity. Alternatively, these may be appropriately combined. However, the second electrode 32 needs to be electrically connected to a portion (current injection region) of the second compound semiconductor layer 22 through which a current flows due to current confinement.

In the examples illustrated in FIGS. 1, 2, 3, and 4, the second electrode 32 is common to the light emitting elements 10A included in the light emitting element array, and the second electrode 32 is connected to an external circuit or the like via the first pad electrode (not illustrated). The first electrode 31 is also common to the light emitting elements 10A included in the light emitting element array, and is connected to an external circuit or the like via the first pad electrode (not illustrated). Then, light may be emitted to the outside via the first light reflecting layer 41, or light may be emitted to the outside via the second light reflecting layer 42.

Figure 13:
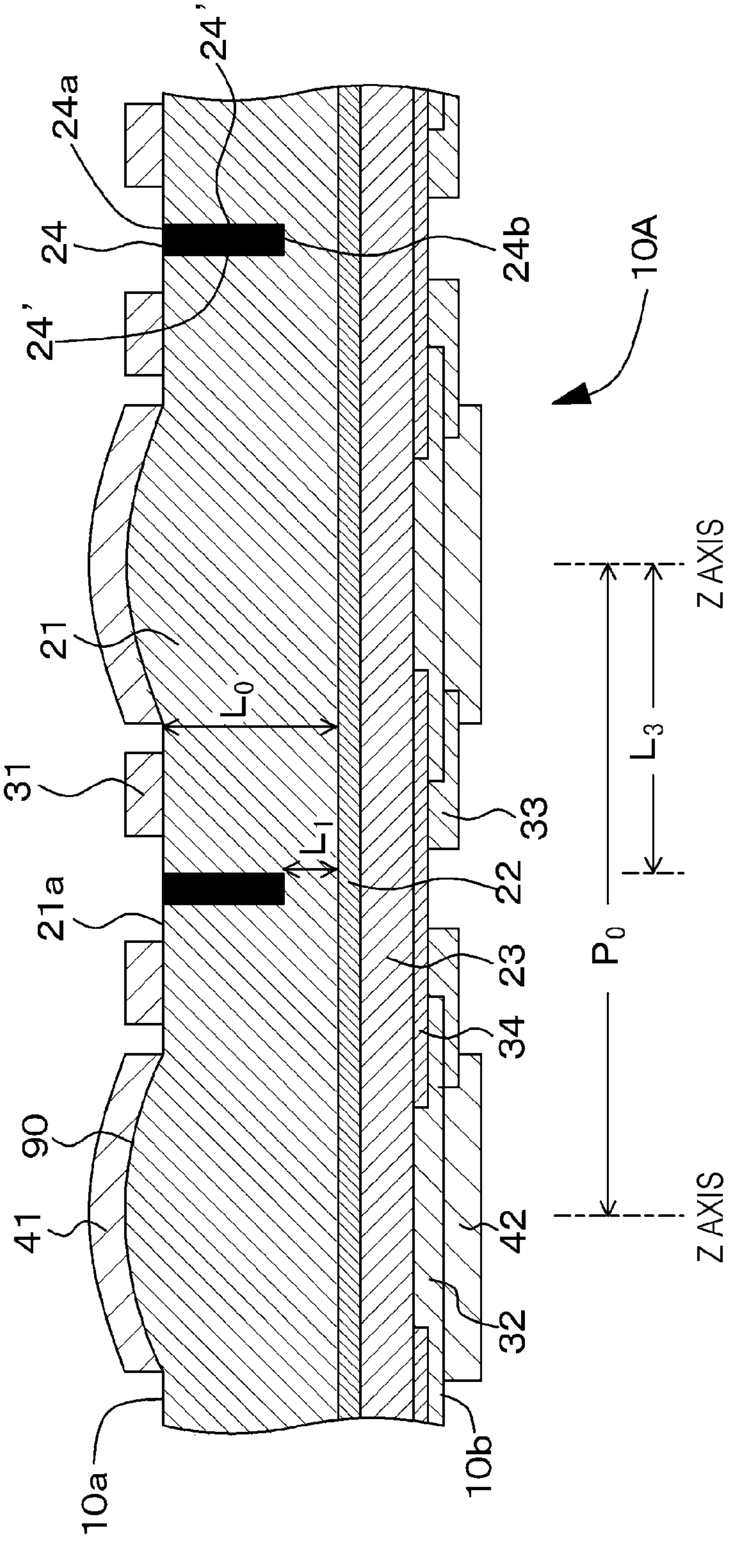
FIG. 13 is a schematic partial cross-sectional view of Modified Example-1 of the light emitting element array of Embodiment 1.
Figure 14:
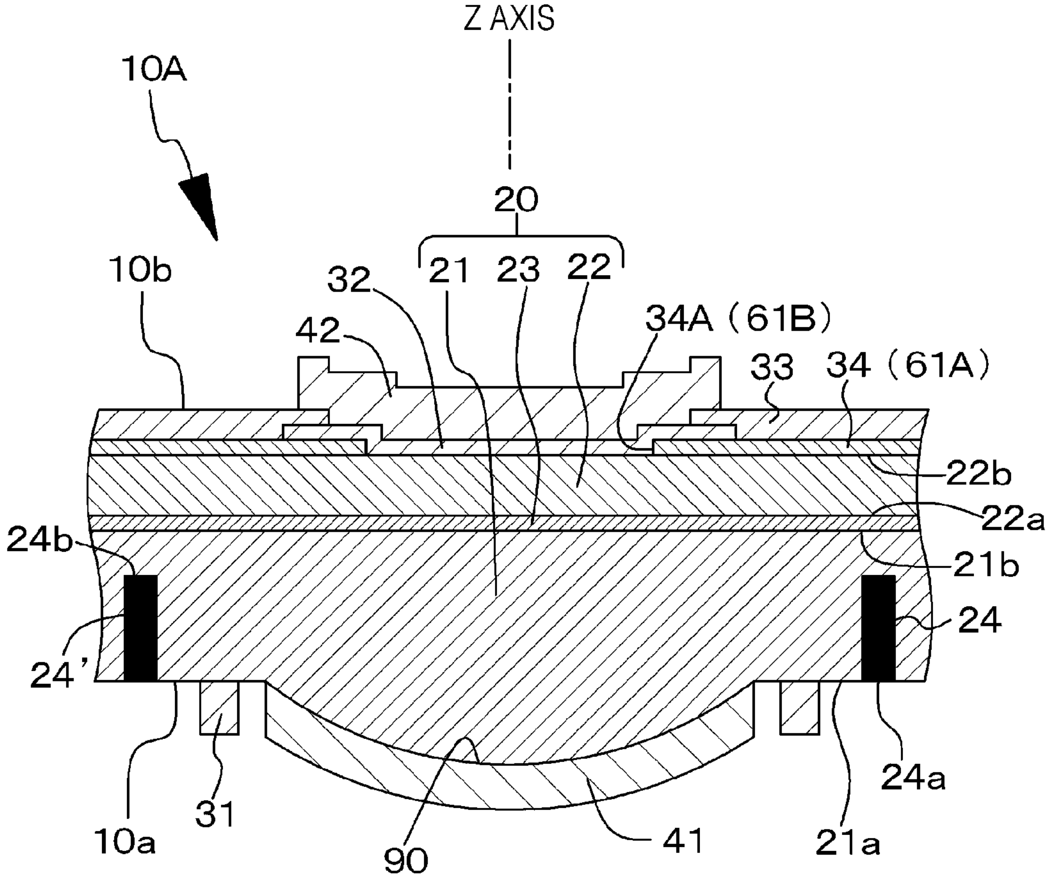
FIG. 14 is a schematic partial cross-sectional view of a light emitting element of Modified Example-1 of the light emitting element array of Embodiment 1 illustrated in FIG. 13.

Alternatively, as illustrated in FIG. 13, which is a schematic partial cross-sectional view of Modified Example-1 of the light emitting element array of Embodiment 1, and FIG. 14, which is a schematic partial cross-sectional view of a light emitting element included in Modified Example-1 of the light emitting element array of Embodiment 1 illustrated in FIG. 13, the second electrode 32 is individually formed in the light emitting element 10A included in the light emitting element array, and is connected to an external circuit or the like via the second pad electrode 33. The first electrode 31 is common to the light emitting elements 10A included in the light emitting element array, and is connected to an external circuit or the like via the first pad electrode (not illustrated). Then, light may be emitted to the outside via the first light reflecting layer 41, or light may be emitted to the outside via the second light reflecting layer 42.

Figure 15:
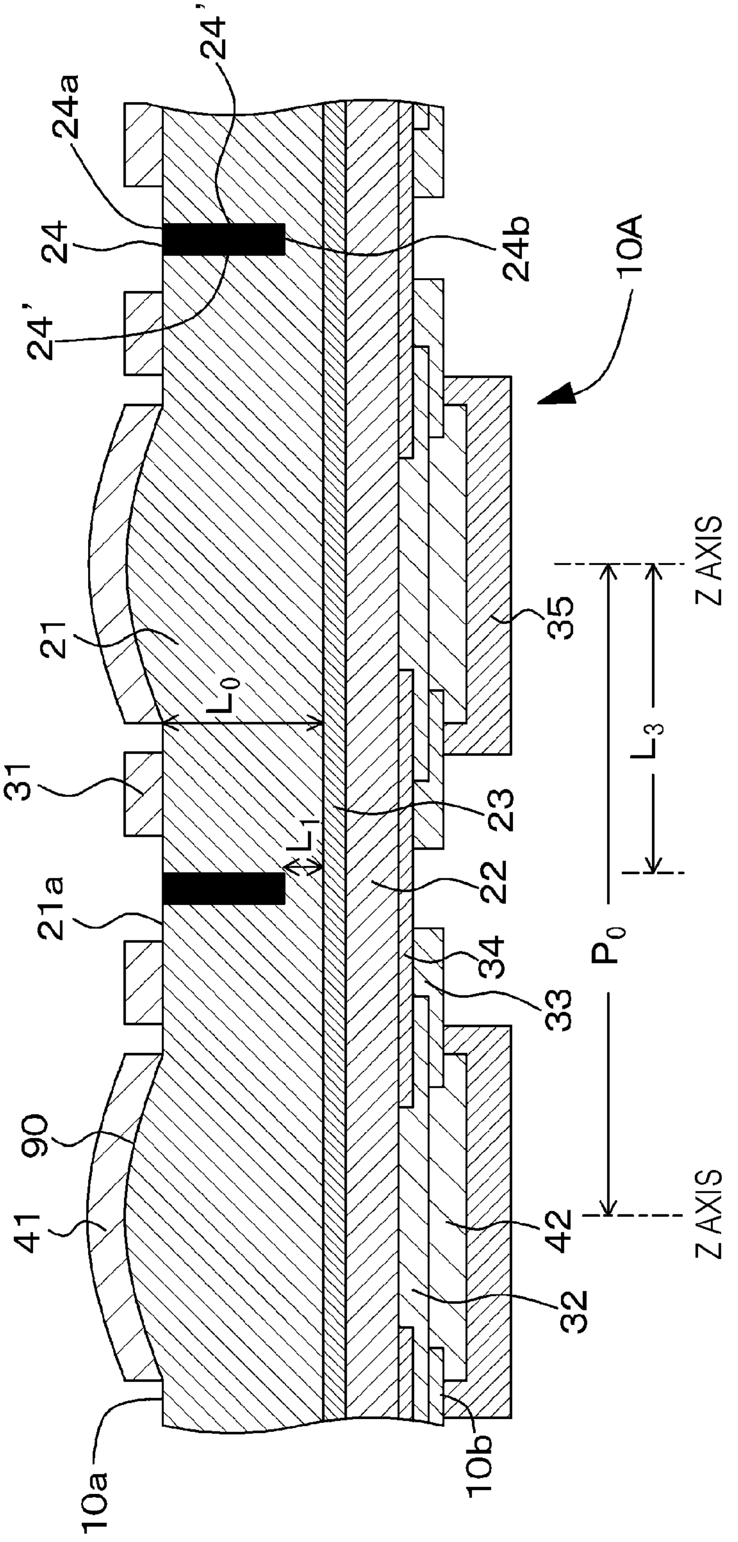
FIG. 15 is a schematic partial cross-sectional view of Modified Example-2 of the light emitting element array of Embodiment 1.
Figure 16:
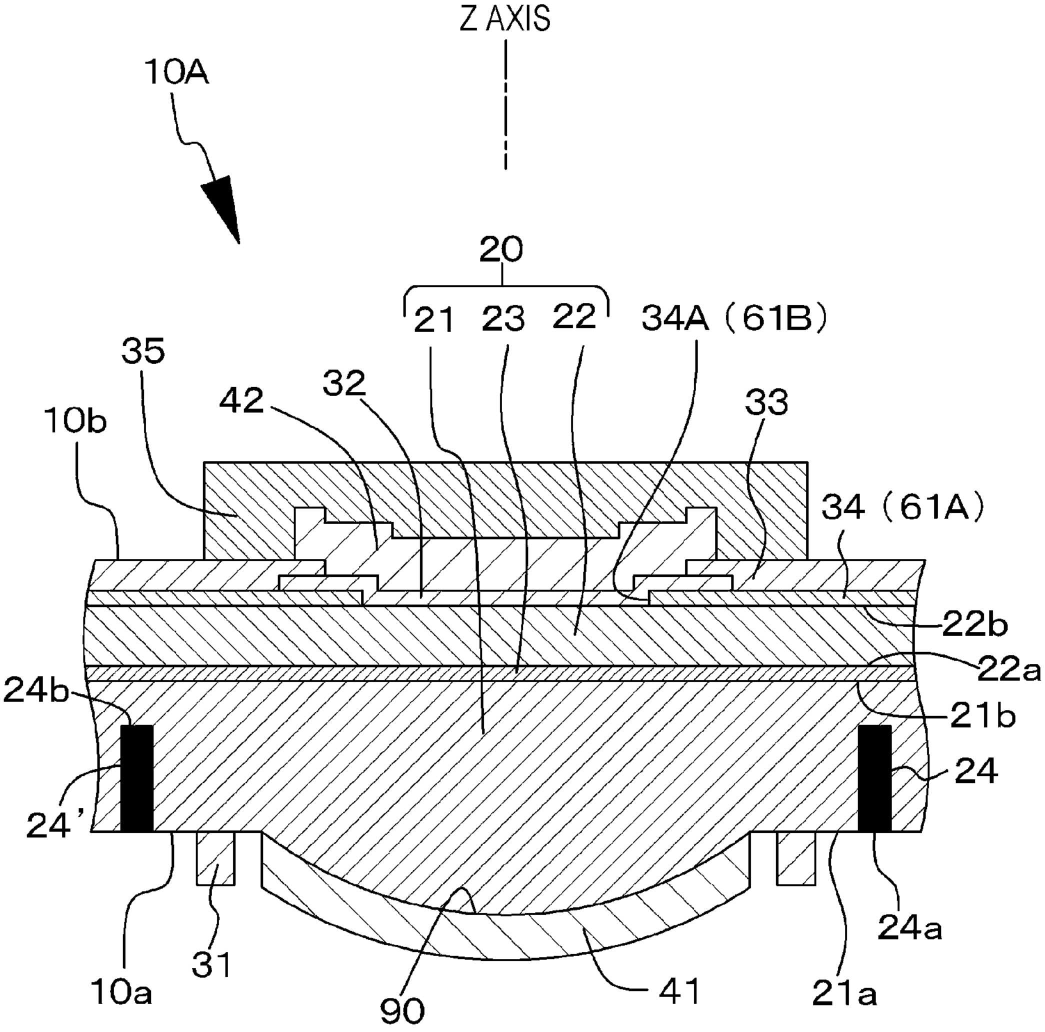
FIG. 16 is a schematic partial cross-sectional view of a light emitting element of Modified Example-2 of the light emitting element array of Embodiment 1 illustrated in FIG. 15.

Alternatively, as illustrated in FIG. 15, which is a schematic partial cross-sectional view of Modified Example-2 of the light emitting element array of Embodiment 1, and FIG. 16, which is a schematic partial cross-sectional view of a light emitting element included in Modified Example-2 of the light emitting element array of Embodiment 1 illustrated in FIG. 15, the second electrode 32 is individually formed in the light emitting element 10A included in the light emitting element array. Furthermore, a bump 35 is formed on the second pad electrode 33 formed on the second electrode 32, and connection to an external circuit or the like is made via the bump 35. The first electrode 31 is common to the light emitting elements 10A included in the light emitting element array, and is connected to an external circuit or the like via the first pad electrode (not illustrated). The bump 35 is arranged at a portion on the second surface side of the second compound semiconductor layer 22 facing the base surface 90, and covers the second light reflecting layer 42. Examples of the bump 35 can include a gold (Au) bump, a solder bump, and an indium (In) bump. A method for arranging the bump 35 can be a known method. Then, light is emitted to the outside via the first light reflecting layer 41. Note that the bump 35 may be provided in the light emitting element 10A illustrated in FIG. 1. Examples of a shape of the bump 35 can include a cylindrical shape, an annular shape, and a hemispherical shape.

Note that the modified examples of the light emitting element array or the light emitting element of Embodiment 1 illustrated in FIGS. 13, 14, 15, and 16 are modified examples of the light emitting element array or the light emitting element of Embodiment 1 illustrated in FIGS. 1 and 2, but may also be modified examples of the light emitting element array or the light emitting element of Embodiment 1 illustrated in FIGS. 3 and 4.

In the light emitting element array of Embodiment 1 illustrated in FIGS. 5 and 7, parameters of the light emitting element 10A are as shown in Table A below. Note that a diameter of the first light reflecting layer 41 is indicated by $D_1$, and a height of the base surface 90 is indicated by $H_1$ (see FIG. 1). In addition, specifications of the light emitting element 10A of Embodiment 1 illustrated in FIGS. 5 and 7 are shown in Tables B and C below. Note that the "number of light emitting elements" is the number of light emitting elements included in one light emitting element array. Furthermore, values of $P_0$, $L_0$, $L_1$, and $L_3$ are shown in Table D, and values of $P_0$, $L_0$, $L_2$, and $L_3'$ in Embodiment 2 as described later are shown in Table E.

A value of a thermal conductivity of the stacked structure 20 is higher than a value of a thermal conductivity of the first light reflecting layer 41. A value of a thermal conductivity of a dielectric material of the first light reflecting layer 41 is about 10 watts/(m·K) or less. On the other hand, a value of a thermal conductivity of the GaN-based compound semiconductor of the stacked structure 20 is about 50 to 100 watts/(m·K).

TABLE A

| | FIG. 5 | FIG. 7 |
|---|---|---|
| Formation pitch | 25 μm | 20 μm |
| Radius $R_1$ of curvature | 100 μm | 200 μm |
| Diameter $D_1$ | 20 μm | 15 μm |
| Height $H_1$ | 2 μm | 2 μm |

TABLE B

| FIG. 5 | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 445 nm |
| Number of light emitting elements | 100 × 100 |

TABLE C

| FIG. 7 | |
|---|---|
| Second light reflecting layer 42 | $SiO_2/SiN$ (9 pairs) |
| Second electrode 32 | ITO (thickness: 22 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 488 nm |

TABLE C-continued

| FIG. 7 | |
|---|---|
| Number of light emitting elements | 1000 × 1000 |

TABLE D

| Embodiment 1 |
|---|
| $P_0$: 40 μm |
| $L_0$: 30 μm |
| $L_1$: 28 μm |
| $L_3$: 18 μm |

TABLE E

| Embodiment 2 |
|---|
| $P_0$: 20 μm |
| $L_0$: 17 μm |
| $L_2$: 12 μm |
| $L_3'$: 9 μm |

A method for manufacturing the light emitting element 10A or the light emitting element array of Embodiment 1 will be described in Embodiment 5.

In the light emitting element or the light emitting element array of Embodiment 1, since the partition wall extending in the stacking direction of the stacked structure is formed so as to surround the first light reflecting layer, occurrence of optical crosstalk can be prevented, or occurrence of thermal saturation can be prevented. As a result, it is possible to provide a light emitting element and a light emitting element array having high light emission efficiency and high reliability.

Embodiment 2

Figure 17:
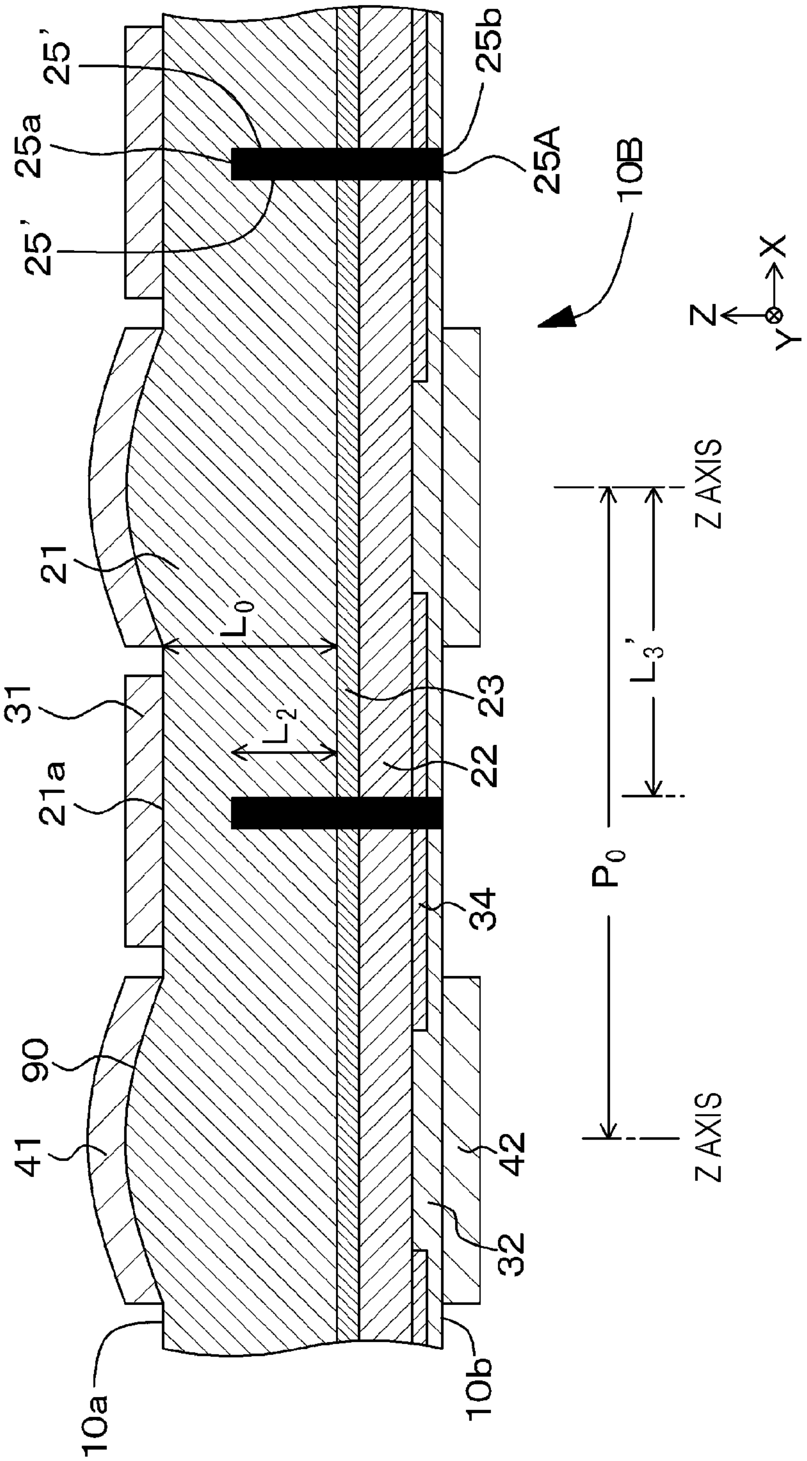
FIG. 17 is a schematic partial cross-sectional view of a light emitting element array of Embodiment 2.
Figure 18:
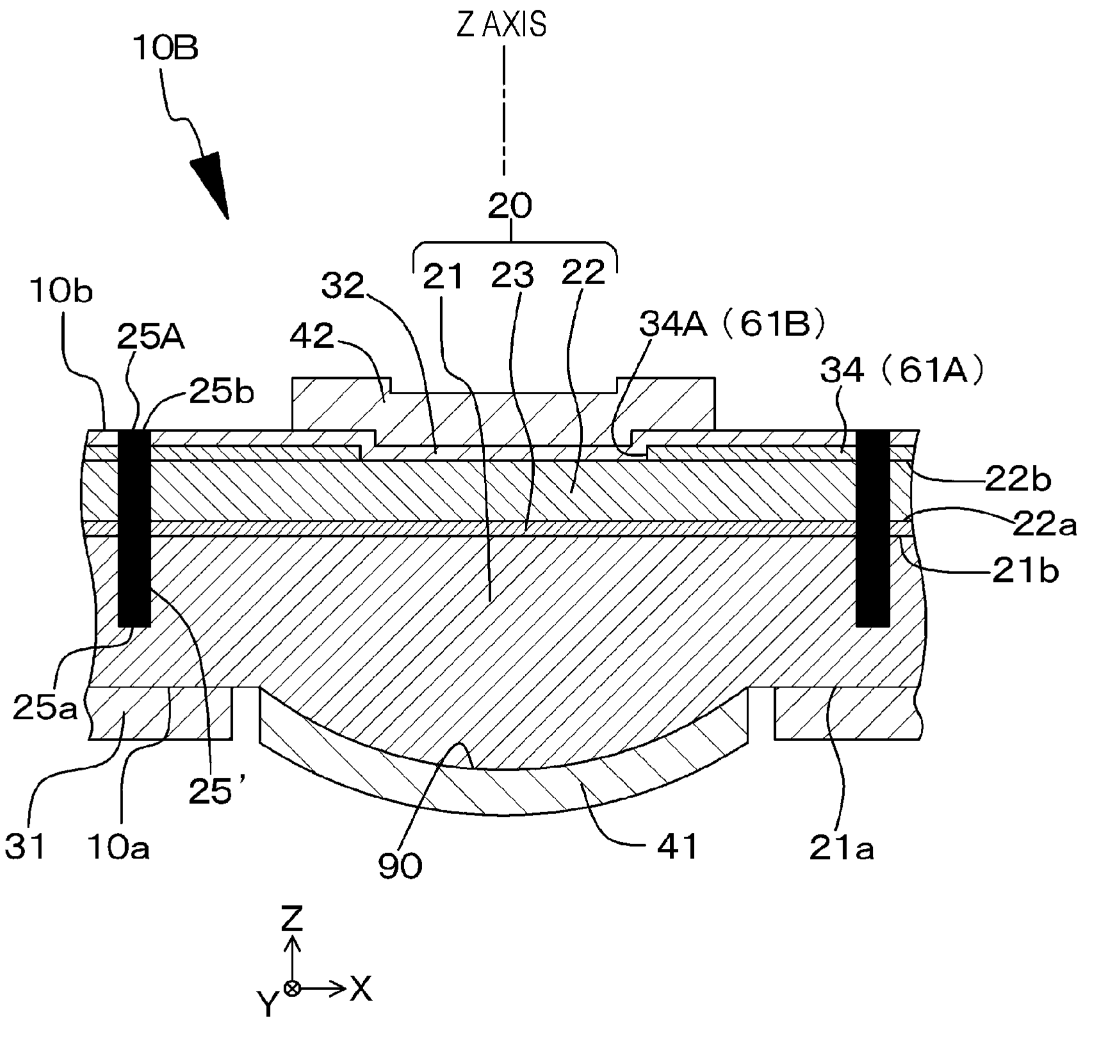
FIG. 18 is a schematic partial cross-sectional view of a light emitting element included in the light emitting element array of Embodiment 2 illustrated in FIG. 17.

Embodiment 2 is a modification of Embodiment 1. FIG. 17 is a schematic partial cross-sectional view of the light emitting element array of Embodiment 2, and FIG. 18 is a schematic partial cross-sectional view of the light emitting element.

In a light emitting element 10B of Embodiment 2, a partition wall 25A extends from the second surface side of the second compound semiconductor layer 22 in the second compound semiconductor layer 22 and the active layer 23, and further extends to the middle of the first compound semiconductor layer 21 in the thickness direction in the first compound semiconductor layer 21. That is, a lower end portion 25*a* of the partition wall 25A may be positioned at the middle of the first compound semiconductor layer 21 in the thickness direction. Then, in the light emitting element array of Embodiment 2, a relationship between $L_0$, $L_2$, and $L_3'$ satisfies the relationship described above, and is as shown in Table E above. An upper end portion 25*b* of a partition wall 25B is exposed at a second surface 10*b* of the light emitting element 10B.

Figure 19:
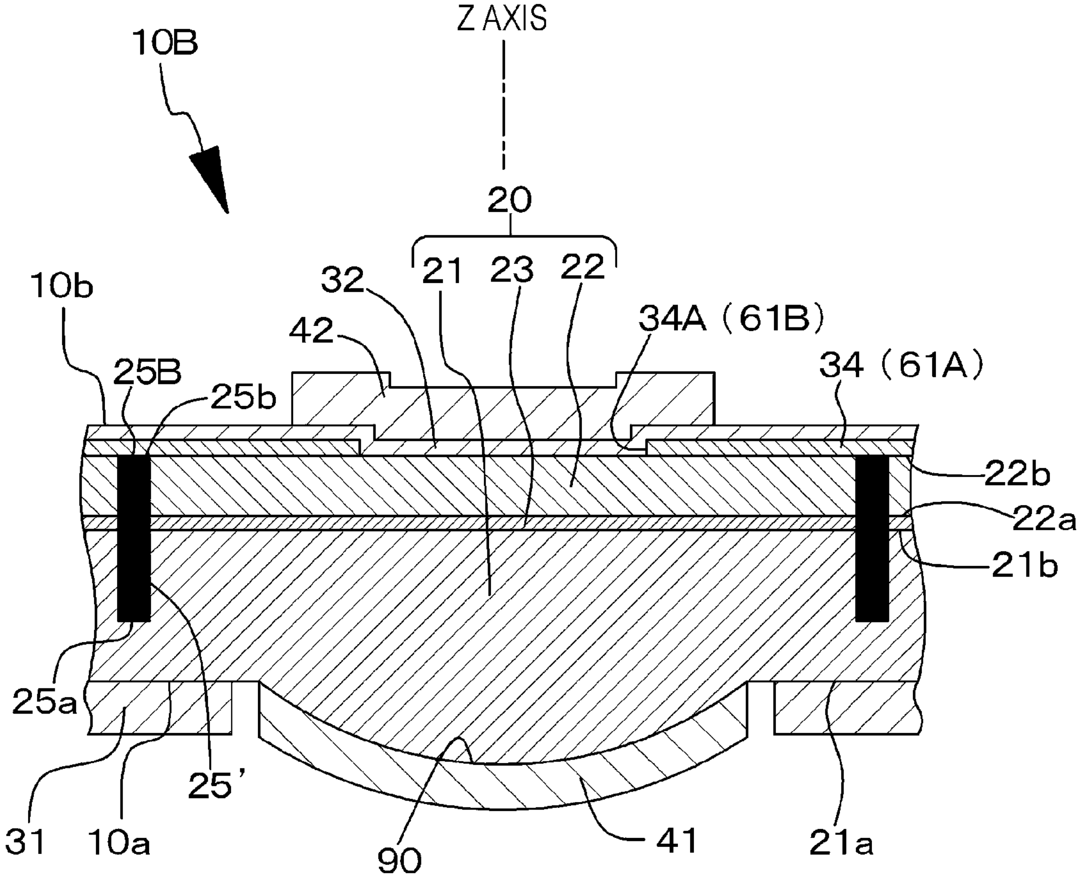
FIG. 19 is a schematic partial cross-sectional view of Modified Example-1 of the light emitting element of Embodiment 2.

Alternatively, as illustrated in FIG. 19, which is a schematic partial cross-sectional view of Modified Example-1 of the light emitting element 10B of Embodiment 2, the upper end portion 25*b* of the partition wall 25B does not have to be exposed at the second surface 10*b* of the light emitting element 10B. Specifically, the upper end portion 25*b* of the partition wall 25B is covered by the insulating layer (current constriction layer) 34 and the second electrode 32.

Figure 20:
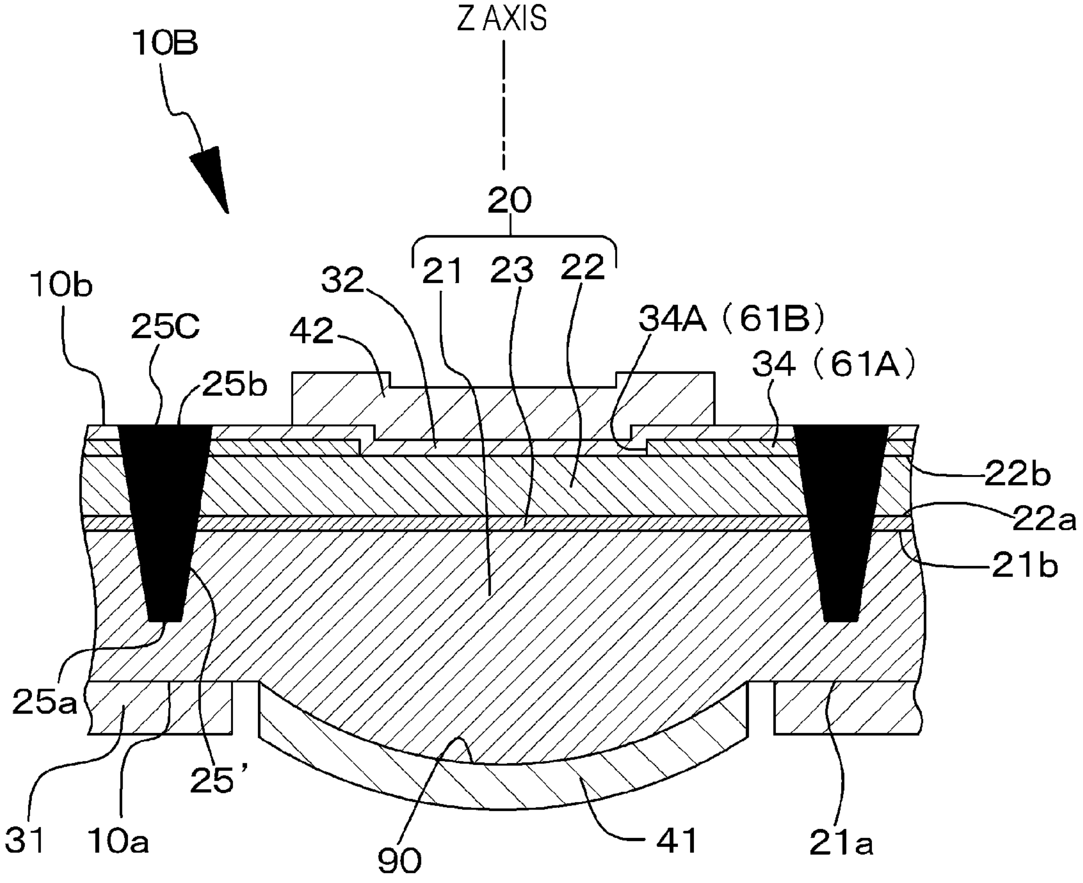
FIG. 20 is a schematic partial cross-sectional view of Modified Example-2 of the light emitting element of Embodiment 2.

Alternatively, as illustrated in FIG. 20, which is a schematic partial cross-sectional view of Modified Example-2 of the light emitting element 10B of Embodiment 2, a side surface 25' of a partition wall 25C is narrowed along a direction from the first surface side of the first compound semiconductor layer 21 toward the second surface side of the second compound semiconductor layer 22. That is, a shape of the side surface of the partition wall 25C in a case where the light emitting element 10B is cut along a virtual plane (for example, the XZ plane in the illustrated example) including the stacking direction of the stacked structure 20 is a trapezoid, specifically, an isosceles trapezoid in which a second compound semiconductor layer side is a shorter side and a first compound semiconductor layer side is a longer side.

These partition walls 25A, 25B, and 25C can each be implemented by the partition wall described in Embodiment 1.

Figure 21:
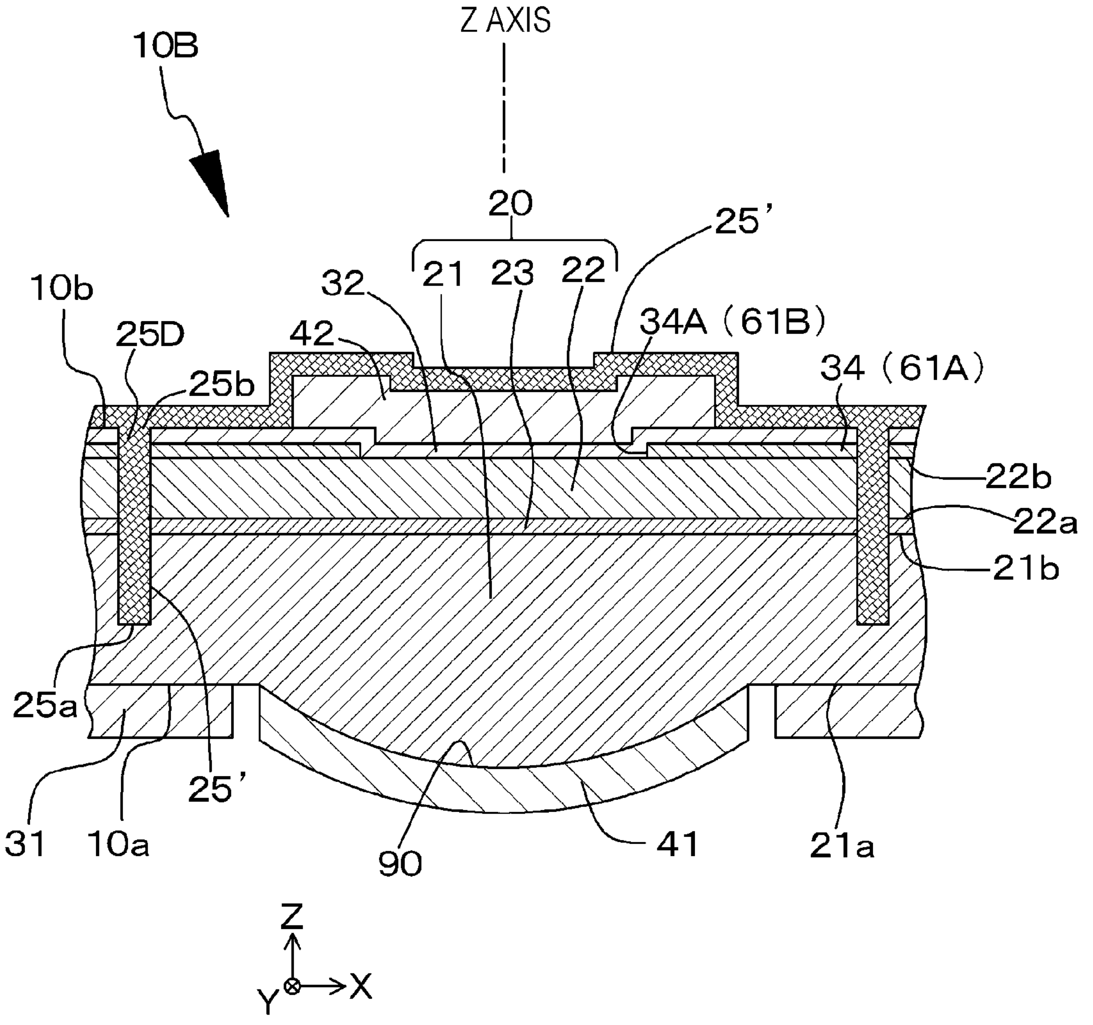
FIG. 21 is a schematic partial cross-sectional view of Modified Example-3 of the light emitting element of Embodiment 2.

Alternatively, as illustrated in FIG. 21, which is a schematic partial cross-sectional view of Modified Example-3 of the light emitting element 10B of Embodiment 2, a partition wall 25D is formed using a solder material, specifically, for example, a Au—Sn eutectic solder, and a portion 25D' of the partition wall 25D is formed on an outer surface (second surface 10*b*) of the light emitting element 10B. Specifically, the portion 25D' of the partition wall 25D exposed at the second surface 10*b* of the light emitting element 10 forms a kind of bump, and connection to an external circuit or the like can be made via the portion 25D' of the partition wall 25D.

Embodiment 3

Figure 22:
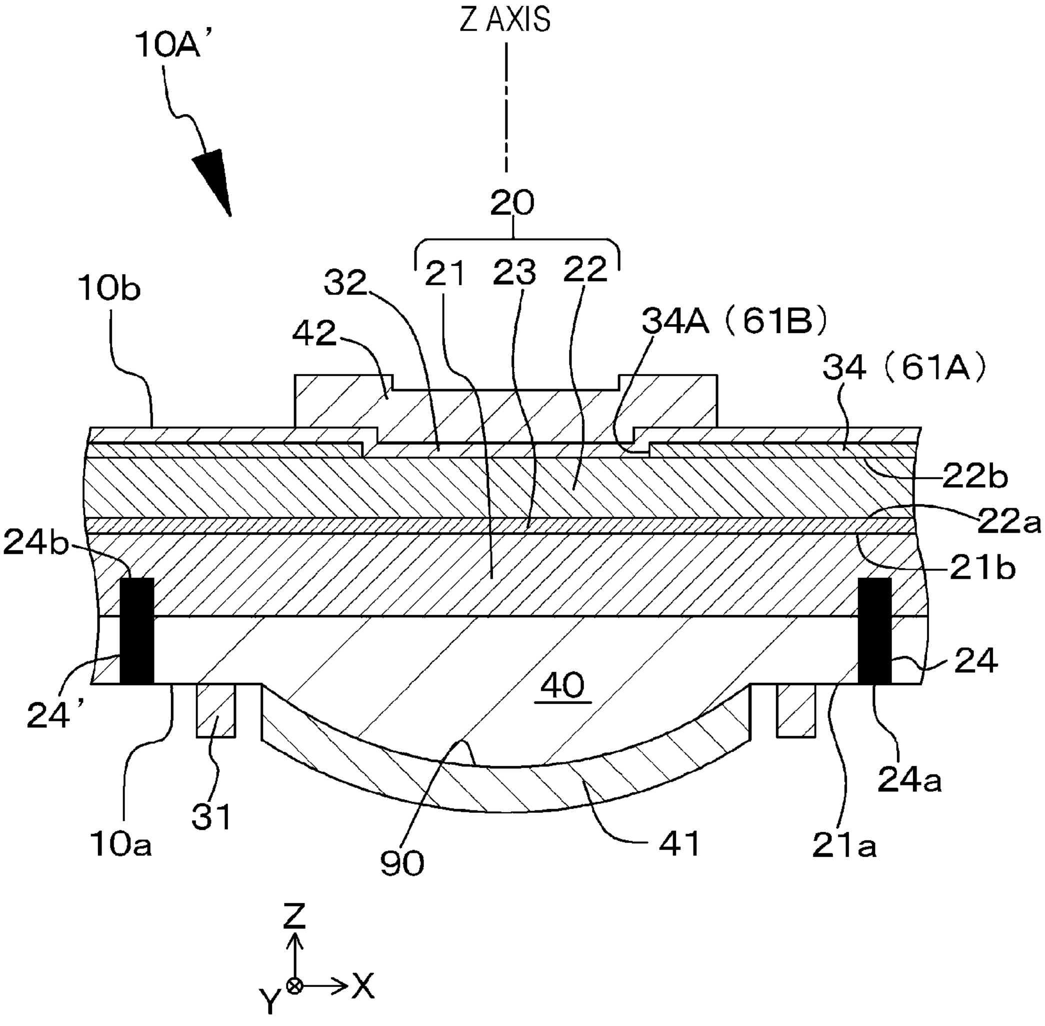
FIG. 22 is a schematic partial cross-sectional view of a light emitting element of Embodiment 3.

Embodiment 3 is a modification of Embodiments 1 and 2. In Embodiments 1 and 2, the first light reflecting layer 41 is formed on the first surface 21*a* of the first compound semiconductor layer 21. On the other hand, a modified example of the light emitting element of Embodiment 1 is illustrated in FIG. 22 as a light emitting element 10A' of Embodiment 3, in which the first light reflecting layer 41 is formed on a sapphire substrate 40 as the light emitting element manufacturing substrate. Except for this point, the light emitting element or the light emitting element array of Embodiment 3 can have a similar configuration and structure as those of the light emitting element or the light emitting element array of Embodiment 1 or 2, and thus a detailed description thereof will be omitted. Note that the first electrode 31 (not illustrated) is connected to the first compound semiconductor layer 21 in a region (not illustrated).

Embodiment 4

Embodiment 4 is a modification of Embodiments 1 to 3. In Embodiments 1 and 2, the stacked structure 20 is formed using a GaN-based compound semiconductor. On the other hand, in Embodiment 4, the stacked structure 20 is formed using an InP-based compound semiconductor. Specifically, the first compound semiconductor layer is formed using n-InP doped with $1\times10^{18}$ $cm^{-3}$ Se, the active layer is formed using InAs or InGaAsP quantum dots, and the second compound semiconductor layer is formed using p-InP doped with $1\times10^{19}$ $cm^{-3}$ Zn. In addition, the current constriction region is formed to have a stacked structure of n-InP layer/p-InP layer/n-InP layer, or is formed using an Fe-doped InP layer, or is formed on the basis of an ion implantation method. The second electrode 32 is formed using IZO or ITO having a thickness of 30 nm. Furthermore, in the light emitting element of Embodiment 4 as a modified example of Embodiment 3, the first light reflecting layer is formed on a semi-insulating InP substrate (undoped or doped with Fe) as the light emitting element manufacturing substrate. Except for the above point, the light emitting element or the light emitting element array of Embodiment 4 can have a similar configuration and structure to those of the light emitting elements or the light emitting element arrays of Embodiments 1 to 3, and thus a detailed description thereof will be omitted.

Embodiment 5

Meanwhile, in the light emitting elements 10A and 10B described in Embodiments 1 to 4, for example, the base surface 90 rises from the first surface 21*a* of the flat first compound semiconductor layer 21. Therefore, in a case where a strong external force is applied to the light emitting elements 10A and 10B for some reason, stress concentrates on a rising portion of the base surface 90, and damage may occur in the first compound semiconductor layer or the like.

Figure 23:
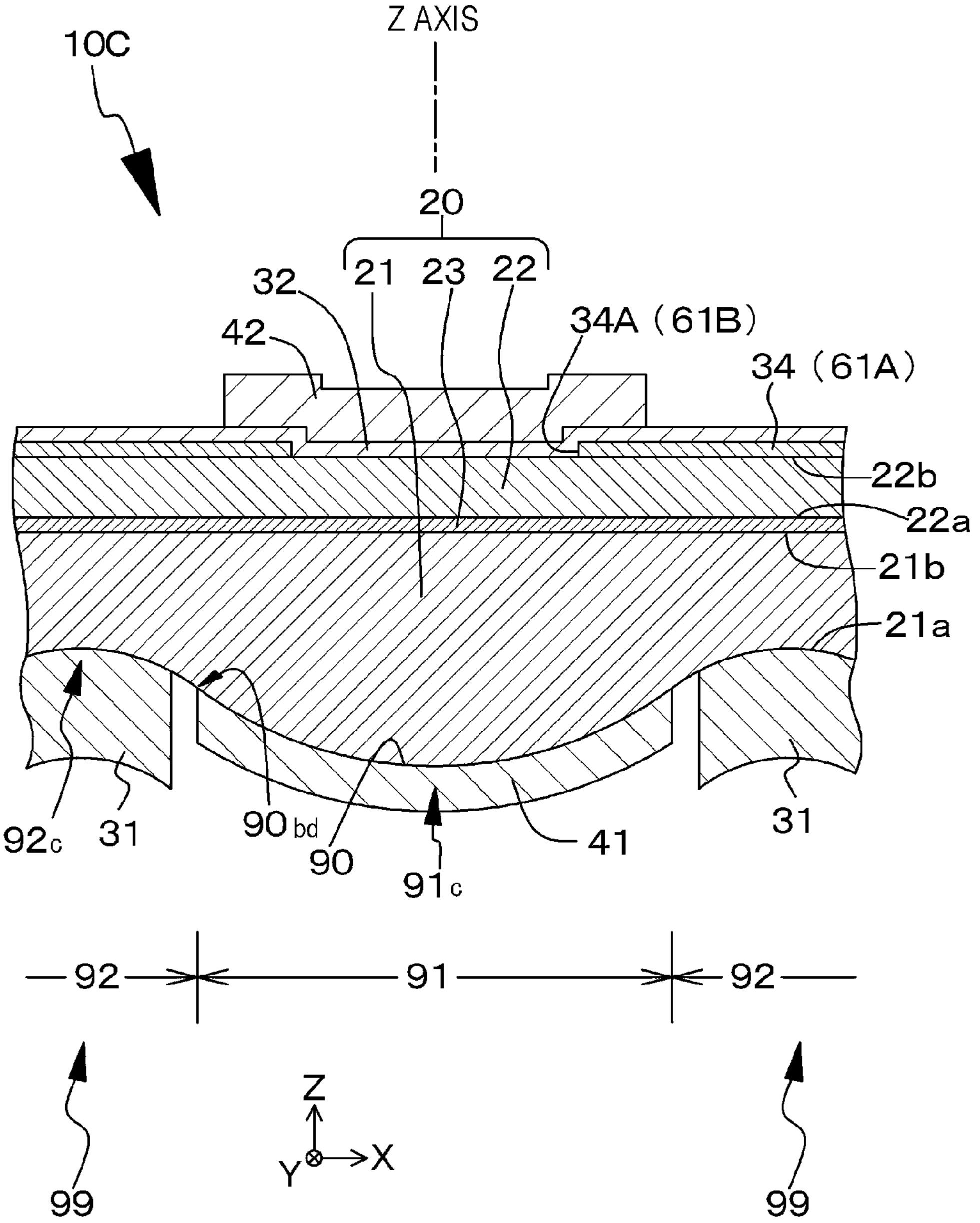
FIG. 23 is a schematic partial end view of a light emitting element of Embodiment 5.
Figure 24:
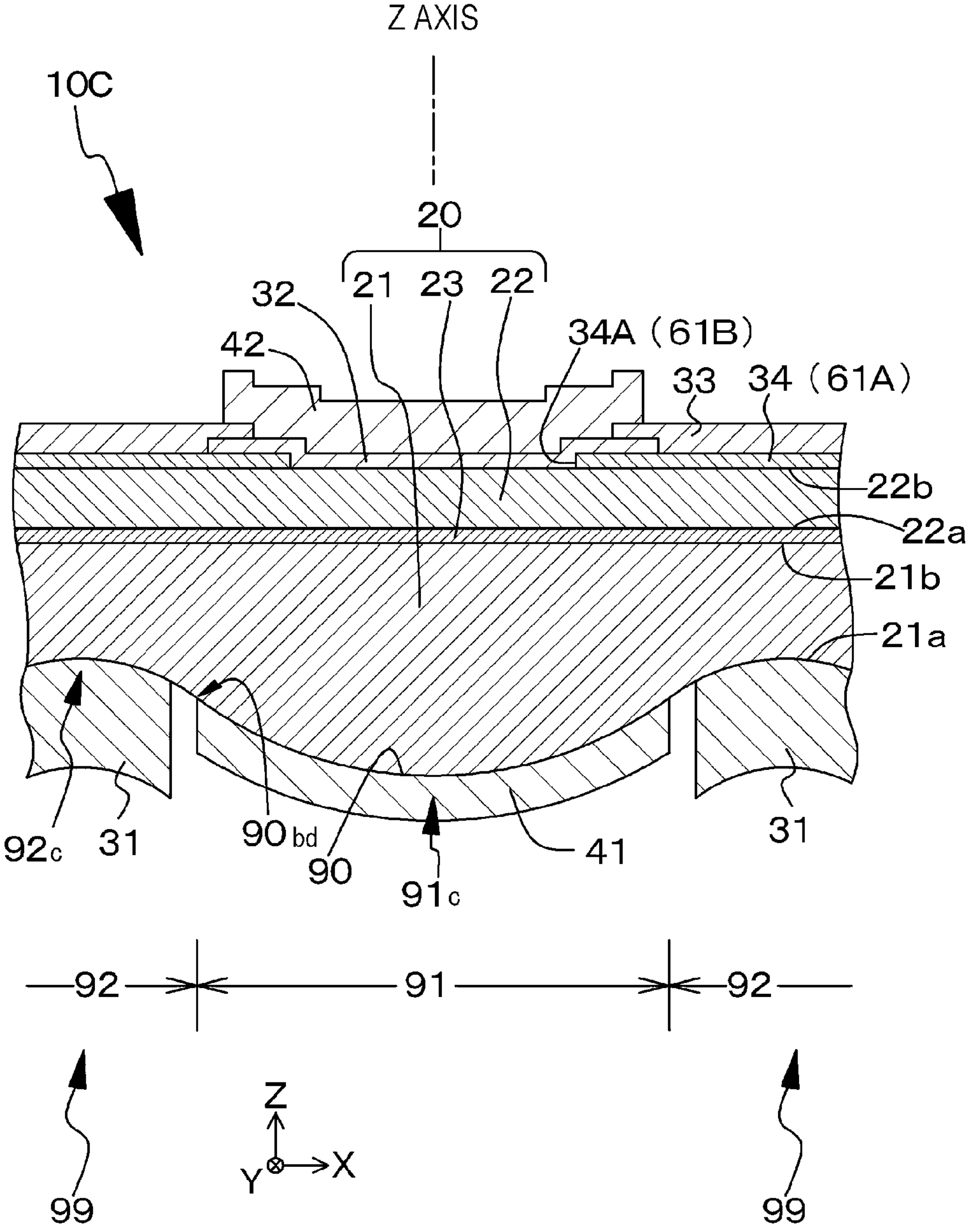
FIG. 24 is a schematic partial end view of a modified example (Modified Example-1) of the light emitting element of Embodiment 5.
Figure 26:
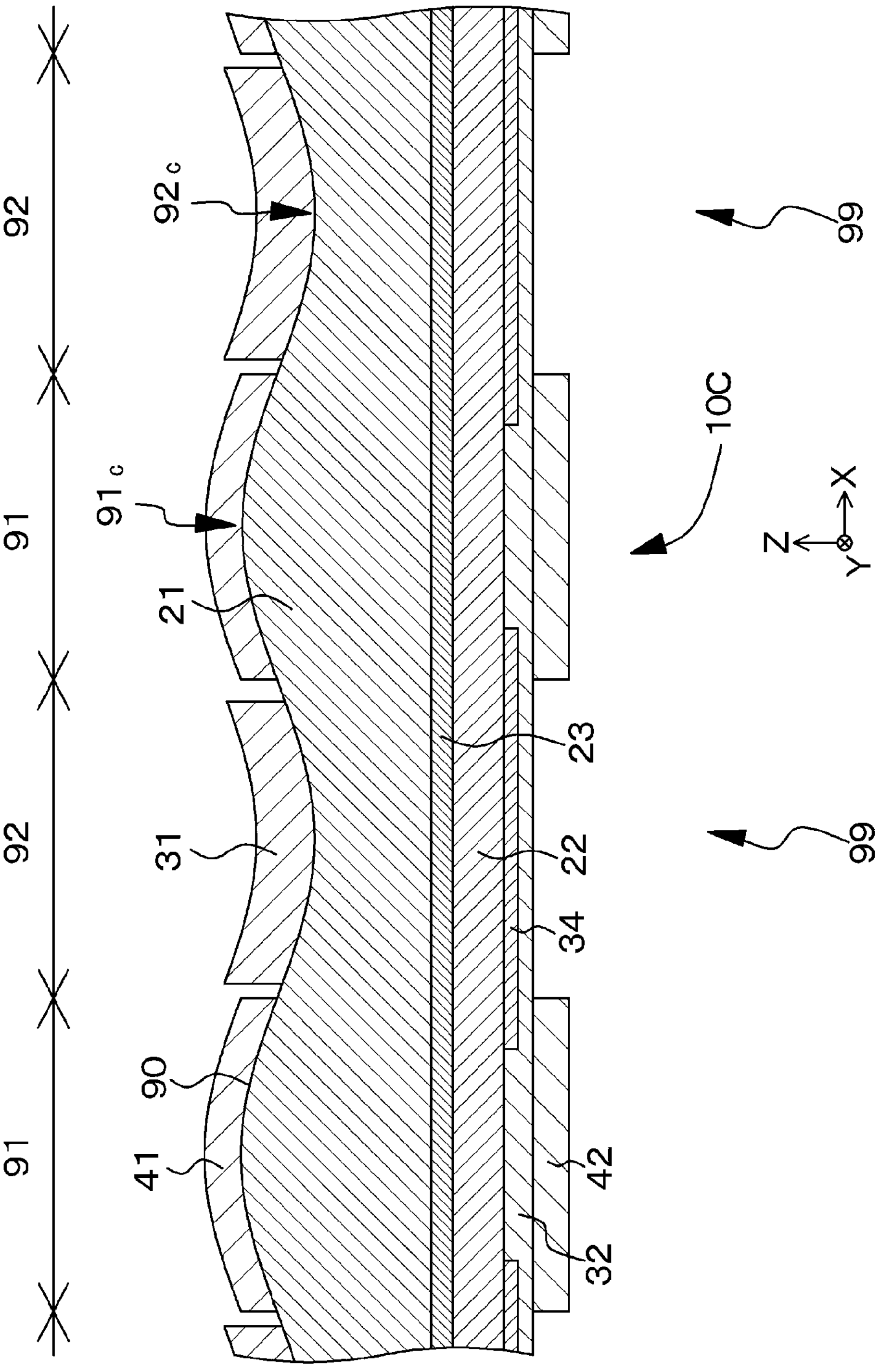
FIG. 26 is a schematic partial end view of a light emitting element array of Embodiment 5.
Figure 27:
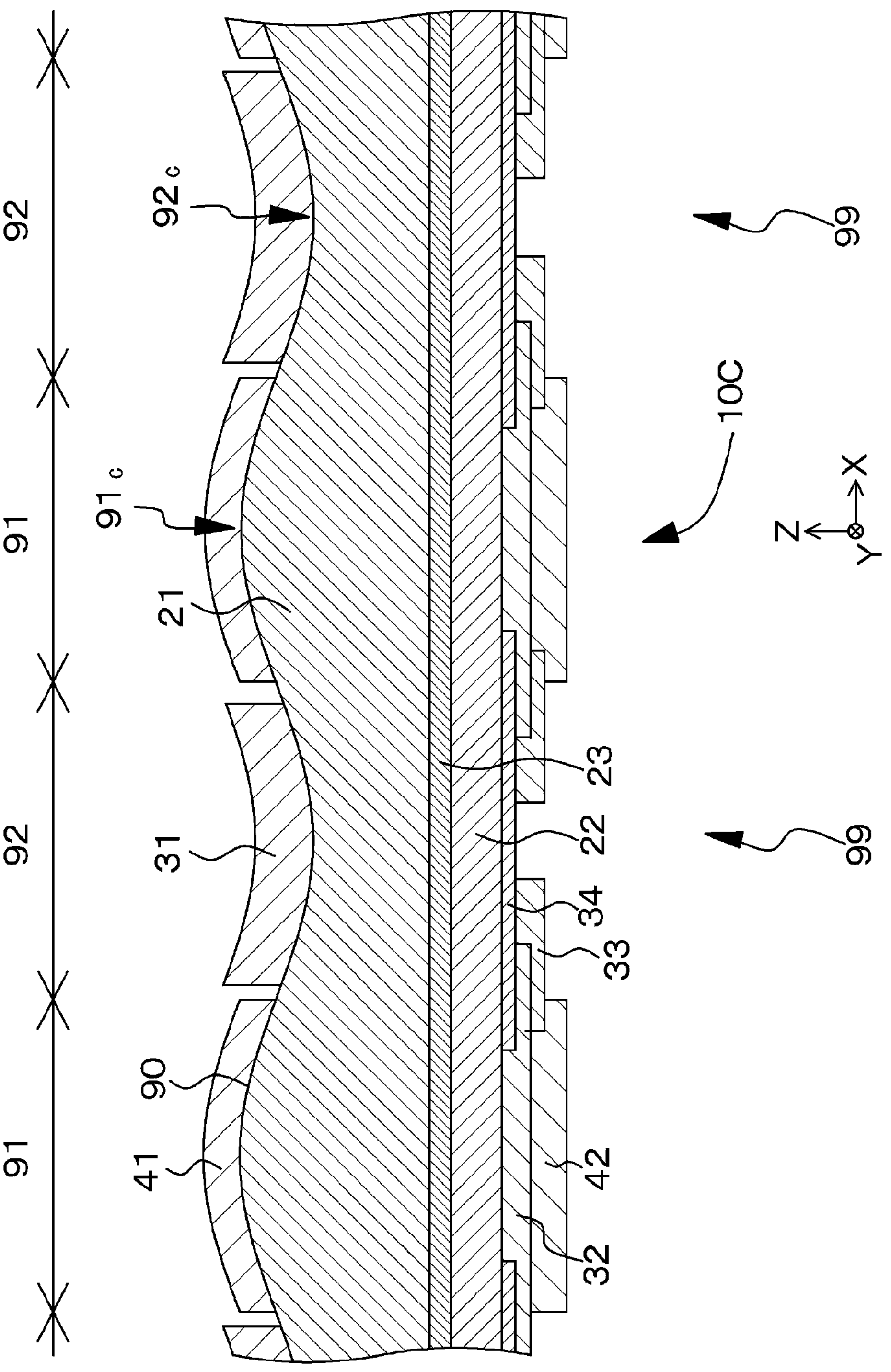
FIG. 27 is a schematic partial end view of the light emitting element array of Embodiment 5.
Figure 28:
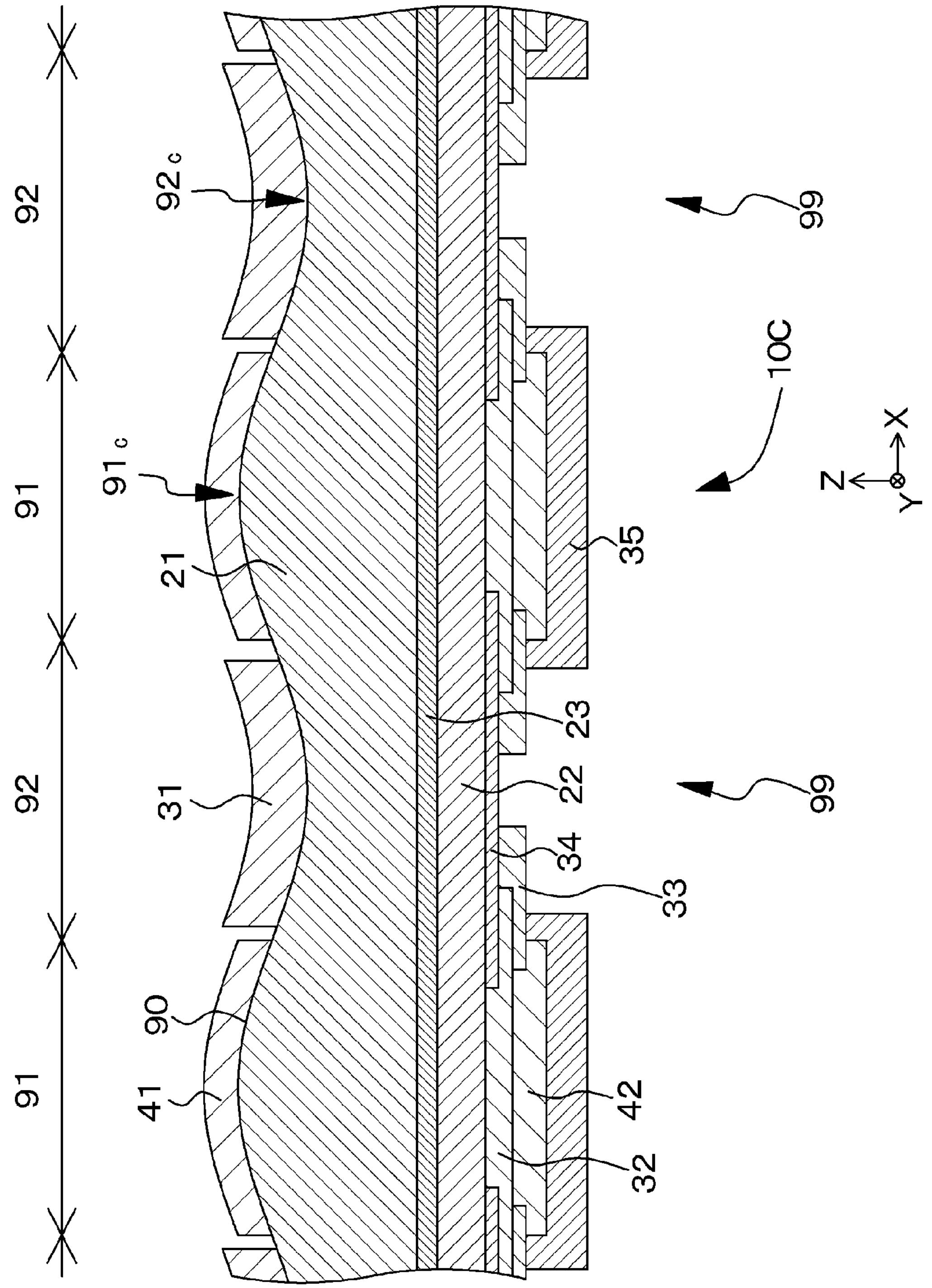
FIG. 28 is a schematic partial end view of the light emitting element array of Embodiment 5.

Embodiment 5 is a modification of Embodiments 1 to 4, and relates to a light emitting element according to a second aspect of the present disclosure as described later and a method for manufacturing the light emitting element array according to the second aspect of the present disclosure, and specifically, to a light emitting element of a first configuration, a light emitting element of a 1-A-th configuration, and a light emitting element of a second configuration. FIGS. 23, 24 (Modified Example-1), and 25 (Modified Example-2) are schematic partial end views of the light emitting element of Embodiment 5, the light emitting element included in the light emitting element array of Embodiment 5, and the light emitting element obtained by a method for manufacturing the light emitting element array of Embodiment 5 (hereinafter, these light emitting elements are collectively referred to as a light emitting element 10C), and FIGS. 26, 27, and 28 are schematic partial end views of the light emitting element array of Embodiment 5. Furthermore, FIGS. 29A, 29B, 30, 31, 32A, 32B, 33A, 33B, 33C, 34A, and 34B are schematic partial end views of the first compound semiconductor layer and the like for explaining the method for manufacturing the light emitting element array of Embodiment 5.

Note that, in FIGS. 32A, 32B, 33A, 33B, 33C, 34A, and 34B, and FIGS. 41A, 41B, 42A, 42B, 43A, 43B, 51A, 51B, 51C, 52A, 52B, and 52C, illustration of the active layer, the second compound semiconductor layer, the second light reflecting layer, and the like is omitted. In addition, in FIGS. 37, 39, 46, 47A, and 47B, a first portion of the base surface is indicated by a solid circle or oval for clarity, a central portion of a second portion of the base surface is indicated by a solid circle for clarity, and a top portion having an annular convex shape of the second portion of the base surface is indicated by a solid ring for clarity.

In addition, in the light emitting element of Embodiment 5 or light emitting elements of Embodiments 6 to 24 as described later, partition walls 24, 25A, 25B, 25C, and 25D are not illustrated.

Then, in order to prevent occurrence of above-described problem such as occurrence of damage, it is preferable that, in the light emitting element array, the first light reflecting layer is formed on the base surface positioned on the first surface side of the first compound semiconductor layer, the base surface extends in a peripheral region surrounded by a plurality of light emitting elements, and the base surface is uneven and differentiable. Note that such a light emitting element is referred to as the "light emitting element array according to the second aspect of the present disclosure" for convenience.

Alternatively, it is preferable that, in the light emitting element, the first light reflecting layer is formed on the base surface positioned on the first surface side of the first compound semiconductor layer, the base surface extends in the peripheral region, and the base surface is uneven and differentiable. Note that such a light emitting element is referred to as the "light emitting element according to the second aspect of the present disclosure" for convenience.

Here, in a case where the base surface is represented by z=f(x,y), a differential value for the base surface can be obtained by the following:

$$\partial z/\partial x=[\partial f(x,y)/\partial x]_y, \text{ and}$$

$$\partial z/\partial y=[\partial f(x,y)/\partial u]_x.$$

Furthermore, the method for manufacturing the light emitting element array according to the second aspect of the present disclosure includes:

- forming the second light reflecting layer on the second surface side of the second compound semiconductor layer after forming the stacked structure;
- forming a first sacrificial layer on the first portion of the base surface on which the first light reflecting layer is to be formed and then making a surface of the first sacrificial layer convex;
- forming a second sacrificial layer on the second portion of the base surface exposed between the first sacrificial layers and on the first sacrificial layer and then making a surface of the second sacrificial layer uneven;
- etching back the second sacrificial layer and the first sacrificial layer and further performing etching back from the base surface inward to form a convex portion in the first portion of the base surface and form at least a concave portion in the second portion of the base surface with respect to the second surface of the first compound semiconductor layer; and
- forming the first light reflecting layer on the first portion of the base surface. Note that such a light emitting element is referred to as a "method for manufacturing the light emitting element array according to a first aspect of the present disclosure" for convenience.

Alternatively, the method for manufacturing the light emitting element array according to the second aspect of the present disclosure includes:

- forming the second light reflecting layer on the second surface side of the second compound semiconductor layer after forming the stacked structure;
- forming the first sacrificial layer on the first portion of the base surface on which the first light reflecting layer is to be formed and then making the surface of the first sacrificial layer convex;
- etching back the first sacrificial layer and further performing etching back from the base surface inward to form a convex portion in the first portion of the base surface with respect to the second surface of the first compound semiconductor layer;
- forming the second sacrificial layer on the base surface and then etching back the second sacrificial layer and further performing etching back from the base surface inward to form a convex portion in the first portion of the base surface and form at least a concave portion in the second portion of the base surface with respect to the second surface of the first compound semiconductor layer; and forming the first light reflecting layer on the first portion of the base surface. Note that such a light emitting element is referred to as the "method for manufacturing the light emitting element array according to the second aspect of the present disclosure" for convenience.

In the light emitting element according to the second aspect of the present disclosure, the light emitting element included in the light emitting element array according to the second aspect of the present disclosure, and the light emitting elements obtained by the methods for manufacturing the light emitting element array according to the first and second aspects of the present disclosure (hereinafter, these light emitting elements may be collectively referred to as the "light emitting element according to the second aspect of the present disclosure and the like"), the first light reflecting layer is formed at the first portion of the base surface, but an extension portion of the first light reflecting layer is formed at the second portion of the base surface occupying the peripheral region in some cases, or the extension portion of the first light reflecting layer is not formed at the second portion in some cases.

The light emitting element according to the second aspect of the present disclosure and the like can have a form in which the base surface is smooth. Here, the term "smooth" is an analytical term. For example, in a case where a real variable function f(x) is differentiable for $a<x<b$, and f'(x) is continuous, it can be said that it is continuously differentiable in terms of words, and it is also expressed as being smooth.

The light emitting element according to the second aspect of the present disclosure and the like having the above-described preferable form can have a configuration in which the first portion of the base surface on which the first light reflecting layer is formed has an upward convex shape with respect to the second surface of the first compound semiconductor layer. The light emitting element according to the second aspect of the present disclosure and the like having such a configuration are referred to as the "light emitting element of the first configuration".

In the light emitting element of the first configuration, a boundary between the first portion and the second portion can be defined as:

(1) an outer peripheral portion of the first light reflecting layer in a case where the first light reflecting layer does not extend in the peripheral region, and (2) a portion where an inflection point is present in the base surface from the first portion to the second portion in a case where the first light reflecting layer extends in the peripheral region.

The light emitting element of the first configuration can have a configuration in which the second portion of the base surface occupying the peripheral region has a downward convex shape with respect to the second surface of the first compound semiconductor layer. The light emitting element according to the second aspect of the present disclosure and the like having such a configuration are referred to as the "light emitting element of the 1-A-th configuration". Then, a central portion of the first portion of the base surface of the light emitting element of the 1-A-th configuration can be positioned at a vertex (intersection portion) of a square lattice, or the central portion of the first portion of the base surface can be positioned at a vertex (intersection portion) of a regular triangular lattice. In the former case, the central portion of the second portion of the base surface can be positioned at a vertex of the square lattice, and in the latter case, the central portion of the second portion of the base surface can be positioned at a vertex of the regular triangular lattice.

In the light emitting element of the 1-A-th configuration, shapes of [the first portion/second portion from the peripheral portion to the central portion] include:

(A) [upward convex shape/downward convex shape];

(B) [upward convex shape/continuing from downward convex shape to line segment];

(C) [upward convex shape/continuing from upward convex shape to downward convex shape];

(D) [upward convex shape/continuing from upward convex shape to downward convex shape and line segment];

(E) [upward convex shape/continuing from line segment to downward convex shape]; and (F) [upward convex shape/continuing from line segment to downward convex shape and line segment]. Note that, in the light emitting element, the base surface may end at the central portion of the second portion.

Alternatively, the light emitting element of the first configuration can have a configuration in which the second portion of the base surface occupying the peripheral region has a downward convex shape and an upward convex shape extending from the downward convex shape toward a central portion of the peripheral region with respect to the second surface of the first compound semiconductor layer. The light emitting element according to the second aspect of the present disclosure and the like having such a configuration are referred to as a "light emitting element of a 1-B-th configuration". Further, the light emitting element of the 1-B-th configuration can have a configuration in which $LL_2>LL_1$, where a distance from the second surface of the first compound semiconductor layer to the central portion of the first portion of the base surface is $LL_1$, and a distance from the second surface of the first compound semiconductor layer to the central portion of the second portion of the base surface is $LL_2$, and $R_1>R_2$, where a radius of curvature of the central portion of the first portion of the base surface (that is, the radius of curvature of the first light reflecting layer) is $R_1$, and a radius of curvature of the central portion of the second portion of the base surface is $R_2$. Note that, although a value of $LL_2/LL_1$ is not limited, $1<LL_2/LL_1\leq 100$ can be satisfied, and although a value of $R_1/R_2$ is not limited, $1<R_1/R_2\leq 100$ can be satisfied.

In the light emitting element of the 1-B-th configuration having the above-described preferable configuration, the central portion of the first portion of the base surface can be positioned at a vertex (intersection portion) of a square lattice, and in this case, the central portion of the second portion of the base surface can be positioned at a vertex of the square lattice. Alternatively, the central portion of the first portion of the base surface can be positioned at a vertex of a regular triangular lattice, and in this case, the central portion of the second portion of the base surface can be positioned at a vertex of the regular triangular lattice.

In the light emitting element of the 1-B-th configuration, shapes of [the first portion/second portion from the peripheral portion to the central portion] include:

(A) [upward convex shape/continuing from downward convex shape to upward convex shape];

(B) [upward convex shape/continuing from upward convex shape to downward convex shape and upward convex shape]; and (C) [upward convex shape/[continuing from line segment to downward convex shape and upward convex shape].

Alternatively, the light emitting element of the first configuration can have a configuration in which the second portion of the base surface occupying the peripheral region has an annular convex shape surrounding the first portion of the base surface and a downward convex shape extending from the annular convex shape toward the first portion of the base surface with respect to the second surface of the first compound semiconductor layer. The light emitting element according to the second aspect of the present disclosure and the like having such a configuration are referred to as a "light emitting element of a 1-C-th configuration".

Further, the light emitting element of the 1-C-th configuration can have a configuration in which $LL_2'>LL_1$, where the distance from the second surface of the first compound semiconductor layer to the central portion of the first portion of the base surface is $LL_1$, and a distance from the second surface of the first compound semiconductor layer to a top portion of the annular convex shape of the second portion of the base surface is $LL_2'$, and $R_1>R_2'$, where the radius of curvature of the central portion of the first portion of the base surface (that is, the radius of curvature of the first light reflecting layer) is $R_1$, and a radius of curvature of the top portion of the annular convex shape of the second portion of the base surface is $R_2'$. Note that, although a value of $LL_2'/LL_1$ is not limited, $1<LL_2'/LL_1\leq 100$ can be satisfied, and although a value of $R_1/R_2'$ is not limited, $1<R_1/R_2'\leq 100$ can be satisfied.

In the light emitting element of the 1-C-th configuration, shapes of [the first portion/second portion from the peripheral portion to the central portion] include:

(A) [upward convex shape/continuing from downward convex shape to upward convex shape and downward convex shape];

(B) [upward convex shape/continuing from downward convex shape to upward convex shape, downward convex shape, and line segment];

(C) [upward convex shape/continuing from upward convex shape to downward convex shape, upward convex shape, and downward convex shape];

(D) [upward convex shape/continuing from upward convex shape to downward convex shape, upward convex shape, and line segment];

(E) [upward convex shape/continuing from line segment to downward convex shape, upward convex shape, and downward convex shape]; and (F) [upward convex shape/continuing from line segment to downward convex shape, upward convex shape, downward convex shape, and line segment]. Note that, in the light emitting element, the base surface may end at the central portion of the second portion.

In the light emitting element of the 1-B-th configuration or the light emitting element of the 1-C-th configuration having the above-described preferable configuration, a bump may be arranged at a portion on the second surface side of the second compound semiconductor layer facing a convex portion in the second portion of the base surface. Alternatively, in the light emitting element of the 1-A-th configuration having the above-described preferable configuration, the bump may be arranged at a portion on the second surface side of the second compound semiconductor layer facing the central portion of the first portion of the base surface. Examples of the bump can include a gold (Au) bump, a solder bump, and an indium (In) bump, and a method for arranging the bump can be a known method. Specifically, the bump is provided on a second pad electrode (as described later) provided on a second electrode, or is provided on an extension portion of the second pad electrode.

Furthermore, in the light emitting element according to the second aspect of the present disclosure and the like having the above-described preferable form and configuration, it is desirable that the radius $R_1$ of curvature of the central portion of the first portion of the base surface is $1\times10^{-5}$ m or more, preferably, $3\times10^{-5}$ m or more. Moreover, the radius $R_1$ of curvature may be $3\times10^{-4}$ m or more. However, in any case, a value of $R_1$ is larger than a value of the resonator length $L_{OR}$.

Furthermore, it is desirable that the radius $R_2$ of curvature of the central portion of the second portion of the base surface is $1\times10^{-6}$ m or more, preferably, $3\times10^{-6}$ m or more, and more preferably, $5\times10^{-6}$ m or more, and it is desirable that the radius $R_2'$ of curvature of the top portion of the annular convex shape of the second portion of the base surface is $1\times10^{-6}$ m or more, preferably, $3\times10^{-6}$ m or more, and more preferably, $5\times10^{-6}$ m or more.

In the light emitting element according to the second aspect of the present disclosure and the like having the above-described preferable form and configuration, a figure drawn by the first portion of the base surface in a case where the base surface is cut along a virtual plane including the stacking direction of the stacked structure can be a part of a circle, a part of a parabola, a part of a sine curve, a part of an ellipse, or a part of a catenary curve. In some cases, the figure is not strictly a part of a circle, is not strictly a part of a parabola, is not strictly a part of a sine curve, is not strictly a part of an ellipse, or is not strictly a part of a catenary curve. That is, a case where the figure is substantially a part of a circle, a case where the figure is substantially a part of a parabola, a case where the figure is substantially a part of a sine curve, a case where the figure is substantially a part of an ellipse, and a case where the figure is substantially a part of a catenary curve are also included in a case where "the figure is a part of a circle, is a part of a parabola, is a part of a sine curve, is substantially a part of an ellipse, or is substantially a part of a catenary curve". A part of these curves may be replaced by a line segment. The figure drawn by the base surface can be obtained by measuring the shape of the base surface with a measuring instrument and analyzing the obtained data on the basis of the least square method.

Furthermore, in the light emitting element according to the second aspect of the present disclosure and the like having the above-described preferable form and configuration can have a form in which the first surface of the first compound semiconductor layer constitutes the base surface. The light emitting element having such a configuration is referred to as the "light emitting element of the second configuration" for convenience. Alternatively, a configuration, in which a compound semiconductor substrate is disposed between the first surface of the first compound semiconductor layer and the first light reflecting layer, and the base surface is constituted by a surface of the compound semiconductor substrate, is possible. The light emitting element having such a configuration is referred to as a "light emitting element of a third configuration" for convenience. In this case, for example, the compound semiconductor substrate can be formed using a GaN substrate. As the GaN substrate, any of a polar substrate, a semipolar substrate, and a nonpolar substrate may be used. As a thickness of the compound semiconductor substrate, $5\times10^{-5}$ m to $1\times10^{-4}$ m can be exemplified, but the thickness is not limited to such a value. Alternatively, a configuration, in which a base material is disposed between the first surface of the first compound semiconductor layer and the first light reflecting layer, or the compound semiconductor substrate and the base material are disposed between the first surface of the first compound semiconductor layer and the first light reflecting layer, and the base surface is constituted by a surface of the base material, is possible. The light emitting element having such a configuration is referred to as a "light emitting element of a fourth configuration" for convenience. Examples of a material of the base material can include a transparent dielectric material such as $TiO_2$, $Ta_2O_5$, or $SiO_2$, a silicone-based resin, and an epoxy-based resin.

Hereinafter, the light emitting element 10C of Embodiment 5 will be specifically described.

In the light emitting element 10C of Embodiment 5, the base surface 90 extends in a peripheral region 99, and the base surface 90 has an uneven shape and is differentiable in the light emitting elements 10A and 10B described in Embodiments 1 to 4. That is, in the light emitting element 10C of Embodiment 5, the base surface 90 is analytically smooth. Note that the first light reflecting layer 41 is formed on the base surface 90 positioned on the first surface side of the first compound semiconductor layer 21, and the second light reflecting layer 42 is formed on the second surface side of the second compound semiconductor layer 22 and has a flat shape, similarly to the light emitting elements 10A and 10B described in Embodiments 1 to 4. Furthermore, the partition wall 24 described in Embodiment 1 or the partition walls 25A, 25B, 25C, and 25D described in Embodiment 2 are formed. However, for simplification of the drawings, illustration of the partition walls 24, 25A, 25B, 25C, and 25D is omitted.

In addition, the light emitting element array of Embodiment 5 includes a plurality of light emitting elements arranged, and each light emitting element is implemented by the light emitting element 10C of Embodiment 5 described above. Note that the base surface 90 extends in the peripheral region 99.

Then, a first portion 91 of the base surface 90 on which the first light reflecting layer 41 is formed has an upward convex shape with respect to the second surface 21*b* of the first compound semiconductor layer 21, and a second portion 92 of the base surface 90 occupying the peripheral region 99 has a downward convex shape with respect to the second surface 21*b* of the first compound semiconductor layer 21. A central portion $91_c$ of the first portion 91 of the base surface 90 is positioned at a vertex (intersection portion) of a square lattice (see, for example, FIGS. 5, 6, 9, and 11 for a disposition state), or the central portion $91_c$ of the first portion 91 of the base surface 90 is positioned at a vertex (intersection portion) of a regular triangular lattice (see, for example, FIGS. 7, 8, 10, and 12 for a disposition state).

Although the first light reflecting layer 41 is formed at the first portion 91 of the base surface 90, in some cases, an extension portion of the first light reflecting layer 41 is formed at the second portion 92 of the base surface 90 occupying the peripheral region 99, or the extension portion of the first light reflecting layer 41 is not formed at the second portion 92. In Embodiment 5, the extension portion of the first light reflecting layer 41 is not formed at the second portion 92 of the base surface 90 occupying the peripheral region 99.

In the light emitting element 10C of Embodiment 5, a boundary $90_{bd}$ between the first portion 91 and the second portion 92 can be defined as:

(1) an outer peripheral portion of the first light reflecting layer 41 in a case where the first light reflecting layer 41 does not extend in the peripheral region 99, and (2) a portion where an inflection point is present in the base surface 90 from the first portion 91 to the second portion 92 in a case where the first light reflecting layer 41 extends in the peripheral region 99. Here, the light emitting element 10C of Embodiment 5 specifically corresponds to (1).

Furthermore, in the light emitting element 10C of Embodiment 5, shapes of [the first portion 91/second portion 92 from the peripheral portion to the central portion] include:

(A) [upward convex shape/downward convex shape];

(B) [upward convex shape/continuing from downward convex shape to line segment];

(C) [upward convex shape/continuing from upward convex shape to downward convex shape];

(D) [upward convex shape/continuing from upward convex shape to downward convex shape and line segment];

(E) [upward convex shape/continuing from line segment to downward convex shape]; and (F) [upward convex shape/continuing from line segment to downward convex shape and line segment], and specifically, the light emitting element 10C of Embodiment 5 corresponds to (A).

In the light emitting element 10C of Embodiment 5, the first surface 21*a* of the first compound semiconductor layer 21 constitutes the base surface 90. A figure drawn by the first portion 91 of the base surface 90 in a case where the base surface 90 is cut along a virtual plane (for example, the XZ plane in the illustrated example) including the stacking direction of the stacked structure 20 is differentiable, and more specifically, can be a part of a circle, a part of a parabola, a sine curve, a part of an ellipse, or a part of a catenary curve, or a combination of these curves, or a part of these curves may be replaced with a line segment. A figure drawn by the second portion 92 is also differentiable, and more specifically, can be a part of a circle, a part of a parabola, a part of a sine curve, a part of an ellipse, a part of a catenary curve, or a combination of these curves, or a part of these curves may be replaced with a line segment. Furthermore, the boundary between the first portion 91 and the second portion 92 of the base surface 90 is also differentiable.

In the light emitting element array, it is desirable that a formation pitch of the light emitting elements is 3 μm or more and 50 μm or less, preferably, 5 μm or more and 30 μm or less, and more preferably, 8 μm or more and 25 μm or less. Furthermore, a radius $R_1$ of curvature of the central portion $91_c$ of the first portion 91 of the base surface 90 is desirably $1\times10^{-5}$ m or more. A resonator length $L_{OR}$ preferably satisfies $1\times10^{-5}\ \mathrm{m} \leq L_{OR}$. In the light emitting element array of Embodiment 5 in which the disposition state is similar to the arrangement illustrated in FIGS. 5 and 7, parameters of the light emitting element 10C are similar to those in Table 1 below. Note that a diameter of the first light reflecting layer 41 is indicated by $D_1$, a height of the first portion 91 is indicated by $H_1$, and a radius of curvature of a central portion $92_c$ of the second portion 92 of the base surface 90 is indicated by $R_2$. Here, the height $H_1$ of the first portion 91 is expressed as $H_1=LL_1-LL_2$, where a distance from the second surface 21*b* of the first compound semiconductor layer 21 to the central portion $91_c$ of the first portion 91 of the base surface 90 is $LL_1$, and a distance from the second surface 21*b* of the first compound semiconductor layer 21 to the central portion $92_c$ of the second portion 92 of the base surface 90 is $LL_2$. Furthermore, specifications of the light emitting element 10C of Embodiment 5 in which the disposition state is similar to those illustrated in FIGS. 5 and 7 are shown in the following Tables 2 and 3. Note that the "number of light emitting elements" is the number of light emitting elements included in one light emitting element array.

As illustrated in FIGS. 23 and 26, the second electrode 32 is common to the light emitting elements 10C included in the light emitting element array, and the second electrode 32 is connected to an external circuit or the like via a first pad electrode (not illustrated). The first electrode 31 is also common to the light emitting elements 10C included in the light emitting element array, and is connected to an external circuit or the like via the first pad electrode (not illustrated). In the light emitting element 10C illustrated in FIGS. 23 and 26, light may be emitted to the outside via the first light reflecting layer 41, or light may be emitted to the outside via the second light reflecting layer 42.

Alternatively, as illustrated in FIGS. 24 and 27, the second electrode 32 is individually formed in the light emitting element 10C included in the light emitting element array, and is connected to an external circuit or the like via the second pad electrode 33. The first electrode 31 is common to the light emitting elements 10C included in the light emitting element array, and is connected to an external circuit or the like via the first pad electrode (not illustrated). In the light emitting element 10C illustrated in FIGS. 24 and 27, light may be emitted to the outside via the first light reflecting layer 41, or light may be emitted to the outside via the second light reflecting layer 42.

Figure 25:
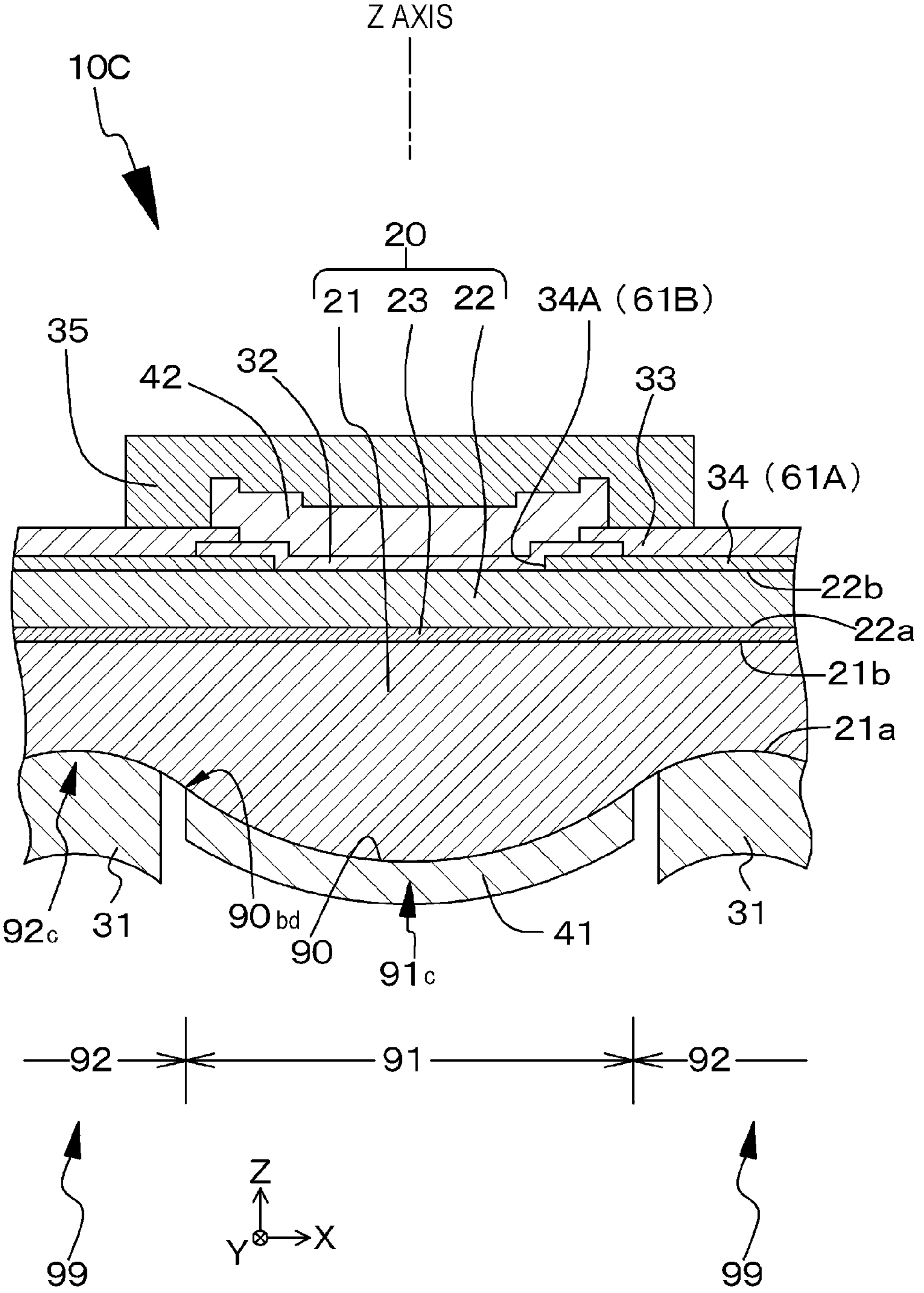
FIG. 25 is a schematic partial end view of a modified example (Modified Example-2) of the light emitting element of Embodiment 5.

Alternatively, as illustrated in FIGS. 25 and 28, the second electrode 32 is individually formed in the light emitting element 10C included in the light emitting element array, the bump 35 is formed on the second pad electrode 33 formed on the second electrode 32, and connection to an external circuit or the like is made via the bump 35. The first electrode 31 is common to the light emitting elements 10C included in the light emitting element array, and is connected to an external circuit or the like via the first pad electrode (not illustrated). The bump 35 is arranged at a portion on the second surface side of the second compound semiconductor layer 22 facing the central portion $91_c$ of the first portion 91 of the base surface 90, and covers the second light reflecting layer 42. Examples of the bump 35 can include a gold (Au) bump, a solder bump, and an indium (In) bump, and a method for arranging the bump 35 can be a known method. In the light emitting element 10C illustrated in FIGS. 25 and 28, light is emitted to the outside via the first light reflecting layer 41. Note that the bump 35 may be provided in the light emitting element 10C illustrated in FIG. 23. Examples of a shape of the bump 35 can include a cylindrical shape, an annular shape, and a hemispherical shape.

TABLE 1

| | Disposition state in FIG. 5 | Disposition state in FIG. 7 |
|---|---|---|
| Formation pitch | 25 μm | 20 μm |
| Radius $R_1$ of curvature | 100 μm | 200 μm |
| Diameter $D_1$ | 20 μm | 15 μm |
| Height $H_1$ | 2 μm | 2 μm |
| Radius $R_2$ of curvature | 2 μm | 3 μm |

TABLE 2

| Disposition state in FIG. 5 | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |
| Resonator length $L_{OR}$ | 25 μm |
| Oscillation wavelength emission wavelength) $\lambda_0$ | 445 nm |
| Number of light emitting elements | 100 × 100 |

TABLE 3

| Disposition state in FIG. 7 | |
|---|---|
| Second light reflecting layer 42 | $SiO_2/SiN$ (9 pairs) |
| Second electrode 32 | ITO (thickness: 22 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 488 nm |
| Number of light emitting elements | 1000 × 1000 |

Hereinafter, the method for manufacturing the light emitting element array of Embodiment 5 will be described with reference to FIGS. 29A, 29B, 30, 31, 32A, 32B, 33A, 33B, 33C, 34A, and 34B which are schematic partial end views of the first compound semiconductor layer and the like.

First, after the stacked structure 20 is formed, the second light reflecting layer 42 is formed on the second surface side of the second compound semiconductor layer 22.

[Step-500]

Specifically, the stacked structure 20 which is formed using a GaN-based compound semiconductor and in which the first compound semiconductor layer 21 having the first surface 21*a* and the second surface 21*b* opposing the first surface 21*a*, the active layer (light emitting layer) 23 facing the second surface 21*b* of the first compound semiconductor layer 21, and the second compound semiconductor layer 22 having the first surface 22*a* facing the active layer 23 and the second surface 22*b* opposing the first surface 22*a* are stacked is formed on a second surface 11*b* of a compound semiconductor substrate 11 having a thickness of about 0.4 mm. More specifically, the stacked structure 20 can be obtained by sequentially forming the first compound semiconductor layer 21, the active layer 23, and the second compound semiconductor layer 22 on the second surface 11*b* of the compound semiconductor substrate 11 on the basis of an epitaxial growth method by a known MOCVD method (see FIG. 29A).

[Step-510]

Figure 29A:
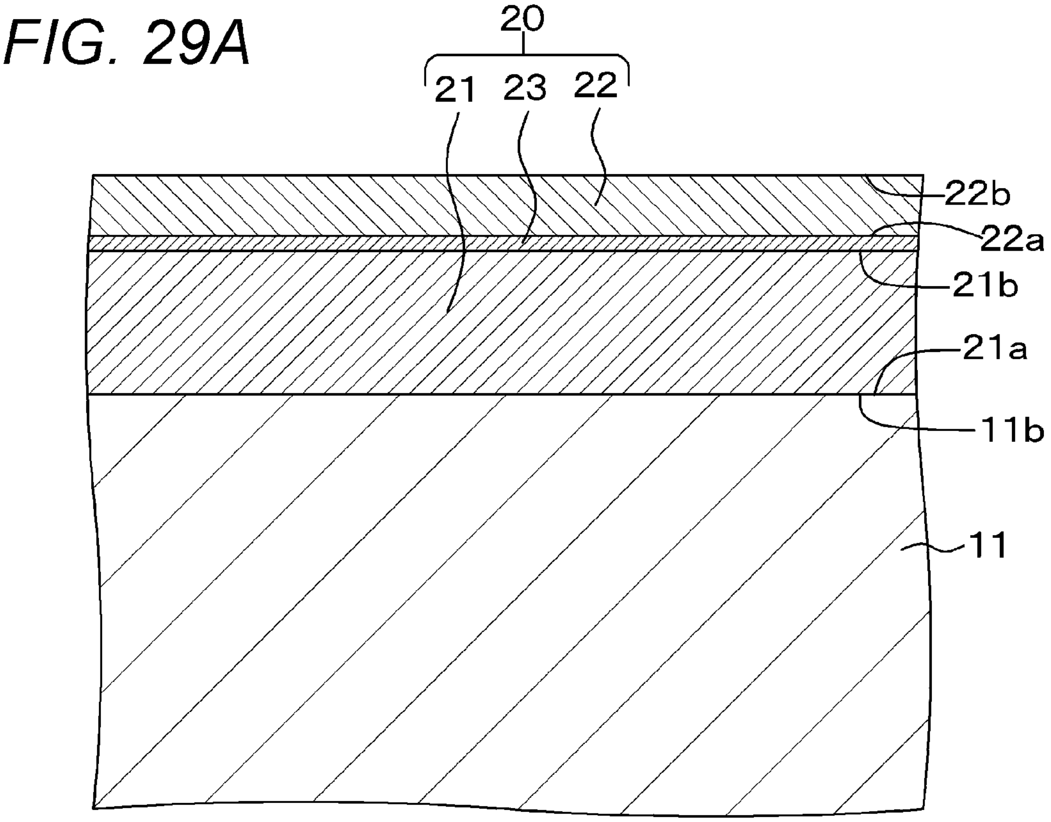
FIGS. 29A and 29B are schematic partial end views of a stacked structure and the like for explaining a method for manufacturing the light emitting element of Embodiment 5.
Figure 29B:
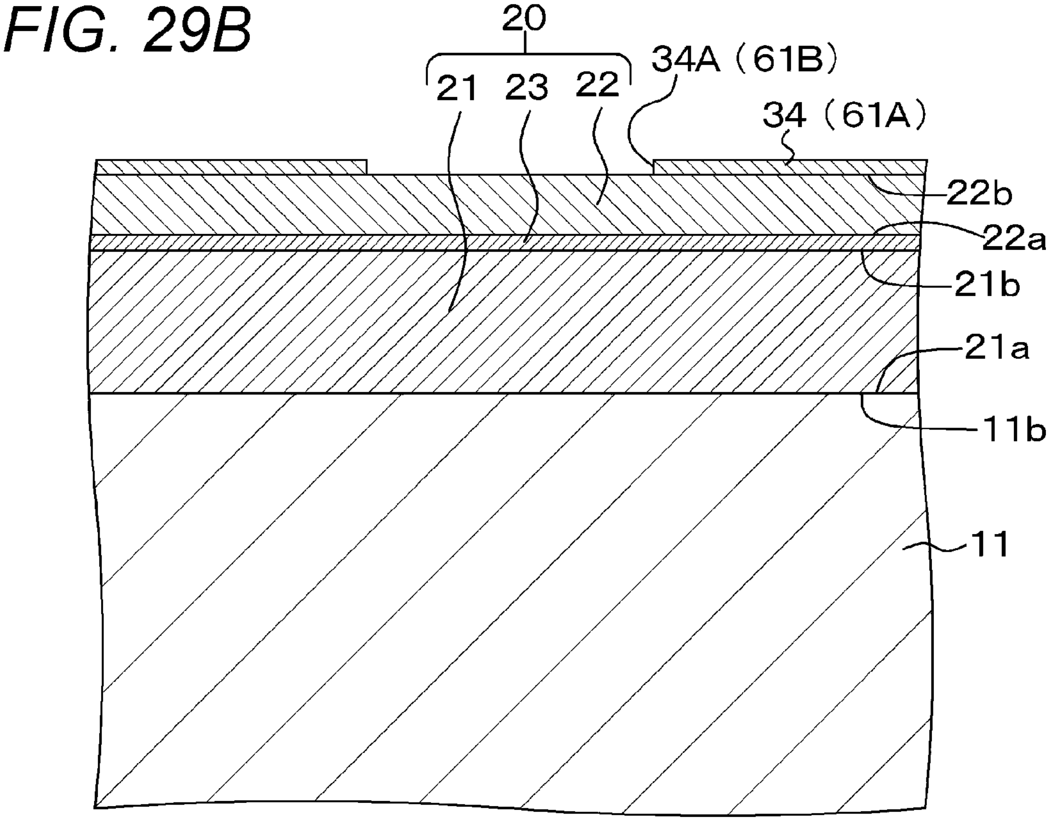
Figure 30:
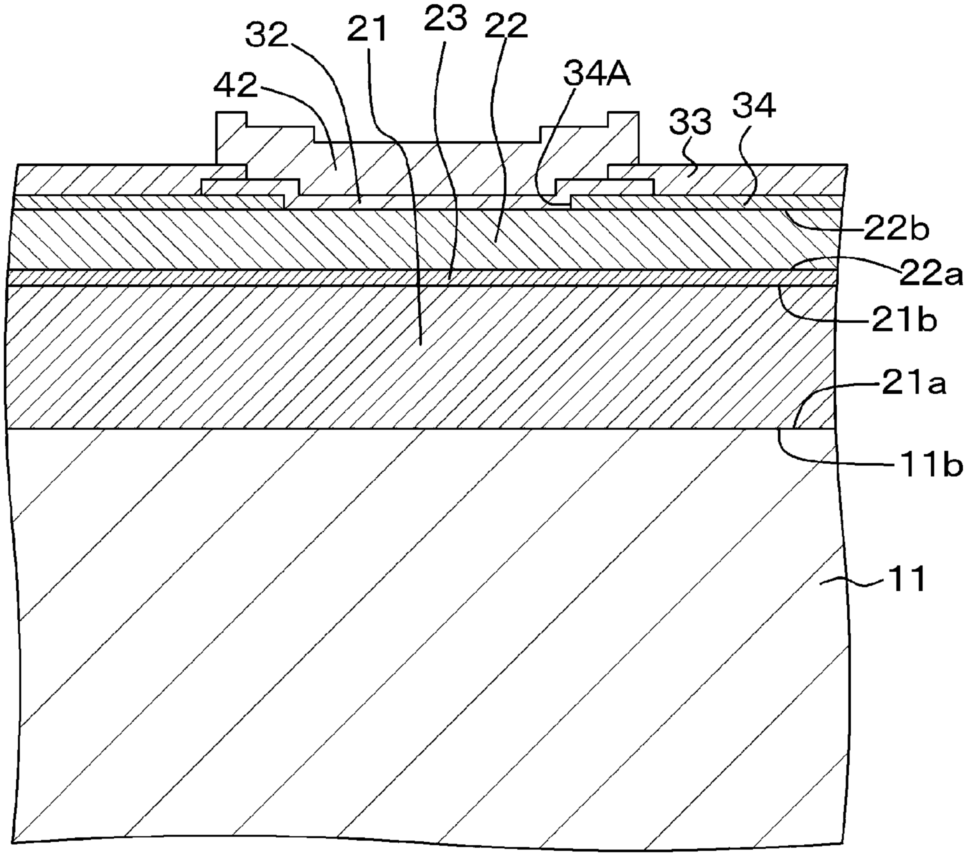
FIG. 30 is a schematic partial end view of the stacked structure and the like for explaining the method for manufacturing the light emitting element of Embodiment 5, continued from FIG. 29B.

Next, the insulating layer (current constriction layer) 34 having the opening 34A and formed using $SiO_2$ is formed on the second surface 22*b* of the second compound semiconductor layer 22 on the basis of a combination of a film forming method such as a CVD method, a sputtering method, or a vacuum vapor deposition method and a wet etching method or a dry etching method (see FIG. 29B). The current constriction region (a current injection region 61A and a current non-injection region 61B) is defined by the insulating layer 34 having the opening 34A. That is, the current injection region 61A is defined by the opening 34A.

[Step-520]

Thereafter, the second electrode 32 and the second light reflecting layer 42 are formed on the second compound semiconductor layer 22. Specifically, the second electrode 32 is formed on the second surface 22*b* of the second compound semiconductor layer 22 exposed at a bottom surface of the opening 34A (current injection region 61A) and on the insulating layer 34, for example, on the basis of a lift-off method, and further, as desired, the second pad electrode 33 is formed on the basis of a combination of a film forming method such as a sputtering method or a vacuum vapor deposition method and a patterning method such as a wet etching method or a dry etching method. Next, the second light reflecting layer 42 is formed on the second electrode 32 and on the second pad electrode 33 on the basis of a combination of a film forming method such as a sputtering method or a vacuum vapor deposition method and a patterning method such as a wet etching method or a dry etching method. The second light reflecting layer 42 on the second electrode 32 has a flat shape. In this way, the structure illustrated in FIG. 30 can be obtained. Thereafter, as desired, the bump 35 may be arranged at a portion on the second surface side of the second compound semiconductor layer 22 facing the central portion $91_c$ of the first portion 91 of the base surface 90. Specifically, the bump 35 may be formed on the second pad electrode 33 (see FIGS. 25 and 26B) formed on the second electrode 32 so as to cover the second light reflecting layer 42, and the second electrode 32 is connected to an external circuit or the like via the bump 35.

[Step-530]

Figure 31:
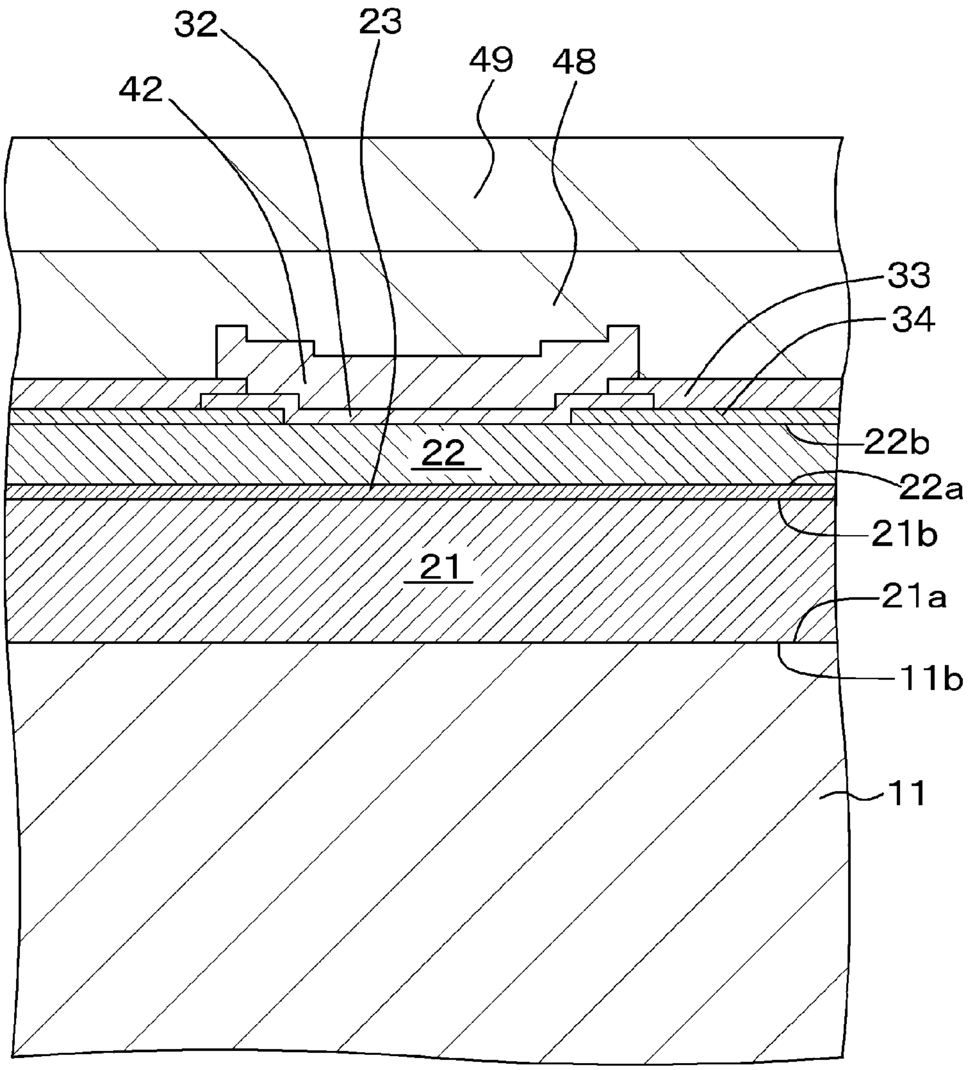
FIG. 31 is a schematic partial end view of the stacked structure and the like for explaining the method for manufacturing the light emitting element of Embodiment 5, continued from FIG. 30.

Next, the second light reflecting layer 42 is fixed to a support substrate 49 via a bonding layer 48 (see FIG. 31). Specifically, the second light reflecting layer 42 (or the bump 35) is fixed to the support substrate 49 formed using a sapphire substrate by using the bonding layer 48 formed using an adhesive.

[Step-540]

Next, the compound semiconductor substrate 11 is thinned on the basis of a mechanical polishing method or a CMP method, and etching is further performed to remove the compound semiconductor substrate 11.

[Step-550]

Figure 32A:
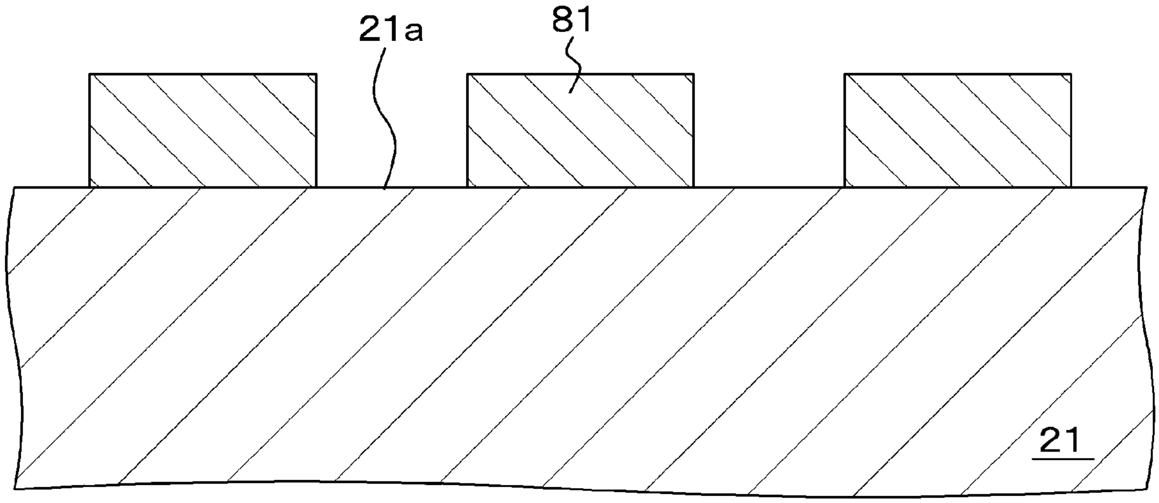
FIGS. 32A and 32B are schematic partial end views of a first compound semiconductor layer and the like for explaining the method for manufacturing the light emitting element array of Embodiment 5, continued from FIG. 31.
Figure 32B:
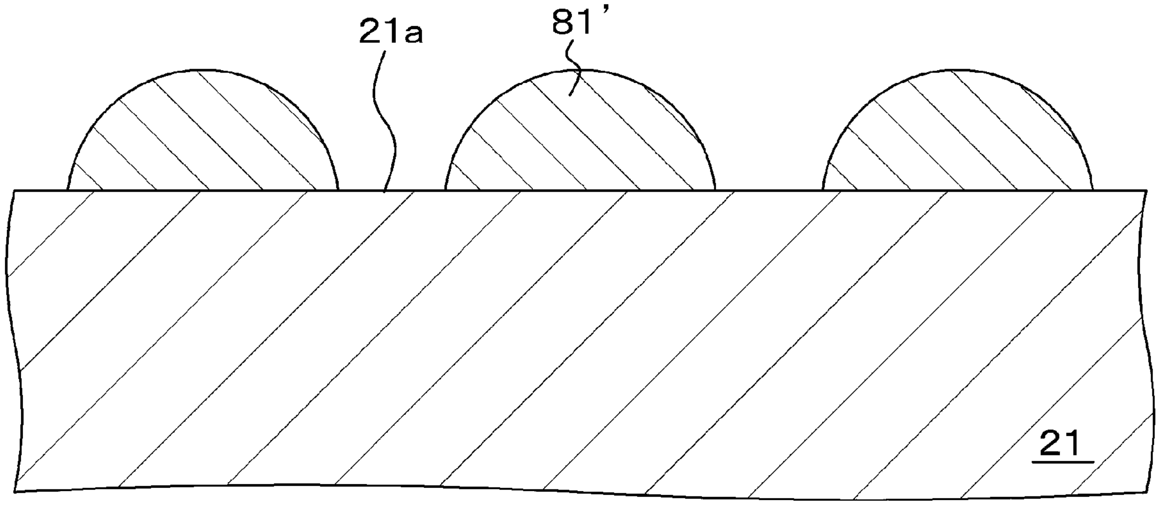

Thereafter, a first sacrificial layer 81 is formed on the first portion 91 of the base surface 90 (specifically, the first surface 21*a* of the first compound semiconductor layer 21) on which the first light reflecting layer 41 is to be formed, and then a surface of the first sacrificial layer is made convex. Specifically, the first sacrificial layer 81 illustrated in FIG. 32A is obtained by forming a first resist material layer on the first surface 21*a* of the first compound semiconductor layer 21 and patterning the first resist material layer so as to leave the first resist material layer on the first portion 91, and then the structure illustrated in FIG. 32B can be obtained by performing heating treatment on the first sacrificial layer 81. Next, a surface of a first sacrificial layer 81' is subjected to ashing treatment (plasma irradiation treatment) to modify the surface of the first sacrificial layer 81', thereby preventing occurrence of damage, deformation, or the like of the first sacrificial layer 81' when a second sacrificial layer 82 is formed in the next step.

[Step-560]

Figure 33A:
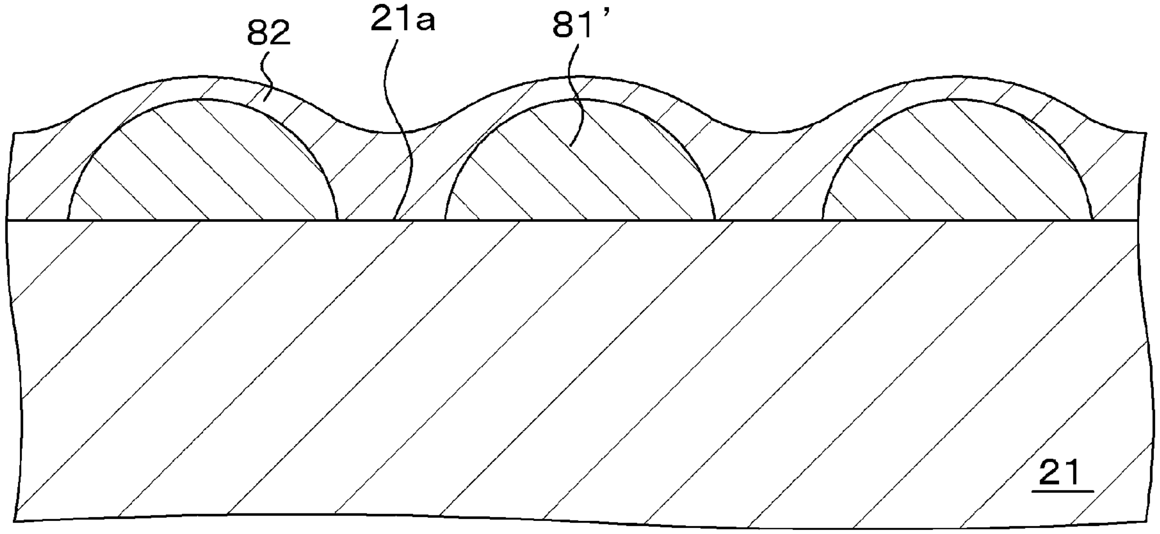
FIGS. 33A, 33B, and 33C are schematic partial end views of the first compound semiconductor layer and the like for explaining the method for manufacturing the light emitting element array of Embodiment 5, continued from FIG. 32B.
Figure 33B:
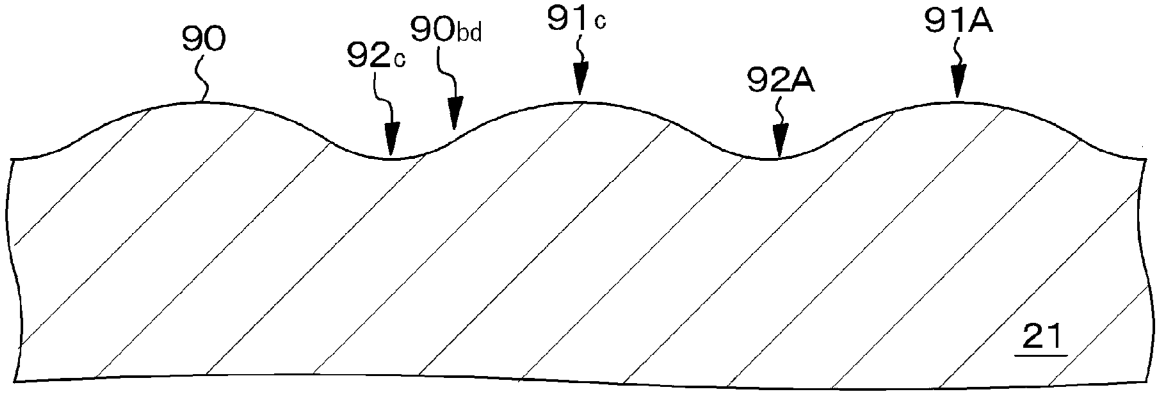
Figure 33C:
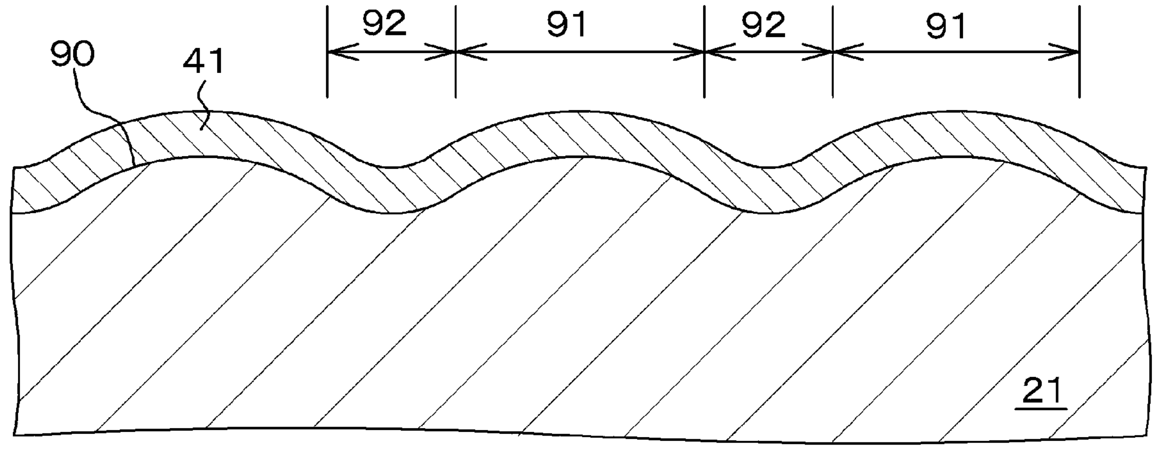
Figure 34A:
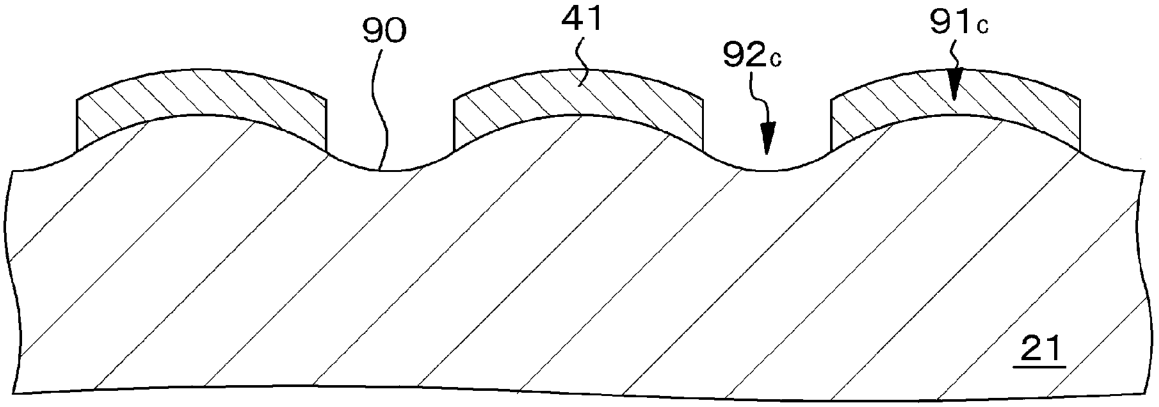
FIGS. 34A and 34B are schematic partial end views of the first compound semiconductor layer and the like for explaining the method for manufacturing the light emitting element array of Embodiment 5, continued from FIG. 33C.
Figure 34B:
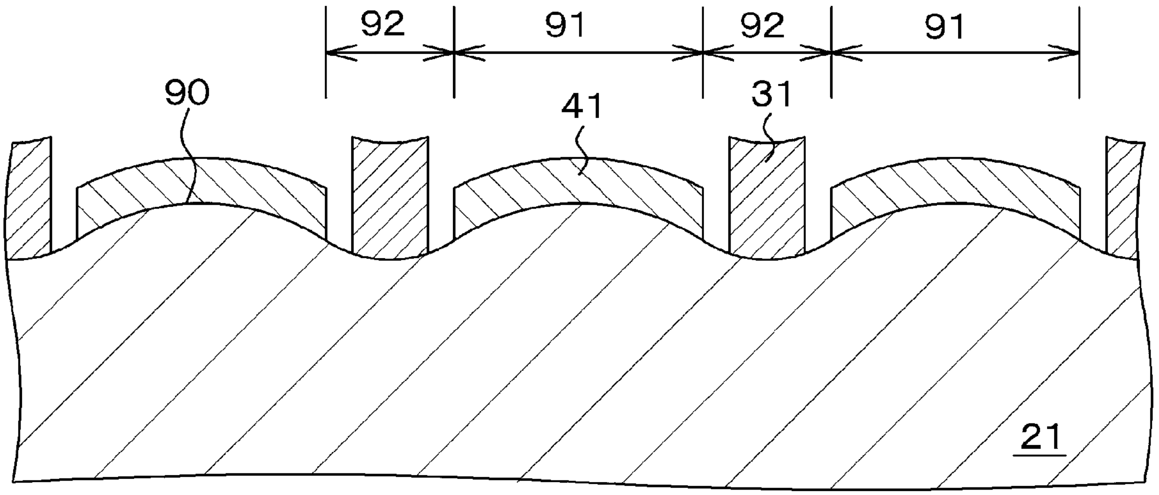

Next, the second sacrificial layer 82 is formed on the second portion 92 of the base surface 90 exposed between the first sacrificial layers 81' and on the first sacrificial layer 81' to make a surface of the second sacrificial layer 82 uneven (see FIG. 33A). Specifically, the second sacrificial layer 82 formed using a second resist material layer having an appropriate thickness is formed on the entire surface. Note that an average thickness of the second sacrificial layer 82 is 2 μm in the example in which the disposition state is illustrated in FIG. 5, and the average thickness of the second sacrificial layer 82 is 5 μm in the example in which the disposition state is illustrated in FIG. 7.

In a case where it is necessary to further increase the radius $R_1$ of curvature of the first portion 91 of the base surface 90, [Step-550] and [Step-560] may be repeated.

The material of the first sacrificial layer 81 and the second sacrificial layer 82 is not limited to the resist material, and it is sufficient if an appropriate material for the first compound semiconductor layer 21, such as an oxide material (for example, $SiO_2$, SiN, or $TiO_2$), a semiconductor material (for example, Si, GaN, InP, or GaAs), or a metal material (for example, Ni, Au, Pt, Sn, Ga, In, or Al), is selected. In addition, as a resist material having an appropriate viscosity is used as the resist material of the first sacrificial layer 81 and the second sacrificial layer 82, and as the thickness of the first sacrificial layer 81, the thickness of the second sacrificial layer 82, a diameter of the first sacrificial layer 81', and the like are appropriately set and selected, a value of the radius of curvature of the base surface 90 and a shape of the unevenness of the base surface 90 (for example, the diameter $D_1$ and the height $H_1$) can be set to a desired value and shape.

[Step-570]

Thereafter, the second sacrificial layer 82 and the first sacrificial layer 81' are etched back, and etching back is further performed from the base surface 90 inward (that is, from the first surface 21*a* of the first compound semiconductor layer 21 to the inside of the first compound semiconductor layer 21), whereby a convex portion 91A is formed in the first portion 91 of the base surface 90 and at least a concave portion (a concave portion 92A in Embodiment 5) is formed in the second portion 92 of the base surface 90 with respect to the second surface 21*b* of the first compound semiconductor layer 21. In this way, the structure illustrated in FIG. 33B can be obtained. The etching back can be performed on the basis of a dry etching method such as an RIE method, or can be performed on the basis of a wet etching method using, for example, a hydrochloric acid, a nitric acid, a hydrofluoric acid, or a phosphoric acid, or a mixture thereof.

[Step-580]

Next, the first light reflecting layer 41 is formed on the first portion 91 of the base surface 90. Specifically, after the first light reflecting layer 41 is formed on the entire surface of the base surface 90 on the basis of a film forming method such as a sputtering method or a vacuum vapor deposition method (see FIG. 33C), the first light reflecting layer 41 is patterned to obtain the first light reflecting layer 41 on the first portion 91 of the base surface 90 (see FIG. 34A). Thereafter, the first electrode 31 common to the respective light emitting elements is formed on the second portion 92 of the base surface 90 (see FIG. 34B). As described above, the light emitting element array or the light emitting element 10C of Embodiment 5 can be obtained. In a case where the first electrode 31 protrudes further than the first light reflecting layer 41, the first light reflecting layer 41 can be protected.

[Step-590]

Thereafter, the support substrate 49 is peeled off, and the light emitting element array is individually separated. Then, the light emitting element array is only required to be electrically connected to an external electrode or circuit (a circuit for driving the light emitting element array). Specifically, it is sufficient if the first compound semiconductor layer 21 is connected to an external circuit or the like via the first electrode 31 and the first pad electrode (not illustrated), and the second compound semiconductor layer 22 is connected to an external circuit or the like via the second pad electrode 33 or the bump 35. Next, the light emitting element array of Embodiment 5 is completed by packaging or sealing.

Note that, for example, it is sufficient if the partition walls 25A, 25B, 25C, and 25D are formed between [Step-510] and [Step-520] or between [Step-520] and [Step-530], the partition wall 24 is formed between [Step-540] and [Step-550], the partition wall 24 is formed between [Step-570] and [Step-580], or the partition wall 24 is formed between [Step-580] and [Step-590].

In the light emitting element of Embodiment 5, since the base surface has an uneven shape and is differentiable, in a case where a strong external force is applied to the light emitting element for some reason, it is possible to reliably avoid a problem that stress concentrates on the rising portion of the convex portion, and there is no possibility that the first compound semiconductor layer or the like is damaged. In particular, the light emitting element array is connected to and bonded to an external circuit or the like using the bump, and it is necessary to apply a large load (for example, about 50 MPa) to the light emitting element array at the time of bonding. In the light emitting element array of Embodiment 5, even in a case where such a large load is applied, there is no possibility that the light emitting element array is damaged. In addition, since the base surface has an uneven shape, generation of stray light is further suppressed, and occurrence of optical crosstalk between the light emitting elements can be more reliably prevented.

In a case where the light emitting elements are arranged in the light emitting element array, a footprint diameter of the first sacrificial layer cannot exceed the formation pitch of the light emitting elements. Therefore, in order to decrease the formation pitch in the light emitting element array, it is necessary to decrease the footprint diameter. Further, the radius $R_1$ of curvature of the central portion of the first portion of the base surface has a positive correlation with the footprint diameter. That is, the footprint diameter decreases as the formation pitch decreases, and as a result, the radius $R_1$ of curvature decreases. For example, the radius $R_1$ of curvature of about 30 μm is reported for the footprint diameter of 24 μm. In addition, a radiation angle of light emitted from the light emitting element has a negative correlation with the footprint diameter. That is, the footprint diameter decreases as the formation pitch decreases, and as a result, the radius $R_1$ of curvature decreases, and a far field pattern (FFP) is expanded. The radiation angle may be several degrees or more at the radius $R_1$ of curvature of less than 30 μm. Depending on an application field of the light emitting element array, light emitted from the light emitting element may be required to have a small radiation angle of 2 to 3 degrees or less.

In Embodiment 5, since the first portion is formed in the base surface on the basis of the first sacrificial layer and the second sacrificial layer, a large radius $R_1$ of curvature can be achieved even in a case where the light emitting elements are arranged at a small formation pitch. Therefore, the radiation angle of the light emitted from the light emitting element can be set to a small radiation angle of 2 to 3 degrees or less or to be as small as possible, such that a light emitting element having a small FFP can be provided, and an increase in light output of the light emitting element and efficiency improvement can be achieved.

In addition, since the height (thickness) of the first portion can be decreased (thinned), when the light emitting element array is connected to and bonded to an external circuit or the like using the bump, a cavity (void) is less likely to be generated in the bump, and thermal conductivity can be improved.

In addition, in the light emitting elements of Embodiments 1 to 24, since the first light reflecting layer also functions as a concave mirror, light diffracted and spreading from the active layer as a starting point and then incident on the first light reflecting layer can be reliably reflected toward the active layer and collected on the active layer. Therefore, an increase in diffraction loss can be avoided, laser oscillation can be reliably performed, and a problem of thermal saturation can be avoided since a long resonator is provided. In addition, since the resonator length can be increased, a tolerance of a process for manufacturing the light emitting element is increased, and as a result, a yield can be improved. Note that the "diffraction loss" refers to a phenomenon in which laser light reciprocating in the resonator is gradually scattered toward the outside of the resonator and lost because light generally tends to spread due to a diffraction effect.

In addition, except for Embodiment 7 as described later, a GaN substrate is used in the process of manufacturing the light emitting element, but a GaN-based compound semiconductor is not formed on the basis of a method of epitaxial growing in the lateral direction such as an ELO method. Therefore, as the GaN substrate, not only a polar GaN substrate but also a semipolar GaN substrate or a nonpolar GaN substrate can be used. In a case where a polar GaN substrate is used, light emission efficiency tends to decrease due to an effect of a piezoelectric field in the active layer, but in a case where a nonpolar GaN substrate or a semipolar GaN substrate is used, such a problem can be solved or alleviated.

Embodiment 6

Figure 35:
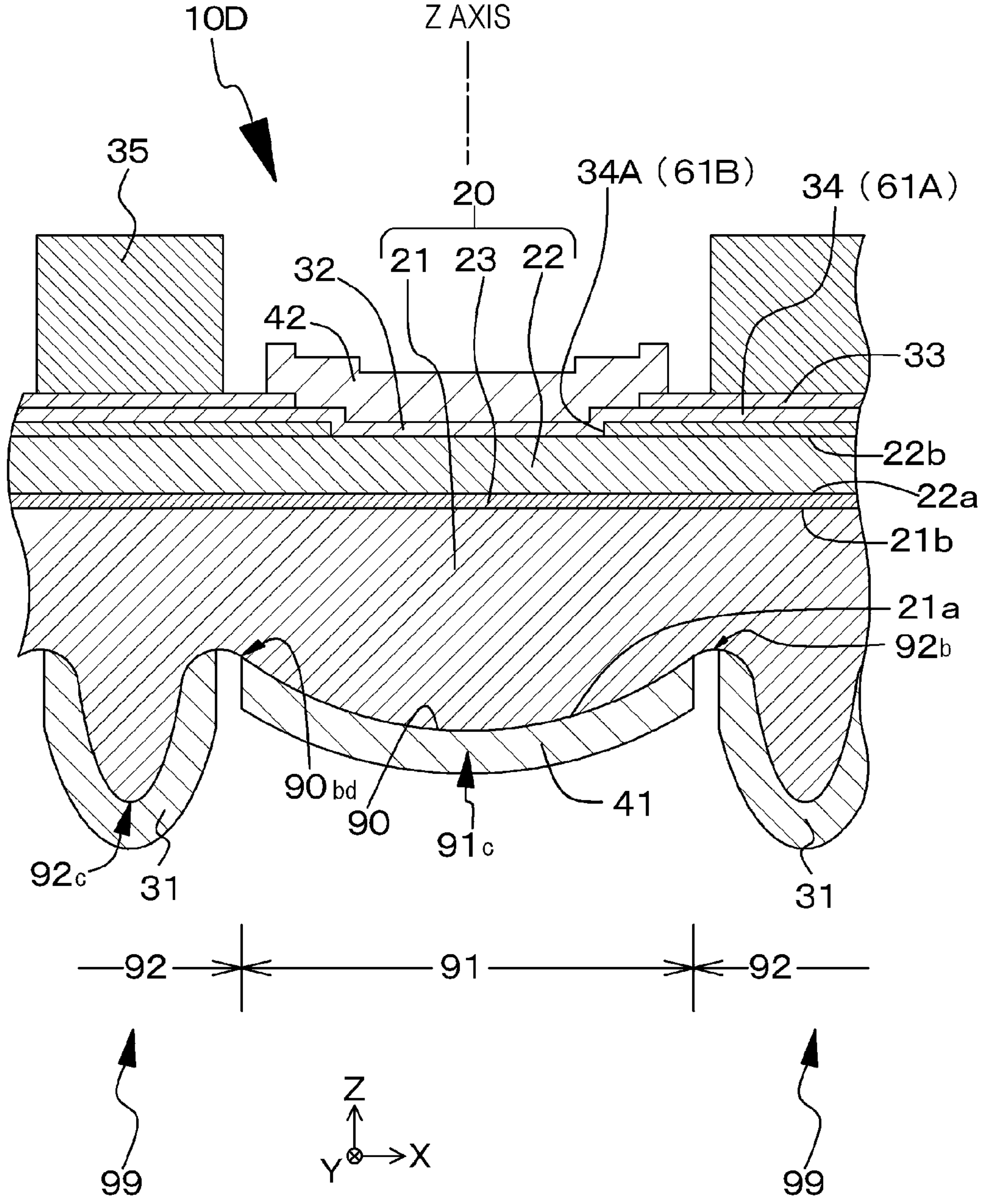
FIG. 35 is a schematic partial end view of a light emitting element of Embodiment 6.
Figure 36:
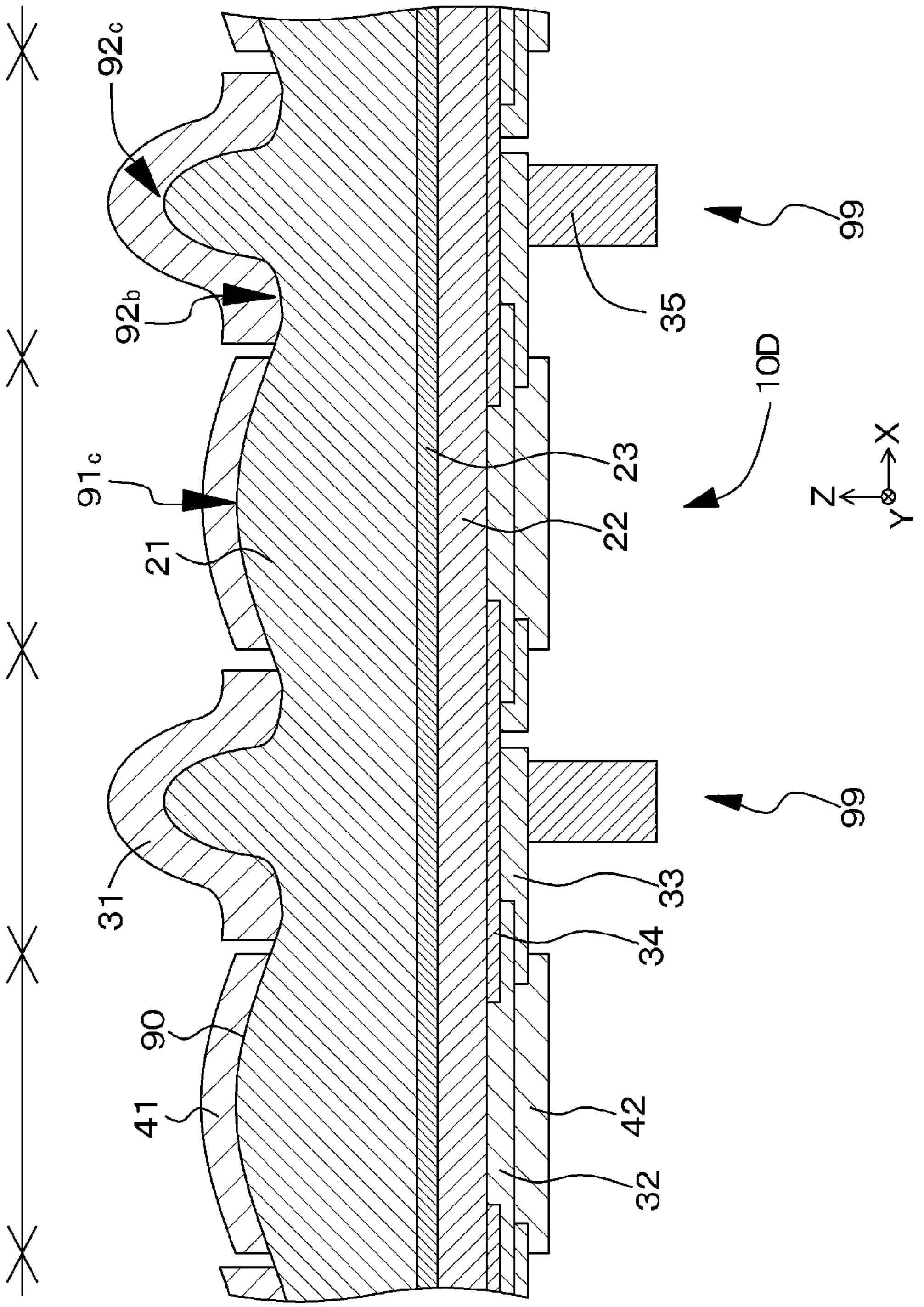
FIG. 36 is a schematic partial end view of a light emitting element array of Embodiment 6.
Figure 37:
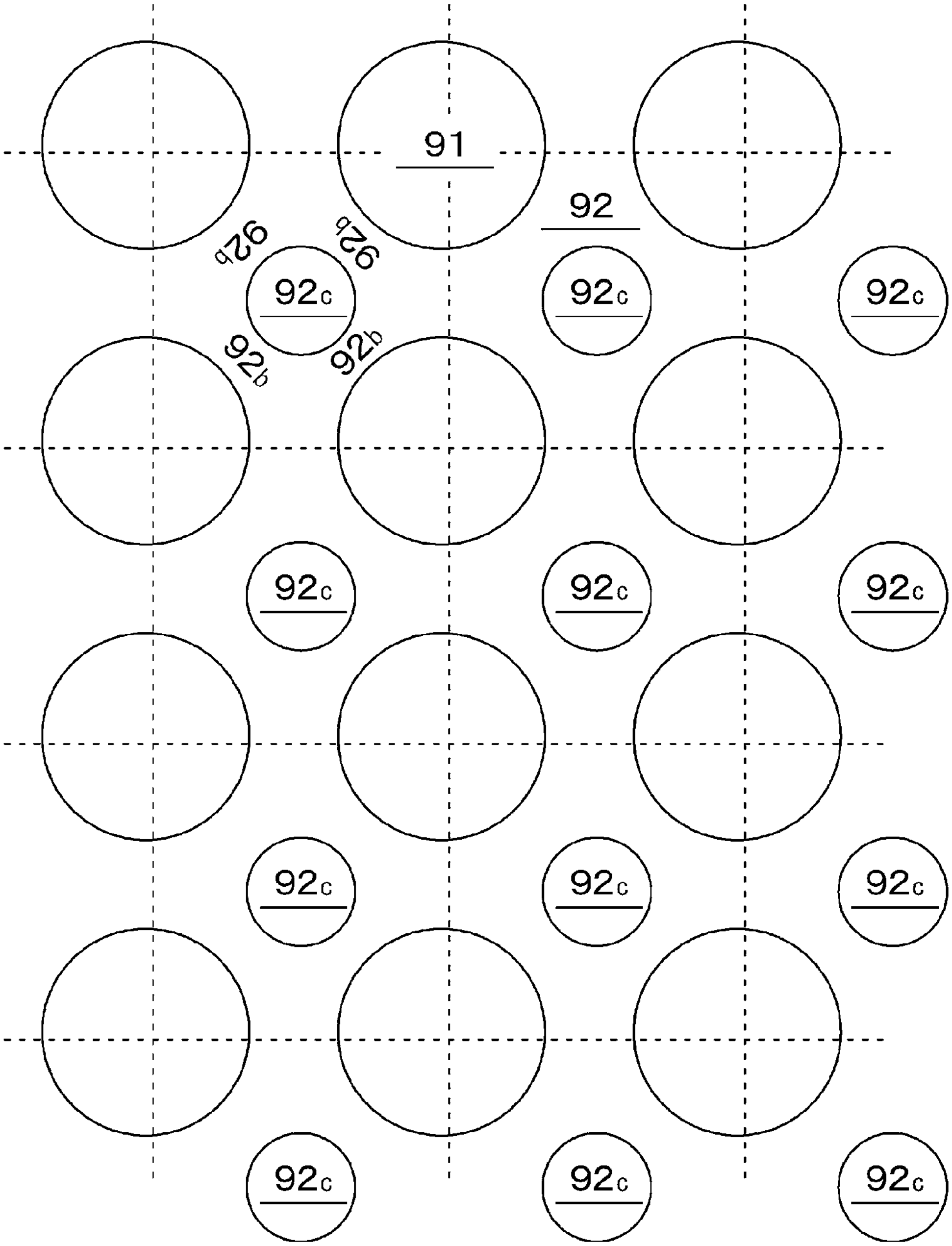
FIG. 37 is a schematic plan view illustrating disposition of a first portion and a second portion of a base surface in the light emitting element array of Embodiment 6.
Figure 38:
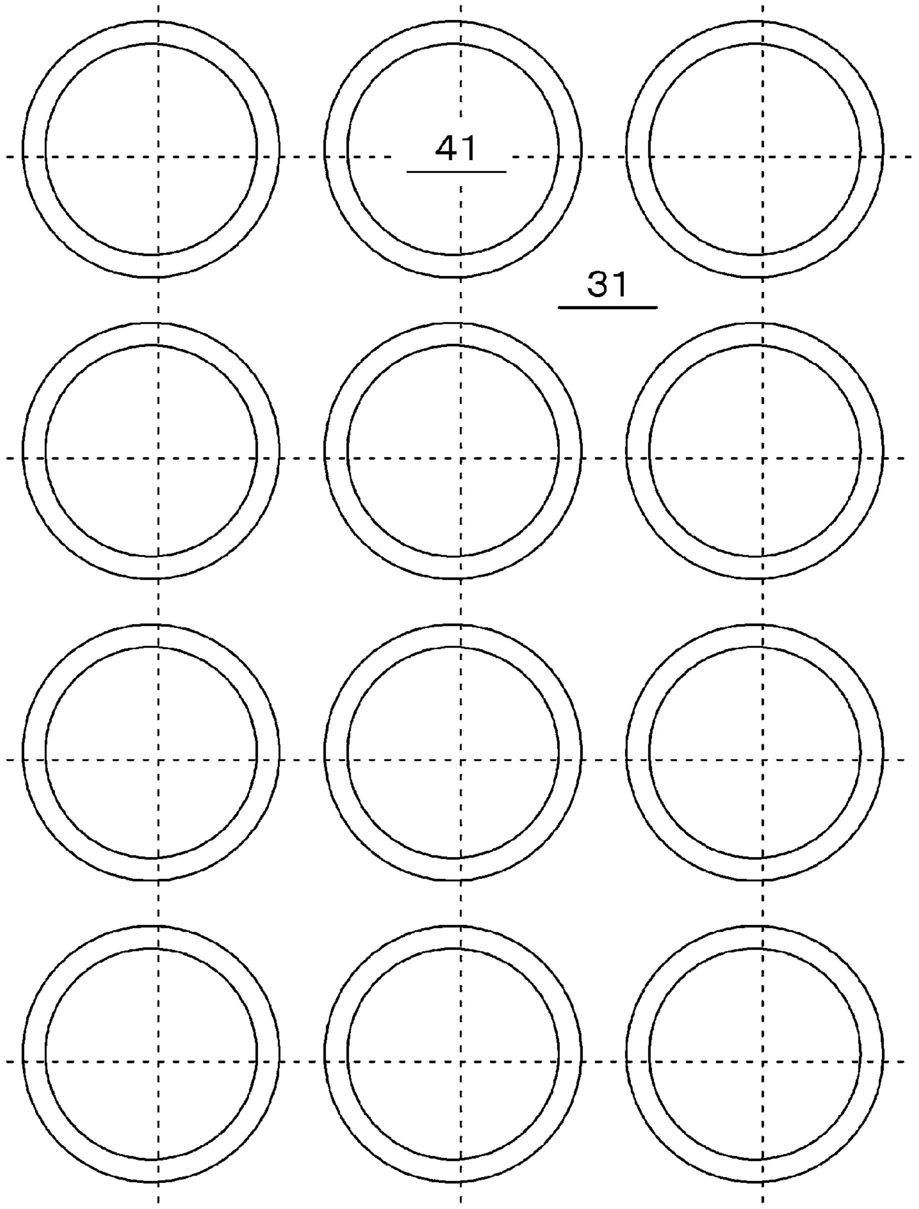
FIG. 38 is a schematic plan view illustrating disposition of a first light reflecting layer and a first electrode in the light emitting element array of Embodiment 6.
Figure 39:
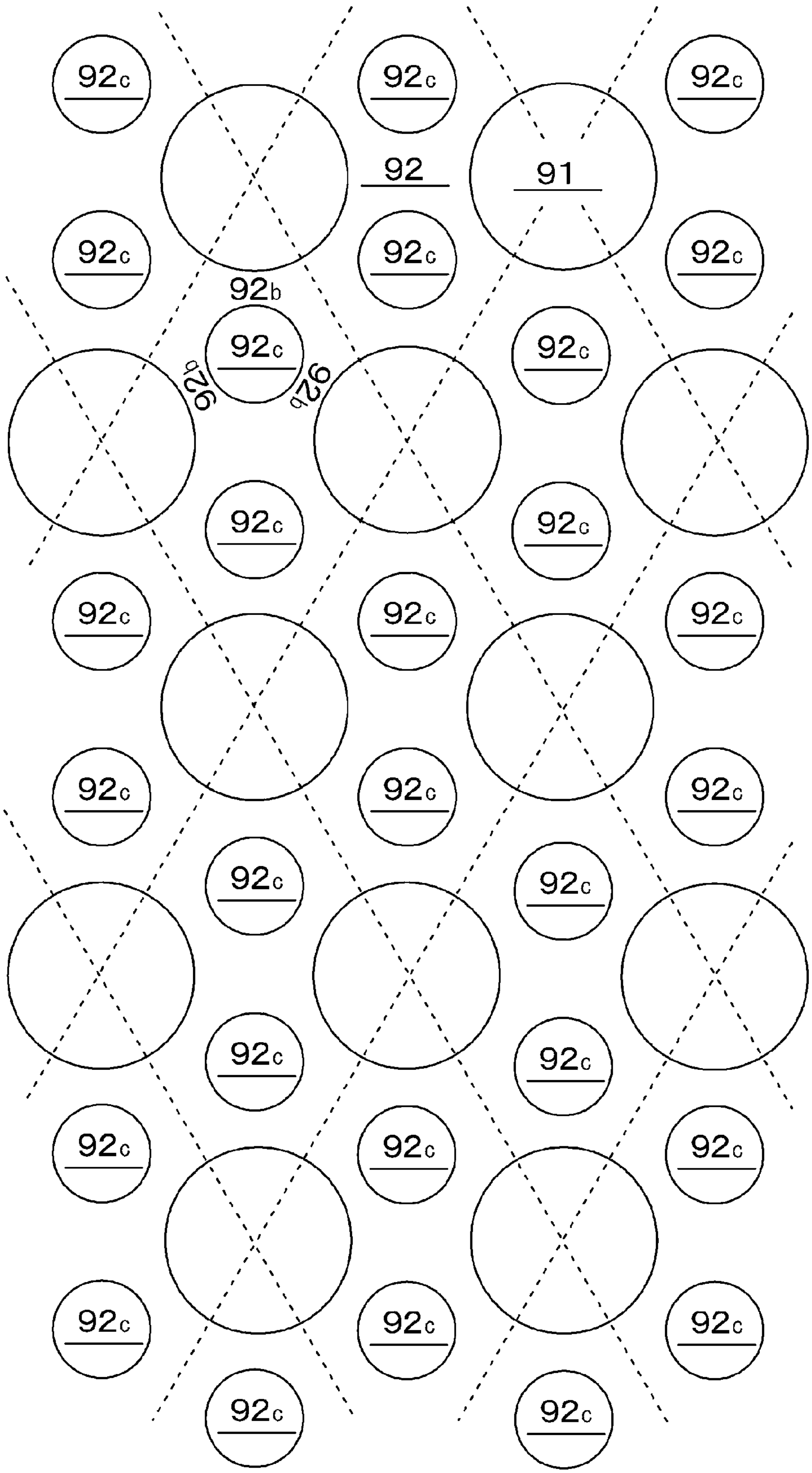
FIG. 39 is a schematic plan view illustrating disposition of the first portion and the second portion of the base surface in the light emitting element array of Embodiment 6.
Figure 40:
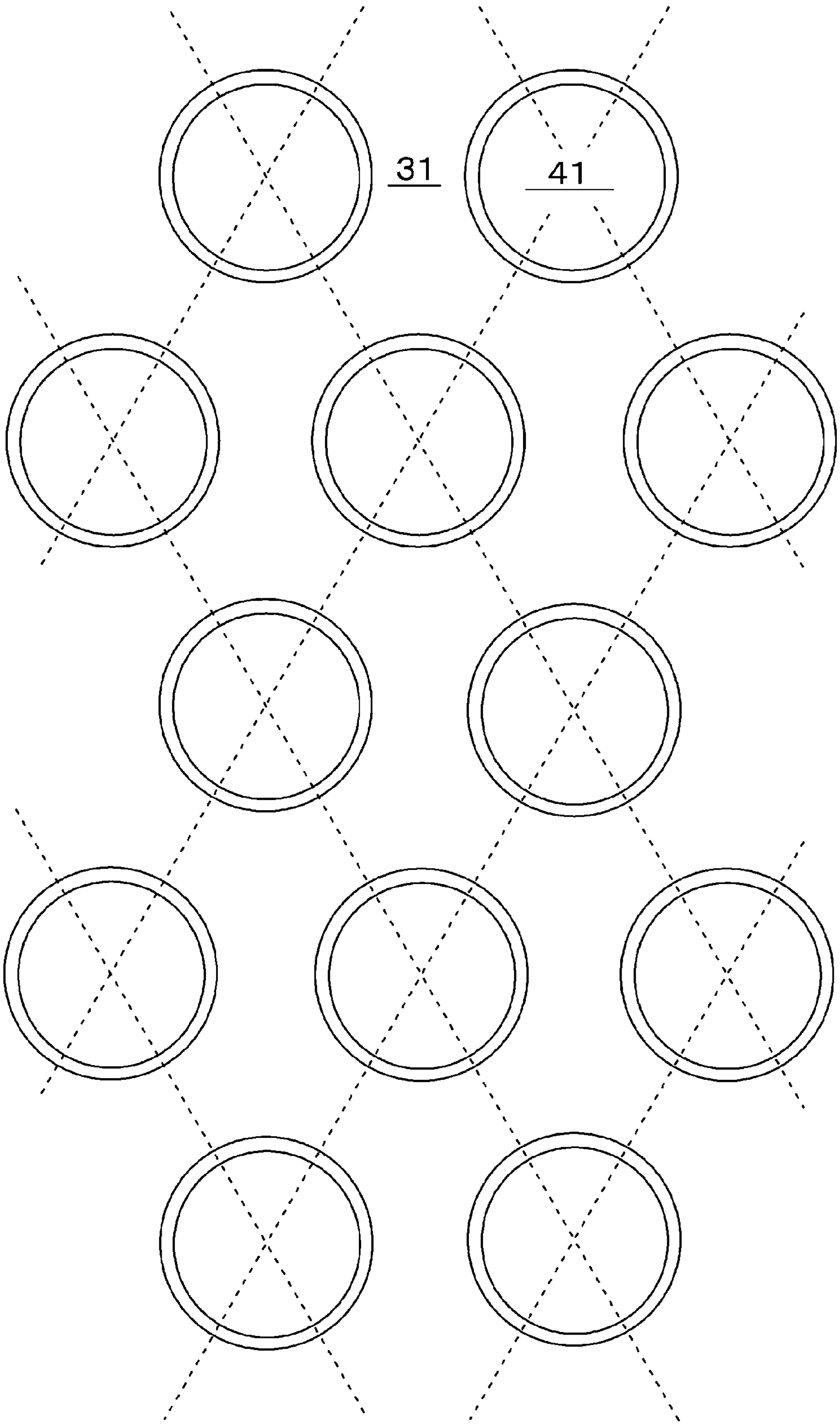
FIG. 40 is a schematic plan view illustrating disposition of the first light reflecting layer and the first electrode in the light emitting element array of Embodiment 6.
Figure 41A:
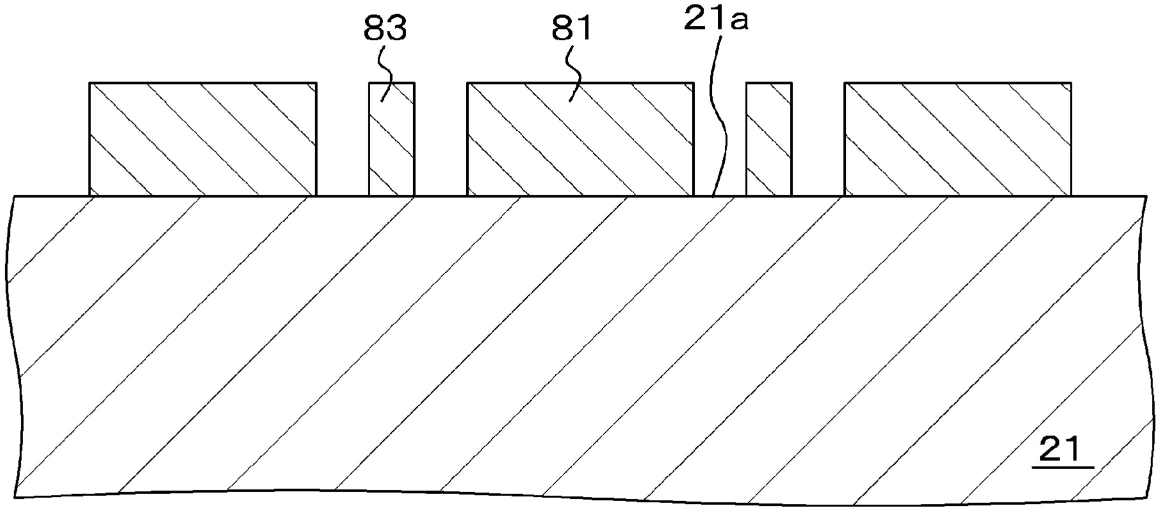
FIGS. 41A and 41B are schematic partial end views of a first compound semiconductor layer and the like for explaining a method for manufacturing the light emitting element array of Embodiment 6.
Figure 41B:
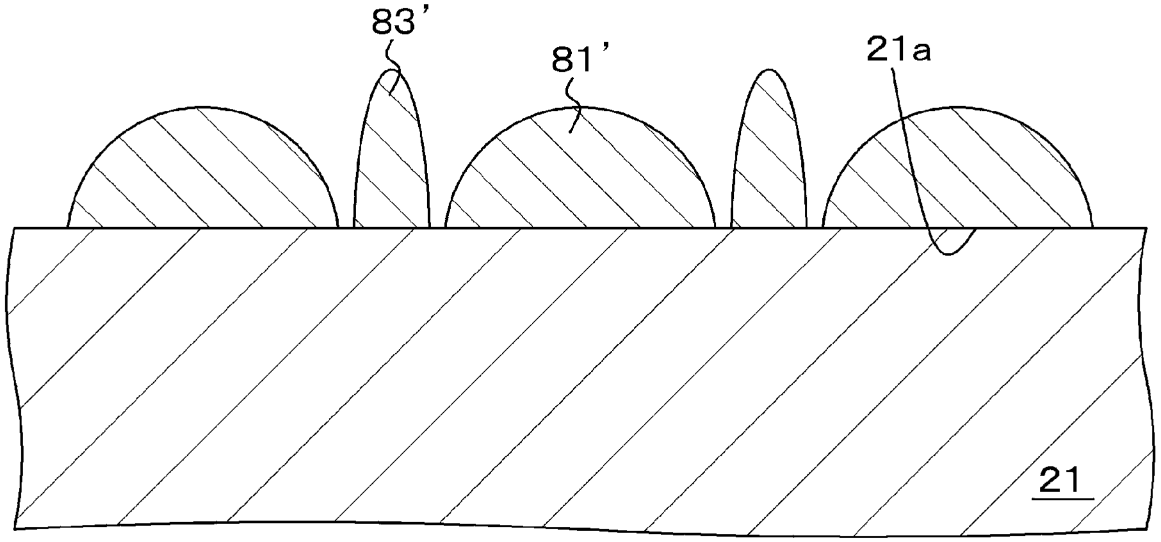
Figure 42A:
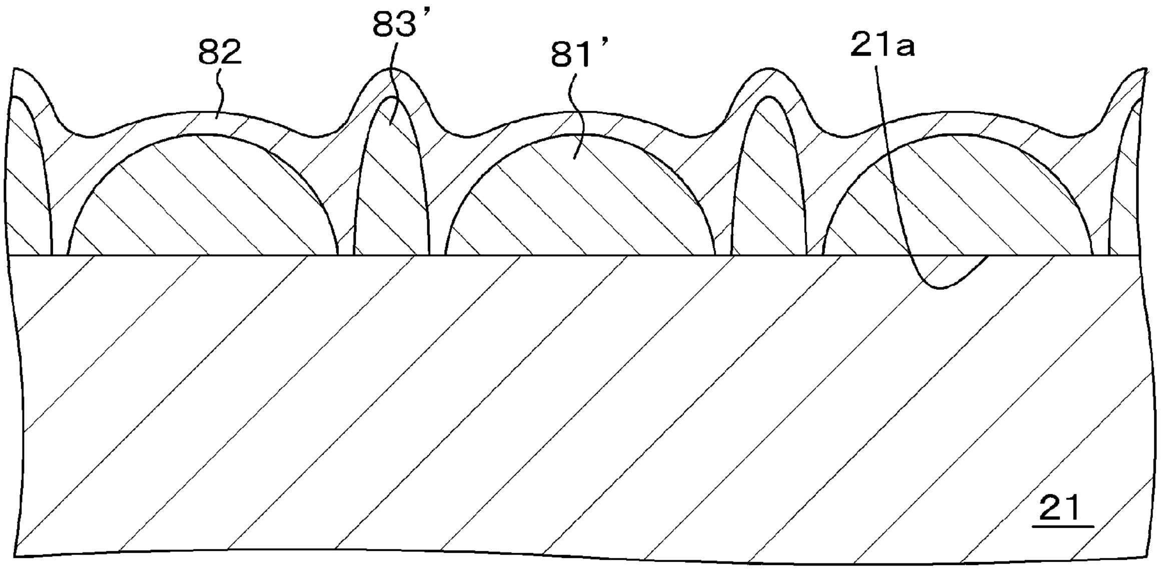
FIGS. 42A and 42B are schematic partial end views of the first compound semiconductor layer and the like for explaining the method for manufacturing the light emitting element array of Embodiment 6, continued from FIG. 41B.
Figure 42B:
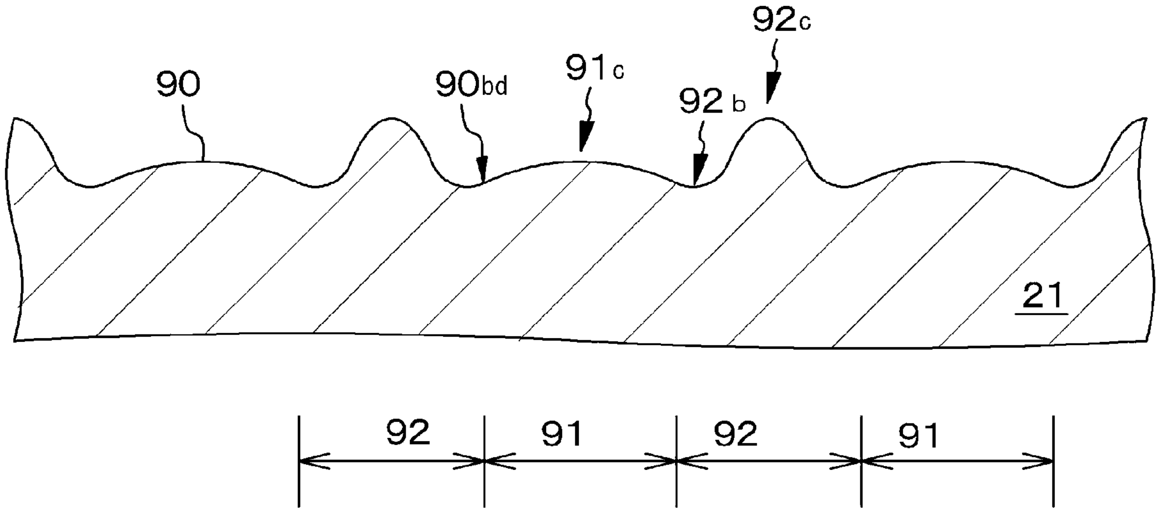
Figure 43A:
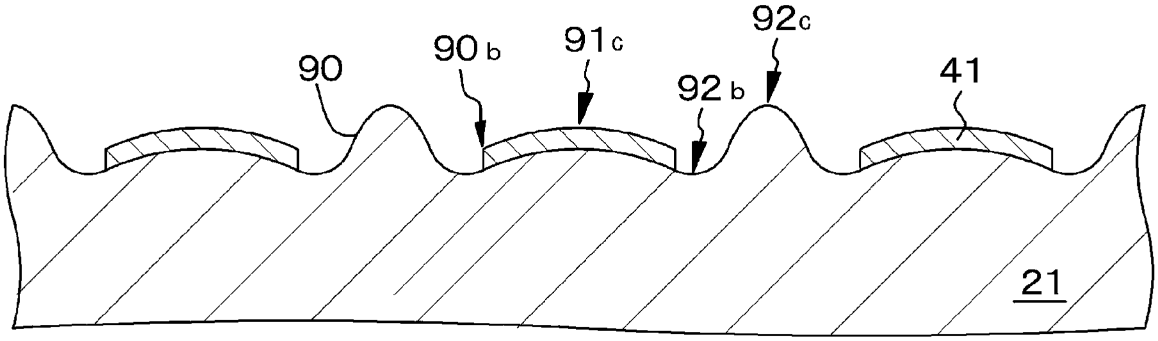
FIGS. 43A and 43B are schematic partial end views of the first compound semiconductor layer and the like for explaining the method for manufacturing the light emitting element array of Embodiment 6, continued from FIG. 42B.
Figure 43B:
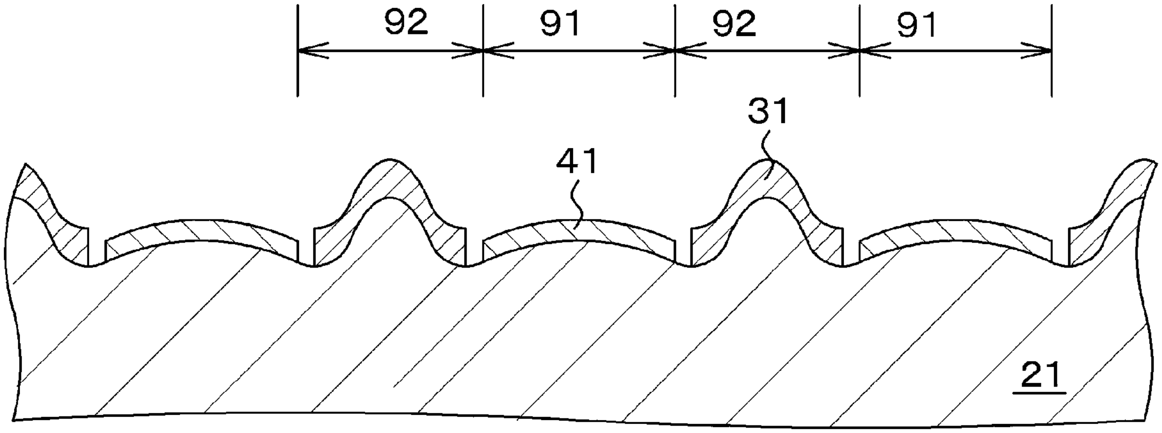

Embodiment 6 is a modification of Embodiment 5, and relates to the light emitting element of the 1-B-th configuration. FIG. 35 is a schematic partial end view of a light emitting element 10D of Embodiment 6, and FIG. 36 is a schematic partial end view of the light emitting element array of Embodiment 6. Furthermore, FIGS. 37 and 39 are schematic plan views illustrating disposition of the first portion and the second portion of the base surface in the light emitting element array of Embodiment 6, and FIGS. 38 and 40 are schematic plan views illustrating disposition of the first light reflecting layer and the first electrode in the light emitting element array of Embodiment 6. Furthermore, FIGS. 41A, 41B, 42A, 42B, 43A, and 43B are schematic partial end views of the first compound semiconductor layer and the like for explaining a method for manufacturing the light emitting element array of Embodiment 6.

In the light emitting element 10D of Embodiment 6, the second portion 92 of the base surface 90 occupying the peripheral region 99 has a downward convex shape and an upward convex shape extending from the downward convex shape toward a central portion of the peripheral region 99 with respect to the second surface 21*b* of the first compound semiconductor layer 21. Then, $LL_2>LL_1$, where a distance from the second surface 21*b* of the first compound semiconductor layer 21 to the central portion $\mathbf{91}_c$ of the first portion 91 of the base surface 90 is $LL_1$, and a distance from the second surface 21*b* of the first compound semiconductor layer 21 to the central portion $\mathbf{92}_c$ of the second portion 92 of the base surface 90 is $LL_2$. Furthermore, $R_1>R_2$, where a radius of curvature (that is, a radius of curvature of the first light reflecting layer 41) of the central portion $\mathbf{91}_c$ of the first portion 91 of the base surface 90 is $R_1$, and a radius of curvature of the central portion $\mathbf{92}_c$ of the second portion 92 of the base surface 90 is $R_2$. Note that, although a value of $LL_2/LL_1$ is not limited, $1<LL_2/LL_1\leq 100$ can be satisfied, and although a value of $R_1/R_2$ is not limited, $1<R_1/R_2\leq 100$ can be satisfied. Specifically, for example, $LL_2/LL_1=1.05$ and $R_1/R_2=10$.

In the light emitting element 10D of Embodiment 6, the central portion $\mathbf{91}_c$ of the first portion 91 of the base surface 90 is positioned at a vertex (intersection portion) of a square lattice (see FIG. 37), and in this case, the central portion $\mathbf{92}_c$ (illustrated as a circle in FIG. 37) of the second portion 92 of the base surface 90 is positioned at a vertex of the square lattice. Alternatively, the central portion $\mathbf{91}_c$ of the first portion 91 of the base surface 90 is positioned at a vertex (intersection portion) of a regular triangle lattice (see FIG. 39), and in this case, the central portion $\mathbf{92}_c$ (illustrated as a circle in FIG. 39) of the second portion 92 of the base surface 90 is positioned at a vertex of the regular triangle lattice. Further, the second portion 92 of the base surface 90 occupying the peripheral region 99 has a downward convex shape toward the central portion of the peripheral region 99, and this region is denoted by Reference Sign $\mathbf{92}_b$ in FIGS. 37 and 39.

In the light emitting element 10D of Embodiment 6, shapes of [the first portion 91/second portion 92 from the peripheral portion to the central portion] include:

(A) [upward convex shape/continuing from downward convex shape to upward convex shape];

(B) [upward convex shape/continuing from upward convex shape to downward convex shape and upward convex shape]; and (C) [upward convex shape/[continuing from line segment to downward convex shape and upward convex shape], and specifically, the light emitting element 10D of Embodiment 6 corresponds to (A).

In the light emitting element 10D of Embodiment 6, the bump 35 is arranged at a portion on the second surface side of the second compound semiconductor layer 22 facing a convex portion in the second portion 92 of the base surface 90.

As illustrated in FIG. 35, the second electrode 32 is common to the light emitting elements 10D included in the light emitting element array, or is individually formed as illustrated in FIG. 36, and is connected to an external circuit or the like via the bump 35. The first electrode 31 is common to the light emitting elements 10D included in the light emitting element array, and is connected to an external circuit or the like via the first pad electrode (not illustrated). The bump 35 is formed at a portion on the second surface side of the second compound semiconductor layer 22 facing a convex portion $\mathbf{92}_c$ in the second portion 92 of the base surface 90. In the light emitting element 10D illustrated in FIGS. 35, 36A, and 36B, light may be emitted to the outside via the first light reflecting layer 41, or light may be emitted to the outside via the second light reflecting layer 42. Examples of a shape of the bump 35 can include a cylindrical shape, an annular shape, and a hemispherical shape.

In addition, it is desirable that the radius $R_2$ of curvature of the central portion $\mathbf{92}_c$ of the second portion 92 of the base surface 90 is $1\times10^{-6}$ m or more, preferably, $3\times10^{-6}$ m or more, and more preferably, $5\times10^{-6}$ m or more, and specifically, the radius of curvature $R_2=3$ μm.

In the light emitting element array of Embodiment 6 illustrated in FIGS. 37 and 38 and FIGS. 39 and 40, parameters of the light emitting element 10D are as shown in Table 4 below. In addition, specifications of the light emitting element 10D of Embodiment 6 illustrated in FIGS. 37 and 38 and FIGS. 39 and 40 are shown in Tables 5 and 6 below. Here, a height $H_1$ of the first portion 91 is expressed as $H_1=LL_1-LL_2''$, and a height $H_2$ of the central portion $\mathbf{92}_c$ of the second portion 92 is expressed as $H_2=LL_2-LL_2''$, where a distance from the second surface 21*b* of the first compound semiconductor layer 21 to the central portion $\mathbf{91}_c$ of the first portion 91 of the base surface 90 is $LL_1$, and a distance from the second surface 21*b* of the first compound semiconductor layer 21 to the deepest concave portion $\mathbf{92}_b$ of the second portion 92 of the base surface 90 is $LL_2''$.

TABLE 4

| | FIGS. 37 and 38 | FIGS. 39 and 40 |
|---|---|---|
| Formation pitch | 25 μm | 25 μm |
| Radius $R_1$ of curvature | 150 μm | 150 μm |
| Diameter $D_1$ | 20 μm | 20 μm |
| Height $H_1$ | 2 μm | 2 μm |
| Radius $R_2$ of curvature | 2 μm | 2 μm |
| Height $H_2$ | 2.5 μm | 2.5 μm |

TABLE 5

| FIGS. 37 and 38 | |
|---|---|
| Second light reflecting layer 42 | $SiO_2/Ta_2O_5$ (11.5 pairs) |
| Second electrode 32 | ITO (thickness: 30 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 445 nm |
| Number of light emitting elements | 100 × 100 |

TABLE 6

| FIGS. 39 and 40 | |
|---|---|
| Second light reflecting layer 42 | $SiO_2/Ta_2O_5$ (11.5 pairs) |
| Second electrode 32 | ITO (thickness: 30 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 445 nm |
| Number of light emitting elements | 100 × 100 |

FIGS. 41A, 41B, 42A, 42B, 43A, and 43B are schematic partial end views of the first compound semiconductor layer and the like for explaining the method for manufacturing the light emitting element array of Embodiment 6, but the method for manufacturing the light emitting element array of Embodiment 6 can be substantially similar to the method for manufacturing the light emitting element array of Embodiment 5, and thus a detailed description thereof is omitted. Note that Reference Sign 83 in FIG. 41A and Reference Sign 83' in FIGS. 41B and 42A each denote a portion of the first sacrificial layer for forming the central portion $\mathbf{92}_c$ of the second portion 92. Note that as a size (diameter) of the first sacrificial layer decreases, a height of the first sacrificial layer after the heating treatment increases.

In a case where the light emitting element array of Embodiment 6 or Embodiment 7 as described later is connected to and bonded to an external circuit or the like using the bump 35, it is also necessary to apply a large load (for example, about 50 MPa) to the light emitting element array at the time of bonding. In the light emitting element array of Embodiment 6, even in a case where such a large load is applied, the bump 35 and the convex portion $\mathbf{92}_c$ in the second portion 92 of the base surface 90 are arranged on a straight line in a vertical direction, such that it is possible to reliably prevent the light emitting element array from being damaged.

Embodiment 7

Figure 44:
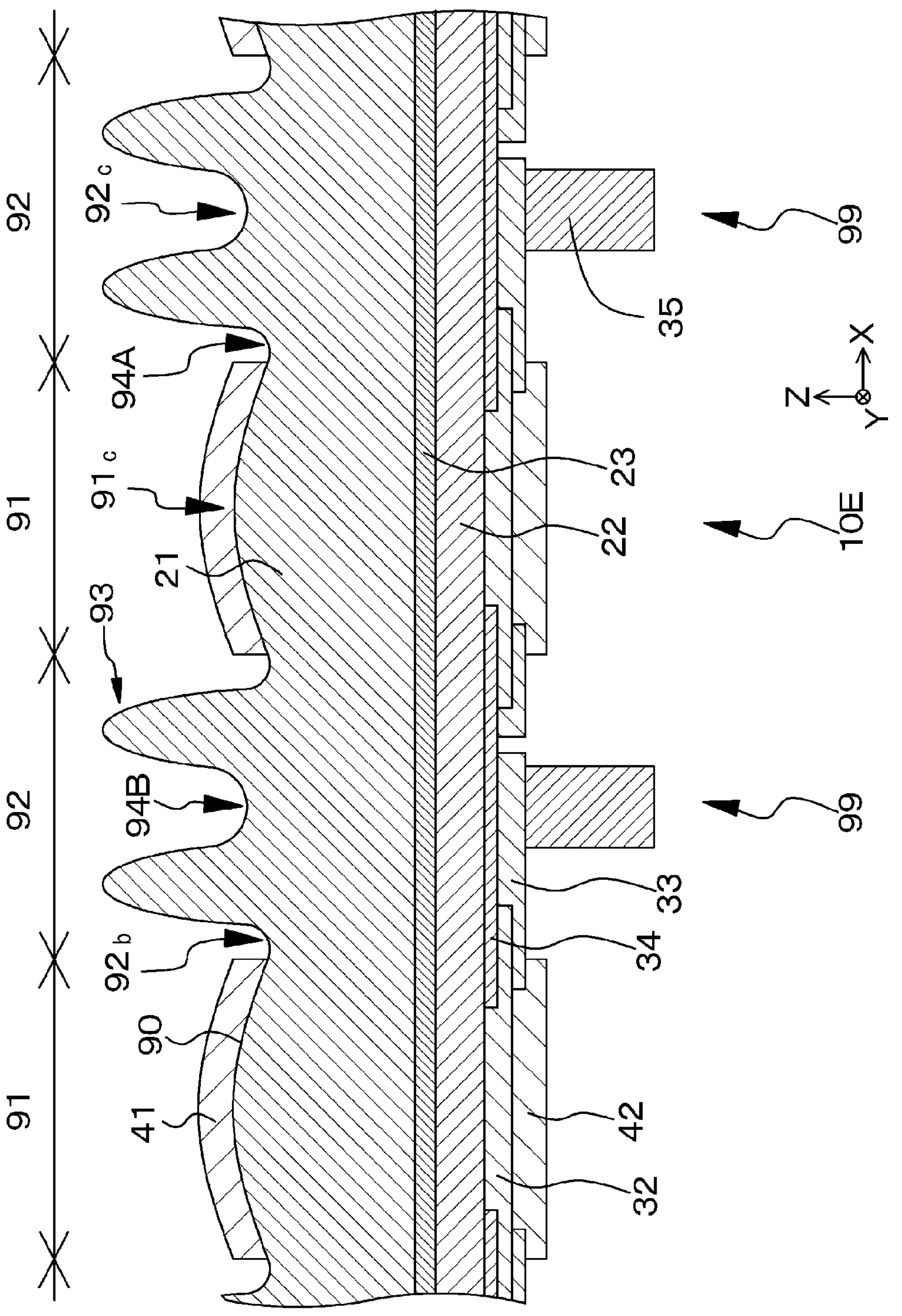
FIG. 44 is a schematic partial end view of a light emitting element array of Embodiment 7.
Figure 45:
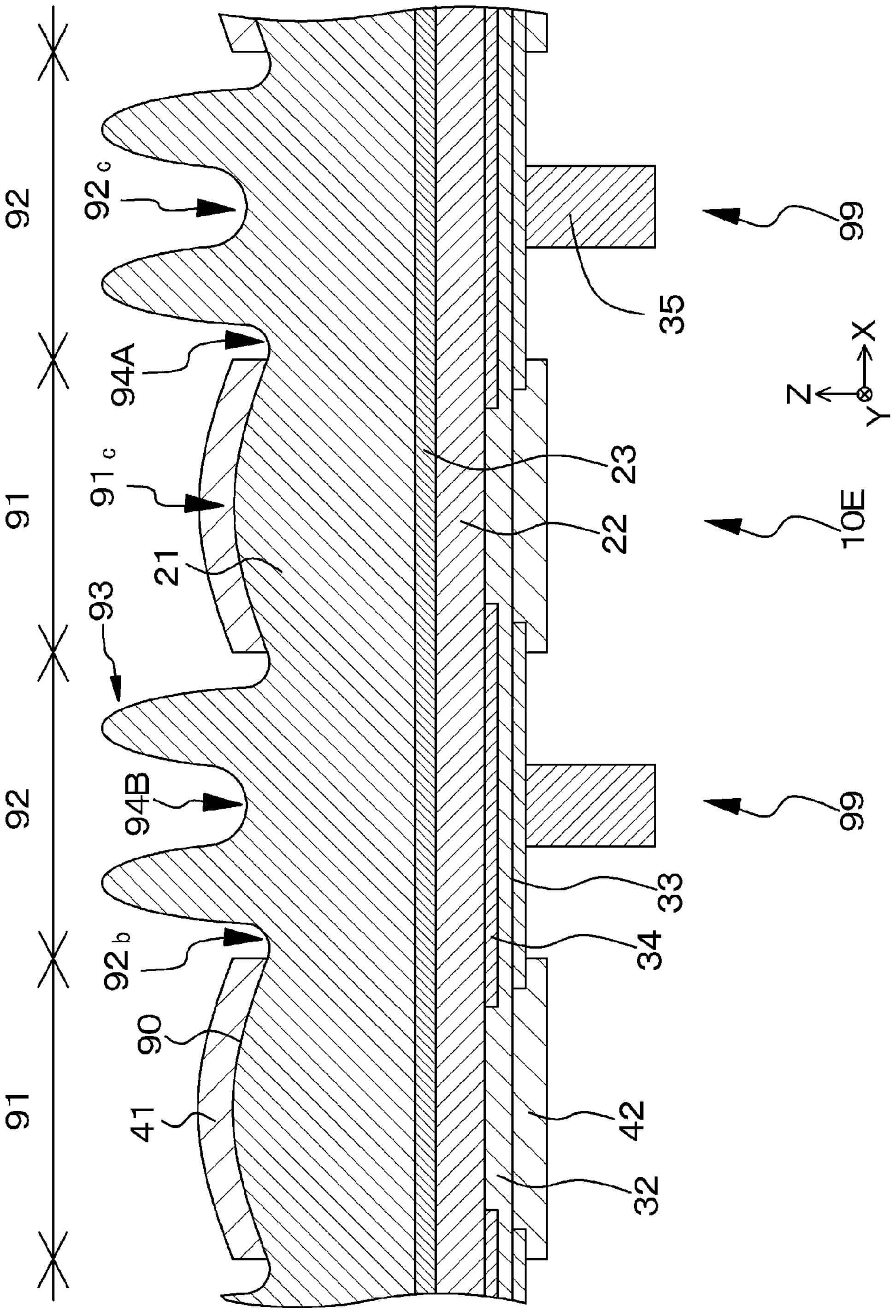
FIG. 45 is a schematic partial end view of the light emitting element array of Embodiment 7.
Figure 46:
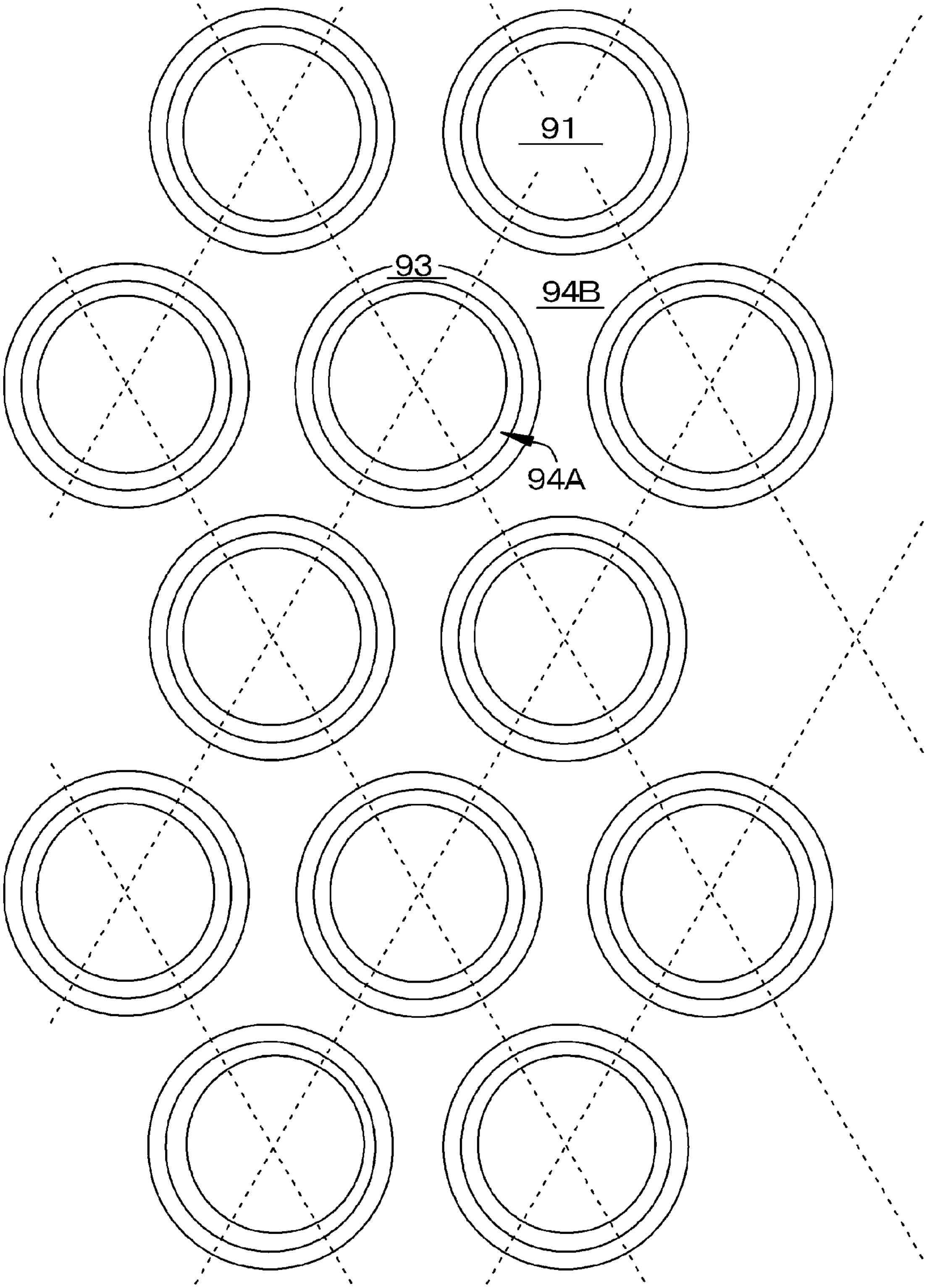
FIG. 46 is a schematic plan view illustrating disposition of a first portion and a second portion of a base surface in the light emitting element array of Embodiment 7.

Embodiment 7 is also a modification of Embodiment 5 or Embodiment 6, and relates to the light emitting element of the 1-C-th configuration. FIGS. 44 and 45 are schematic partial end views of the light emitting element array of Embodiment 7, and FIG. 46 is a schematic plan view illustrating disposition of the first portion and the second portion of the base surface in the light emitting element array of Embodiment 7. Note that, in the example illustrated in FIG. 44, the second electrode 32 is individually formed in each light emitting element, and in the example illustrated in FIG. 45, the second electrode 32 is formed common to the respective light emitting elements. Furthermore, in FIGS. 44 and 45, illustration of the first electrode is omitted.

In a light emitting element 10E of Embodiment 7, the second portion 92 of the base surface 90 occupying the peripheral region 99 has an annular convex shape 93 surrounding the first portion 91 of the base surface 90 and a downward convex shape 94A extending from the annular convex shape 93 toward the first portion 91 of the base surface 90 with respect to the second surface 21*b* of the first compound semiconductor layer 21. A region surrounded by the annular convex shape 93 in the second portion 92 of the base surface 90 occupying the peripheral region 99 is denoted by Reference Sign 94B.

In the light emitting element 10E of Embodiment 7, $LL_2'>LL_1$, where a distance from the second surface 21*b* of the first compound semiconductor layer 21 to the central portion $\mathbf{91}_c$ of the first portion 91 of the base surface 90 is $LL_1$, and a distance from the second surface 21*b* of the first compound semiconductor layer 21 to a top portion of the annular convex shape 93 of the second portion 92 of the base surface 90 is $LL_2'$. Furthermore, $R_1>R_2'$, where a radius of curvature (that is, a radius of curvature of the first light reflecting layer 41) of the central portion $\mathbf{91}_c$ of the first portion 91 of the base surface 90 is $R_1$, and a radius of curvature of the top portion of the annular convex shape 93 of the second portion 92 of the base surface 90 is $R_2'$. Note that although a value of $LL_2'/LL_1$ is not limited, $1<LL_2'/LL_1\leq 100$ can be satisfied, and specifically, for example, $LL_2'/LL_1=1.1$. In addition, although a value of $R_1/R_2'$ is not limited, $1<R_1/R_2'\leq 100$ can be satisfied, and specifically, for example, $R_1/R_2'=50$.

In the light emitting element 10E of Embodiment 7, shapes of [the first portion 91/second portion 92 from the peripheral portion to the central portion] include:

(A) [upward convex shape/continuing from downward convex shape to upward convex shape and downward convex shape];

(B) [upward convex shape/continuing from downward convex shape to upward convex shape, downward convex shape, and line segment];

(C) [upward convex shape/continuing from upward convex shape to downward convex shape, upward convex shape, and downward convex shape];

(D) [upward convex shape/continuing from upward convex shape to downward convex shape, upward convex shape, and line segment];

(E) [upward convex shape/continuing from line segment to downward convex shape, upward convex shape, and downward convex shape]; and (F) [upward convex shape/continuing from line segment to downward convex shape, upward convex shape, downward convex shape, and line segment], and specifically, the light emitting element 10E of Embodiment 7 corresponds to (A).

Furthermore, in the light emitting element 10E of Embodiment 7, the bump 35 is arranged at a portion on the second surface side of the second compound semiconductor layer 22 facing the annular convex portion 93 in the second portion 92 of the base surface 90. A shape of the bump 35 is preferably an annular shape facing the annular convex shape 93. A cylindrical shape, an annular shape, and a hemispherical shape can be exemplified. The bump 35 is formed at a portion on the second surface side of the second compound semiconductor layer 22 facing a convex portion $\mathbf{92}_c$ in the second portion 92 of the base surface 90.

As illustrated in FIG. 44, the second electrode 32 is individually formed in the light emitting element 10E included in the light emitting element array, and is connected to an external circuit or the like via the bump 35. The first electrode 31 is common to the light emitting elements 10E included in the light emitting element array, and is connected to an external circuit or the like via the first pad electrode (not illustrated). Alternatively, as illustrated in FIG. 45, the second electrode 32 is common to the light emitting elements 10E included in the light emitting element array, and is connected to an external circuit or the like via the bump 35. The first electrode 31 is common to the light emitting elements 10E included in the light emitting element array, and is connected to an external circuit or the like via the first pad electrode (not illustrated). In the light emitting element 10E illustrated in FIGS. 44 and 45, light may be emitted to the outside via the first light reflecting layer 41, or light may be emitted to the outside via the second light reflecting layer 42.

In addition, it is desirable that the radius $R_2'$ of curvature of the annular convex portion 93 of the second portion 92 of the base surface 90 is $1\times10^{-6}$ m or more, preferably, $3\times10^{-6}$ m or more, and more preferably, $5\times10^{-6}$ m or more, and specifically, the radius of curvature $R_2'=5$ μm.

In the light emitting element array of Embodiment 7 illustrated in FIG. 46, parameters of the light emitting element 10E are as shown in Table 7 below. In addition, specifications of the light emitting element 10E of Embodiment 7 illustrated in FIG. 46 are shown in Table 8 below.

Here, a height $H_1$ of the first portion 91 is expressed as $H_1=LL_1-LL_2''$, and a height $H_2$ of the annular convex portion 93 of the second portion 92 is expressed as $H_2=LL_2-LL_2''$, where a distance from the second surface 21*b* of the first compound semiconductor layer 21 to the central portion $\mathbf{91}_c$ of the first portion 91 of the base surface 90 is $LL_1$, and a distance from the second surface 21*b* of the first compound semiconductor layer 21 to the deepest concave portion $\mathbf{92}_b$ of the second portion 92 of the base surface 90 is $LL_2''$. Furthermore, a diameter $D_2$ indicates a diameter of the annular convex shape 93.

TABLE 7

| FIG. 46 | |
|---|---|
| Formation pitch | 25 μm |
| Radius $R_1$ of curvature | 150 μm |
| Diameter $D_1$ | 15 μm |
| Height $H_1$ | 2 μm |
| Radius $R_2$ of curvature | 3 μm |
| Diameter $D_2$ | 19 μm (inner diameter 18 μm/outer diameter 20 μm) |
| Height $H_2$ | 3 μm |

TABLE 8

| FIG. 46. | |
|---|---|
| Second light reflecting layer 42 | $SiO_2/Ta_2O_5$ (7 pairs) |
| Second electrode 32 | ITO (thickness: 25 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |
| Resonator length $L_{OR}$ | 20 μm |
| Oscillation wavelength (emission wavelength) $\lambda_0$ | 405 nm |
| Number of light emitting elements | 1000 × 1000 |

Since a method for manufacturing the light emitting element array of Embodiment 7 can be substantially similar to the method for manufacturing the light emitting element array of Embodiment 5 or 6, a detailed description will be omitted.

Embodiment 8

Figure 47A:
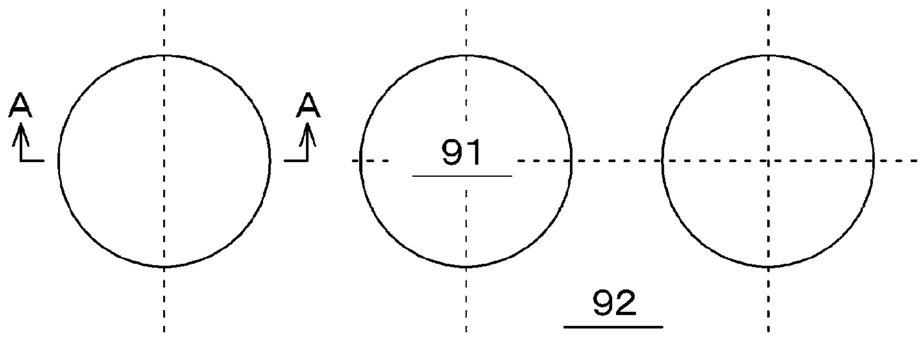
FIGS. 47A and 47B are schematic plan views illustrating disposition of a first portion and a second portion of a base surface in a light emitting element array of Embodiment 8.
Figure 47B:
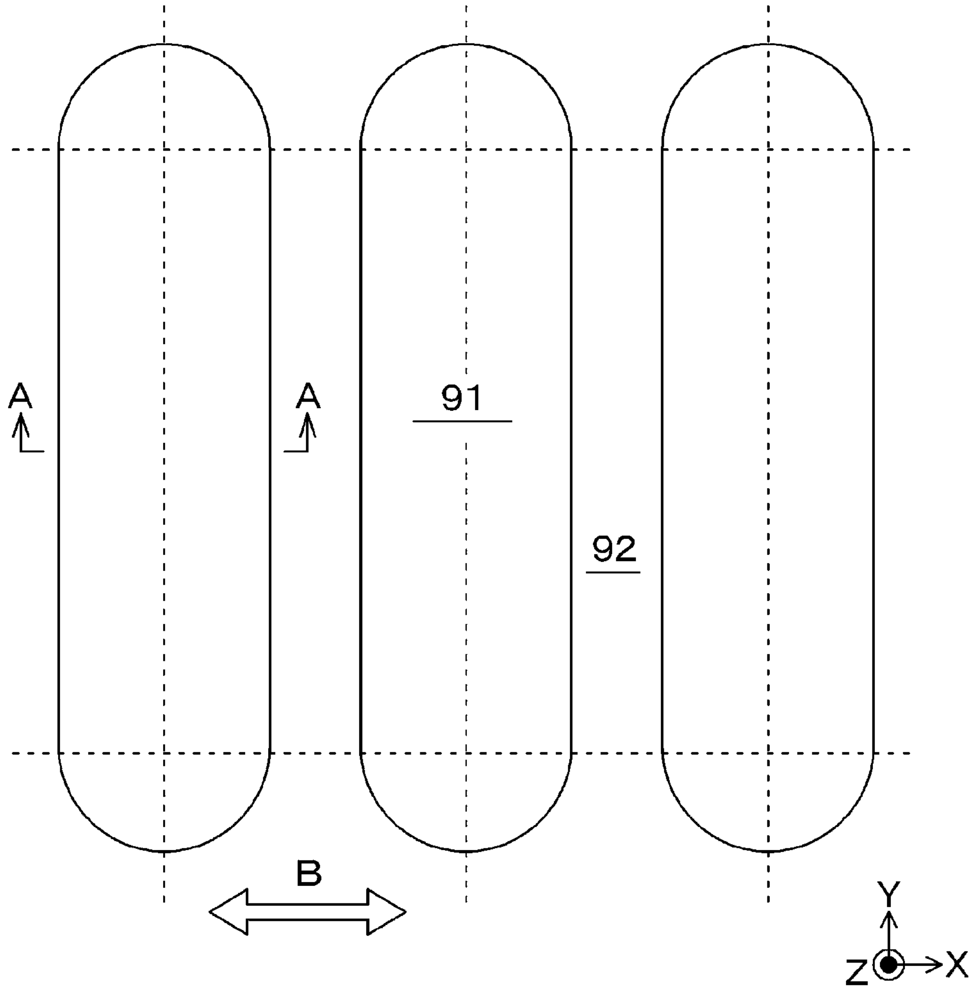

Embodiment 8 is a modification of Embodiment 5. FIGS. 47A and 47B are schematic plan views illustrating disposition of the first portion and the second portion of the base surface in the light emitting element array of Embodiment 8. In the example illustrated in FIG. 47A, in the light emitting element array, for example, the light emitting elements of Embodiment 5 are arranged in a line. A schematic partial end view taken along arrow A-A in FIG. 47A is similar to that illustrated in FIG. 23. In the example illustrated in FIG. 47B, in the light emitting element array, for example, light emitting elements having a planar shape longer than that of the light emitting element of Embodiment 5 are arranged in a line. A schematic partial end view taken along arrow A-A in FIG. 47B is similar to that illustrated in FIG. 23. In the light emitting element array of Embodiment 8 illustrated in FIG. 47A, parameters of the light emitting element are as shown in Table 9 below, and specifications of the light emitting element are shown in Table 10 below. Furthermore, in the light emitting element array of Embodiment 8 illustrated in FIG. 47B, parameters of the light emitting element are as shown in Table 11 below, and specifications of the light emitting element are shown in Table 12 below. Note that a shape of the base surface illustrated in FIG. 47B is a part of a cylindrical shape or a part of a semi-cylindrical shape.

TABLE 9

| FIG. 47A | |
|---|---|
| Formation pitch | 25 μm |
| Radius $R_1$ of curvature | 100 μm |
| Diameter $D_1$ | 20 μm |
| Height $H_1$ | 2 μm |

TABLE 10

| FIG. 47A | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 445 nm |
| Number of light emitting elements | 1000 × 1 |

TABLE 11

| FIG. 47B | |
|---|---|
| Formation pitch | 25 μm (pitch along arrow B in FIG. 47B) |
| Radius $R_1$ of curvature | 100 μm (radius of curvature in direction of arrow B in FIG. 47B) |
| Size of first portion | 400 μm in length × 20 μm in width |
| Height $H_1$ | 2 μm |

TABLE 12

| FIG. 47B | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-GaN |
| Active layer 23 | InGaN (multiple quantum well structure) |
| First compound semiconductor layer 21 | n-GaN |
| First light reflecting layer 41 | $SiO_2/Ta_2O_5$ (14 pairs) |

TABLE 12-continued

| FIG. 47B | |
|---|---|
| Resonator length $L_{OR}$ | 25 μm |
| Oscillation wavelength (emission wavelength) $\lambda_0$ | 445 nm |
| Number of light emitting elements | 512 × 1 |

Embodiment 9

Figure 48:
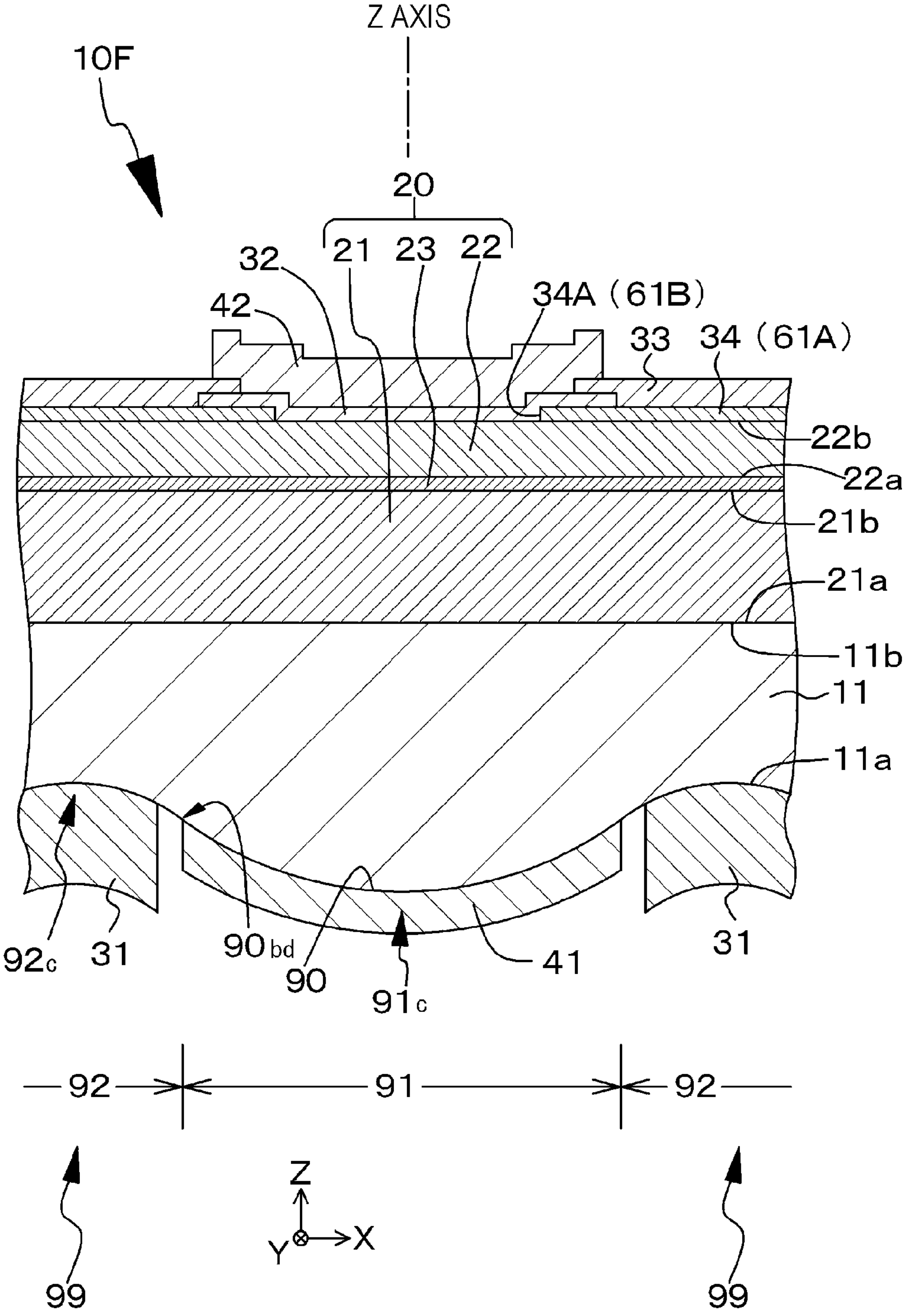
FIG. 48 is a schematic partial end view of a light emitting element of Embodiment 9.

Embodiment 9 is a modification of Embodiments 5 to 8, and relates to the light emitting element of the third configuration. In a light emitting element 10F of Embodiment 9 of which the schematic partial end view is illustrated in FIG. 48, the compound semiconductor substrate 11 is disposed (left) between the first surface 21*a* of the first compound semiconductor layer 21 and the first light reflecting layer 41, and the base surface 90 is constituted by a surface (first surface 11*a*) of the compound semiconductor substrate 11.

In the light emitting element 10F of Embodiment 9, the compound semiconductor substrate 11 is thinned and mirror-finished in a step similar to [Step-540] of Embodiment 5. A value of a surface roughness Ra of the first surface 11*a* of the compound semiconductor substrate 11 is preferably 10 nm or less. The surface roughness Ra is specified in JIS B-610: 2001, and can be specifically measured on the basis of observation based on AFM or cross-sectional TEM. Thereafter, the first sacrificial layer 81 in [Step-550] of Embodiment 5 may be formed on an exposed surface (first surface 11*a*) of the compound semiconductor substrate 11, then, a process similar to the process after [Step-550] of Embodiment 5, au be performed, and the base surface 90 having the first portion 91 and the second portion may be provided on the compound semiconductor substrate 11 instead of the first compound semiconductor layer 21 in Embodiment 5, thereby completing the light emitting element or the light emitting element array.

Except for the above point, the light emitting element of Embodiment 9 can have a similar configuration and structure to those of the light emitting elements of Embodiments 5 to 8, and thus a detailed description thereof will be omitted.

Embodiment 10

Figure 49:
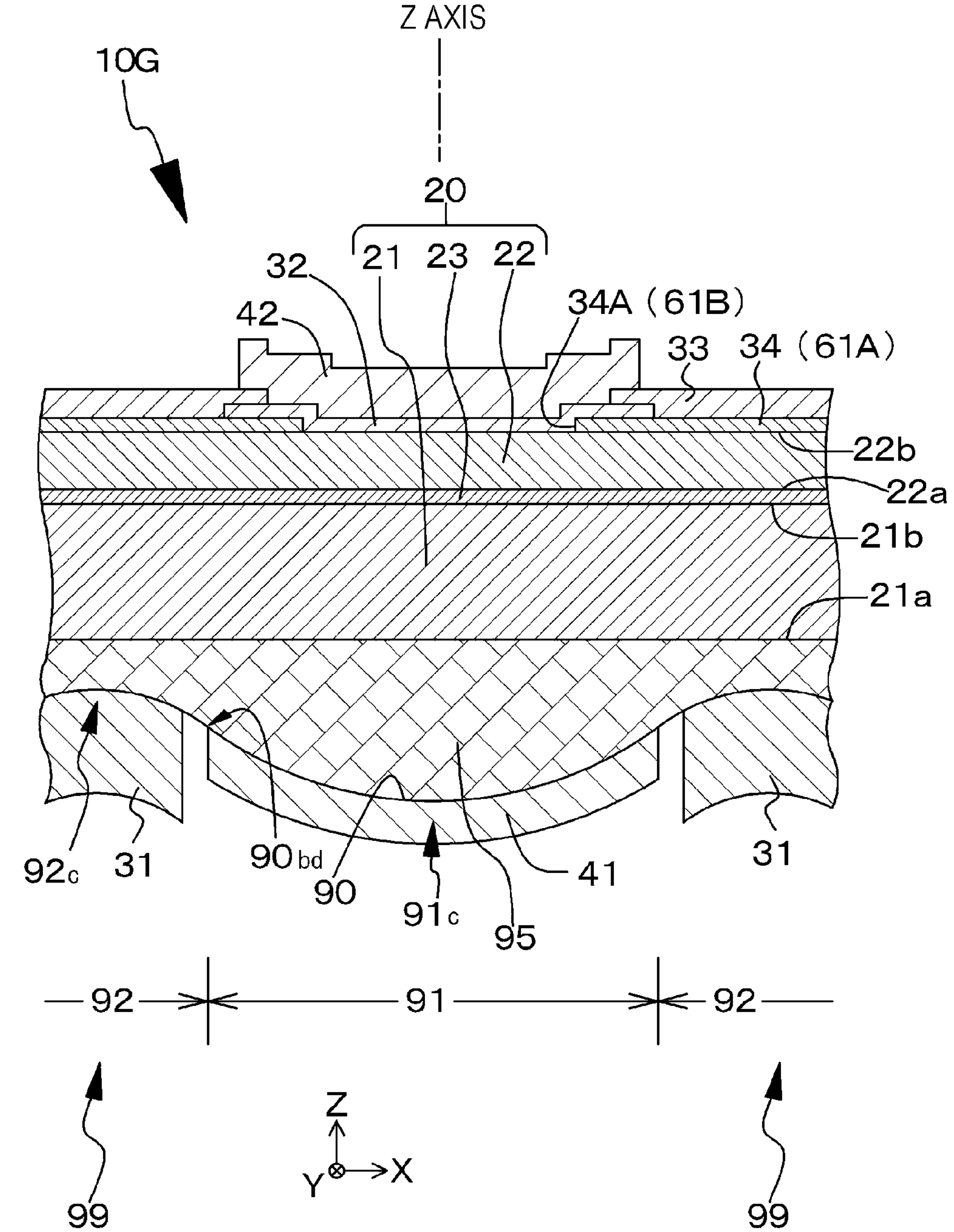
FIG. 49 is a schematic partial end view of a light emitting element of Embodiment 10.

Embodiment 10 is also a modification of Embodiments 5 to 8, and relates to the light emitting element of the fourth configuration. In a light emitting element 10G of Embodiment 10 of which the schematic partial end view is illustrated in FIG. 49, a base material 95 is disposed between the first surface 21*a* of the first compound semiconductor layer 21 and the first light reflecting layer 41, and the base surface 90 is constituted by a surface of the base material 95. Alternatively, in a modified example of the light emitting element 10G of Embodiment 10 illustrated in FIG. 50 which is a schematic partial end view, the compound semiconductor substrate 11 and the base material 95 are disposed between the first surface 21*a* of the first compound semiconductor layer 21 and the first light reflecting layer 41, and the base surface 90 is constituted by the surface of the base material 95. Examples of a material of the base material 95 can include a transparent dielectric material such as $TiO_2$, $Ta_2O_5$, or $SiO_2$, a silicone-based resin, and an epoxy-based resin.

In the light emitting element 10G of Embodiment 10 illustrated in FIG. 49, the compound semiconductor substrate 11 is removed in a step similar to [Step-540] of Embodiment 5, and the base material 95 having the base surface 90 is formed on the first surface 21*a* of the first compound semiconductor layer 21. Specifically, for example, a $TiO_2$ layer or a $Ta_2O_5$ layer is formed on the first surface 21*a* of the first compound semiconductor layer 21, a patterned resist layer is then formed on the $TiO_2$ layer or the $Ta_2O_5$ layer on which the first portion 91 is to be formed, and the resist layer is heated to reflow the resist layer, thereby obtaining a resist pattern. The resist pattern has the same shape as (or a shape similar to) a shape of the first portion. Then, as etching back is performed on the resist pattern and the $TiO_2$ layer or the $Ta_2O_5$ layer, the base material 95 (including the $TiO_2$ layer or the $Ta_2O_5$ layer) in which the first portion 91 and the second portion 92 are provided can be obtained on the first surface 21*a* of the first compound semiconductor layer 21. Next, the first light reflecting layer 41 is only required to be formed on a desired region of the base material 95 on the basis of a known method.

Figure 50:
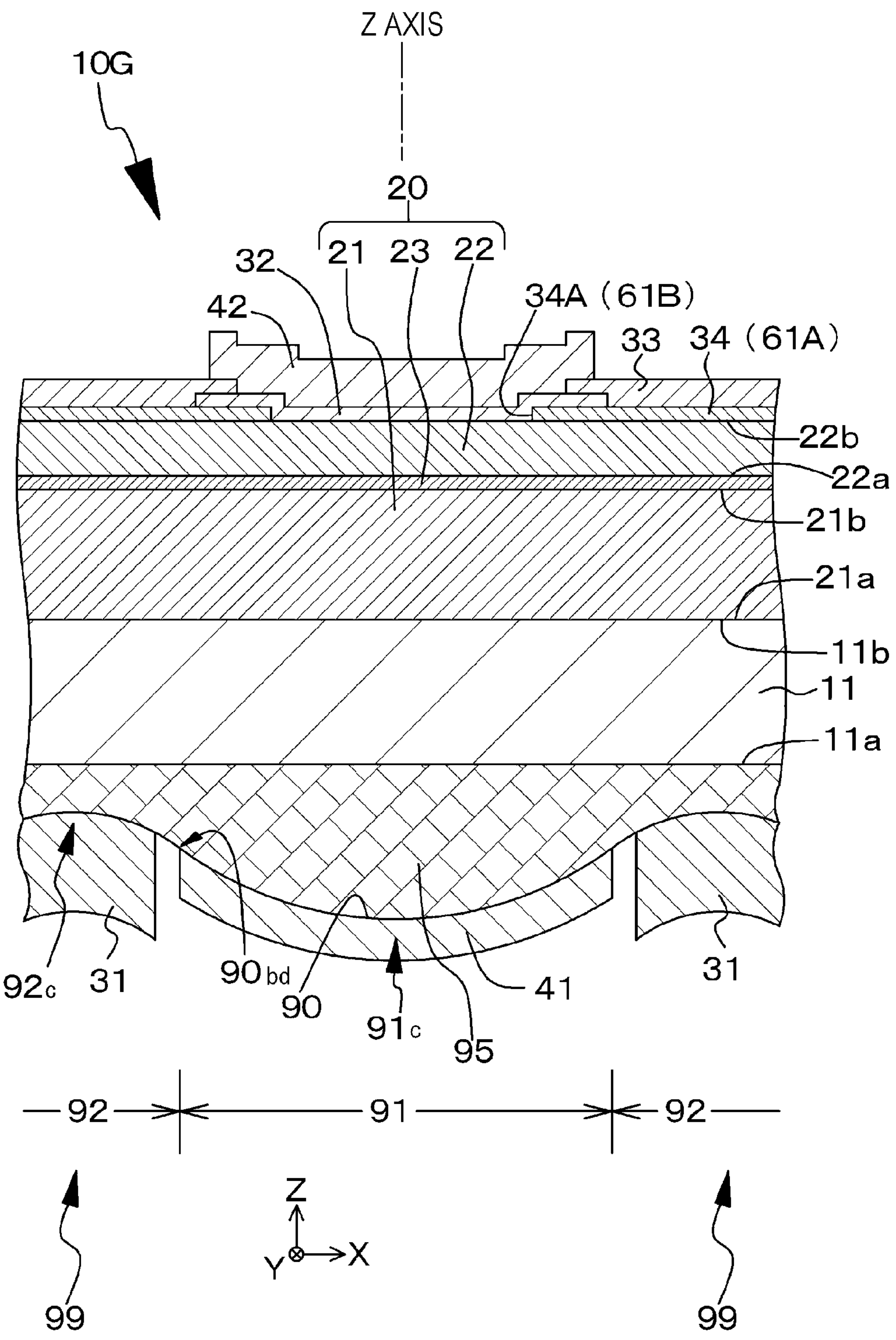
FIG. 50 is a schematic partial end view of a modified example of the light emitting element of Embodiment 10.

Alternatively, in the light emitting element 10G of Embodiment 10 illustrated in FIG. 50, the base material 95 having the base surface 90 is formed on an exposed surface (first surface 11*a*) of the compound semiconductor substrate 11 after thinning and mirror-finishing the compound semiconductor substrate 11 in a step similar to [Step-540] of Embodiment 5. Specifically, for example, a $TiO_2$ layer or a $Ta_2O_5$ layer is formed on the exposed surface (first surface 11*a*) of the compound semiconductor layer 11, a patterned resist layer is then formed on the $TiO_2$ layer or the $Ta_2O_5$ layer on which the first portion 91 is to be formed, and the resist layer is heated to reflow the resist layer, thereby obtaining a resist pattern. The resist pattern has the same shape as (or a shape similar to) a shape of the first portion. Then, as etching back is performed on the resist pattern and the $TiO_2$ layer or the $Ta_2O_5$ layer, the base material 95 (including the $TiO_2$ layer or the $Ta_2O_5$ layer) in which the first portion 91 and the second portion 92 are provided can be obtained on the exposed surface (first surface 11*a*) of the compound semiconductor layer 11. Next, the first light reflecting layer 41 is only required to be formed on a desired region of the base material 95 on the basis of a known method.

Except for the above point, the light emitting element of Embodiment 10 can have a similar configuration and structure to those of the light emitting elements of Embodiments 5 to 8, and thus a detailed description thereof will be omitted.

Embodiment 11

Embodiment 11 is a modification of Embodiment 10. A schematic partial end view of the light emitting element of Embodiment 11 is substantially similar to FIG. 50, and the light emitting element of Embodiment 11 can have a substantially similar configuration and structure to those of the light emitting element of Embodiment 10, and thus, a detailed description thereof will be omitted.

Figure 51A:
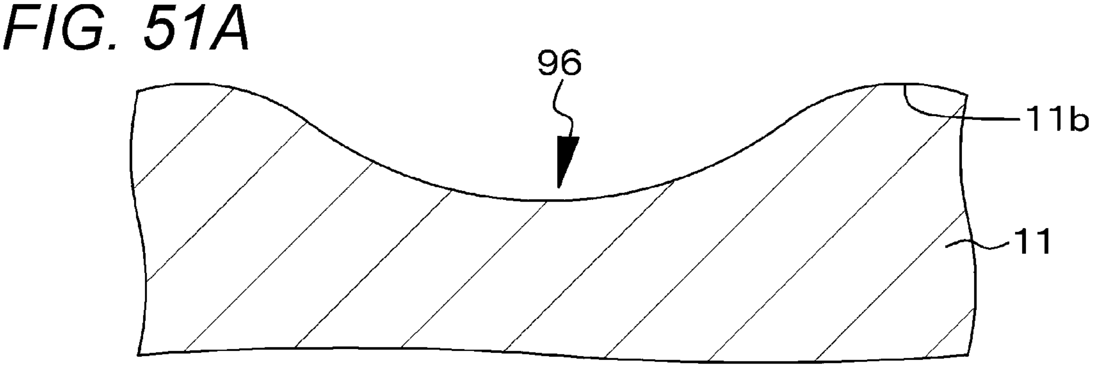
FIGS. 51A, 51B, and 51C are schematic partial end views of a stacked structure and the like for explaining a method for manufacturing a light emitting element of Embodiment 11.
Figure 51B:
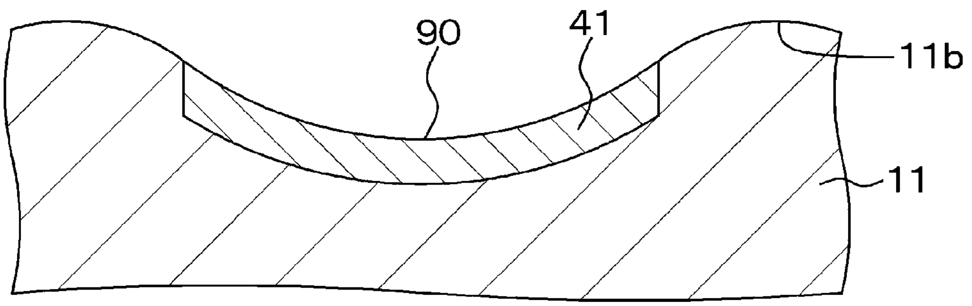
Figure 51C:
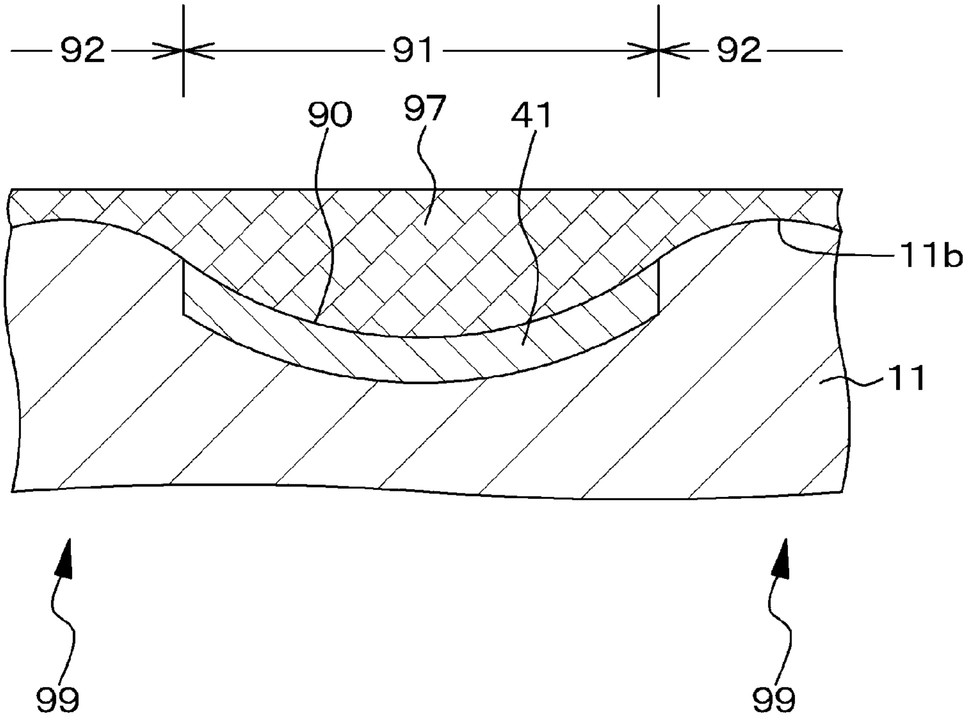

In Embodiment 11, first, an uneven portion 96 for forming the base surface 90 is formed in a second surface 11*b* of a light emitting element manufacturing substrate 11 (see FIG. 51A). Then, after the first light reflecting layer 41 formed using a multilayer film is formed in the second surface 11*b* of the light emitting element manufacturing substrate 11 (see FIG. 51B), a planarization film 97 is formed on the first light reflecting layer 41 and the second surface 11*b*, and the planarization film 97 is subjected to planarization processing (see FIG. 51C).

Next, the stacked structure 20 is formed on the planarization film 97 of the light emitting element manufacturing substrate 11 including the first light reflecting layer 41 on the basis of lateral growth by using a method of epitaxial growing in the lateral direction such as an ELO method. Thereafter, [Step-510] and [Step-520] of Embodiment 5 are performed. Then, the light emitting element manufacturing substrate 11 is removed, and the first electrode 31 is formed on the exposed planarization film 97. Alternatively, the first electrode 31 is formed on a first surface 11*a* of the light emitting element manufacturing substrate 11 without removing the light emitting element manufacturing substrate 11.

Embodiment 12

Embodiment 12 is a modification of Embodiments 5 to 11. In Embodiments 5 to 11, the stacked structure 20 is formed using a GaN-based compound semiconductor. On the other hand, in Embodiment 12, the stacked structure 20 is formed using an InP-based compound semiconductor or a GaAs-based compound semiconductor.

Parameters of the light emitting element in the light emitting element array (in which the stacked structure 20 is formed using an InP-based compound semiconductor) of Embodiment 12 in which the disposition state is similar to the configuration and structure illustrated in FIGS. 5 and 7 are as shown in Table 13 below, and specifications of the light emitting element are illustrated in Tables 14 and 15 below.

TABLE 13

| | Disposition state in FIG. 5 | Disposition state in FIG. 7 |
|---|---|---|
| Formation pitch | 25 μm | 20 μm |
| Radius $R_1$ of curvature | 100 μm | 200 μm |
| Diameter $D_1$ | 20 μm | 15 μm |
| Height $H_1$ | 2 μm | 2 μm |
| Radius $R_2$ of curvature | 4 μm | 5 μm |

TABLE 14

| Disposition state in FIG. 5 | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-InP |
| Active layer 23 | InGaAs (multiple quantum well structure), AlInGaAsP (multiple quantum well structure) or InAs quantum dot |
| First compound semiconductor layer 21 | n-InP |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 1.6 μm |
| Number of light emitting elements | 100 × 100 |

TABLE 15

| Disposition state in FIG. 7 | |
|---|---|
| Second light reflecting layer 42 | $SiO_2/SiN$ (9 pairs) |
| Second electrode 32 | ITO (thickness: 22 nm) |
| Second compound semiconductor layer 22 | p-InP |
| Active layer 23 | InGaAs (multiple quantum well structure), AlInGaAsP (multiple quantum well structure) or InAs quantum dot |
| First compound semiconductor layer 21 | n-InP |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 1.6 μm |
| Number of light emitting elements | 1000 × 1000 |

Furthermore, parameters of the light emitting element in the light emitting element array (in which the stacked structure 20 is formed using a GaAs-based compound semiconductor) of Embodiment 12 in which the disposition state is similar to the configuration and structure illustrated in FIGS. 5 and 7 are as shown in Table 16 below, and specifications of the light emitting element are illustrated in Tables 17 and 18 below.

TABLE 16

| | Disposition state in FIG. 5 | Disposition state in FIG. 7 |
|---|---|---|
| Formation pitch | 25 μm | 20 μm |
| Radius $R_1$ of curvature | 100 μm | 200 μm |
| Diameter $D_1$ | 20 μm | 15 μm |
| Height $H_1$ | 2 μm | 2 μm |
| Radius $R_2$ of curvature | 5 μm | 10 μm |

TABLE 17

| Disposition state in FIG. 5 | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-GaAs |
| Active layer 23 | InGaAs (multiple quantum well structure), GaInNAs (multiple quantum well structure), or InAs quantum dot |
| First compound semiconductor layer 21 | n-GaAs |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 0.94 μm |
| Number of light emitting elements | 100 × 100 |

TABLE 18

| Disposition state in FIG. 7 | |
|---|---|
| Second light reflecting layer 42 | $SiO_2/SiN$ (9 pairs) |
| Second electrode 32 | ITO (thickness: 22 nm) |
| Second compound semiconductor layer 22 | p-GaAs |
| Active layer 23 | InGaAs (multiple quantum well structure), GaInNAs (multiple quantum well structure), or InAs quantum dot |
| First compound semiconductor layer 21 | n-GaAs |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 0.94 μm |
| Number of light emitting elements | 1000 × 1000 |

Parameters of the light emitting element in the light emitting element array (in which the stacked structure 20 is formed using an InP-based compound semiconductor) of Embodiment 12 having a similar configuration and structure to those illustrated in FIGS. 37 and 38 and FIGS. 39 and 40 are as shown in Table 19 below, and specifications of the light emitting element are illustrated in Tables 20 and 21 below.

TABLE 19

| | FIGS. 37 and 38 | FIGS. 39 and 40 |
|---|---|---|
| Formation pitch | 25 μm | 25 μm |
| Radius $R_1$ of curvature | 150 μm | 150 μm |
| Diameter $D_1$ | 20 μm | 20 μm |
| Height $H_1$ | 2 μm | 2 μm |
| Radius $R_2$ of curvature | 2 um | 8 μm |
| Height $H_2$ | 2.5 μm | 2.5 μm |

TABLE 20

| FIGS. 37 and 38 | |
|---|---|
| Second light reflecting layer 42 | $SiO_2/Ta_2O_5$ (11.5 pairs) |
| Second electrode 32 | ITO (thickness: 30 nm) |
| Second compound semiconductor layer 22 | p-InP |
| Active layer 23 | InGaAs (multiple quantum well structure), AlInGaAsP (multiple quantum well structure), or InAs quantum dot |
| First compound semiconductor layer 21 | n-InP |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 1.6 μm |
| Number of light emitting elements | 100 × 100 |

TABLE 21

| FIGS. 39 and 40 | |
|---|---|
| Second light reflecting layer 42 | $SiO_2/Ta_2O_5$ (11.5 pairs) |
| Second electrode 32 | ITO (thickness: 30 nm) |
| Second compound semiconductor layer 22 | p-InP |
| Active layer 23 | InGaAs (multiple quantum well structure), AlInGaAsP (multiple quantum well structure), or InAs quantum dot |
| First compound semiconductor layer 21 | n-InP |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 1.6 μm |
| Number of light emitting elements | 100 × 100 |

Parameters of the light emitting element in the light emitting element array (in which the stacked structure 20 is formed using a GaAs-based compound semiconductor) of Embodiment 12 having a similar configuration and structure to those illustrated in FIGS. 37 and 38 and FIGS. 39 and 40 are as shown in Table 22 below, and specifications of the light emitting element are illustrated in Tables 23 and 24 below.

TABLE 22

| | FIGS. 37 and 38 | FIGS. 39 and 40 |
|---|---|---|
| Formation pitch | 25 μm | 25 μm |
| Radius $R_1$ of curvature | 150 μm | 150 μm |
| Diameter $D_1$ | 20 μm | 20 μm |
| Height $H_1$ | 2 μm | 2 μm |
| Radius $R_2$ of curvature | 6 μm | 4 μm |
| Height $H_2$ | 2.5 μm | 2.5 μm |

TABLE 23

| FIGS. 37 and 38 | |
|---|---|
| Second light reflecting layer 42 | $SiO_2/Ta_2O_5$ (11.5 pairs) |
| Second electrode 32 | ITO (thickness: 30 nm) |
| Second compound semiconductor layer 22 | p-GaAs |
| Active layer 23 | InGaAs (multiple quantum well structure), GaInNAs (multiple quantum well structure), or InAs quantum dot |
| First compound semiconductor layer 21 | n-GaAs |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 0.94 μm |
| Number of light emitting elements | 100 × 100 |

TABLE 24

| FIGS. 39 and 40 | |
|---|---|
| Second light reflecting layer 42 | $SiO_2/Ta_2O_5$ (11.5 pairs) |
| Second electrode 32 | ITO (thickness: 30 nm) |
| Second compound semiconductor layer 22 | p-GaAs |
| Active layer 23 | InGaAs (multiple quantum well structure), GaInNAs (multiple quantum well structure), or InAs quantum dot |

TABLE 24-continued

| FIGS. 39 and 40 | |
|---|---|
| First compound semiconductor layer 21 | n-GaAs |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 0.94 μm |
| Number of light emitting elements | 100 × 100 |

Parameters of the light emitting element in the light emitting element array (in which the stacked structure 20 is formed using an InP-based compound semiconductor) of Embodiment 12 having a similar configuration and structure to those illustrated in FIG. 46 are as shown in Table 25 below, and specifications of the light emitting element are illustrated in Table 26 below.

TABLE 25

| FIG. 46 | |
|---|---|
| Formation pitch | 25 μm |
| Radius $R_1$ of curvature | 150 μm |
| Diameter $D_1$ | 15 μm |
| Height $H_1$ | 2 μm |
| Radius $R_2$ of curvature | 3 μm |
| Diameter $D_2$ | 19 μm (inner diameter 18 μm/ outer diameter 20 μm) |
| Height $H_2$ | 3 μm |

TABLE 26

| FIG. 46 | |
|---|---|
| Second light reflecting layer 42 | $SiO_2/Ta_2O_5$ (7 pairs) |
| Second electrode 32 | ITO (thickness: 25 nm) |
| Second compound semiconductor layer 22 | p-InP |
| Active layer 23 | InGaAs (multiple quantum well structure), AlInGaAsP (multiple quantum well structure), or InAs quantum dot |
| First compound semiconductor layer 21 | n-InP |
| First light reflecting layer 41 | $SiO_2/Ta_2O_5$ (14 pairs) |
| Resonator length $L_{OR}$ | 20 μm |
| Oscillation wavelength (emission wavelength) $\lambda_0$ | 1.6 μm |
| Number of light emitting elements | 1000 × 1000 |

Parameters of the light emitting element in the light emitting element array (in which the stacked structure 20 is formed using a GaAs-based compound semiconductor) of Embodiment 12 having a similar configuration and structure to those illustrated in FIG. 46 are as shown in Table 27 below, and specifications of the light emitting element are illustrated in Table 28 below.

TABLE 27

| FIG. 46 | |
|---|---|
| Formation pitch | 25 μm |
| Radius $R_1$ of curvature | 150 μm |
| Diameter $D_1$ | 15 μm |
| Height $H_1$ | 2 μm |
| Radius $R_2$ of curvature | 3 μm |
| Diameter $D_2$ | 19 μm (inner diameter 18 μm/ outer diameter 20 μm) |
| Height $H_2$ | 3 μm |

TABLE 28

| FIG. 46 | |
|---|---|
| Second light reflecting layer 42 | $SiO_2/Ta_2O_5$ (7 pairs) |
| Second electrode 32 | ITO (thickness: 25 nm) |
| Second compound semiconductor layer 22 | p-GaAs |
| Active layer 23 | InGaAs (multiple quantum well structure), GaInNAs (multiple quantum well structure), or InAs quantum dot |
| First compound semiconductor layer 21 | n-GaAs |
| First light reflecting layer 41 | $SiO_2/Ta_2O_5$ (14 pairs) |
| Resonator length $L_{OR}$ | 20 μm |
| Oscillation wavelength (emission wavelength) $\lambda_0$ | 0.94 μm |
| Number of light emitting elements | 1000 × 1000 |

Parameters of the light emitting element in the light emitting element array (in which the stacked structure 20 is formed using an InP-based compound semiconductor) of Embodiment 12 having a similar configuration and structure to those illustrated in FIGS. 47A and 47B are as shown in Tables 29 and 31 below, and specifications of the light emitting element are illustrated in Tables 30 and 32 below.

TABLE 29

| FIG. 47A | |
|---|---|
| Formation pitch | 25 μm |
| Radius $R_1$ of curvature | 100 μm |
| Diameter $D_1$ | 20 μm |
| Height $H_1$ | 2 μm |

TABLE 30

| FIG. 47A | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-InP |
| Active layer 23 | InGaAs (multiple quantum well structure) |
| First compound semiconductor layer 21 | n-InP |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 1.6 μm |
| Number of light emitting elements | 1000 × 1 |

TABLE 31

| FIG. 47B | |
|---|---|
| Formation pitch | 25 μm (pitch along arrow B in FIG. 47B) |
| Radius $R_1$ of curvature | 100 μm (radius of curvature in direction of arrow B in FIG. 47B) |
| Size of first portion | 400 μm in length × 20 μm in width |
| Height $H_1$ | 2 μm |

TABLE 32

| FIG. 47B | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-InP |
| Active layer 23 | InGaAs (multiple quantum well structure), AlInGaAsP (multiple quantum well structure), or InAs quantum dot |
| First compound semiconductor layer 21 | n-InP |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 1.6 μm |
| Number of light emitting elements | 512 × 1 |

Parameters of the light emitting element in the light emitting element array (in which the stacked structure 20 is formed using a GaAs-based compound semiconductor) of Embodiment 12 having a similar configuration and structure to those illustrated in FIGS. 47A and 47B are as shown in Tables 33 and 35 below, and specifications of the light emitting element are illustrated in Tables 34 and 36 below.

TABLE 33

| FIG. 47A | |
|---|---|
| Formation pitch | 25 μm |
| Radius $R_1$ of curvature | 100 μm |
| Diameter $D_1$ | 20 μm |
| Height $H_1$ | 2 μm |

TABLE 34

| FIG. 47A | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-GaAs |
| Active layer 23 | InGaAs (multiple quantum well structure), GaInNAs (multiple quantum well structure), or InAs quantum dot |
| First compound semiconductor layer 21 | n-GaAs |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 0.94 μm |
| Number of light emitting elements | 1000 × 1 |

TABLE 35

| FIG. 47B | |
|---|---|
| Formation pitch | 25 μm (pitch along arrow B in FIG. 47B) |
| Radius $R_1$ of curvature | 100 μm (radius of curvature in direction of arrow B in FIG. 47B) |
| Size of first portion | 400 μm in length × 20 μm in width |
| Height $H_1$ | 2 μm |

TABLE 36

| FIG. 47B | |
|---|---|
| Second light reflecting layer 42 | $SiO_2/Ta_2O_5$ (11.5 pairs) |
| Second electrode 32 | ITO (thickness: 22 nm) |
| Second compound semiconductor layer 22 | p-GaAs |
| Active layer 23 | InGaAs (multiple quantum well structure), GaInNAs (multiple quantum well structure), or InAs quantum dot |
| First compound semiconductor layer 21 | n-GaAs |
| First light reflecting layer 41 | $SiO_2/Ta_2O_5$ (14 pairs) |
| Resonator length $L_{OR}$ | 25 μm |
| Oscillation wavelength (emission wavelength) $\lambda_0$ | 0.94 μm |
| Number of light emitting elements | 512 × 1 |

Embodiment 13

Embodiment 13 is a modification of the method for manufacturing the light emitting element array according to the second aspect of the present disclosure.

[Step-1300]

In a method for manufacturing the light emitting element array of Embodiment 13, after the stacked structure 20 is formed, the second light reflecting layer 42 is formed on the second surface side of the second compound semiconductor layer 22. Specifically, first, steps similar to [Step-500] to [Step-540] of Embodiment 5 are performed.

[Step-1310]

Next, after the first sacrificial layer 81 is formed on the first surface 21*a* of the first compound semiconductor layer 21, the surface of the first sacrificial layer 81 is made convex (see FIGS. 32A and 32B), then, the first sacrificial layer 81' is etched back, and the first compound semiconductor layer 21 is further etched back inward from the first surface 21*a* of the first compound semiconductor layer 21, thereby forming a convex portion 91' with respect to the second surface 21*b* of the first compound semiconductor layer 21. In this way, the structure illustrated in FIG. 52A can be obtained.

[Step-1320]

Figure 52A:
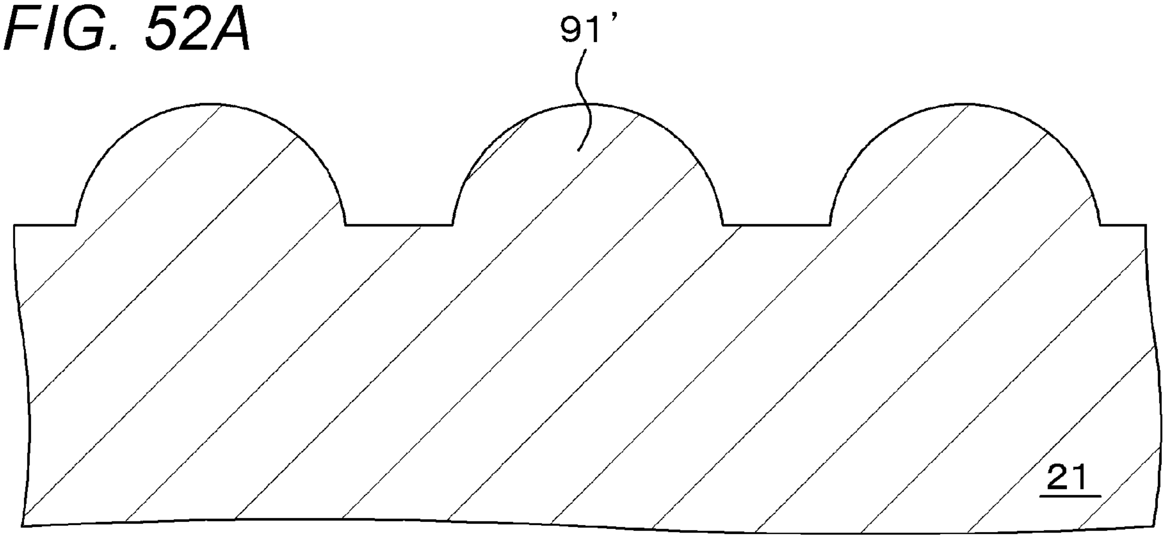
FIGS. 52A, 52B, and 52C are schematic partial end views of a stacked structure and the like for explaining a method for manufacturing a light emitting element of Embodiment 13.
Figure 52B:
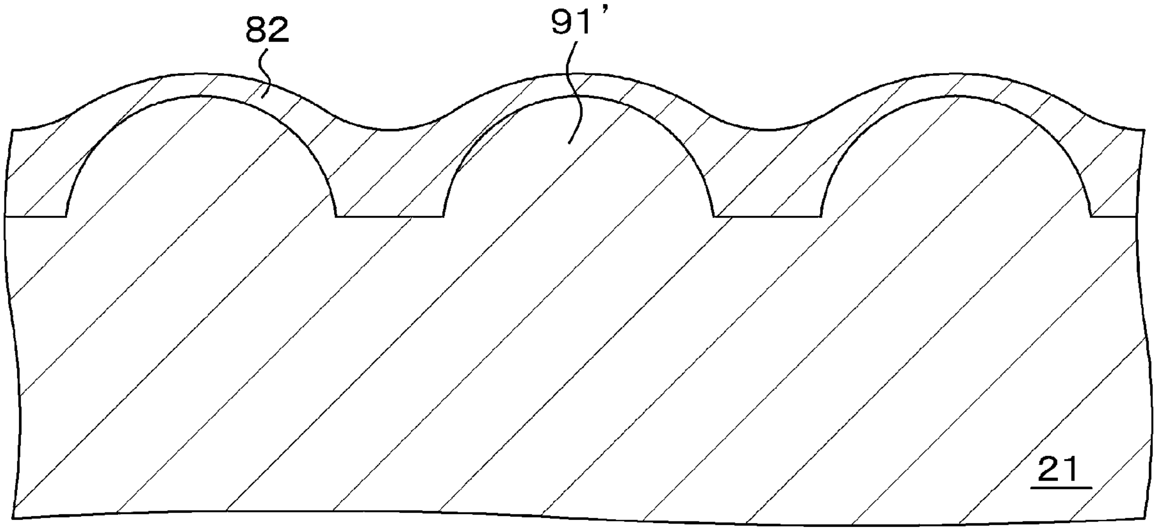
Figure 52C:
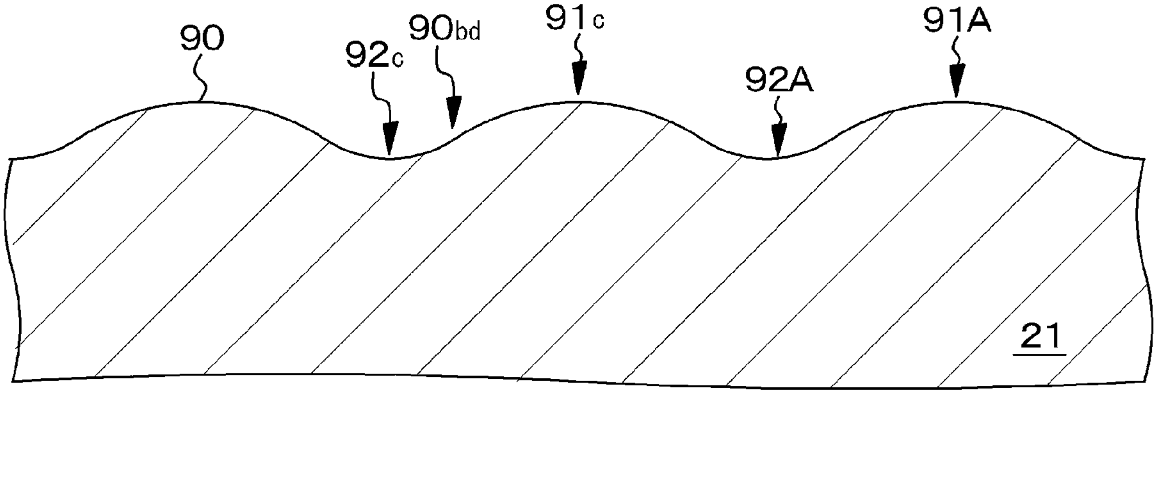

Thereafter, after the second sacrificial layer 82 is formed on the entire surface (see FIG. 52B), the second sacrificial layer 82 is etched back, and the first compound semiconductor layer 21 is further etched back inward, such that a convex portion is formed in the first portion 91 of the base surface 90 and at least a concave portion is formed in the second portion 92 of the base surface 90 with respect to the second surface 21*b* of the first compound semiconductor layer 21 (see FIG. 52C).

In a case where it is necessary to further increase a radius $R_1$ of curvature of the first portion 91 of the base surface 90, [Step-1320] may be repeated.

[Step-1330]

Thereafter, it is sufficient if steps similar to [Step-580] to [Step-590] of Embodiment 5 are performed.

Hereinafter, various modified examples of the light emitting elements of Embodiments 1 to 13 and the light emitting element according to the second aspect of the present disclosure and the like having the above-described preferable form and configuration will be described, and then Embodiments 14 to 24 will be described.

In the light emitting element according to the second aspect of the present disclosure and the like having the above-described preferable form and configuration can have a configuration in which the current injection region and the current non-injection region surrounding the current injection region are provided in the second compound semiconductor layer, and the shortest distance $D_{CI}$ from an area center point of the current injection region to a boundary between the current injection region and the current non-injection region satisfies the following formula. Here, the light emitting element having such a configuration is referred to as a "light emitting element of a fifth configuration" for convenience. Note that, for derivation of the following formula, see, for example, H. Kogelnik and T. Li, "Laser Beams and Resonators", Applied Optics/Vol. 5, No. 10/October 1966. Furthermore, $\omega_0$ is also called a beam waist radius.

$$D_{CI} \geq \omega_0/2 \quad (1\text{-}1)$$

Provided that, $$\omega_0^2 \equiv (\lambda_0/\pi)\{L_{OR}(R_1 - L_{OR})\}^{1/2} \quad (1\text{-}2)$$

where $\lambda_0$: a desired wavelength of light mainly emitted from the light emitting element (oscillation wavelength)

$L_{OR}$: a resonator length $R_1$: a radius of curvature of the central portion of the first portion of the base surface (that is, the radius of curvature of the first light reflecting layer)

Here, in the light emitting element according to the second aspect of the present disclosure and the like, only the first light reflecting layer has a concave mirror shape, but considering symmetry of the second light reflecting layer with respect to a flat mirror, the resonator can be expanded to a Fabry-Perot resonator sandwiched between two concave mirror portions having the same radius of curvature (see the schematic diagram of FIG. 64). At this time, a resonator length of a virtual Fabry-Perot resonator is twice the resonator length $L_{OR}$. FIGS. 65 and 66 are graphs illustrating a relationship between a value of $\omega_0$, a value of the resonator length $L_{OR}$, and a value of the radius $R_1$ of curvature of the first light reflecting layer. Note that, in FIGS. 65 and 66, the radius $R_1$ of curvature is indicated by "$R_{DBR}$". The value of $\omega_0$ being "positive" indicates that laser light is schematically in the state illustrated in FIG. 67A, and the value of $\omega_0$ being "negative" indicates that laser light is schematically in the state illustrated in FIG. 67B. The state of the laser light may be the state illustrated in FIG. 67A or the state illustrated in FIG. 67B. However, in the virtual Fabry-Perot resonator having the two concave mirror portions, when the radius $R_1$ of curvature becomes smaller than the resonator length $L_{OR}$, the state of the laser light becomes the state illustrated in FIG. 67B, such that confinement becomes excessive and a diffraction loss occurs. Therefore, the state illustrated in FIG. 67A in which the radius $R_1$ of curvature is larger than the resonator length $L_{OR}$ is preferable. Note that, in a case where the active layer is disposed close to a flat light reflecting layer of two light reflecting layers, specifically, the second light reflecting layer, the light field is further collected in the active layer. That is, light field confinement in the active layer is enhanced, and laser oscillation is facilitated. A position of the active layer, that is, a distance from the surface of the second light reflecting layer facing the second compound semiconductor layer to the active layer is not limited, but $\lambda_0/2$ to $10\lambda_0$ can be exemplified.

By the way, in a case where a region where light reflected by the first light reflecting layer is collected is not included in the current injection region corresponding to a region where the active layer has a gain by current injection, there is a possibility that stimulated emission of light from a carrier is inhibited, and eventually laser oscillation is inhibited. In a case where the above Formulas (1-1) and (1-2) are satisfied, it is possible to ensure that the region where the light reflected by the first light reflecting layer is collected is included in the current injection region, and laser oscillation can be reliably achieved.

Further, the light emitting element of the fifth configuration can have a configuration in which a mode loss acting portion provided on the second surface of the second compound semiconductor layer and constituting a mode loss acting region acting on an increase or decrease in oscillation mode loss, the second electrode formed on the second surface of the second compound semiconductor layer and on the mode loss acting portion, and the first electrode electrically connected to the first compound semiconductor layer are further included, the second light reflecting layer is formed on the second electrode, the current injection region, the current non-injection/inner region surrounding the current injection region, and the current non-injection/outer region surrounding the current non-injection/inner region are formed in the stacked structure, and an orthogonal projection image of the mode loss acting region and an orthogonal projection image of the current non-injection/outer region overlap each other.

Then, the light emitting element of the fifth configuration having such a preferable configuration can have a configuration in which a radius $r_1$ ($=D_1/2$) of a light reflection effective region of the first light reflecting layer satisfies $\omega_0 \leq r_1 \leq 20 \cdot \omega_0$, preferably, $\omega_0 \leq r_1 \leq 10 \cdot \omega_0$. Alternatively, as a value of $r_1$, $r_1 \leq 1\times10^{-4}$ m, preferably, $r_1 \leq 5\times10^{-5}$ m, can be exemplified. In addition, as a height (a thickness or height of the first portion of the base surface) $h_1$ of the base surface, $h_1 \leq 5\times10^{-5}$ m can be exemplified. Furthermore, the light emitting element of the fifth configuration having such a preferable configuration can have a configuration in which $D_{CI} \geq \omega_0$. Furthermore, the light emitting element of the fifth configuration having such a preferable configuration can have a configuration in which $R_1 \leq 1\times10^{-3}$ m, preferably, $1\times10^{-5}$ m $\leq R_1 \leq 1\times10^{-3}$ m, and more preferably, $1\times10^{-5}$ m $\leq R_1 \leq 1\times10^{-4}$ m.

In addition, the light emitting element according to the second aspect of the present disclosure and the like having the above-described preferable form and configuration can have a configuration in which the mode loss acting portion provided on the second surface of the second compound semiconductor layer and constituting the mode loss acting region acting on an increase or decrease in oscillation mode loss, the second electrode formed on the second surface of the second compound semiconductor layer and on the mode loss acting portion, and the first electrode electrically connected to the first compound semiconductor layer are further included, the second light reflecting layer is formed on the second electrode, the current injection region, the current non-injection/inner region surrounding the current injection region, and the current non-injection/outer region surrounding the current non-injection/inner region are formed in the stacked structure, and the orthogonal projection image of the mode loss acting region and the orthogonal projection image of the current non-injection/outer region overlap each other. Here, the light emitting element having such a configuration is referred to as a "light emitting element of a sixth configuration" for convenience.

Alternatively, the light emitting element according to the second aspect of the present disclosure and the like having the above-described preferable form and configuration can have a configuration in which the second electrode formed on the second surface of the second compound semiconductor layer, the second light reflecting layer formed on the second electrode, the mode loss acting portion provided on the first surface of the first compound semiconductor layer and constituting the mode loss acting region acting on an increase or decrease in oscillation mode loss, and the first electrode electrically connected to the first compound semiconductor layer are further included, the first light reflecting layer is formed on the first surface of the first compound semiconductor layer and on the mode loss acting portion, the current injection region, the current non-injection/inner region surrounding the current injection region, and the current non-injection/outer region surrounding the current non-injection/inner region are formed in the stacked structure, and the orthogonal projection image of the mode loss acting region and the orthogonal projection image of the current non-injection/outer region overlap each other. Here, the light emitting element having such a configuration is referred to as a "light emitting element of a seventh configuration" for convenience. Note that definition of the light emitting element of the seventh configuration can be applied to the light emitting element of the fifth configuration.

In the light emitting element of the sixth configuration or the light emitting element of the seventh configuration, the current non-injection region (a generic term of the current non-injection/inner region and the current non-injection/outer region) is formed in the stacked structure, but specifically, the current non-injection region may be formed in a region on a side of the second compound semiconductor layer where the second electrode is present in the thickness direction, may be formed in the entire second compound semiconductor layer, may be formed in the second compound semiconductor layer and the active layer, or may be formed in the second compound semiconductor layer and in a part of the first compound semiconductor layer. Although the orthogonal projection image of the mode loss acting region and the orthogonal projection image of the current non-injection/outer region overlap each other, in a region sufficiently away from the current injection region, the orthogonal projection image of the mode loss acting region and the orthogonal projection image of the current non-injection/outer region do not have to overlap each other.

The light emitting element of the sixth configuration can have a configuration in which the current non-injection/outer region is positioned below the mode loss acting region.

The light emitting element of the sixth configuration having the above-described preferable configuration can have a configuration in which $0.01 \le S_1/(S_1+S_2) \le 0.7$, where an area of an orthogonal projection image of the current injection region is $S_1$, and an area of an orthogonal projection image of the current non-injection/inner region is $S_2$. Further, the light emitting element of the seventh configuration can have a configuration in which $0.01 \le S_1'/(S_1'+S_2') \le 0.7$, where an area of the orthogonal projection image of the current injection region is $S_1'$, and an area of the orthogonal projection image of the current non-injection/inner region is $S_2'$. However, a range of $S_1/(S_1'+S_2)$ and a range of $S_1'/(S_1'+S_2')$ are not limited or restricted to the above-described ranges.

In the light emitting element of the sixth configuration or the light emitting element of the seventh configuration having the above-described preferable configuration can have a configuration in which the current non-injection/inner region and the current non-injection/outer region are formed by ion implantation into the stacked structure. The light emitting element having such a configuration is referred to as a "light emitting element of a 6-A-th configuration" or a "light emitting element of a 7-A-th configuration" for convenience. Then, in this case, an ion type may be at least one type of ion (that is, one type of ion or two or more types of ions) selected from the group consisting of boron, proton, phosphorus, arsenic, carbon, nitrogen, fluorine, oxygen, germanium, zinc, and silicon.

Alternatively, in the light emitting element of the sixth configuration or the light emitting element of the seventh configuration having the above-described preferable configuration can have a configuration in which the current non-injection/inner region and the current non-injection/outer region are formed by plasma irradiation on the second surface of the second compound semiconductor layer, ashing treatment on the second surface of the second compound semiconductor layer, or reactive ion etching treatment on the second surface of the second compound semiconductor layer. The light emitting element having such a configuration is referred to as a "light emitting element of a 6-B-th configuration" or a "light emitting element of a 7-B-th configuration" for convenience. In these treatments, since the current non-injection/inner region and the current non-injection/outer region are exposed to plasma particles, conductivity of the second compound semiconductor layer is deteriorated, and the current non-injection/inner region and the current non-injection/outer region are in a high resistance state. That is, the current non-injection/inner region and the current non-injection/outer region can be formed by exposure of the second surface of the second compound semiconductor layer to the plasma particles. Specifically, examples of the plasma particles can include argon, oxygen, and nitrogen.

Alternatively, the light emitting element of the sixth configuration or the light emitting element of the seventh configuration having the above-described preferable configuration can have a configuration in which the second light reflecting layer has a region that reflects or scatters light from the first light reflecting layer toward the outside of a resonator structure including the first light reflecting layer and the second light reflecting layer. The light emitting element having such a configuration is referred to as a "light emitting element of a 6-C-th configuration" or a "light emitting element of a 7-C-th configuration" for convenience. Specifically, a region of the second light reflecting layer positioned above a side wall of the mode loss acting portion (a side wall of an opening provided in the mode loss acting portion) has a forward tapered inclination, or has a region curved convexly toward the first light reflecting layer. Alternatively, the light emitting element of the sixth configuration or the light emitting element of the seventh configuration having the above-described preferable configuration can have a configuration in which the first light reflecting layer has a region that reflects or scatters light from the second light reflecting layer toward the outside of the resonator structure including the first light reflecting layer and the second light reflecting layer. Specifically, it is sufficient if a forward tapered inclination is formed in a partial region of the first light reflecting layer, or a convexly curved portion is formed toward the second light reflecting layer, or a region of the first light reflecting layer positioned above the side wall of the mode loss acting portion (the side wall of the opening provided in the mode loss acting portion) has a forward tapered inclination, or has a region curved convexly toward the second light reflecting layer. In addition, by scattering light at a boundary (side wall edge portion) between a top surface of the mode loss acting portion and the side wall of the opening provided in the mode loss acting portion, light can be scattered toward the outside of the resonator structure including the first light reflecting layer and the second light reflecting layer.

The light emitting element of the 6-A-th configuration, the light emitting element of the 6-B-th configuration, or the light emitting element of the 6-C-th configuration described above can have a configuration in which $OL_0 > OL_2$, where an optical distance from the active layer to the second surface of the second compound semiconductor layer in the current injection region is $OL_2$, and an optical distance from the active layer to the top surface of the mode loss acting portion in the mode loss acting region is $OL_0$. Further, the light emitting element of the 7-A-th configuration, the light emitting element of the 7-B-th configuration, or the light emitting element of the 7-C-th configuration described above can have a configuration in which, $OL_0' > OL_1'$, where an optical distance from the active layer to the first surface of the first compound semiconductor layer in the current injection region is $OL_1'$, and an optical distance from the active layer to the top surface of the mode loss acting portion in the mode loss acting region is $OL_0'$. Furthermore, the light emitting element of the 6-A-th configuration, the light emitting element of the 7-A-th configuration, the light emitting element of the 6-B-th configuration, the light emitting element of the 7-B-th configuration, the light emitting element of the 6-C-th configuration, or the light emitting element of the 7-C-th configuration described above having these configurations can have a configuration in which generated light having a higher-order mode is scattered toward the outside of the resonator structure including the first light reflecting layer and the second light reflecting layer and lost by the mode loss acting region, and thus an oscillation mode loss is increased. That is, light field intensities of a basic mode and the higher-order mode generated decrease as the distance from the Z axis increases in the orthogonal projection image of the mode loss acting region due to the presence of the mode loss acting region acting on an increase or decrease in oscillation mode loss, but a mode loss of the higher-order mode is larger than the decrease in light field intensity of the basic mode, such that the basic mode can thus be further stabilized, and since the mode loss can be suppressed as compared with a case where a current injection inner region is not present, a threshold current can be reduced. Note that, for convenience, an axial line (the perpendicular line with respect to the stacked structure passing through the center of the first light reflecting layer) passing through the center of the resonator formed by two light reflecting layers is the Z axis, and a virtual plane orthogonal to the Z axis is an XY plane.

Furthermore, in the light emitting element of the 6-A-th configuration, the light emitting element of the 7-A-th configuration, the light emitting element of the 6-B-th configuration, the light emitting element of the 7-B-th configuration, the light emitting element of the 6-C-th configuration, or the light emitting element of the 7-C-th configuration described above can have a configuration in which the mode loss acting portion is formed using a dielectric material, a metal material, or an alloy material. Examples of the dielectric material can include $SiO_X$, $SiN_X$, $AlN_X$, $AlO_X$, $TaO_X$, and $ZrO_X$, and examples of the metal material or the alloy material can include titanium, gold, platinum, and an alloy thereof, but are not limited to these materials. Light can be absorbed by the mode loss acting portion formed using these materials, thereby increasing the mode loss. Alternatively, the mode loss can be controlled by disturbing a phase without directly absorbing light. In this case, the mode loss acting portion can be formed using the dielectric material, and an optical thickness $t_0$ of the mode loss acting portion can be a value deviating from an integral multiple of ¼ of the wavelength $\lambda_0$ of the light generated in the light emitting element. That is, it is possible to destroy a standing wave by disturbing a phase of light circulating in the resonator and forming the standing wave at the mode loss acting portion and to give a corresponding mode loss. Alternatively, the mode loss acting portion can be formed using the dielectric material, and the optical thickness $t_0$ of the mode loss acting portion (a refractive index is $n_0$) can be an integral multiple of ¼ of the wavelength $\lambda_0$ of the light generated in the light emitting element. That is, the optical thickness $t_0$ of the mode loss acting portion can be a thickness at which the standing wave is not destroyed without disturbing the phase of the light generated in the light emitting element. However, it is not necessary that the optical thickness $t_0$ is strictly an integral multiple of ¼, and it is sufficient if $(\lambda_0/4n_0)\times m-(\lambda_0/8n_0)\leq t_0\leq(\lambda_0/4n_0)\times 2m+(\lambda_0/8n_0)$. Alternatively, by forming the mode loss acting portion by using the dielectric material, the metal material, or the alloy material, light passing through the mode loss acting portion can be disturbed in phase or absorbed by the mode loss acting portion. Then, by employing these configurations, the oscillation mode loss can be controlled with a higher degree of freedom, and the degree of freedom in designing the light emitting element can be further increased.

Alternatively, the light emitting element of the sixth configuration having the above-described preferable configuration can have a configuration in which the convex portion is formed on the second surface side of the second compound semiconductor layer, and the mode loss acting portion is formed on a region of the second surface of the second compound semiconductor layer surrounding the convex portion. The light emitting element having such a configuration is referred to as a "light emitting element of a 6-D-th configuration" for convenience. The convex portion occupies the current injection region and the current non-injection/inner region. Then, in this case, $OL_0 < OL_2$, where the optical distance from the active layer to the second surface of the second compound semiconductor layer in the current injection region is $OL_2$, and the optical distance from the active layer to the top surface of the mode loss acting portion in the mode loss acting region is $OL_0$. Furthermore, in these cases, the generated light having the higher-order mode is confined in the current injection region and the current non-injection/inner region by the mode loss acting region, and thus the oscillation mode loss can be reduced. That is, the light field intensities of the basic mode and higher-order mode generated increase in the orthogonal projection images of the current injection region and the current non-injection/inner region due to the presence of the mode loss acting region acting on an increase or decrease in oscillation mode loss. Furthermore, in these cases, the mode loss acting portion can be formed using a dielectric material, a metal material, or an alloy material. Here, examples of the dielectric material, the metal material, or the alloy material can include the above-described various materials.

Alternatively, the light emitting element of the seventh configuration having the above-described preferable configuration can have a configuration in which the convex portion is formed on the first surface side of the first compound semiconductor layer, and the mode loss acting portion is formed on a region of the first surface of the first compound semiconductor layer surrounding the convex portion, or the mode loss acting portion includes a region of the first compound semiconductor layer surrounding the convex portion. The light emitting element having such a configuration is referred to as a "light emitting element of a 7-D-th configuration" for convenience. The convex portion coincides with the orthogonal projection images of the current injection region and the current non-injection/inner region. Then, in this case, $OL_0' < OL_1'$, where an optical distance from the active layer to the first surface of the first compound semiconductor layer in the current injection region is $OL_1'$, and an optical distance from the active layer to the top surface of the mode loss acting portion in the mode loss acting region is $OL_0'$. Furthermore, in these cases, the generated light having the higher-order mode is confined in the current injection region and the current non-injection region by the mode loss acting region, and thus, the oscillation mode loss can be reduced. Moreover, in these cases, the mode loss acting portion can be formed using a dielectric material, a metal material, or an alloy material. Here, examples of the dielectric material, the metal material, or the alloy material can include the above-described various materials.

Furthermore, the light emitting element according to the second aspect of the present disclosure and the like having the above-described preferable form and configuration can have a configuration in which at least two light absorbing material layers are formed in the stacked structure including the second electrode in parallel with the virtual plane (XY plane) occupied by the active layer. Here, the light emitting element having such a configuration is referred to as a "light emitting element of an eighth configuration" for convenience.

In the light emitting element of the eighth configuration, it is preferable that at least four light absorbing material layers are formed.

In the light emitting element of the eighth configuration having the above-described preferable configuration, it is preferable that $0.9\times\{(m\cdot\lambda_0)/(2\cdot n_{eq})\}\leq L_{Abs}\leq 1.1\times\{(m\cdot\lambda_0)/(2\cdot n_{eq})\}$, where the oscillation wavelength (which is a wavelength of light mainly emitted from the light emitting element, and is a desired oscillation wavelength) is $\lambda_0$, an equivalent refractive index of the whole of two light absorbing material layers and a portion of the stacked structure positioned between the light absorbing material layers is $n_{eq}$, and a distance between the light absorbing material layers is $L_{Abs}$. Here, m is 1 or an arbitrary integer of 2 or more including 1. The equivalent refractive index $n_{eq}$ is represented by $n_{eq}=\Sigma(t_i\times n_i)/\Sigma(t_i)$, where a thickness of each of the two light absorbing material layers and each of layers constituting the portion of the stacked structure positioned between the light absorbing material layers is $t_i$ and a refractive index thereof is $n_i$. However, i=1, 2, 3, . . . , and I, and "I" is the total number of the two light absorbing material layers and the layers constituting the portion of the stacked structure positioned between the light absorbing material layers, and "Σ" means to sum up from i=1 to i=I. The equivalent refractive index $n_{eq}$ is only required to be calculated on the basis of a known refractive index of each constituent material and a thickness obtained by observation of the constituent material by electron microscope observation or the like of a cross section of the light emitting element. In a case where m is 1, the distance between adjacent light absorbing material layers satisfies $0.9\times\{\lambda_0/(2\cdot n_{eq})\}\leq L_{Abs}\leq 1.1\times\{\lambda_0/(2\cdot n_{eq})\}$ for all of a plurality of light absorbing material layers. Further, in a case where m is an arbitrary integer of 2 or more including 1, as an example, if m=1, 2, for some light absorbing material layers, the distance between adjacent light absorbing material layers satisfies $0.9\times\{\lambda_0/(2\cdot n_{eq})\}\leq L_{Abs}\leq 1.1\times\{\lambda_0/(2\cdot n_{eq})\}$, and for the remaining light absorbing material layers, the distance between adjacent light absorbing material layers satisfies $0.9\times\{(2\cdot\lambda_0)/(2\cdot n_{eq})\}\leq L_{Abs}\leq 1.1\times\{(2\cdot\lambda_0)/(2\cdot n_{eq})\}$. Broadly, for some light absorbing material layers, the distance between adjacent light absorbing material layers satisfies $0.9\times\{\lambda_0/(2\cdot n_{eq})\}\leq L_{Abs}\leq 1.1\times\{\lambda_0/(2\cdot n_{eq})\}$, and for the remaining various light absorbing material layers, the distance between adjacent light absorbing material layers satisfies $0.9\times\{(m'\cdot\lambda_0)/(2\cdot n_{eq})\}\leq L_{Abs}\leq 1.1\times\{(m'\cdot\lambda_0)/(2\cdot n_{eq})\}$. Here, m' is an arbitrary integer of 2 or more. In addition, the distance between adjacent light absorbing material layers is a distance between the centers of gravity of the adjacent light absorbing material layers. That is, the distance between adjacent light absorbing material layers is actually a distance between the centers of the respective light absorbing material layers when cut along the virtual plane (XZ plane) in the thickness direction of the active layer.

Furthermore, in the light emitting element of the eighth configuration having the above-described various preferable configurations, a thickness of the light absorbing material layer is preferably $\lambda_0/(4\cdot n_{eq})$ or less. A lower limit value of the thickness of the light absorbing material layer can be 1 nm, for example.

Furthermore, the light emitting element of the eighth configuration having the above-described various preferable configurations can have a configuration in which the light absorbing material layer is positioned at a minimum amplitude portion generated in a standing wave of light formed inside the stacked structure.

Furthermore, the light emitting element of the eighth configuration having the above-described various preferable configurations can have a configuration in which the active layer is positioned at a maximum amplitude portion generated in the standing wave of the light formed inside the stacked structure.

Furthermore, the light emitting element of the eighth configuration having the above-described various preferable configurations can have a configuration in which the light absorbing material layer has a light absorption coefficient that is twice or more the light absorption coefficient of the compound semiconductor constituting the stacked structure. Here, the light absorption coefficient of the light absorbing material layer and the light absorption coefficient of the compound semiconductor constituting the stacked structure can be obtained by observing the constituent material by electron microscope observation or the like of the cross section of the light emitting element, and performing analogization on the basis of a known evaluation result obtained by observation of each constituent material.

Furthermore, the light emitting element of the eighth configuration having the above-described various preferable configurations can have a configuration in which the light absorbing material layer is formed using at least one material selected from the group consisting of a compound semiconductor material having a narrower band gap than the compound semiconductor constituting the stacked structure, a compound semiconductor material doped with impurities, a transparent conductive material, and a light reflecting layer constituting material having a light absorption characteristic. Here, for example, in a case where the compound semiconductor constituting the stacked structure is GaN, examples of the compound semiconductor material having a narrower band gap than the compound semiconductor constituting the stacked structure can include InGaN, examples of the compound semiconductor material doped with impurities can include n-GaN doped with Si and n-GaN doped with B, examples of the transparent conductive material can include a transparent conductive material constituting the electrode as described later, and examples of the light reflecting layer constituting material having the light absorption characteristic can include a material constituting the light reflecting layer as described later (for example, $SiO_X$, $SiN_X$, and $TaO_X$). All of the light absorbing material layers may be formed using one of these materials. Alternatively, each of the light absorbing material layers may be formed using various materials selected from these materials, but it is preferable that one light absorbing material layer is formed using one kind of material from the viewpoint of simplification of formation of the light absorbing material layer. The light absorbing material layer may be formed in the first compound semiconductor layer, may be formed in the second compound semiconductor layer, may be formed in the first light reflecting layer, or may be formed in the second light reflecting layer, or any combination thereof is possible. Alternatively, the light absorbing material layer can also serve as the electrode formed using the transparent conductive material as described later.

Embodiment 14

Embodiment 14 is a modification of Embodiments 5 to 13, and relates to the light emitting element of the fifth configuration. As described above, the current constriction region (the current injection region 61A and the current non-injection region 61B) is defined by the insulating layer 34 having the opening 34A. That is, the current injection region 61A is defined by the opening 34A. That is, in the light emitting element of Embodiment 14, the current injection region 61A and the current non-injection region 61B surrounding the current injection region 61A are provided in the second compound semiconductor layer 22, and the shortest distance $D_{CI}$ from an area center point of the current injection region 61A to a boundary between the current injection region 61A and the current non-injection region 61B satisfies the above Formulas (1-1) and (1-2).

In the light emitting element of Embodiment 14, a radius $r_1$ of a light reflection effective region of the first light reflecting layer 41 satisfies $\omega_0 \leq r_1 \leq 20 \cdot \omega_0$. In addition, $D_{CI} \geq \omega_0$. Further, $R_1 \leq 1 \times 10^{-3}$ m. Specifically, $D_{CI}$=4 μm,
$\omega_0$=1.5 μm,
$L_{OR}$=50 μm,
$R_1$=60 μm, and
$\lambda_0$=525 nm can be exemplified. Further, a diameter of the opening 34A can be 8 μm, for example. As the GaN substrate, a substrate of which the main plane is a plane obtained by inclining a c plane by about 75 degrees in an m-axis direction is used. That is, the GaN substrate has a {20-21} plane which is a semipolar plane as the main plane. Note that such a GaN substrate can also be used in other embodiments.

A deviation between a central axis (Z axis) of the first portion 91 of the base surface 90 and the current injection region 61A in an XY plane direction causes deterioration of the characteristics of the light emitting element. Both of patterning for forming the first portion 91 and patterning for forming the opening 34A often use a lithography technology. In this case, a positional relationship therebetween is often shifted in the XY plane according to performance of an exposure machine. In particular, the opening 34A (current injection region 61A) is positioned by performing alignment from a side of the second compound semiconductor layer 22. On the other hand, the first portion 91 is positioned by performing alignment from a side of the compound semiconductor substrate 11. Therefore, in the light emitting element of Embodiment 14, the opening 34A (current injection region 61) is formed to be larger than a region where light is narrowed by the first portion 91, thereby implementing a structure in which an oscillation characteristic is not affected even in a case where the deviation occurs between the central axis (Z axis) of the first portion 91 and the current injection region 61A in the XY plane direction.

That is, in a case where a region where light reflected by the first light reflecting layer is collected is not included in the current injection region corresponding to a region where the active layer has a gain by current injection, there is a possibility that stimulated emission of light from a carrier is inhibited, and eventually laser oscillation is inhibited. However, in a case where the above Formulas (1-1) and (1-2) are satisfied, it is possible to ensure that the region where the light reflected by the first light reflecting layer is collected is included in the current injection region, and laser oscillation can be reliably achieved.

Embodiment 15

Figure 53:
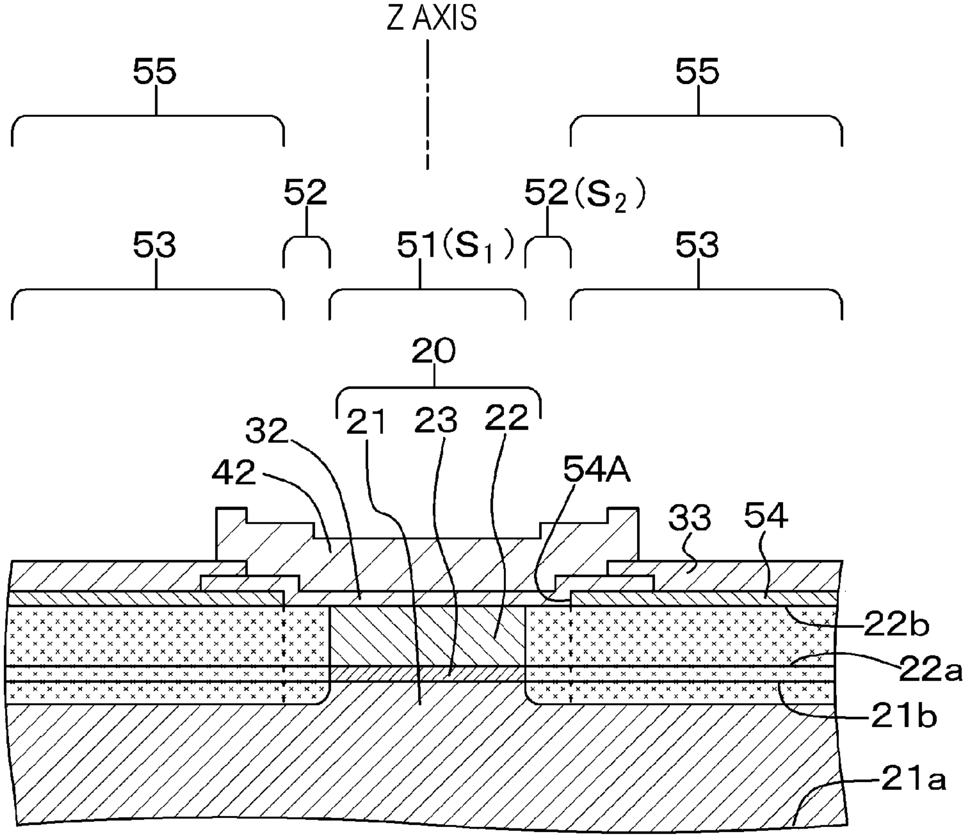
FIG. 53 is a schematic partial end view of a light emitting element of Embodiment 15.

Embodiment 15 is a modification of Embodiments 5 to 14, and relates to the light emitting element of the sixth configuration, specifically, the light emitting element of the 6-A-th configuration. FIG. 53 is a schematic partial end view of the light emitting element of Embodiment 15.

Meanwhile, in order to control a flow path (current injection region) of a current flowing between the first electrode and the second electrode, the current non-injection region is formed so as to surround the current injection region. In a GaAs-based surface emitting laser element (a surface emitting laser element formed using a GaAs-based compound semiconductor), the current non-injection region surrounding the current injection region can be formed by oxidizing the active layer from the outside along the XY plane. The oxidized region of the active layer (current non-injection region) has a refractive index lower than that of the non-oxidized region (current injection region). As a result, an optical path length (represented by the product of a refractive index and a physical distance) of the resonator is smaller in the current non-injection region than in the current injection region. Then, as a result, a kind of "lens effect" is generated, which leads to an action of confining laser light in a central portion of the surface emitting laser element. In general, since light tends to spread due to a diffraction effect, laser light reciprocating in the resonator is gradually scattered toward the outside of the resonator and lost (diffraction loss), and adverse effects such as an increase in threshold current occur. However, since the lens effect compensates for this diffraction loss, an increase in threshold current and the like can be suppressed.

However, in the light emitting element formed using the GaN-based compound semiconductor, it is difficult to oxidize the active layer from the outside along the XY plane (in the lateral direction) due to the characteristics of the material. Therefore, as described in Embodiments 5 to 14, the insulating layer 34 formed using $SiO_2$ and having an opening is formed on the second compound semiconductor layer 22, the second electrode 32 formed using a transparent conductive material is formed on the second compound semiconductor layer 22 exposed at the bottom of the opening 34A and on the insulating layer 34, and the second light reflecting layer 42 having a stacked structure of an insulating material is formed on the second electrode 32. In this manner, as the insulating layer 34 is formed, the current non-injection region 61B is formed. Then, a portion of the second compound semiconductor layer 22 positioned in the opening 34A provided in the insulating layer 34 becomes the current injection region 61A.

In a case where the insulating layer 34 is formed on the second compound semiconductor layer 22, the resonator length in the region where the insulating layer 34 is formed (current non-injection region 61B) is longer than the resonator length in the region where the insulating layer 34 is not formed (current injection region 61A) by an optical thickness of the insulating layer 34. Therefore, laser light reciprocating in the resonator formed by two light reflecting layers 41 and 42 of the surface emitting laser element (light emitting elements) is emitted and scattered toward the outside of the resonator and lost. Such an action is referred to as a "reversed lens effect" for convenience. Then, as a result, the oscillation mode loss occurs in the laser light, and there is a possibility that the threshold current increases or slope efficiency deteriorates. Here, the "oscillation mode loss" is a physical quantity that increases or decreases the light field intensities of the basic mode and the higher-order mode for oscillating laser light, and different oscillation mode losses are defined for individual modes. Note that the "light field intensity" is a light field intensity with a distance L from the Z axis on the XY plane as a function. In general, in the basic mode, the "light field intensity" monotonously decreases as the distance L increases, but in the higher-order mode, the "light field intensity" decreases while increasing and decreasing once or multiple times as the distance L increases (see the conceptual diagram of (A) of FIG. 55). Note that, in FIG. 55, a solid line indicates light field intensity distribution of the basic mode, and a broken line indicates light field intensity distribution of the higher-order mode. In addition, in FIG. 55, the first light reflecting layer 41 is illustrated as being flat for convenience, but the first light reflecting layer 41 has a concave mirror shape in actual implementation.

The light emitting element of Embodiment 15 or the light emitting elements of Embodiments 16 to 19 as described later include:

(A) the stacked structure 20 which is formed using a GaN-based compound semiconductor and in which the first compound semiconductor layer 21 having the first surface 21*a* and the second surface 21*b* opposing the first surface 21*a*, the active layer (light emitting layer) 23 facing the second surface 21*b* of the first compound semiconductor layer 21, and the second compound semiconductor layer 22 having the first surface 22*a* facing the active layer 23 and the second surface 22*b* opposing the first surface 22*a* are stacked;

(B) a mode loss acting portion (mode loss acting layer) 54 provided on the second surface 22*b* of the second compound semiconductor layer 22 and constituting a mode loss acting region 55 acting on an increase or decrease in oscillation mode loss;

(C) the second electrode 32 formed on the second surface 22*b* of the second compound semiconductor layer 22 and on the mode loss acting portion 54;

(D) the second light reflecting layer 42 formed on the second electrode 32;

(E) the first light reflecting layer 41 provided on the first surface side of the first compound semiconductor layer 21; and (F) the first electrode 31 electrically connected to the first compound semiconductor layer 21.

Then, a current non-injection region 51, a current non-injection/inner region 52 surrounding the current injection region 51, and a current non-injection/outer region 53 surrounding the current non-injection/inner region 52 are formed in the stacked structure 20, and an orthogonal projection image of the mode loss acting region 55 and an orthogonal projection image of the current non-injection/outer region 53 overlap each other. That is, the current non-injection/outer region 53 is positioned below the mode loss acting region 55. Note that, in a region sufficiently away from the current injection region 51 into which the current is injected, the orthogonal projection image of the mode loss acting region 55 and the orthogonal projection image of the current non-injection/outer region 53 do not have to overlap each other. Here, the current non-injection regions 52 and 53 into which no current is injected are formed in the stacked structure 20, but in the illustrated example, the current non-injection regions are formed in the second compound semiconductor layer 22 and in a part of the first compound semiconductor layer 21 in the thickness direction. However, the current non-injection regions 52 and 53 may be formed in a region on the side of the second compound semiconductor layer 22 where the second electrode is present in the thickness direction, may be formed in the entire second compound semiconductor layer 22, or may be formed in the second compound semiconductor layer 22 and the active layer 23.

The mode loss acting portion (mode loss acting layer) 54 is formed using a dielectric material such as $SiO_2$, and is formed between the second electrode 32 and the second compound semiconductor layer 22 in the light emitting element of Embodiment 15 or Embodiments 16 to 19 as described later. An optical thickness of the mode loss acting portion 54 can be a value deviating from an integral multiple of ¼ of the wavelength $\lambda_0$ of the light generated in the light emitting element. Alternatively, the optical thickness $t_0$ of the mode loss acting portion 54 can be an integral multiple of ¼ of the wavelength $\lambda_0$ of the light generated in the light emitting element. That is, the optical thickness $t_0$ of the mode loss acting portion 54 can be a thickness at which the standing wave is not destroyed without disturbing the phase of the light generated in the light emitting element. However, it is not necessary that the optical thickness $t_0$ is strictly an integral multiple of ¼, and it is sufficient if $(\lambda_0/4n_0)\times m-(\lambda_0/8n_0)\leq t_0\leq(\lambda_0/4n_0)\times 2m+(\lambda_0/8n_0)$. Specifically, the optical thickness $t_0$ of the mode loss acting portion 54 is preferably about 25 to 250 in a case where a value of ¼ of the wavelength of the light generated in the light emitting element is set to "100". Then, by employing these configurations, a phase difference between laser light passing through the mode loss acting portion 54 and laser light passing through the current injection region 51 can be changed (controlled), such that the oscillation mode loss can be controlled with a higher degree of freedom, and the degree of freedom in designing the light emitting element can be further increased.

In Embodiment 15, a shape of a boundary between the current injection region 51 and the current non-injection/inner region 52 is a circle (diameter: 8 μm), and a shape of a boundary between the current non-injection/inner region 52 and the current non-injection/outer region 53 is a circle (diameter: 12 μm). That is, $0.01\leq S_1/(S_1+S_2)\leq 0.7$, where an area of an orthogonal projection image of the current injection region 51 is $S_1$ and an area of an orthogonal projection image of the current non-injection/inner region 52 is $S_2$. Specifically, $S_1/(S_1+S_2)=8^2/12^2=0.44$.

In the light emitting element of Embodiment 15 or Embodiments 16 to 17 and Embodiment 19 as described later, $OL_0>OL_2$, where an optical distance from the active layer 23 to the second surface of the second compound semiconductor layer 22 in the current injection region 51 is $OL_2$, and an optical distance from the active layer 23 to a top surface (a surface facing the second electrode 32) of the mode loss acting portion 54 in the mode loss acting region 55 is $OL_0$. Specifically, $OL_0/OL_2=1.5$. Then, generated laser light having the higher-order mode is scattered toward the outside of the resonator structure including the first light reflecting layer 41 and the second light reflecting layer 42 and lost by the mode loss acting region 55, such that the oscillation mode loss increases. That is, the light field intensities of the basic mode and the higher-order mode generated decrease as the distance from the Z axis increases in the orthogonal projection image of the mode loss acting region 55 due to the presence of the mode loss acting region 55 acting on an increase or decrease in oscillation mode loss (see the conceptual diagram of (B) of FIG. 55), but the decrease in light field intensity of the higher-order mode is larger than the decrease in the light field intensity of the basic mode, such that the basic mode can thus be further stabilized, the threshold current can be reduced, and a relative light field intensity of the basic mode can be increased. Moreover, since a skirt portion of the light field intensity of the higher-order mode is positioned farther from the current injection region than that of the conventional light emitting element (see (A) of FIG. 55), an influence of the reversed lens effect can be reduced. Note that a mixed oscillation mode is caused in a case where the mode loss acting portion 54 formed using $SiO_2$ is not provided.

The first compound semiconductor layer 21 includes an n-GaN layer, the active layer 23 has a five-layered multiple quantum well structure in which an $In_{0.04}Ga_{0.96}N$ layer (barrier layer) and an $In_{0.16}Ga_{0.84}N$ layer (well layer) are stacked, and the second compound semiconductor layer 22 includes a p-GaN layer. Furthermore, the first electrode 31 is formed using Ti/Pt/Au, and the second electrode 32 is formed using a transparent conductive material, specifically, ITO. A circular opening 54A is formed in the mode loss acting portion 54, and the second compound semiconductor layer 22 is exposed at a bottom of the opening 54A. The first pad electrode (not illustrated) formed using, for example, Ti/Pt/Au or V/Pt/Au for electrical connection with an external circuit or the like is formed or connected on an edge portion of the first electrode 31. The second pad electrode 33 formed using, for example, Ti/Pd/Au or Ti/Ni/Au for electrical connection with an external circuit or the like is formed or connected on an edge portion of the second electrode 32. The first light reflecting layer 41 and the second light reflecting layer 42 have a structure in which a SiN layer and a $SiO_2$ layer are stacked (the total number of stacked dielectric films: 20).

In the light emitting element of Embodiment 15, the current non-injection/inner region 52 and the current non-injection/outer region 53 are formed by ion implantation into the stacked structure 20. For example, boron is selected as the ion, but the ion is not limited to boron.

Hereinafter, an outline of a method for manufacturing the light emitting element of Embodiment 15 will be described.

[Step-1500]

In manufacturing the light emitting element of Embodiment 15, first, a step similar to [Step-500] of Embodiment 5 is performed.

[Step-1510]

Next, the current non-injection/inner region 52 and the current non-injection/outer region 53 are formed in the stacked structure 20 on the basis of an ion implantation method using a boron ion.

[Step-1520]

Figure 54A:
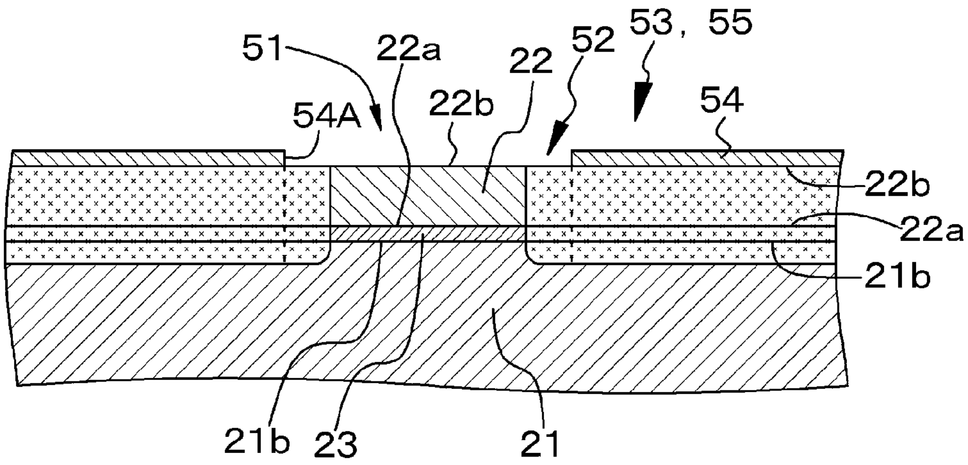
FIGS. 54A and 54B are schematic partial end views of a stacked structure and the like for explaining a method for manufacturing the light emitting element of Embodiment 15.

Thereafter, in a step similar to [Step-510] of Embodiment 5, the mode loss acting portion (mode loss acting layer) 54 having the opening 54A and formed using $SiO_2$ is formed on the second surface 22*b* of the second compound semiconductor layer 22 on the basis of a known method (see FIG. 54A).

[Step-1530]

Figure 54B:
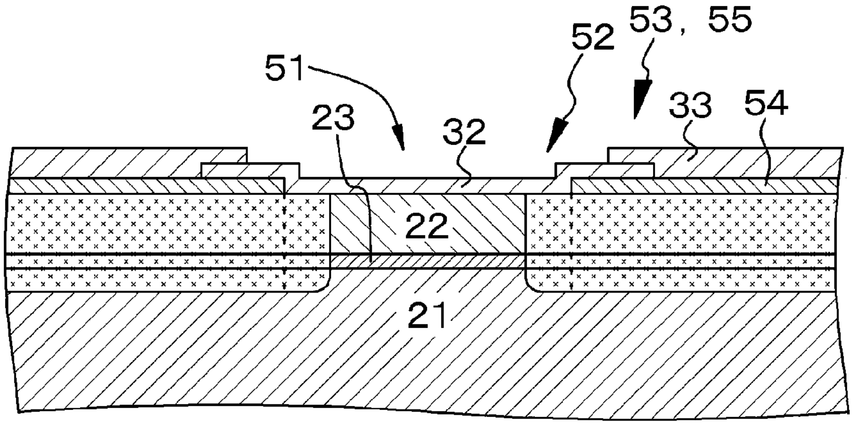

Thereafter, the light emitting element of Embodiment 15 can be obtained by performing steps similar to the steps after [Step-520] of Embodiment 5. Note that FIG. 54B illustrates a structure obtained in the middle of a step similar to [Step-520].

In the light emitting element of Embodiment 15, the current non-injection region, the current non-injection/inner region surrounding the current injection region, and the current non-injection/outer region surrounding the current non-injection/inner region are formed in the stacked structure, and the orthogonal projection image of the mode loss acting region and the orthogonal projection image of the current non-injection/outer region overlap each other. That is, the current injection region and the mode loss acting region are spaced (separated) by the current non-injection/inner region. Therefore, as illustrated in the conceptual diagram of (B) of FIG. 55, it is possible to make an increase or decrease in oscillation mode loss (specifically, an increase in Embodiment 15) be in a desired state. Alternatively, by appropriately determining a positional relationship between the current injection region and the mode loss acting region, the thickness of the mode loss acting portion constituting the mode loss acting region, and the like, it is possible to make an increase or decrease in oscillation mode loss be in a desired state. Then, as a result, it is possible to solve problems in the conventional light emitting element, such as an increase in threshold current and deterioration in slope efficiency. For example, the threshold current can be reduced by reducing the oscillation mode loss in the basic mode. Moreover, since a region to which the oscillation mode loss is given and a region to which a current is injected and which contributes to light emission can be controlled independently, that is, since the oscillation mode loss and a light emitting state of the light emitting element can be controlled independently, the degree of freedom in control and the degree of freedom in designing the light emitting element can be increased. Specifically, by setting the current injection region, the current non-injection region, and the mode loss acting region to have the above-described predetermined disposition relationship, it is possible to control a magnitude relationship of the oscillation mode loss given by the mode loss acting region to the basic mode and the higher-order mode, and it is possible to further stabilize the basic mode by making the oscillation mode loss given to the higher-order mode be relatively larger than the oscillation mode loss given to the basic mode. Moreover, since the light emitting element of Embodiment 15 has the first portion 91, occurrence of the diffraction loss can be more reliably suppressed.

Embodiment 16

Embodiment 16 is a modification of Embodiment 15, and relates to the light emitting element of the 6-B-th configuration. As illustrated in FIG. 56 which is a schematic partial cross-sectional view, in the light emitting element of Embodiment 16, the current non-injection/inner region 52 and the current non-injection/outer region 53 are formed by plasma irradiation on the second surface of the second compound semiconductor layer 22, ashing treatment on the second surface of the second compound semiconductor layer 22, or reactive ion etching (RIE) treatment on the second surface of the second compound semiconductor layer 22. Then, since the current non-injection/inner region 52 and the current non-injection/outer region 53 are exposed to plasma particles (specifically, argon, oxygen, nitrogen, and the like) as described above, conductivity of the second compound semiconductor layer 22 is deteriorated, and the current non-injection/inner region 52 and the current non-injection/outer region 53 are in a high resistance state. That is, the current non-injection/inner region 52 and the current non-injection/outer region 53 are formed by exposure of the second surface 22*b* of the second compound semiconductor layer 22 to the plasma particles. Note that illustration of the first light reflecting layer 41 is omitted in FIGS. 56, 57, 58A, and 58B.

Also in Embodiment 16, the shape of the boundary between the current injection region 51 and the current non-injection/inner region 52 is a circle (diameter: 10 μm), and the shape of the boundary between the current non-injection/inner region 52 and the current non-injection/outer region 53 is a circle (diameter: 15 μm). That is, $0.01 \le S_1/(S_1+S_2) \le 0.7$, where an area of an orthogonal projection image of the current injection region 51 is $S_1$ and an area of an orthogonal projection image of the current non-injection/inner region 52 is $S_2$. Specifically, $S_1/(S_1+S_2)=10^2/15^2=0.44$.

In Embodiment 16, instead of [Step-1510] of Embodiment 15, it is sufficient if the current non-injection/inner region 52 and the current non-injection/outer region 53 are formed in the stacked structure 20 on the basis of plasma irradiation on the second surface of the second compound semiconductor layer 22, ashing treatment on the second surface of the second compound semiconductor layer 22, or reactive ion etching treatment on the second surface of the second compound semiconductor layer 22.

Except for the above point, the light emitting element of Embodiment 16 can have a similar configuration and structure to those of the light emitting element of Embodiment 15, and thus a detailed description thereof will be omitted.

Even in the light emitting element of Embodiment 16 or Embodiment 17 as described later, by setting the current injection region, the current non-injection region, and the mode loss acting region to have the above-described predetermined disposition relationship, it is possible to control the magnitude relationship of the oscillation mode loss given by the mode loss acting region to the basic mode and the higher-order mode, and it is possible to further stabilize the basic mode by making the oscillation mode loss given to the higher-order mode be relatively larger than the oscillation mode loss given to the basic mode.

Embodiment 17

Embodiment 17 is a modification of Embodiments 15 and 16, and relates to the light emitting element of the 6-C-th configuration. As illustrated in FIG. 57 which is a schematic partial cross-sectional view, in the light emitting element of Embodiment 17, the second light reflecting layer 42 has a region that reflects or scatters light from the first light reflecting layer 41 toward the outside of the resonator structure including the first light reflecting layer 41 and the second light reflecting layer 42 (that is, toward the mode loss acting region 55). Specifically, a portion of the second light reflecting layer 42 positioned above the side wall (the side wall of the opening 54B) of the mode loss acting portion (mode loss acting layer) 54 has a forward tapered inclined portion 42A or has a region curved convexly toward the first light reflecting layer 41.

In Embodiment 17, the shape of the boundary between the current injection region 51 and the current non-injection/inner region 52 is a circle (diameter: 8 μm), and the shape of the boundary between the current non-injection/inner region 52 and the current non-injection/outer region 53 is a circle (diameter: 10 to 20 μm).

In Embodiment 17, in a step similar to [Step-1520] of Embodiment 15, in a case where the mode loss acting portion (mode loss acting layer) 54 having the opening 54B and formed using $SiO_2$ is formed, it is sufficient if the opening 54B having the forward tapered side wall is formed. Specifically, a resist layer is formed on the mode loss acting layer formed on the second surface 22*b* of the second compound semiconductor layer 22, and an opening is provided in a portion of the resist layer where the opening 54B is to be formed on the basis of a photolithography technology. The side wall of the opening is formed in a forward tapered shape on the basis of a known method. Then, by performing etching back, the opening 54B having the forward tapered side wall can be formed in the mode loss acting portion (mode loss acting layer) 54. Furthermore, by forming the second electrode 32 and the second light reflecting layer 42 on such a mode loss acting portion (mode loss acting layer) 54, the forward tapered inclined portion 42A can be provided in the second light reflecting layer 42.

Except for the above point, the light emitting element of Embodiment 17 can have a similar configuration and structure to those of the light emitting elements of Embodiments 15 and 16, and thus a detailed description thereof will be omitted.

Embodiment 18

Embodiment 18 is a modification of Embodiments 15 to 17, and relates to the light emitting element of the 6-D-th configuration. As illustrated in FIG. 58A which is a schematic partial cross-sectional view of the light emitting element of Embodiment 18, and in FIG. 58B which is a schematic partial cross-sectional view obtained by cutting out a main part, a convex portion 22A is formed on the second surface side of the second compound semiconductor layer 22. Then, as illustrated in FIGS. 58A and 58B, the mode loss acting portion (mode loss acting layer) 54 is formed on a region 22B of the second surface 22*b* of the second compound semiconductor layer 22 surrounding the convex portion 22A. The convex portion 22A occupies the current injection region 51, the current injection region 51, and the current non-injection/inner region 52. The mode loss acting portion (mode loss acting layer) 54 is formed using a dielectric material such as $SiO_2$, for example, similarly to Embodiment 15. In the region 22B, the current non-injection/outer region 53 is provided. $OL_2 < OL_2$, where the optical distance from the active layer 23 to the second surface of the second compound semiconductor layer 22 in the current injection region 51 is $OL_2$, and the optical distance from the active layer 23 to the top surface (the surface facing the second electrode 32) of the mode loss acting portion 54 in the mode loss acting region 55 is $OL_0$. Specifically, $OL_2/OL_0=1.5$. As a result, the lens effect is generated in the light emitting element.

In the light emitting element of Embodiment 18, the generated laser light having the higher-order mode is confined in the current injection region 51 and the current non-injection/inner region 52 by the mode loss acting region

55, such that the oscillation mode loss decreases. That is, the light field intensities of the basic mode and higher-order mode generated increase in the orthogonal projection images of the current injection region 51 and the current non-injection/inner region 52 due to the presence of the mode loss acting region 55 acting on an increase or decrease in oscillation mode loss.

In Embodiment 18, the shape of the boundary between the current injection region 51 and the current non-injection/inner region 52 is a circle (diameter: 8 μm), and the shape of the boundary between the current non-injection/inner region 52 and the current non-injection/outer region 53 is a circle (diameter: 30 μm).

In Embodiment 18, it is sufficient if the convex portion 22A is formed by removing a portion of the second compound semiconductor layer 22 from the second surface side between [Step-1510] and [Step-1520] of Embodiment 15.

Except for the above point, the light emitting element of Embodiment 18 can have a similar configuration and structure to those of the light emitting element of Embodiment 15, and thus a detailed description thereof will be omitted. In the light emitting element of Embodiment 18, it is possible to suppress the oscillation mode loss given by the mode loss acting region to various modes to not only perform multi-transverse-mode oscillation, but also reduce the threshold current of laser oscillation. In addition, as illustrated in the conceptual diagram of (C) of FIG. 55, the light field intensities of the basic mode and higher-order mode generated can increase in the orthogonal projection images of the current injection region and the current non-injection/inner region due to the presence of the mode loss acting region acting on an increase/decrease (specifically, a decrease in Embodiment 18) in oscillation mode loss.

Embodiment 19

Embodiment 19 is a modification of Embodiments 15 to 18. More specifically, the light emitting element of Embodiment 19 or Embodiment 20 as described later includes a surface emitting laser element (light emitting element) (VCSEL) that emits laser light from the first surface 21*a* of the first compound semiconductor layer 21 via the first light reflecting layer 41.

In the light emitting element of Embodiment 19, as illustrated in FIG. 59 which is a schematic partial cross-sectional view, the second light reflecting layer 42 is fixed to the support substrate 49 formed using a silicon semiconductor substrate via the bonding layer 48 formed using a gold (Au) layer or a solder layer containing tin (Sn) on the basis of a solder bonding method. In manufacturing the light emitting element of Embodiment 19, for example, it is sufficient if steps similar to [Step-1500] to [Step-1530] of Embodiment 15 are performed except for the removal of the support substrate 49, that is, without removing the support substrate 49.

Even in the light emitting element of Embodiment 19, by setting the current injection region, the current non-injection region, and the mode loss acting region to have the above-described predetermined disposition relationship, it is possible to control the magnitude relationship of the oscillation mode loss given by the mode loss acting region to the basic mode and the higher-order mode, and it is possible to further stabilize the basic mode by making the oscillation mode loss given to the higher-order mode be relatively larger than the oscillation mode loss given to the basic mode.

In the example of the light emitting element described above and illustrated in FIG. 59, an end portion of the first electrode 31 is separated from the first light reflecting layer 41. However, the present disclosure is not limited to such a structure, and the end portion of the first electrode 31 may be in contact with the first light reflecting layer 41, or the end portion of the first electrode 31 may be formed on an edge portion of the first light reflecting layer 41.

In addition, for example, after the steps similar to [Step-1500] to [Step-1530] of Embodiment 15 are performed, the light emitting element manufacturing substrate 11 may be removed to expose the first surface 21*a* of the first compound semiconductor layer 21, and then the first light reflecting layer 41 and the first electrode 31 may be formed on the first surface 21*a* of the first compound semiconductor layer 21.

Embodiment 20

Embodiment 20 is a modification of Embodiments 5 to 19, and relates to the light emitting element of the seventh configuration, specifically, the light emitting element of the 7-A-th configuration. More specifically, the light emitting element of Embodiment 20 includes a surface emitting laser element (light emitting element) (VCSEL) that emits laser light from the first surface 21*a* of the first compound semiconductor layer 21 via the first light reflecting layer 41.

The light emitting element of Embodiment 20 illustrated in FIG. 60 which is a schematic partial end view includes:

(a) the stacked structure 20 in which the first compound semiconductor layer 21 formed using a GaN-based compound semiconductor and having the first surface 21*a* and the second surface 21*b* opposing the first surface 21*a*, the active layer (light emitting layer) 23 that is formed using a GaN-based compound semiconductor and is in contact with the second surface 21*b* of the first compound semiconductor layer 21, and the second compound semiconductor layer 22 formed using a GaN-based compound semiconductor and having the first surface 22*a* and the second surface 22*b* opposing the first surface 22*a* are stacked, the first surface 22*a* being in contact with the active layer 23;

(b) the second electrode 32 formed on the second surface 22*b* of the second compound semiconductor layer 22;

(c) the second light reflecting layer 42 formed on the second electrode 32;

(d) a mode loss acting portion 64 provided on the first surface 21*a* of the first compound semiconductor layer 21 and constituting a mode loss acting region 65 acting on an increase or decrease in oscillation mode loss;

(e) the first light reflecting layer 41 formed on the first surface 21*a* of the first compound semiconductor layer 21 and on the mode loss acting portion 64; and (f) the first electrode 31 electrically connected to the first compound semiconductor layer 21. Note that, in the light emitting element of Embodiment 20, the first electrode 31 is formed on the first surface 21*a* of the first compound semiconductor layer 21.

Then, a current non-injection region 61, a current non-injection/inner region 62 surrounding the current injection region 61, and a current non-injection/outer region 63 surrounding the current non-injection/inner region 62 are formed in the stacked structure 20, and an orthogonal projection image of the mode loss acting region 65 and an orthogonal projection image of the current non-injection/outer region 63 overlap each other. Here, the current non-injection regions 62 and 63 are formed in the stacked structure 20, but in the illustrated example, the current non-injection regions are formed in the second compound semiconductor layer 22 and in a part of the first compound semiconductor layer 21 in the thickness direction. However, the current non-injection regions 62 and 63 may be formed in a region on the side of the second compound semiconductor layer 22 where the second electrode is present in the thickness direction, may be formed in the entire second compound semiconductor layer 22, or may be formed in the second compound semiconductor layer 22 and the active layer 23.

The configurations of the stacked structure 20, the second pad electrode 33, the first light reflecting layer 41, and the second light reflecting layer 42 can be similar to those in Embodiment 15, and the configurations of the bonding layer 48 and the support substrate 49 can be similar to those in Embodiment 19. A circular opening 64A is formed in the mode loss acting portion 64, and the first surface 21_a_ of the first compound semiconductor layer 21 is exposed at a bottom of the opening 64A.

The mode loss acting portion (mode loss acting layer) 64 is formed using a dielectric material such as $SiO_2$, and is formed on the first surface 21_a_ of the first compound semiconductor layer 21. An optical thickness $t_0$ of the mode loss acting portion 64 can be a value deviating from an integral multiple of ¼ of the wavelength $\lambda_0$ of the light generated in the light emitting element. Alternatively, the optical thickness $t_0$ of the mode loss acting portion 64 can be an integral multiple of ¼ of the wavelength $\lambda_0$ of the light generated in the light emitting element. That is, the optical thickness $t_0$ of the mode loss acting portion 64 can be a thickness at which the standing wave is not destroyed without disturbing the phase of the light generated in the light emitting element. However, it is not necessary that the optical thickness $t_0$ is strictly an integral multiple of ¼, and it is sufficient if $(\lambda_0/4n_0)\times m-(\lambda_0/8n_0)\leq t_0\leq(\lambda_0/4n_0)\times 2m+(\lambda_0/8n_0)$. Specifically, the optical thickness $t_0$ of the mode loss acting portion 64 is preferably about 25 to 250 in a case where a value of ¼ of the wavelength $\lambda_0$ of the light generated in the light emitting element is set to "100". Then, by employing these configurations, a phase difference between laser light passing through the mode loss acting portion 64 and laser light passing through the current injection region 61 can be changed (controlled), such that the oscillation mode loss can be controlled with a higher degree of freedom, and the degree of freedom in designing the light emitting element can be further increased.

In Embodiment 20, a shape of a boundary between the current injection region 61 and the current non-injection/inner region 62 is a circle (diameter: 8 μm), and a shape of a boundary between the current non-injection/inner region 62 and the current non-injection/outer region 63 is a circle (diameter: 15 μm). That is, $0.01\leq S_1'/(S_1'+S_2')\leq 0.7$, where an area of an orthogonal projection image of the current injection region 61 is $S_1'$ and an area of an orthogonal projection image of the current non-injection/inner region 62 is $S_2'$. Specifically, $S_1'/(S_1'+S_2')=8^2/15^2=0.28$.

In the light emitting element of Embodiment 20, $OL_0'>OL_1'$, where an optical distance from the active layer 23 to the first surface of the first compound semiconductor layer 21 in the current injection region 61 is $OL_1'$, and an optical distance from the active layer 23 to the top surface (the surface facing the first electrode 31) of the mode loss acting portion 64 in the mode loss acting region 65 is $OL_0'$. Specifically, $OL_0'/OL_1'=1.01$. Then, generated laser light having the higher-order mode is scattered toward the outside of the resonator structure including the first light reflecting layer 41 and the second light reflecting layer 42 and lost by the mode loss acting region 65, such that the oscillation mode loss increases. That is, the light field intensities of the basic mode and the higher-order mode generated decrease as the distance from the Z axis increases in the orthogonal projection image of the mode loss acting region 65 due to the presence of the mode loss acting region 65 acting on an increase or decrease in oscillation mode loss (see the conceptual diagram of (B) of FIG. 55), but the decrease in light field intensity of the higher-order mode is larger than the decrease in the light field intensity of the basic mode, such that the basic mode can thus be further stabilized, the threshold current can be reduced, and a relative light field intensity of the basic mode can be increased.

In the light emitting element of Embodiment 20, the current non-injection/inner region 62 and the current non-injection/outer region 63 are formed by ion implantation into the stacked structure 20, similarly to Embodiment 15. For example, boron is selected as the ion, but the ion is not limited to boron.

Hereinafter, a method for manufacturing the light emitting element of Embodiment 20 will be described.

[Step-2000]

First, the stacked structure 20 can be obtained by performing a step similar to [Step-1500] of Embodiment 15. Next, by performing a step similar to [Step-1510] of Embodiment 15, the current non-injection/inner region 62 and the current non-injection/outer region 63 can be formed in the stacked structure 20.

[Step-2010]

Next, the second electrode 32 is formed on the second surface 22_b_ of the second compound semiconductor layer 22 on the basis of, for example, a lift-off method, and in addition, the second pad electrode 33 is formed on the basis of a known method. Thereafter, the second light reflecting layer 42 is formed on the second electrode 32 and on the second pad electrode 33 on the basis of a known method.

[Step-2020]

Thereafter, the second light reflecting layer 42 is fixed to the support substrate 49 via the bonding layer 48.

[Step-2030]

Next, the light emitting element manufacturing substrate 11 is removed to expose the first surface 21_a_ of the first compound semiconductor layer 21. Specifically, first, the light emitting element manufacturing substrate 11 is thinned on the basis of a mechanical polishing method, and then the remaining portion of the light emitting element manufacturing substrate 11 is removed on the basis of a CMP method. In this way, the first surface 21_a_ of the first compound semiconductor layer 21 is exposed, and then the base surface 90 having the first portion 91 and the second portion 92 is formed in the first surface 21_a_ of the first compound semiconductor layer 21.

[Step-2040]

Thereafter, the mode loss acting portion (mode loss acting layer) 64 having the opening 64A and formed using $SiO_2$ is formed on the first surface 21_a_ of the first compound semiconductor layer 21 (specifically, on the second portion 92 of the base surface 90) on the basis of a known method.

[Step-2050]

Next, the first light reflecting layer 41 is formed on the first portion 91 of the first surface 21_a_ of the first compound semiconductor layer 21 exposed at the bottom of the opening 64A of the mode loss acting portion 64, and in addition, the first electrode 31 is formed. Note that a portion of the first electrode 31 penetrates through the mode loss acting portion (mode loss acting layer) 64 and reaches the first compound semiconductor layer 21 in a region (not illustrated). In this way, the light emitting element of Embodiment 20 having the structure illustrated in FIG. 60 can be obtained.

Also in the light emitting element of Embodiment 20, the current non-injection region, the current non-injection/inner region surrounding the current injection region, and the current non-injection/outer region surrounding the current non-injection/inner region are formed in the stacked structure, and the orthogonal projection image of the mode loss acting region and the orthogonal projection image of the current non-injection/outer region overlap each other. Therefore, as illustrated in the conceptual diagram of (B) of FIG. 55, it is possible to make an increase or decrease in oscillation mode loss (specifically, an increase in Embodiment 20) be in a desired state. Moreover, since the oscillation mode loss and the light emitting state of the light emitting element can be controlled independently, the degree of freedom in control and the degree of freedom in designing the light emitting element can be increased. Specifically, by setting the current injection region, the current non-injection region, and the mode loss acting region to have the above-described predetermined disposition relationship, it is possible to control the magnitude relationship of the oscillation mode loss given by the mode loss acting region to the basic mode and the higher-order mode, and it is possible to further stabilize the basic mode by making the oscillation mode loss given to the higher-order mode be relatively larger than the oscillation mode loss given to the basic mode. Furthermore, an influence of the reversed lens effect can be reduced. Moreover, since the light emitting element of Embodiment 20 has the first portion 91, occurrence of the diffraction loss can be more reliably suppressed.

Also in Embodiment 20, similarly to Embodiment 16, the current non-injection/inner region 62 and the current non-injection/outer region 63 can be formed by plasma irradiation on the second surface of the second compound semiconductor layer 22, ashing treatment on the second surface of the second compound semiconductor layer 22, or reactive ion etching (RIE) treatment on the second surface of the second compound semiconductor layer 22 (the light emitting element of the 7-B-th configuration). As the current non-injection/inner region 62 and the current non-injection/outer region 63 are exposed to plasma particles as described above, conductivity of the second compound semiconductor layer 22 is deteriorated, and the current non-injection/inner region 62 and the current non-injection/outer region 63 are in a high resistance state. That is, the current non-injection/inner region 62 and the current non-injection/outer region 63 are formed by exposure of the second surface **22*b* of the second compound semiconductor layer 22** to the plasma particles.

Furthermore, similarly to Embodiment 17, the second light reflecting layer 42 can have a region that reflects or scatters light from the first light reflecting layer 41 toward the outside of the resonator structure including the first light reflecting layer 41 and the second light reflecting layer 42 (that is, toward the mode loss acting region 65) (the light emitting element of the 7-C-th configuration).

In addition, similarly to Embodiment 18, the mode loss acting portion (mode loss acting layer) 64 may be formed (the light emitting element of the 7-D-th configuration). It is sufficient if the mode loss acting portion (mode loss acting layer) 64 is formed on a region of the first surface **21*a* of the first compound semiconductor layer 21 surrounding a convex portion. The convex portion occupies the current injection region 61, the current injection region 61, and the current non-injection/inner region 62. Then, as a result, the generated laser light having the higher-order mode is confined in the current injection region 61 and the current non-injection/inner region 62 by the mode loss acting region 65, such that the oscillation mode loss decreases. That is, the light field intensities of the basic mode and higher-order mode generated increase in the orthogonal projection images of the current injection region 61 and the current non-injection/inner region 62 due to the presence of the mode loss acting region 65 acting on an increase or decrease in oscillation mode loss. Also in a modified example of the light emitting element of Embodiment 20 having such a configuration, it is possible to suppress the oscillation mode loss given by the mode loss acting region 65 to various modes to not only perform multi-transverse-mode oscillation, but also reduce the threshold current of laser oscillation. In addition, as illustrated in the conceptual diagram of (C) of FIG. 55, the light field intensities of the basic mode and higher-order mode generated can increase in the orthogonal projection images of the current injection region and the current non-injection/inner region due to the presence of the mode loss acting region 65** acting on an increase/decrease (specifically, a decrease in the modified example of the light emitting element of Embodiment 20) in oscillation mode loss.

Embodiment 21

Embodiment 21 is a modification of Embodiments 5 to 20, and relates to the light emitting element of the eighth configuration.

Meanwhile, the resonator length $L_{OR}$ in the stacked structure including two DBR layers and a stacked structure formed therebetween is represented by $L=(m\cdot\lambda_0)/(2\cdot n_{eq})$, where an equivalent refractive index of the entire stacked structure is $n_{eq}$, and a wavelength of laser light to be emitted from a surface emitting laser element (light emitting element) is $\lambda_0$. Here, m is a positive integer. Then, in the surface emitting laser element (light emitting element), a wavelength at which oscillation is possible is determined by the resonator length $L_{OR}$. Each oscillatable oscillation mode is called a longitudinal mode. Then, among the longitudinal modes, a longitudinal mode that matches a gain spectrum determined by the active layer can be laser-oscillated. An interval $\Delta\lambda$ between the longitudinal modes is represented by $\lambda_0^2/(2n_{eff}\cdot L)$, where an effective refractive index is $n_{eff}$. That is, the larger the resonator length $L_{OR}$, the smaller the interval $\Delta\lambda$ between the longitudinal modes. Therefore, in a case where the resonator length $L_{OR}$ is large, a plurality of longitudinal modes can exist in the gain spectrum, and thus the plurality of longitudinal modes can oscillate. Note that the equivalent refractive index $n_{eq}$ and the effective refractive index $n_{eff}$ have the following relationship in which the oscillation wavelength is $\lambda_0$.

$$n_{eff}=n_{eq}-\lambda_0\cdot(dn_{eq}/d\lambda_0)$$

Here, in a case where the stacked structure includes a GaAs-based compound semiconductor layer, the resonator length $L_{OR}$ is usually 1 μm or less, which is small, and one type (one wavelength) of laser light in the longitudinal mode is emitted from the surface emitting laser element (see the conceptual diagram of FIG. 68A). Therefore, it is possible to accurately control the oscillation wavelength of the laser light in the longitudinal mode emitted from the surface emitting laser element. On the other hand, in a case where the stacked structure includes a GaN-based compound semiconductor layer, the resonator length $L_{OR}$ is usually several times the wavelength of the laser light emitted from the surface emitting laser element, which is large. Therefore, a plurality of types of laser light in the longitudinal mode is emitted from the surface emitting laser element (see the conceptual diagram of FIG. 68B), and it thus becomes difficult to accurately control the oscillation wavelength of the laser light that can be emitted from the surface emitting laser element.

As illustrated in FIG. 61 which is a schematic partial cross-sectional view, in the light emitting element of Embodiment 21 or the light emitting elements of Embodiments 22 to 24 as described later, at least two light absorbing material layers 71, preferably, at least four light absorbing material layers 71, and specifically, 20 light absorbing material layers 71 in Embodiment 21 are formed in the stacked structure 20 including the second electrode 32 in parallel with the virtual plane (XY plane) occupied by the active layer 23. Note that, in order to simplify the drawing, only two light absorbing material layers 71 are illustrated in the drawing.

In Embodiment 21, the oscillation wavelength (a desired oscillation wavelength emitted from the light emitting element) $\lambda_0$ is 450 nm. The 20 light absorbing material layers 71 are formed using a compound semiconductor material having a band gap narrower than that of the compound semiconductor constituting the stacked structure 20, specifically, n-$In_{0.2}Ga_{0.8}N$, and are formed inside the first compound semiconductor layer 21. A thickness of the light absorbing material layer 71 is $\lambda_0/(4 \cdot n_{eq})$ or less, specifically, 3 nm. Furthermore, a light absorption coefficient of the light absorbing material layer 71 is two times or more, specifically, $1\times10^3$ times the light absorption coefficient of the first compound semiconductor layer 21 including an n-GaN layer.

In addition, the light absorbing material layer 71 is positioned at a minimum amplitude portion generated in a standing wave of light formed inside the stacked structure, and the active layer 23 is positioned at a maximum amplitude portion generated in a standing wave of light formed inside the stacked structure. A distance between a center of the active layer 23 in the thickness direction and a center of the light absorbing material layer 71 adjacent to the active layer 23 in the thickness direction is 46.5 nm. Furthermore, $0.9\times\{(m\cdot\lambda_0)/(2\cdot n_{eq})\}\leq L_{Abs}\leq 1.1\times\{(m\cdot\lambda_0)/(2\cdot n_{eq})\}$, where an equivalent refractive index of the whole of two light absorbing material layers 71 and a portion (specifically, the first compound semiconductor layer 21 in Embodiment 21) of the stacked structure positioned between the light absorbing material layers 71 is $n_{eq}$, and a distance between the light absorbing material layers 71 is $L_{Abs}$. Here, m is 1 or an arbitrary integer of 2 or more including 1. However, in Embodiment 21, m is 1. Therefore, the distance between adjacent light absorbing material layers 71 satisfies $0.9\times\{\lambda_0/(2\cdot n_{eq})\}\leq L_{Abs}\leq 1.1\times\{\lambda_0/(2\cdot n_{eq})\}$ for all of the plurality of light absorbing material layers 71 (20 light absorbing material layers 71). A value of the equivalent refractive index $n_{eq}$ is specifically 2.42, and in a case where m=1, specifically, $L_{Abs}=1\times450/(2\times2.42)=93.0$ nm. Note that, in some of the 20 light absorbing material layers 71, m may be an arbitrary integer of 2 or more.

In manufacturing the light emitting element of Embodiment 21, the stacked structure 20 is formed in a step similar to [Step-500] of Embodiment 5, and at this time, the 20 light absorbing material layers 71 are also formed inside the first compound semiconductor layer 21. Except for this point, the light emitting element of Embodiment 21 can be manufactured on the basis of a method similar to that for the light emitting element of Embodiment 5.

FIG. 62 schematically illustrates a case where a plurality of longitudinal modes is generated in the gain spectrum determined by the active layer 23. Note that FIG. 62 illustrates two longitudinal modes, a longitudinal mode A and a longitudinal mode B. Then, in this case, it is assumed that the light absorbing material layer 71 is positioned at a minimum amplitude portion of the longitudinal mode A and is not positioned at a minimum amplitude portion of the longitudinal mode B. Then, a mode loss of the longitudinal mode A is minimized, but a mode loss of the longitudinal mode B is large. In FIG. 62, the mode loss of the longitudinal mode B is schematically indicated by a solid line. Therefore, the longitudinal mode A oscillates more easily than the longitudinal mode B. Therefore, by using such a structure, that is, by controlling the position and period of the light absorbing material layer 71, a specific longitudinal mode can be stabilized and oscillation can be facilitated. Meanwhile, since it is possible to increase mode losses of other undesirable longitudinal modes, it is possible to suppress oscillation of other undesirable longitudinal modes.

As described above, in the light emitting element of Embodiment 21, since at least two light absorbing material layers are formed inside the stacked structure, it is possible to suppress oscillation of laser light of an undesired longitudinal mode among laser light of a plurality of longitudinal modes that can be emitted from the surface emitting laser element. As a result, the oscillation wavelength of the emitted laser light can be accurately controlled. Moreover, since the light emitting element of Embodiment 21 has the first portion 91, occurrence of the diffraction loss can be reliably suppressed.

Embodiment 22

Embodiment 22 is a modification of Embodiment 21. In Embodiment 21, the light absorbing material layer 71 is formed using a compound semiconductor material having a band gap narrower than that of the compound semiconductor constituting the stacked structure 20. On the other hand, in Embodiment 22, 10 light absorbing material layers 71 are formed using a compound semiconductor material doped with impurities, specifically, a compound semiconductor material having an impurity concentration (impurity: Si) of $1\times10^{19}/cm^3$ (specifically, n-GaN:Si). Furthermore, in Embodiment 22, the oscillation wavelength $\lambda_0$ is 515 nm. Note that a composition of the active layer 23 is $In_{0.3}Ga_{0.7}N$. In Embodiment 22, m=1, a value of $L_{Abs}$ is 107 nm, the distance between the center of the active layer 23 in the thickness direction and the center of the light absorbing material layer 71 adjacent to the active layer 23 in the thickness direction is 53.5 nm, and the thickness of the light absorbing material layer 71 is 3 nm. Except for the above point, the light emitting element of Embodiment 22 can have a similar configuration and structure to those of the light emitting element of Embodiment 21, and thus a detailed description thereof will be omitted. Note that, in some of the 10 light absorbing material layers 71, m may be an arbitrary integer of 2 or more.

Embodiment 23

Embodiment 23 is also a modification of Embodiment 21. In Embodiment 23, five light absorbing material layers (referred to as “first light absorbing material layers” for convenience) have a configuration similar to that of the light absorbing material layer 71 of Embodiment 21, that is, the first light absorbing material layer is formed using n-$In_{0.3}Ga_{0.7}N$. Furthermore, in Embodiment 23, one light absorbing material layer (referred to as a "second light absorbing material layer" for convenience) is formed using a transparent conductive material. Specifically, the second light absorbing material layer also serves as the second electrode 32 formed using ITO. In Embodiment 23, the oscillation wavelength $\lambda_0$ is 450 nm. In addition, m=1 and 2. In a case where m=1, a value of $L_{Abs}$ is 93.0 nm, a distance between the center of the active layer 23 in the thickness direction and the center of the first light absorbing material layer adjacent to the active layer 23 in the thickness direction is 46.5 nm, and a thickness of the five first light absorbing material layers is 3 nm. That is, for the five first light absorbing material layers, $0.9\times\{\lambda_0/(2\cdot n_{eq})\}\leq L_{Abs}\leq 1.1\times\{\lambda_0/(2\cdot n_{eq})\}$. In addition, m=2 for the first light absorbing material layer adjacent to the active layer 23 and the second light absorbing material layer. That is, $0.9\times\{(2\cdot\lambda_0)/(2\cdot n_{eq})\}\leq L_{Abs}\leq 1.1\times\{(2\cdot\lambda_0)/(2\cdot n_{eq})\}$. One second light absorbing material layer also serving as the second electrode 32 has a light absorption coefficient of 2000 $cm^{-1}$ and a thickness of 30 nm, and a distance from the active layer 23 to the second light absorbing material layer is 139.5 nm. Except for the above point, the light emitting element of Embodiment 23 can have a similar configuration and structure to those of the light emitting element of Embodiment 21, and thus a detailed description thereof will be omitted. Note that, in some of the five first light absorbing material layers, m may be an arbitrary integer of 2 or more. Note that, unlike Embodiment 21, the number of light absorbing material layers 71 can also be one. Also in this case, a positional relationship between the second light absorbing material layer also serving as the second electrode 32 and the light absorbing material layer 71 needs to satisfy the following formula.

$$0.9\times\{(m\cdot\lambda_0)/(2\cdot n_{eq})\}\leq L_{Abs}\leq 1.1\times\{(m\cdot\lambda_0)/(2\cdot n_{eq})\}$$

Embodiment 24

Embodiment 24 is a modification of Embodiments 21 to 23. More specifically, the light emitting element of Embodiment 24 includes a surface emitting laser element (VCSEL) that emits laser light from the first surface 21*a* of the first compound semiconductor layer 21 via the first light reflecting layer 41.

In the light emitting element of Embodiment 24, as illustrated in FIG. 63 which is a schematic partial cross-sectional view, the second light reflecting layer 42 is fixed to the support substrate 49 formed using a silicon semiconductor substrate via the bonding layer 48 formed using a gold (Au) layer or a solder layer containing tin (Sn) on the basis of a solder bonding method.

The light emitting element of Embodiment 24 can be manufactured on the basis of a method similar to that for the light emitting element of Embodiment 5 except that 20 light absorbing material layers 71 are also formed inside the first compound semiconductor layer 21 and the support substrate 49 is not removed.

Although the present disclosure has been described above on the basis of preferred embodiments, the present disclosure is not limited to these embodiments. The configurations and structures of the light emitting elements described in the embodiments are examples, and can be appropriately changed, and the method for manufacturing the light emitting element can also be appropriately changed. In some cases, by appropriately selecting the bonding layer and the support substrate, a surface emitting laser element that emits light from the second surface of the second compound semiconductor layer via the second light reflecting layer can be obtained. Furthermore, in some cases, a through hole reaching the first compound semiconductor layer can be formed in a region of the second compound semiconductor layer and the active layer that do not affect light emission, and the first electrode insulated from the second compound semiconductor layer and the active layer can be formed in the through hole. The first light reflecting layer may extend to the second portion of the base surface. That is, the first light reflecting layer on the base surface may be formed using a so-called solid film. Then, in this case, it is sufficient if a through hole is formed in the first light reflecting layer extending to the second portion of the base surface, and the first electrode connected to the first compound semiconductor layer is formed in the through hole. Furthermore, the base surface 90 can also be formed by providing a sacrificial layer on the basis of a nanoimprint method.

A wavelength conversion material layer (color conversion material layer) can be provided in a region of the light emitting element where light is emitted. Then, in this case, white light can be emitted via the wavelength conversion material layer (color conversion material layer). Specifically, in a case where light emitted from the active layer is emitted to the outside via the first light reflecting layer, it is sufficient if the wavelength conversion material layer (color conversion material layer) is formed on a light emitting side of the first light reflecting layer, and in a case where light emitted from the active layer is emitted to the outside via the second light reflecting layer, it is sufficient if the wavelength conversion material layer (color conversion material layer) is formed on a light emitting side of the second light reflecting layer.

In a case where blue light is emitted from the light emitting layer, white light can be emitted via the wavelength conversion material layer by employing the following form.

[A] By using a wavelength conversion material layer that converts blue light emitted from the light emitting layer into yellow light, white light in which blue and yellow are mixed is obtained as light emitted from the wavelength conversion material layer.

[B] By using a wavelength conversion material layer that converts blue light emitted from the light emitting layer into orange light, white light in which blue and orange are mixed is obtained as light emitted from the wavelength conversion material layer.

[C] By using a wavelength conversion material layer that converts blue light emitted from the light emitting layer into green light and a wavelength conversion material layer that converts blue light into red light, white light in which blue, green, and red are mixed is obtained as light emitted from the wavelength conversion material layer.

Alternatively, in a case where an ultraviolet ray is emitted from the light emitting layer, white light can be emitted via the wavelength conversion material layer by employing the following form.

[D] By using a wavelength conversion material layer that converts ultraviolet light emitted from the light emitting layer into blue light and a wavelength conversion material layer that converts ultraviolet light into yellow light, white light in which blue and yellow are mixed is obtained as light emitted from the wavelength conversion material layer.

[E] By using a wavelength conversion material layer that converts ultraviolet light emitted from the light emitting layer into blue light and a wavelength conversion material layer that converts ultraviolet light into orange light, white light in which blue and orange are mixed is obtained as light emitted from the wavelength conversion material layer.

[F] By using a wavelength conversion material layer that converts ultraviolet light emitted from the light emitting layer into blue light, a wavelength conversion material layer that converts ultraviolet light into green light, and a wavelength conversion material layer that converts ultraviolet light into red light, white light in which blue, green, and red are mixed is obtained as light emitted from the wavelength conversion material layer.

Here, examples of a wavelength conversion material which is excited by blue light and emits red light can include, specifically, red light emitting phosphor particles, and more specifically, (ME:Eu)S [however, "ME" means at least one atom selected from the group consisting of Ca, Sr, and Ba, and a similar configuration applies to the following], $(M:Sm)_x(Si,Al)_{12}(O,N)_{16}$ [however, "M" means at least one atom selected from the group consisting of Li, Mg, and Ca, and a similar configuration applies to the following], $ME_2Si_5M_3$:Eu, (Ca:Eu)$SiN_2$, and (Ca:Eu)$AlSiN_3$. Furthermore, examples of a wavelength conversion material which is excited by blue light and emits green light can include, specifically, green light emitting phosphor particles, and more specifically, (ME:Eu)$Ga_2S_4$, $(M:RE)_x(Si,Al)_{12}(O,N)_{16}$ [however, "RE" means Tb and Yb], $(M:Tb)_x(Si,Al)_{12}(O,N)_{16}$, $(M:Yb)_x(Si,Al)_{12}(O,N)_{16}$, and $Si_{6-z}Al_zO_zN_{3-z}$:Eu. Furthermore, examples of a wavelength conversion material that is excited by blue light and emits yellow light can include, specifically, yellow light emitting phosphor particles, and more specifically, yttrium-aluminum-garnet (YAG)-based phosphor particles. Note that the wavelength conversion material may be used singly or in combination of two or more thereof. Furthermore, by using a mixture of two or more kinds of wavelength conversion materials, emission light of a color other than yellow, green, and red can be emitted from the wavelength conversion material mixture. Specifically, for example, cyan light may be emitted, and in this case, it is sufficient if a mixture of the green light emitting phosphor particles (for example, $LaPO_4$:Ce,Tb, $BaMgAl_{10}O_{17}$:Eu, Mn, $Zn_2SiO_4$:Mn, $MgAl_{11}O_{19}$:Ce,Tb, $Y_2SiO_5$:Ce,Tb, and $MgAl_{11}O_{19}$:CE,Tb,Mn) and the blue light emitting phosphor particles (for example, $BaMgAl_{10}O_{17}$:Eu, $BaMg_2Al_{16}O_{27}$:Eu, $Sr_2P_2O_7$:Eu, $Sr_5(PO_4)_3Cl$:Eu, $(Sr,Ca,Ba,Mg)_5(PO_4)_3Cl$:Eu, $CaWO_4$, and $CaWO_4$:Pb) is used.

Furthermore, examples of a wavelength conversion material that is excited by an ultraviolet ray and emits red light can include, specifically, red light emitting phosphor particles, and more specifically, $Y_2O_3$:Eu, $YVO_4$:Eu, $Y(P,V)O_4$:Eu, $3.5MgO·0.5MgF_2·Ge_2$:Mn, $CaSiO_3$:Pb,Mn, $Mg_6AsO_{11}$:Mn, $(Sr,Mg)_3(PO_4)_3$:Sn, $La_2O_2S$:Eu, and $Y_2O_2S$:Eu. Furthermore, examples of a wavelength conversion material that is excited by an ultraviolet ray and emits green light can include, specifically, green light emitting phosphor particles, and more specifically, $LaPO_4$:Ce,Tb, $BaMgAl_{10}O_{17}$:Eu,Mn, $Zn_2SiO_4$:Mn, $MgAl_{11}O_{19}$:Ce,Tb, $Y_2SiO_5$:Ce,Tb, $MgAl_{11}O_{19}$:CE,Tb,Mn, and $Si_{6-z}Al_zO_zN_{3-z}$:Eu. Furthermore, examples of a wavelength conversion material that is excited by an ultraviolet ray and emits blue light can include, specifically, blue light emitting phosphor particles, and more specifically, $BaMgAl_{10}O_{17}$:Eu, $BaMg_2Al_{16}O_{27}$:Eu, $Sr_2P_2O_7$:Eu, $Sr_5(PO_4)_3Cl$:Eu, $(Sr,Ca,Ba,Mg)_5(PO_4)_3Cl$:Eu, $CaWO_4$, and $CaWO_4$:Pb. Furthermore, examples of a wavelength conversion material that is excited by an ultraviolet ray and emits yellow light can include, specifically, yellow light emitting phosphor particles, and more specifically, YAG-based phosphor particles. Note that the wavelength conversion material may be used singly or in combination of two or more thereof. Furthermore, by using a mixture of two or more kinds of wavelength conversion materials, emission light of a color other than yellow, green, and red can be emitted from the wavelength conversion material mixture. Specifically, cyan light may be emitted, and in this case, it is sufficient if a mixture of the green light emitting phosphor particles and the blue light emitting phosphor particles is used.

However, the wavelength conversion material (color conversion material) is not limited to phosphor particles. For example, with an indirect transition type silicon-based material, light emitting particles to which a quantum well structure localizing a carrier wave function and using a quantum effect to efficiently convert a carrier into light like a direct transition type, such as a two-dimensional quantum well structure, a one-dimensional quantum well structure (quantum wire), or a zero-dimensional quantum well structure (quantum dot), is applied can be used. Alternatively, it is known that a rare earth atom added to a semiconductor material emits light keenly by interior transition, and light emitting particles to which such a technology is applied can be used.

Examples of the wavelength conversion material (color conversion material) can include the quantum dot as described above. As a size (diameter) of the quantum dot decreases, a band gap energy increases, and a wavelength of light emitted from the quantum dot decreases. That is, as the size of the quantum dot decreases, light having a shorter wavelength (light on a blue light side) is emitted, and as the size of the quantum dot increases, light having a longer wavelength (light on a red light side) is emitted. Therefore, it is possible to obtain a quantum dot that emits light having a desired wavelength (performs color conversion to a desired color) by using the same material constituting the quantum dot and adjusting the size of the quantum dot. Specifically, the quantum dot preferably has a core-shell structure. Examples of a material constituting the quantum dot can include Si, Se, a chalcopyrite-based compound such as CuInGaSe (CICS), $CuInSe_2$(CIS), $CuInS_2$, $CuAlS_2$, $CuAlSe_2$, $CuGaS_2$, $CuGaSe_2$, $AgAlS_2$, $AgAlSe_2$, $AgInS_2$, or $AgInSe_2$, a perovskite-based material, a Group III-V compound such as GaAs, GaP, InP, InAs, InGaAs, AlGaAs, InGaP, AlGaInP, InGaAsP, or GaN; CdSe, CdSeS, CdS, CdTe, $In_2Se_3$, $In_2S_3$, $Bi_2Se_3$, $Bi_2S_3$, ZnSe, ZnTe, ZnS, HgTe, HgS, PbSe, PbS, and $TiO_2$, but are not limited thereto.

Note that the present disclosure can also have the following configuration.

[A01] <<Light Emitting Element>>

A light emitting element including:

a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked;

a first light reflecting layer formed on a first surface side of the first compound semiconductor layer and having a convex shape in a direction away from the active layer; and a second light reflecting layer formed on a second surface side of the second compound semiconductor layer and having a flat shape, in which a partition wall extending in a stacking direction of the stacked structure is formed so as to surround the first light reflecting layer.

[A02] The light emitting element according to [A01], in which the partition wall extends from the first surface side of the first compound semiconductor layer to the middle of the first compound semiconductor layer in a thickness direction in the first compound semiconductor layer.

[A03] The light emitting element according to [A01], in which the partition wall extends from the second surface side of the second compound semiconductor layer in the second compound semiconductor layer and the active layer, and further extends to the middle of the first compound semiconductor layer in the thickness direction in the first compound semiconductor layer.

[A04] The light emitting element according to any one of [A01] to [A03], in which the partition wall is formed using a material that does not transmit light generated in the active layer.

[A05] The light emitting element according to any one of [A01] to [A04], in which the partition wall is formed using a material that reflects light generated in the active layer.

[A06] The light emitting element according to any one of [A01] to [A05], in which $1\times10^{-1}\leq TC_1/TC_0\leq1\times10^2$, where a thermal conductivity of a material forming the first compound semiconductor layer is $TC_1$, and a thermal conductivity of the material forming the partition wall is $TC_0$.

[A07] The light emitting element according to any one of [A01] to [A06], in which $|CTE_0-CTE_1|\leq1\times10^{-4}$/K, where a linear expansivity of the material forming the first compound semiconductor layer is $CTE_1$, and a linear expansivity of the material forming the partition wall is $CTE_0$.

[A08] The light emitting element according to any one of [A01] to [A07], in which the partition wall is formed using a solder material, and a portion of the partition wall is exposed at an outer surface of the light emitting element.

[A09] The light emitting element according to any one of [A01] to [A08], in which a side surface of the partition wall is narrowed in a direction from the first surface side of the first compound semiconductor layer toward the second surface side of the second compound semiconductor layer.

[A10] The light emitting element according to any one of [A01] to [A09], in which the first light reflecting layer is formed on the base surface positioned on the first surface side of the first compound semiconductor layer, the base surface extends in a peripheral region, and the base surface is uneven and differentiable.

[B01] <<Light Emitting Element Array>>

A light emitting element array in which a plurality of light emitting elements is arranged, the light emitting elements each including:

- a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked;
- a first light reflecting layer formed on a first surface side of the first compound semiconductor layer and having a convex shape in a direction away from the active layer; and
- a second light reflecting layer formed on a second surface side of the second compound semiconductor layer and having a flat shape.

[B02] The light emitting element array according to [B01], in which in each light emitting element, a partition wall extending in a stacking direction of the stacked structure is formed so as to surround the first light reflecting layer.

[B03] The light emitting element array according to [B02], in which in each light emitting element, the partition wall extends from the first surface side of the first compound semiconductor layer to the middle of the first compound semiconductor layer in a thickness direction in the first compound semiconductor layer.

[B04] The light emitting element array according to [B03], in which a relationship between $L_0$, $L_1$, and $L_3$ satisfies the following Formula (1), preferably, Formula (1'), satisfies the following Formula (2), preferably, Formula (2'), satisfies the following Formulas (1) and (2), or satisfies the following Formulas (1') and (2'):

$$0.01\times L_0\leq L_0-L_1 \quad (1)$$

$$0.05\times L_0\leq L_0-L_1 \quad (1')$$

$$0.01\times L_3\leq L_1 \quad (2)$$

$$0.05\times L_3\leq L_1 \quad (2')$$

where $L_0$: a distance from an end portion of a facing surface of the first light reflecting layer that faces the first surface of the first compound semiconductor layer to the active layer, $L_1$: a distance from the active layer to an end portion (an upper end portion of the partition wall and an end portion facing the active layer) of the partition wall extending to the middle of the first compound semiconductor layer in the thickness direction in the first compound semiconductor layer, and $L_3$: a distance from an axial line of the first light reflecting layer included in the light emitting element to an orthogonal projection image of the partition wall on the stacked structure (more specifically, an orthogonal projection image of the upper end portion of the partition wall).

[B05] The light emitting element array according to [B02], in which in each light emitting element, the partition wall extends from the second surface side of the second compound semiconductor layer in the second compound semiconductor layer and the active layer, and further extends to the middle of the first compound semiconductor layer in a thickness direction in the first compound semiconductor layer.

[B06] The light emitting element array according to [B05], in which a relationship between $L_0$, $L_2$, and $L_3'$ satisfies the following Formula (3), preferably, Formula (3'), satisfies the following Formula (4), preferably, Formula (4'), satisfies the following Formulas (3) and (4), or satisfies the following Formulas (3') and (4'):

$$0.01\times L_0\leq L_2 \quad (3)$$

$$0.05\times L_0\leq L_2 \quad (3')$$

$$0.01\times L_3'\leq L_2 \quad (4)$$

$$0.05\times L_3'\leq L_2 \quad (4')$$

where $L_0$: a distance from an end portion of a facing surface of the first light reflecting layer that faces the first surface of the first compound semiconductor layer to the active layer, $L_2$: a distance from the active layer to an end portion (a lower end portion of the partition wall and an end portion facing a first electrode) of the partition wall extending to the middle of the first compound semiconductor layer in the thickness direction in the first compound semiconductor layer, and $L_3$': a distance from an axial line of the first light reflecting layer included in the light emitting element to an orthogonal projection image of the partition wall on the stacked structure (more specifically, an orthogonal projection image of the lower end portion of the partition wall).

[C01] The light emitting element array according to any one of [B01] to [B06], in which the first light reflecting layer is formed on the base surface positioned on the first surface side of the first compound semiconductor layer, the base surface extends in a peripheral region surrounded by the plurality of light emitting elements, and the base surface is uneven and differentiable.

[C02] The light emitting element array according to [C01], in which the base surface is smooth.

[C03] <<Light Emitting Element of First Configuration>>

The light emitting element array according to [C01] or [C02], in which a first portion of the base surface on which the first light reflecting layer is formed has an upward convex shape with respect to the second surface of the first compound semiconductor layer.

[C04] <<Light Emitting Element of 1-A-th Configuration>>

The light emitting element array according to [C03], in which a second portion of the base surface occupying the peripheral region has a downward convex shape with respect to the second surface of the first compound semiconductor layer.

[C05] The light emitting element array according to [C04], in which a central portion of the first portion of the base surface is positioned at a vertex (intersection portion) of a square lattice.

[C06] The light emitting element array according to [C04], in which a central portion of the first portion of the base surface is positioned at a vertex (intersection portion) of a regular triangle lattice.

[C07] <<Light Emitting Element of 1-B-th Configuration>>

The light emitting element array according to [C03], in which a second portion of the base surface occupying the peripheral region has a downward convex shape and an upward convex shape extending from the downward convex shape toward a central portion of the peripheral region with respect to the second surface of the first compound semiconductor layer.

[C08] The light emitting element array according to [C07], in which $LL_2>LL_1$, where a distance from the second surface of the first compound semiconductor layer to a central portion of the first portion of the base surface is $LL_1$, and a distance from the second surface of the first compound semiconductor layer to a central portion of the second portion of the base surface is $LL_2$.

[C09] The light emitting element array according to [C07] or [C08], in which $R_1>R_2$, where a radius of curvature (that is, a radius of curvature of the first light reflecting layer) of the central portion of the first portion of the base surface is $R_1$, and a radius of curvature of the central portion of the second portion of the base surface is $R_2$.

[C10] The light emitting element array according to any one of [C07] to [C09], in which the central portion of the first portion of the base surface is positioned at a vertex (intersection portion) of a square lattice.

[C11] The light emitting element array according to [C10], in which the central portion of the second portion of the base surface is positioned at a vertex (intersection portion) of the square lattice.

[C12] The light emitting element array according to any one of [C07] to [C09], in which the central portion of the first portion of the base surface is positioned at a vertex (intersection portion) of a regular triangle lattice.

[C13] The light emitting element array according to [C12], in which the central portion of the second portion of the base surface is positioned at a vertex (intersection portion) of the regular triangle lattice.

[C14] The light emitting element array according to any one of [C07] to [C13], in which the radius $R_2$ of curvature of the central portion of the second portion of the base surface is $1\times10^{-6}$ m or more, preferably, $3\times10^{-6}$ m or more, and more preferably, $5\times10^{-6}$ m or more.

[C15] <<Light Emitting Element of 1-C-th Configuration>>

The light emitting element array according to [C03], in which a second portion of the base surface occupying the peripheral region has an annular convex shape surrounding the first portion of the base surface and a downward convex shape extending from the annular convex shape toward the first portion of the base surface with respect to the second surface of the first compound semiconductor layer.

[C16] The light emitting element array according to [C15], in which $LL_2'>LL_1$, where a distance from the second surface of the first compound semiconductor layer to a central portion of the first portion of the base surface is $LL_1$, and a distance from the second surface of the first compound semiconductor layer to a top portion of the annular convex shape of the second portion of the base surface is $LL_2'$.

[C17] The light emitting element array according to [C15] or [C16], in which $R_1>R_2'$, where a radius of curvature (that is, a radius of curvature of the first light reflecting layer) of the central portion of the first portion of the base surface is $R_1$, and a radius of curvature of the top portion of the annular convex shape of the second portion of the base surface is $R_2'$.

[C18] The light emitting element array according to any one of [C15] to [C17], in which the radius $R_2'$ of curvature of the top portion of the annular convex shape of the second portion of the base surface is $1\times10^{-6}$ m or more, preferably, $3\times10^{-6}$ m or more, and more preferably, $5\times10^{-6}$ m or more.

[C19] The light emitting element array according to any one of [C07] to [C18], in which a bump is arranged at a portion on the second surface side of the second compound semiconductor layer facing a convex portion in the second portion of the base surface.

[C20] The light emitting element array according to any one of [C04] to [C06], in which a bump is arranged at a portion on the second surface side of the second compound semiconductor layer facing the central portion of the first portion of the base surface.

[C21] The light emitting element array according to any one of [C01] to [C20], in which a formation pitch of the light emitting elements is 3 μm or more and 50 μm or less, preferably, 5 μm or more and 30 μm or less, and more preferably, 8 μm or more and 25 μm or less.

[C22] The light emitting element array according to any one of [C01] to [C21], in which the radius $R_1$ of curvature (that is, the radius of curvature of the first light reflecting layer) of the central portion of the first portion of the base surface is $1\times10^{-5}$ m or more, and preferably $3\times10^{-5}$ m or more.

[C23] The light emitting element array according to any one of [C01] to [C22], in which the stacked structure is formed using at least one material selected from the group consisting of a GaN-based compound semiconductor, an InP-based compound semiconductor, and a GaAs-based compound semiconductor.

[C24] The light emitting element array according to any one of [C01] to [C23], in which $1\times10^{-5}$ m$\leq L_{OR}$, where a resonator length is $L_{OR}$.

[C25] The light emitting element array according to any one of [C01] to [C24], in which a figure drawn by the first portion of the base surface in a case where the base surface is cut along a virtual plane including the stacking direction of the stacked structure is a part of a circle or a part of a parabola.

[C26] <<Light Emitting Element of Second Configuration>>

The light emitting element array according to any one of [C01] to [C25], in which the first surface of the first compound semiconductor layer constitutes the base surface.

[C27] <<Light Emitting Element of Third Configuration>>

The light emitting element array according to any one of [C01] to [C25], in which a compound semiconductor substrate is disposed between the first surface of the first compound semiconductor layer and the first light reflecting layer, and the base surface is constituted by a surface of the compound semiconductor substrate.

[C28] <<Light Emitting Element of Fourth Configuration>>

The light emitting element array according to any one of [C01] to [C25], in which a base material is disposed between the first surface of the first compound semiconductor layer and the first light reflecting layer, or a compound semiconductor substrate and the base material are disposed between the first surface of the first compound semiconductor layer and the first light reflecting layer, and the base surface is constituted by a surface of the base material.

[C29] The light emitting element array according to [C28], in which a material of the base material is at least one kind of material selected from the group consisting of a transparent dielectric material such as $TiO_2$, $Ta_2O_5$, or $SiO_2$, a silicone-based resin, and an epoxy-based resin.

[C30] The light emitting element array according to any one of [C01] to [C29], in which the first light reflecting layer is formed on the base surface.

[C31] The light emitting element array according to any one of [C01] to [C30], in which a value of a thermal conductivity of the stacked structure is higher than a value of a thermal conductivity of the first light reflecting layer.

[D01] <<Light Emitting Element Array of Fifth Configuration>>

The light emitting element array according to any one of [C01] to [C31], in which a current injection region and a current non-injection region surrounding the current injection region are provided in the second compound semiconductor layer, and the shortest distance $D_{CI}$ from an area center point of the current injection region to a boundary between the current injection region and the current non-injection region satisfies the following formula:

$$D_{CI}\geq\omega_0/2$$

provided that $$\omega_0^2\equiv(\lambda_0/\pi)\{L_{OR}(R_1-L_{OR})\}^{1/2}$$

where $\lambda_0$: a desired wavelength of light mainly emitted from the light emitting element (oscillation wavelength)

$L_{OR}$: the resonator length $R_1$: the radius of curvature of the central portion of the first portion of the base surface (that is, the radius of curvature of the first light reflecting layer).

[D02] The light emitting element array according to [D01], further including:

a mode loss acting portion provided on the second surface of the second compound semiconductor layer and constituting a mode loss acting region acting on an increase or decrease in oscillation mode loss;

a second electrode formed on the second surface of the second compound semiconductor layer and on the mode loss acting portion; and the first electrode electrically connected to the first compound semiconductor layer, in which the second light reflecting layer is formed on the second electrode, the current injection region, a current non-injection/outer injection/inner region surrounding the current injection region, and a current non-injection/outer region surrounding the current non-injection/inner region are formed in the stacked structure, and an orthogonal projection image of the mode loss acting region and an orthogonal projection image of the current non-injection/outer region overlap each other.

[D03] The light emitting element array according to [D01] or [D02], in which a radius $r_1$ of a light reflection effective region of the first light reflecting layer satisfies $\omega_0\leq r_1\leq 20\cdot\omega_0$.

[D04] The light emitting element array according to any one of [D01] to [D03], in which $D_{CI}\geq\omega_0$.

[D05] The light emitting element array according to any one of [D01] to [D04], in which $R_1\leq1\times10^{-3}$ m.

[E01] <<Light Emitting Element Array of Sixth Configuration>>

The light emitting element array according to any one of [C01] to [C31], further including:

a mode loss acting portion provided on the second surface of the second compound semiconductor layer and constituting a mode loss acting region acting on an increase or decrease in oscillation mode loss;

a second electrode formed on the second surface of the second compound semiconductor layer and on the mode loss acting portion; and the first electrode electrically connected to the first compound semiconductor layer, in which the second light reflecting layer is formed on the second electrode, a current injection region, a current non-injection/inner region surrounding the current injection region, and a current non-injection/outer region surrounding the current non-injection/inner region are formed in the stacked structure, and an orthogonal projection image of the mode loss acting region and an orthogonal projection image of the current non-injection/outer region overlap each other.

[E02] The light emitting element array according to [E01], in which the current non-injection/outer region is positioned below the mode loss acting region.

[E03] The light emitting element array according to [E01] or [E02], in which $0.01\leq S_1/(S_1+S_2)\leq0.7$, where an area of an orthogonal projection image of the current injection region is $S_1$ and an area of an orthogonal projection image of the current non-injection/inner region is $S_2$.

[E04] The light emitting element array according to any one of [E01] to [E03], in which the current non-injection/ inner region and the current non-injection/outer region are formed by ion implantation into the stacked structure.

[E05] The light emitting element array according to [E04], in which an ion type is at least one type of ion selected from the group consisting of boron, proton, phosphorus, arsenic, carbon, nitrogen, fluorine, oxygen, germanium, and silicon.

[E06] <<Light Emitting Element Array of 6-B-th Configuration>>

The light emitting element array according to any one of [E01] to [E05], in which the current non-injection/inner region and the current non-injection/outer region are formed by plasma irradiation on the second surface of the second compound semiconductor layer, ashing treatment on the second surface of the second compound semiconductor layer, or reactive ion etching treatment on the second surface of the second compound semiconductor layer.

[E07] <<Light Emitting Element Array of 6-C-th Configuration>>

The light emitting element array according to any one of [E01] to [E06], in which the second light reflecting layer has a region that reflects or scatters light from the first light reflecting layer toward the outside of a resonator structure including the first light reflecting layer and the second light reflecting layer.

[E08] The light emitting element array according to any one of [E01] to [E07], in which $OL_0>OL_2$, where an optical distance from the active layer to the second surface of the second compound semiconductor layer in the current injection region is $OL_2$, and an optical distance from the active layer to a top surface of the mode loss acting portion in the mode loss acting region is $OL_0$.

[E09] The light emitting element array according to any one of [E01] to [E08], in which generated light having a higher-order mode is scattered toward the outside of the resonator structure including the first light reflecting layer and the second light reflecting layer and lost by the mode loss acting region, such that the oscillation mode loss increases.

[E10] The light emitting element array according to any one of [E01] to [E09], in which the mode loss acting portion is formed using a dielectric material, a metal material, or an alloy material.

[E11] The light emitting element array according to [E10], in which the mode loss acting portion is formed using the dielectric material, and an optical thickness of the mode loss acting portion is a value deviating from an integral multiple of ¼ of a wavelength of light generated in the light emitting element array.

[E12] The light emitting element array according to [E10], in which the mode loss acting portion is formed using the dielectric material, and an optical thickness of the mode loss acting portion is an integral multiple of ¼ of a wavelength of light generated in the light emitting element array.

[E13] <<Light Emitting Element Array of 6-D-th Configuration>>

The light emitting element array according to any one of [E01] to [E03], in which a convex portion is formed on the second surface side of the second compound semiconductor layer, and the mode loss acting portion is formed on a region of the second surface of the second compound semiconductor layer surrounding the convex portion.

[E14] The light emitting element array according to [E13], in which $OL_0<OL_2$, where an optical distance from the active layer to the second surface of the second compound semiconductor layer in the current injection region is $OL_2$, and an optical distance from the active layer to a top surface of the mode loss acting portion in the mode loss acting region is $OL_0$.

[E15] The light emitting element array according to [E13] or [E14], in which generated light having a higher-order mode is confined in the current injection region and the current non-injection/inner region by the mode loss acting region, such that the oscillation mode loss decreases.

[E16] The light emitting element array according to any one of [E13] to [E15], in which the mode loss acting portion is formed using a dielectric material, a metal material, or an alloy material.

[E17] The light emitting element array according to any one of [E01] to [E16], in which the second electrode is formed using a transparent conductive material.

[F01] <<Light Emitting Element Array of Seventh Configuration>>

The light emitting element array according to any one of [C01] to [C31], further including:

a second electrode formed on the second surface of the second compound semiconductor layer;

the second light reflecting layer formed on the second electrode;

a mode loss acting portion provided on the first surface of the first compound semiconductor layer and constituting a mode loss acting region acting on an increase or decrease in oscillation mode loss; and the first electrode electrically connected to the first compound semiconductor layer, in which the first light reflecting layer is formed on the first surface of the first compound semiconductor layer and on the mode loss acting portion, a current injection region, a current non-injection/inner region surrounding the current injection region, and a current non-injection/outer region surrounding the current non-injection/inner region are formed in the stacked structure, and an orthogonal projection image of the mode loss acting region and an orthogonal projection image of the current non-injection/outer region overlap each other.

[F02] The light emitting element array according to [F01], in which $0.01 \leq S_1'/(S_1'+S_2') \leq 0.7$, where an area of an orthogonal projection image of the current injection region is $S_1'$ and an area of an orthogonal projection image of the current non-injection/inner region is $S_2'$.

[F03] <<Light Emitting Element Array of 7-A-th Configuration>>

The light emitting element array according to [F01] or [F02], in which the current non-injection/inner region and the current non-injection/outer region are formed by ion implantation into the stacked structure.

[F04] The light emitting element array according to [F03], in which an ion type is at least one type of ion selected from the group consisting of boron, proton, phosphorus, arsenic, carbon, nitrogen, fluorine, oxygen, germanium, and silicon.

[F05] <<Light Emitting Element Array of 7-B-th Configuration>>

The light emitting element array according to any one of [F01] to [F04], in which the current non-injection/inner region and the current non-injection/outer region are formed by plasma irradiation on the second surface of the second compound semiconductor layer, ashing treatment on the second surface of the second compound semiconductor layer, or reactive ion etching treatment on the second surface of the second compound semiconductor layer.

[F06] <<Light Emitting Element Array of 7-C-th Configuration>>

The light emitting element array according to any one of [F01] to [F05], in which the second light reflecting layer has a region that reflects or scatters light from the first light reflecting layer toward the outside of a resonator structure including the first light reflecting layer and the second light reflecting layer.

[F07] The light emitting element array according to any one of [F01] to [F06], in which $OL_0' > OL_1'$, where an optical distance from the active layer to the first surface of the first compound semiconductor layer in the current injection region is $OL_1'$, and an optical distance from the active layer to a top surface of the mode loss acting portion in the mode loss acting region is $OL_0'$.

[F08] The light emitting element array according to any one of [F01] to [F07], in which generated light having a higher-order mode is scattered toward the outside of the resonator structure including the first light reflecting layer and the second light reflecting layer and lost by the mode loss acting region, such that the oscillation mode loss increases.

[F09] The light emitting element array according to any one of [F01] to [F08], in which the mode loss acting portion is formed using a dielectric material, a metal material, or an alloy material.

[F10] The light emitting element array according to [F09], in which the mode loss acting portion is formed using the dielectric material, and an optical thickness of the mode loss acting portion is a value deviating from an integral multiple of ¼ of a wavelength of light generated in the light emitting element array.

[F11] The light emitting element array according to [F09], in which the mode loss acting portion is formed using the dielectric material, and an optical thickness of the mode loss acting portion is an integral multiple of ¼ of a wavelength of light generated in the light emitting element array.

[F12] <<Light Emitting Element Array of 7-D-th Configuration>>

The light emitting element array according to [F01] or [F02], in which a convex portion is formed on the first surface side of the first compound semiconductor layer, and the mode loss acting portion is formed on a region of the first surface of the first compound semiconductor layer surrounding the convex portion.

[F13] The light emitting element array according to [F12], in which $OL_0' < OL_1'$, where an optical distance from the active layer to the first surface of the first compound semiconductor layer in the current injection region is $OL_1'$, and an optical distance from the active layer to a top surface of the mode loss acting portion in the mode loss acting region is $OL_0'$.

[F14] The light emitting element array according to [F01] or [F02], in which a convex portion is formed on the first surface side of the first compound semiconductor layer, and the mode loss acting portion is formed on a region of the first surface of the first compound semiconductor layer surrounding the convex portion.

[F15] The light emitting element array according to any one of [F12] to [F14], in which generated light having a higher-order mode is confined in the current injection region and the current non-injection/inner region by the mode loss acting region, such that the oscillation mode loss decreases.

[F16] The light emitting element array according to any one of [F12] to [F15], in which the mode loss acting portion is formed using a dielectric material, a metal material, or an alloy material.

[F17] The light emitting element array according to any one of [F01] to [F16], in which the second electrode is formed using a transparent conductive material.

[G01] <<Light Emitting Element Array of Eighth Configuration>>

The light emitting element array according to any one of [C01] to [F17], in which at least two light absorbing material layers are formed in the stacked structure including the second electrode in parallel with a virtual plane occupied by the active layer.

[G02] The light emitting element array according to [G01], in which at least four light absorbing material layers are formed.

[G03] The light emitting element array according to [G01] or [G02], in which $0.9\times\{(m\cdot\lambda_0)/(2\cdot n_{eq})\}\leq L_{Abs}\leq 1.1\times\{(m\cdot\lambda_0)/(2\cdot n_{eq})\}$, where the oscillation wavelength is $\lambda_0$, an equivalent refractive index of the whole of two light absorbing material layers and a portion of the stacked structure positioned between the light absorbing material layers is $n_{eq}$, and a distance between the light absorbing material layers is $L_{Abs}$, m being 1 or an arbitrary integer of 2 or more including 1.

[G04] The light emitting element array according to any one of [G01] to [G03], in which a thickness of the light absorbing material layer is $\lambda_0/(4\cdot n_{eq})$ or less.

[G05] The light emitting element array according to any one of [G01] to [G04], in which the light absorbing material layer is positioned at a minimum amplitude portion generated in a standing wave of light formed inside the stacked structure.

[G06] The light emitting element array according to any one of [G01] to [G05], in which the active layer is positioned at a maximum amplitude portion generated in a standing wave of light formed inside the stacked structure.

[G07] The light emitting element array according to any one of [G01] to [G06], in which the light absorbing material layer has a light absorption coefficient that is twice or more the light absorption coefficient of a compound semiconductor constituting the stacked structure.

[G08] The light emitting element array according to any one of [G01] to [G07], in which the light absorbing material layer is formed using at least one material selected from the group consisting of a compound semiconductor material having a narrower band gap than the compound semiconductor constituting the stacked structure, a compound semiconductor material doped with impurities, a transparent conductive material, and a light reflecting layer constituting material having a light absorption characteristic.

[H01] <<Method for Manufacturing Light Emitting Element Array: Third Aspect>>

A method for manufacturing a light emitting element array that includes a plurality of light emitting elements each including a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked, a first light reflecting layer formed on a base surface positioned on a first surface side of the first compound semiconductor layer, and a second light reflecting layer formed on a second surface side of the second compound semiconductor layer and having a flat shape, the base surface extending in a peripheral region surrounded by a plurality of light emitting elements and being uneven and differentiable, the method including:

forming the second light reflecting layer on the second surface side of the second compound semiconductor layer after forming the stacked structure;

forming a first sacrificial layer on a first portion of the base surface on which the first light reflecting layer is to be formed and then making a surface of the first sacrificial layer convex;

forming a second sacrificial layer on a second portion of the base surface exposed between the first sacrificial layers and on the first sacrificial layer and then making a surface of the second sacrificial layer uneven;

etching back the second sacrificial layer and the first sacrificial layer and further performing etching back from the base surface inward to form a convex portion in the first portion of the base surface and form at least a concave portion in the second portion of the base surface with respect to the second surface of the first compound semiconductor layer; and forming the first light reflecting layer on the first portion of the base surface.

[H02] <<Method for Manufacturing Light Emitting Element Array: Fourth Aspect>>

A method for manufacturing a light emitting element array that includes a plurality of light emitting elements each including a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked, a first light reflecting layer formed on a base surface positioned on a first surface side of the first compound semiconductor layer, and a second light reflecting layer formed on a second surface side of the second compound semiconductor layer and having a flat shape, the base surface extending in a peripheral region surrounded by a plurality of light emitting elements and being uneven and differentiable, the method including:

forming the second light reflecting layer on the second surface side of the second compound semiconductor layer after forming the stacked structure;

forming a first sacrificial layer on a first portion of the base surface on which the first light reflecting layer is to be formed and then making a surface of the first sacrificial layer convex;

etching back the first sacrificial layer and further performing etching back from the base surface inward to form a convex portion in the first portion of the base surface with respect to the second surface of the first compound semiconductor layer;

forming a second sacrificial layer on the base surface and then etching back the second sacrificial layer and further performing etching back from the base surface inward to form a convex portion in the first portion of the base surface and form at least a concave portion in the second portion of the base surface with respect to the second surface of the first compound semiconductor layer; and forming the first light reflecting layer on the first portion of the base surface.

[H03] <<Method for Manufacturing Light Emitting Element Array: Imprint Method>>

A method for manufacturing a light emitting element array that includes a plurality of light emitting elements each including a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked, a first light reflecting layer formed on a base surface positioned on a first surface side of the first compound semiconductor layer, and a second light reflecting layer formed on a second surface side of the second compound semiconductor layer and having a flat shape, the base surface extending in a peripheral region surrounded by a plurality of light emitting elements and being uneven and differentiable, the method including:

preparing a mold having a surface complementary to the base surface;

forming the second light reflecting layer on the second surface side of the second compound semiconductor layer after forming the stacked structure;

forming a sacrificial layer on the base surface on which the first light reflecting layer is to be formed, and then transferring a shape of the surface complementary to the base surface of the mold to the sacrificial layer to form an uneven portion in the sacrificial layer;

etching back the sacrificial layer and further performing etching back from the base surface inward to form a convex portion in the first portion of the base surface and form at least a concave portion in the second portion of the base surface with respect to the second surface of the first compound semiconductor layer; and forming the first light reflecting layer on the first portion of the base surface.

REFERENCE SIGNS LIST

10A, 10A', 10B, 10C, 10D, 10E, 10F, 10G Light emitting element (surface emitting element and surface emitting laser element)

11 Compound semiconductor substrate (light emitting element array manufacturing substrate)

11*a* First surface of compound semiconductor substrate (light emitting element array manufacturing substrate) facing first compound semiconductor layer

11*b* Second surface of compound semiconductor substrate (light emitting element array manufacturing substrate) facing first compound semiconductor layer

20 Stacked structure

21 First compound semiconductor layer

21*a* First surface of first compound semiconductor layer

21*b* Second surface of first compound semiconductor layer

22 Second compound semiconductor layer

22*a* First surface of second compound semiconductor layer

22*b* Second surface of second compound semiconductor layer

23 Active layer (light emitting layer)

24, 25A, 25B, 25C, 25D Partition wall

24', 25' Side surface of partition wall

25D' Portion of partition wall

31 First electrode

31' Opening provided in first electrode

32 Second electrode
33 Second pad electrode
34 Insulating layer (current constriction layer)
34A Opening provided in insulating layer (current constriction layer)
35 Bump
40 Light emitting element manufacturing substrate (sapphire substrate)
41 First light reflecting layer
42 Second light reflecting layer
42A Forward tapered inclined portion formed in second light reflecting layer
48 Bonding layer
49 Support substrate
51, 61 Current injection region
61A Current injection region
61B Current non-injection region
52, 62 Current non-injection/inner region
53, 63 Current non-injection/outer region
54, 64 Mode loss acting portion (mode loss acting layer)
54A, 54B, 64A Opening formed in mode loss acting portion
55, 65 Mode loss acting region
71 Light absorbing material layer
81, 81' First sacrificial layer
82 Second sacrificial layer
83, 83' Portion of first sacrificial layer for forming central portion of second portion
90 Base surface
$\mathbf{90}_{bd}$ Boundary between first portion and second portion
91 First portion of base surface
91' Convex portion formed in first portion of base surface
91A Convex portion formed in first portion of base surface
$\mathbf{91}_c$ Central portion of first portion of base surface
92 Second portion of base surface
92A Concave portion formed in second portion of base surface
$\mathbf{92}_c$ Central portion of second portion of base surface
$\mathbf{92}_b$ Downward convex portion of second portion of base surface
93 Annular convex shape surrounding first portion of base surface
94A Downward convex shape extending from annular convex shape toward first portion of base surface
94B Region surrounded by annular convex shape in second portion of base surface
95 Base material
96 Uneven portion for forming base surface
97 Planarization film
99 Peripheral region

The invention claimed is:

1. A light emitting element comprising:

a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked;

a first light reflecting layer formed on a first surface side of the first compound semiconductor layer and having a convex shape in a direction away from the active layer; and a second light reflecting layer formed on a second surface side of the second compound semiconductor layer and having a flat shape, wherein a partition wall extending in a stacking direction of the stacked structure is formed of an insulating material so as to surround the first light reflecting layer, wherein the partition wall is a structural member formed separately from an electrode provided on the first surface.

2. The light emitting element according to claim 1, wherein the partition wall extends from the first surface side of the first compound semiconductor layer to a middle of the first compound semiconductor layer in a thickness direction in the first compound semiconductor layer.

3. The light emitting element according to claim 1, wherein the partition wall extends from the second surface side of the second compound semiconductor layer in the second compound semiconductor layer and the active layer, and further extends to a middle of the first compound semiconductor layer in a thickness direction in the first compound semiconductor layer.

4. The light emitting element according to claim 1, wherein the partition wall is formed using a material that does not transmit light generated in the active layer.

5. The light emitting element according to claim 1, wherein the partition wall is formed using a material that reflects light generated in the active layer.

6. The light emitting element according to claim 1, wherein $1\times10^{-1}\leq TC_1/TC_0\leq1\times10^{2}$, where a thermal conductivity of a material forming the first compound semiconductor layer is $TC_1$, and a thermal conductivity of a material forming the partition wall is $TC_0$.

7. The light emitting element according to claim 1, wherein $|CTE_0\text{-}CTE_1|\leq1\times10^{-4}/K$, where a linear expansivity of a material forming the first compound semiconductor layer is $CTE_1$, and a linear expansivity of a material forming the partition wall is $CTE_0$.

8. The light emitting element according to claim 1, wherein the partition wall is formed using a solder material, and a portion of the partition wall is exposed at an outer surface of the light emitting element.

9. The light emitting element according to claim 1, wherein a side surface of the partition wall is narrowed in a direction from the first surface side of the first compound semiconductor layer toward the second surface side of the second compound semiconductor layer.

10. The light emitting element according to claim 1, wherein the partition wall is formed a continuous or discontinuous groove shape.

11. The light emitting element according to claim 1, wherein a planar shape of the partition wall is approximate to a planar shape of the first light reflecting layer.

12. The light emitting element according to claim 11, wherein the planar shape is circular, elliptical, or polygonal, and the partition wall is concentrically disposed with respect to the first light reflecting layer.

13. A light emitting element array in which a plurality of light emitting elements is arranged, the light emitting elements each including:

a stacked structure in which a first compound semiconductor layer having a first surface and a second surface opposing the first surface, an active layer facing the second surface of the first compound semiconductor layer, and a second compound semiconductor layer having a first surface facing the active layer and a second surface opposing the first surface are stacked;

a first light reflecting layer formed on a first surface side of the first compound semiconductor layer and having a convex shape in a direction away from the active layer;

a second light reflecting layer formed on a second surface side of the second compound semiconductor layer and having a flat shape; and a partition wall extending in a stacking direction of the stacked structure is formed of an insulating material so as to surround the first light reflecting layer, wherein the partition wall is a structural member formed separately from an electrode provided on the first surface.

14. The light emitting element array according to claim 13, wherein in each light emitting element, the partition wall extends from the first surface side of the first compound semiconductor layer to a middle of the first compound semiconductor layer in a thickness direction in the first compound semiconductor layer.

15. The light emitting element array according to claim 14, wherein a relationship between $L_0$, $L_1$, and $L_3$ satisfies a following Formula (1), satisfies a following Formula (2), or satisfies the following Formulas (1) and (2):

$$0.01 \times L_0 \leq L_0 - L_1 \quad (1)$$

$$0.01 \times L_3 \leq L_1 \quad (2)$$

where $L_0$: a distance from an end portion of a facing surface of the first light reflecting layer that faces the first surface of the first compound semiconductor layer to the active layer, $L_1$: a distance from the active layer to an end portion of the partition wall extending to the middle of the first compound semiconductor layer in the thickness direction in the first compound semiconductor layer, and $L_3$: a distance from an axial line of the first light reflecting layer included in the light emitting element to an orthogonal projection image of the partition wall on the stacked structure.

16. The light emitting element array according to claim 13, wherein in each light emitting element, the partition wall extends from the second surface side of the second compound semiconductor layer in the second compound semiconductor layer and the active layer, and further extends to the middle of the first compound semiconductor layer in the thickness direction in the first compound semiconductor layer.

17. The light emitting element array according to claim 16, wherein a relationship between $L_0$, $L_2$, and $L_3'$ satisfies a following Formula (3), satisfies a following Formula (4), or satisfies the following Formulas (3) and (4):

$$0.01 \times L_0 \leq L_2 \quad (3)$$

$$0.01 \times L_3' \leq L_2 \quad (4)$$

where $L_0$: a distance from an end portion of a facing surface of the first light reflecting layer that faces the first surface of the first compound semiconductor layer to the active layer, $L_2$: a distance from the active layer to an end portion of the partition wall extending to the middle of the first compound semiconductor layer in the thickness direction in the first compound semiconductor layer, and $L_3'$: a distance from an axial line of the first light reflecting layer included in the light emitting element to an orthogonal projection image of the partition wall on the stacked structure.

18. The light emitting element array according to claim 13, wherein, in the plurality of light emitting elements, each first light reflecting layer is surrounded by a respective partition wall physically separating adjacent light emitting elements.

19. The light emitting element array according to claim 13, wherein the light emitting elements are arranged at a pitch of 3 μm to 50 μm, and corresponding partition walls of adjacent light emitting elements optically isolate corresponding first light reflecting layers from each other.

20. The light emitting element array according to claim 13, wherein the partition walls of adjacent light emitting elements are arranged such that a space between the adjacent light emitting elements is occupied by the insulating material.

* * * * *